US005659557A

United States Patent [19]

Glover et al.

[11] Patent Number: 5,659,557

[45] Date of Patent: Aug. 19, 1997

[54] REED-SOLOMON CODE SYSTEM EMPLOYING K-BIT SERIAL TECHNIQUES FOR ENCODING AND BURST ERROR TRAPPING

[75] Inventors: Neal Glover, Broomfield; Trent Dudley, Littleton, both of Colo.

[73] Assignee: Cirrus Logic, Inc., Fremont, Calif.

[21] Appl. No.: 56,839

[22] Filed: May 3, 1993

Related U.S. Application Data

[63] Continuation of Ser. No. 612,430, Nov. 8, 1990, Pat. No. 5,280,488.

[51] Int. Cl.$^6$ .......................... G11B 20/18; H03M 13/00; H03M 13/22

[52] U.S. Cl. ....................... 371/37.1; 371/38.1; 371/39.1; 371/40.11

[58] Field of Search ................................. 371/37.1, 37.5, 371/38.1, 39.1, 40.1

[56] References Cited

U.S. PATENT DOCUMENTS

| | | | |
|---|---|---|---|
| 3,811,108 | 5/1974 | Howell | 371/37.1 |
| 4,099,160 | 7/1978 | Flagg | 371/37.1 |
| 4,142,174 | 2/1979 | Chen et al. | 371/37.1 |
| 4,162,480 | 7/1979 | Berlekamp | 371/37.1 |
| 4,355,391 | 10/1982 | Alsop, IV | 371/37.8 |
| 4,410,989 | 10/1983 | Berlekamp | 371/39.1 |
| 4,413,399 | 11/1983 | Riggle et al. | 371/40.1 |
| 4,455,655 | 6/1984 | Galen et al. | 371/37.7 |
| 4,494,234 | 1/1985 | Patel | 371/40.3 |
| 4,525,838 | 7/1985 | Patel | 371/37.4 |
| 4,566,105 | 1/1986 | Oisel et al. | 371/37.5 |
| 4,567,594 | 1/1986 | Deodhar | 371/40.1 |
| 4,584,686 | 4/1986 | Fritze | 371/37.1 |
| 4,604,750 | 8/1986 | Manton et al. | 371/40.2 |
| 4,633,470 | 12/1986 | Welch et al. | 371/37.1 |
| 4,706,250 | 11/1987 | Patel | 371/38.1 |
| 4,730,321 | 3/1988 | Machado | 371/37.5 |

(List continued on next page.)

OTHER PUBLICATIONS

Glover, N., et al., *"Practical Error Correction for Engineers"*, Second Edition, 1988, Data Systems Technology Corp., pp. 129–134, 256–268.

R.E. Blahut, *"Transform Techniques for Error Control Codes,"* IBM Journal of R&D., vol. 23, No. 3, May 1979.

N.N. Heise and W.G. Verdoorn, *"Serial Implementation of b–adjacent Codes,"* IBM Technical Bulletin, vol. 24, No. 5, Oct. 1981.

D.C. Bossen and M.Y. Hsiao, *"Serial Processing of Interleaved Codes,"* IBM Technical Disclosure Bulletin, vol. 17, No. 3, Aug. 1974.

Elwyn R. Berlekamp, *"Algebraic Codes for Improving the Reliability of Tape Storage,"* National Computer Conference, pp. 497–499, 1975.

Data Sheet for: *"Advanced Burst Error Processor,"* Part No. Am95C94, Advanced Micro Devices, May 1989.

(List continued on next page.)

*Primary Examiner*—Stephen M. Baker
*Attorney, Agent, or Firm*—Blakely, Sokoloff, Taylor & Zafman LLP

[57] ABSTRACT

Apparatus and methods are disclosed for providing an improved system for encoding and decoding of Reed-Solomon and related codes. The system employs a k-bit-serial shift register for encoding and residue generation. For decoding, a residue is generated as data is read. Single-burst errors are corrected in real time by a k-bit-serial burst trapping decoder that operates on this residue. Error cases greater than a single burst are corrected with a non-real-time firmware decoder, which retrieves the residue and converts it to a remainder, then converts the remainder to syndromes, and then attempts to compute error locations and values from the syndromes. In the preferred embodiment, a new low-order first, k-bit-serial, finite-field constant multiplier is employed within the burst trapping circuit. Also, code symbol sizes are supported that need not equal the information byte size. The implementor of the methods disclosed may choose time-efficient or space-efficient firmware for multiple-burst correction.

44 Claims, 133 Drawing Sheets

U.S. PATENT DOCUMENTS

| | | | |
|---|---|---|---|
| 4,733,396 | 3/1988 | Baldwin et al. | 371/40.2 |
| 4,777,635 | 10/1988 | Glover | 371/37.5 |
| 4,782,490 | 11/1988 | Tenegolts | 371/37.5 |
| 4,833,679 | 5/1989 | Anderson et al. | 371/37.6 |
| 4,839,896 | 6/1989 | Glover et al. | 371/37.8 |
| 4,843,607 | 6/1989 | Tong | 371/37.1 |
| 4,845,713 | 7/1989 | Zook | 371/37.1 |
| 4,849,975 | 7/1989 | Patel | 371/38.1 |
| 4,856,003 | 8/1989 | Weng | 371/37.1 |
| 4,866,716 | 9/1989 | Weng | 371/37.1 |
| 4,890,287 | 12/1989 | Johnson et al. | 371/37.2 |
| 4,916,702 | 4/1990 | Berlekamp | 371/39.1 |
| 4,979,173 | 12/1990 | Geldman et al. | 371/39.1 |
| 5,001,715 | 3/1991 | Weng | 371/37.1 |
| 5,099,482 | 3/1992 | Cameron | 371/37.1 |
| 5,107,503 | 4/1992 | Riggle et al. | 371/37.1 |
| 5,107,506 | 4/1992 | Weng et al. | 371/39.1 |
| 5,109,385 | 4/1992 | Karp et al. | 371/42 |
| 5,136,592 | 8/1992 | Weng | 371/39.1 |
| 5,267,241 | 11/1993 | Kowal | 371/5.3 |
| 5,280,488 | 1/1994 | Glover et al. | 371/37.1 |

OTHER PUBLICATIONS

Product Description for: "Low–Cost High Performance Error Correcting Code Chip," Part No. NG–8520, Cirrus Logic, Inc., Jan. 1988.

Error Correction Coding for Digital Communications, Clark & Cain, "Algebraic Techniques for Multiple Error Correction", Chapter 5, pp. 181–225.

Practical Error Correction Design for Engineers, Second Edition, Neal Glover & Trent Dudley, pp. 11–13, 32–34, 89–90, 112–113, 181, 242, 270, 285, 298, 350.

NOTES: If the user data field length in bits is divisible by ten, then there will be no PREPAD_TIME and POSTPAD_TIME will be eight bits in length. If the user data field length plus eight is divisible by ten, then there will be no POSTPAD_TIME and the PREPAD_TIME will be eight bits in length.

FREEZE-CLK IS NORMALLY DE-ACTIVATED. IT IS ACTIVATED ONLY DURING THE GAP BETWEEN HALFS OF A SPLIT SECTOR. IT MUST BE ACTIVATED AND DEACTIVATED DURING THE HIGH HALF CYCLE OF 1FCLK.

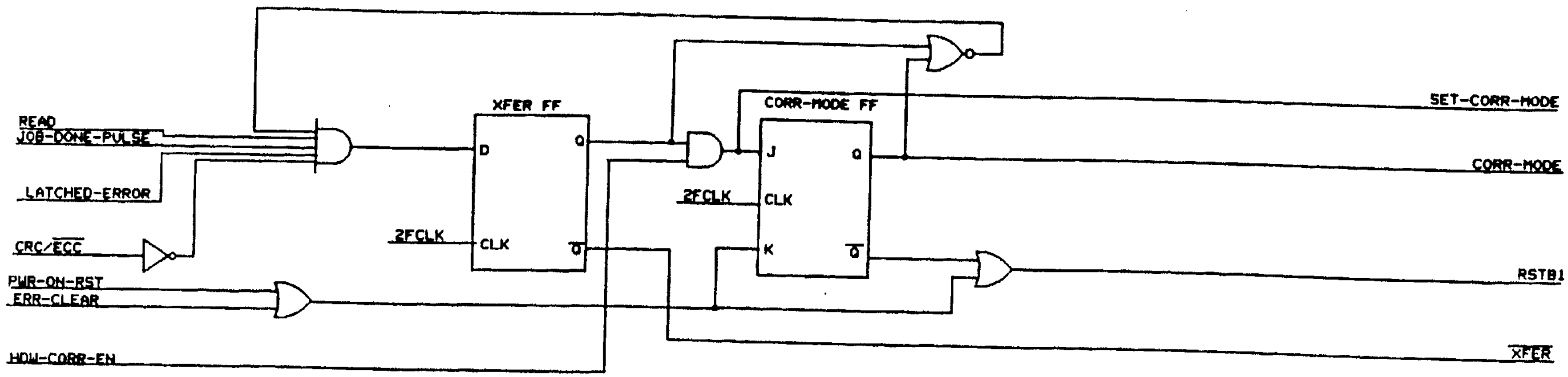

1) THE TOP NOR GATE ENSURES THAT THE XFER FF IS ACTIVE FOR ONE PERIOD OF THE 2FCLK ONLY. IT COMPENSATES FOR SKEW BETWEEN THE 1FCLK AND THE 2FCLK.

2) THE XFER FF PULSES AT THE END OF EACH READ IF LATCHED_ERROR IS ACTIVE. THE XFER FF NEEDS TO PULSE EVEN IF HDW-CORR-EN IS INACTIVE IN ORDER FOR REMAINDERS TO BE TRANSFERRED TO SHIFT REGISTER B. THE CORR-MODE FF IS SET ONLY IF HDW-CORR-EN IS ACTIVE.

*FIG. 52*

THE SUPPRESS SIGNAL PREVENTS THE CORRECTION OF ERRORS WITHIN EXTENDED REDUNDANCY.

EACH COLUMN DEFINES A PARITY TREE. A ROW HAS AN INPUT TO A COLUMN PARITY TREE IF THERE IS A "1" AT THE INTERSECTION OF THE ROW AND COLUMN.

EACH COLUMN DEFINES A PARITY TREE. A ROW HAS AN INPUT TO A COLUMN PARITY TREE IF THERE IS A "1" AT THE INTERSECTION OF THE ROW AND COLUMN.

IF THE DELAYS ASSOCIATED WITH THE PARITY TREES OF PTREE-A (SHT 17) OR PTREE-B (SHT 17A) ARE TOO GREAT PIPELINING CAN BE USED TO REDUCE THEM. THIS TECHNIQUE IS ILLUSTRATED BELOW. THE THREE CIRCUITS

FREEZE-CLK IS NORMALLY DE-ACTIVATED. IT IS ACTIVATED ONLY DURING THE GAP BETWEEN HALFS OF A SPLIT SECTOR. IT MUST BE ACTIVATED AND DEACTIVATED DURING THE HIGH HALF CYCLE OF 1FCLK.

SEE NOTE ON SHEET 17C

EACH COLUMN DEFINES A PARITY TREE. A ROW HAS AN INPUT TO A COLUMN PARITY TREE IF THERE IS A "1" AT THE INTERSECTION OF THE ROW AND COLUMN.

EACH COLUMN DEFINES A PARITY TREE. A ROW HAS AN INPUT TO A COLUMN PARITY TREE IF THERE IS A "1" AT THE INTERSECTION OF THE ROW AND COLUMN.

EACH COLUMN DEFINES A PARITY TREE. A ROW HAS AN INPUT TO A COLUMN PARITY TREE IF THERE IS A "1" AT THE INTERSECTION OF THE ROW AND COLUMN.

IF THE DELAYS ASSOCIATED WITH THE PARITY TREES OF PTREE-A (SHT 17) OR PTREE-B (SHT 17A) ARE TOO GREAT PIPELINING CAN BE USED TO REDUCE THEM. THIS TECHNIQUE IS ILLUSTRATED BELOW. THE THREE CIRCUITS ARE EQUIVALENT.

NOTE: FREEZE-CLK IS NORMALLY DE-ACTIVATED. IT IS ACTIVATED ONLY DURING THE GAP BETWEEN HALFS OF A SPLIT SECTOR. IT MUST BE ACTIVATED AND DEACTIVATED DURING THE HIGH HALF CYCLE OF 1FCLK.

NOTE: THE XFER FF PULSES AT THE END OF EACH READ IF LATCHED_ERROR IS ACTIVE. THE XFER FF NEEDS TO PULSE EVEN IF HDW-CORR-EN IS INACTIVE IN ORDER FOR REMAINDERS TO BE TRANSFERRED TO SHIFT REGISTER B. THE CORR-MODE FF IS SET ONLY IF HDW-CORR-EN IS ACTIVE.

NOTE: THE SUPPRESS SIGNAL PREVENTS THE CORRECTION OF ERRORS WITHIN EXTENDED REDUNDANCY.

EACH COLUMN DEFINES A PARITY TREE. A ROW HAS AN INPUT TO A COLUMN PARITY TREE IF THERE IS A "1" AT THE INTERSECTION OF THE ROW AND COLUMN.

EACH COLUMN DEFINES A PARITY TREE. A ROW HAS AN INPUT TO A COLUMN PARITY TREE IF THERE IS A "1" AT THE INTERSECTION OF THE ROW AND COLUMN.

EACH COLUMN DEFINES A PARITY TREE. A ROW HAS AN INPUT TO A COLUMN PARITY TREE IF THERE IS A "1" AT THE INTERSECTION OF THE ROW AND COLUMN.

IF THE DELAYS ASSOCIATED WITH THE PARITY TREES OF PTREE-A (SHT 17) OR PTREE-B (SHT 17A) ARE TOO GREAT PIPELINING CAN BE USED TO REDUCE THEM. THIS TECHNIQUE IS ILLUSTRATED BELOW. THE THREE CIRCUITS ARE EQUIVALENT.

REED-SOLOMON CODE SYSTEM EMPLOYING K-BIT SERIAL TECHNIQUES FOR ENCODING AND BURST ERROR TRAPPING

This is a continuation of application Ser. No. 07/612,430, filed Nov. 8, 1990 for "REED-SOLOMON CODE SYSTEM EMPLOYING K-BIT SERIAL TECHNIQUES FOR ENCODING AND BURST ERROR TRAPPING", now U.S. Pat. No. 5,280,458.

BACKGROUND OF THE INVENTION

This invention relates to information storage and retrieval or transmission systems, and more particularly to means for encoding and decoding codewords for use in error detection and correction in such information systems.

Digital information storage devices, such as magnetic disk, magnetic tape or optical disk, store information in the form of binary bits. Also, information transmitted between two digital devices, such as computers, is transmitted in the form of binary bits. During transfer of data between devices, or during transfer between the storage media and the control portions of a device, errors are sometimes introduced so that the information received is a corrupted version of the information sent. Errors can also be introduced by defects in a magnetic or optical storage medium. These errors must almost always be corrected if the storage or transmission device is to be useful.

Correction of the received information is accomplished by (1) deriving additional bits, called redundancy, by processing the original information mathematically; (2) appending the redundancy to the original information during the storage or transmission process; and (3) processing the received information and redundancy mathematically to detect and correct erroneous bits at the time the information is retrieved. The process of deriving the redundancy is called encoding. One class of codes often used in the process of encoding is Reed-Solomon codes.

Encoding of information is accomplished by processing a sequence of information bits, called an information polynomial or information word, to devise a sequence of redundancy bits, called a redundancy polynomial, in accord with an encoding rule such as one of the Reed-Solomon codes. An encoder processes the information polynomial with the encoding rule to create the redundancy polynomial and then appends it to the information polynomial to form a codeword polynomial which is transmitted over the signal channel or stored in an information storage device. When a received codeword polynomial is received from the signal channel or read from the storage device, a decoder processes the received codeword polynomial to detect the presence of error(s) and to attempt to correct any error(s) present before transferring the corrected information polynomial for further processing.

Symbol-serial encoders for Reed-Solomon error correcting codes are known in the prior art (see Riggle, U.S. Pat. No. 4,413,339). These encoders utilize the conventional or standard finite-field basis but are not easy to adapt to bit-serial operation. Bit-serial encoders for Reed-Solomon codes are also known in the prior art (see Berlekamp, U.S. Pat. No. 4,410,989 and Glover, U.S. Pat. No. 4,777,635). The Berlekamp bit-serial encoder is based on the dual basis representation of the finite field while the bit-serial encoder of 4,777,635 is based on the conventional representation of the finite field. Neither 4,410,989 nor 4,777,635 teach methods for decoding Reed-Solomon codes using bit-serial techniques.

It is typical in the prior art to design encoding and error identification apparatus where n=m=8 bits, where n is the number of bits in a byte and m is the symbol size (in bits) of the Reed-Solomon code. However, this imposes a severe restriction on the information word length: since the total of information bytes plus redundancy symbols must be less than $2^m$, no more than 247 information bytes may appear in a single information word if 8 redundancy symbols are to be used. Increasing media densities and decreasing memory costs push for increasing the size of information words. Thus, there is a need to decouple n, the byte-size of the information word, from m, the symbol size of the Reed-Solomon code employed.

Also, bit-serial finite-field constant multiplier circuits are well known in the prior art. For example, see Glover and Dudley, *Practical Error Correction Design for Engineers* (Second Edition), pages 112–113, published by Data Systems Technology Corp., Broomfield, Colo. However, these designs require that the most-significant (higher order) bit of the code symbol be presented first in the serial input stream. Using exclusively multipliers with this limitation to implement an error identification circuit results in the bits included in a burst error not being adjacent in the received word symbols. Thus, there is a need for a least-significant-bit first, bit-serial, finite-field constant multiplier.

Prior-art circuits used table look-up to implement the finite-field arithmetic operation of multiplication, which is used in the error-identification computation. Because the look-up table size is established by $\alpha^m$ the number of bits in each code symbol, even a modest increase in m results in a substantial increase in the look-up table size. It is possible to reduce the size of the required tables, at the expense of the multiplication computation time, by representing the finite field elements as the concatenation of two elements of a finite field whose size is significantly less than the size of the original field. However, there are situations in which one would like to be able to choose implementations at either of two points on the speed-versus-space tradeoff to accomplish either fast correction using large tables or slower correction using small tables. Thus, there is a need for a way of supporting either implementation of finite-field arithmetic in error correcting computations.

As the recording densities of storage devices increase, the rate of occurrence for soft errors (non-repeating noise related errors) and hard errors (permanent defects) increase. Soft errors adversely affect performance while hard errors affect data integrity.

Errors frequently occur in bursts e.g. due to a noise event of sufficient duration or a media defect of sufficient size to affect more than one bit. It is desirable to reduce the impact of single-burst errors by correcting them on-the-fly, without re-reading or re-transmitting, in order to decrease data access time. Multiple, independent soft or hard errors affecting a single codeword occur with frequency low enough that performance is not seriously degraded when re-reading or off-line correction is used. Thus, there is a need for the capability to correct a single-burst error in real time and a multiple-burst error in an off-line mode.

Due to market pressure there is a continuous push toward lower manufacturing cost for storage devices. This constrains the ratio of the length of the redundancy polynomial to the length of the information polynomial.

It is thus apparent that there is a need in the art for higher performance, low cost implementations of more powerful Reed-Solomon codes.

FIG. 1A shows the prior art classical example of a Reed-Solomon linear feedback shift register (LSFR) encoder circuit that implements the code generator polynomial $$x^4+c_3x^3+c_2x^2+c_1x+c_0$$

over the finite field GF($2^m$). The elements 121, 122, 123, and 124 of the circuit are m-bit wide, one-bit long registers. Data bits grouped into symbols being received on data path 125 are elements of the finite field GF($2^m$). Prior to transmitting or receiving, register stages 121, 122, 123, 124 are initialized to some appropriate starting value; symbol-wide logic gate 128 is enabled; and multiplexer 136 is set to connect data path 125 to data/redundancy path 137. On transmit, data symbols from data path 125 are modulo-two summed by symbol-wide EXCLUSIVE-OR gate 126 with the high order register stage 121 to produce a feedback symbol on data path 127. The feedback symbol on data path 127 then passes through symbol-wide logic gate 128 and is applied to finite field constant multipliers 129, 130, 131, and 132. These constant multipliers multiply the feedback symbol by each of the coefficients of the code generator polynomial. The outputs of the multipliers 129, 130, and 131, are applied to symbol-wide summing circuits 133, 134, and 135 between registers 121, 122, 123, and 124. The output of multiplier 132 is applied to the low order register 124.

When the circuit is clocked, register 121, 122, and 123 take the values at the outputs of the modulo-two summing circuits 133, 134, and 135, respectively. Register 124 takes the value at the output of constant multiplier 132. The operation described above for the first data symbol continues for each data symbol through the last data symbol. After the last data symbol is clocked, the REDUNDANCY TIME signal 138 is asserted, symbol-wide logic gate 128 is disabled, and symbol-wide multiplexer 136 is set to connect the output of the high order register 121 to the data/redundancy path 137. The circuit receives 4 additional clocks to shift the check bytes to the data/redundancy path 137. The result of the operation described above is to divide an information polynomial I(x) by the code generator polynomial G(x) to generate a redundancy polynomial R(x) and to append the redundancy polynomial to the information polynomial to obtain a codeword polynomial C(x). Circuit operation can be described mathematically as follows:

$$R(x)=(x^4*I(x)) \text{ MOD } G(x)$$

$$c(x)=x^4*I(x)+R(x)$$

where + means modulo-two sum and * means finite field multiplication.

FIG. 1B shows a prior art example of an external-XOR Reed-Solomon LFSR encoder circuit that implements the same code generator polynomial as is implemented in FIG. 1A, though FIG. 1A uses the internal-XOR form of LFSR. Internal-XOR LFSR circuits always have an XOR (or parity tree or summing) circuit between shift register stages containing different powers of X, whereas external-XOR circuits do not have a summing circuit between all such shift register stages. In addition, internal-XOR LFSR circuits always shift data toward the stage holding the highest power of X, whereas external-XOR circuits always shift data toward the stage holding the lowest power of X. External-XOR LFSR circuits are known to the prior art (for example, see Glover and Dudley, *Practical Error Correction for Engineers*pages 32–34, 181, 296 and 298,).

FIG. 2 is a block diagram of another prior art encoder and time domain syndrome generation circuit which operates on m-bit symbols from GF($2^m$), k bits per clock cycle where k evenly divides m. The circuit of FIG. 2 employs the conventional finite field representation and performs the same function as the encoder shown in FIG. 1 except that it is easily adapted to operate on k bits of an m-bit symbol per clock, where k evenly divides m.

The circuit of FIG. 2 utilizes n registers, here represented by 160, 161, 162, and 163, where n is the degree of the code generator polynomial. The input and output paths of each register are k bits wide. The depth (number of delay elements between input and output) of each register is m/k. When k is less than m, each of the registers 160, 161, 162, and 163 function as k independent shift registers, each m/k bits long. Prior to transmitting or receiving, all registers 160, 161, 162, and 163 are initialized to some appropriate starting value, logic gates 164 and 165 are enabled; and multiplexer 166 is set to pass data from logic gate(s) 165 to data/redundancy path 167. On transmit, data symbols from data path 168 are modulo-two summed by EXCLUSIVE-OR gate(s) 169 with the output of the high order register 160, k bits at a time, to produce a feedback signal at 170. The feedback signal is passed through gate(s) 164 to the linear network 171 and to the next to highest order register 161. The output of register 161 is fed to the next lower order register 162 and so on. The output of all registers other than the highest order register 160 also have outputs that go directly to the linear network 171. Once per m-bit data symbol the output of linear network 171 is transferred, in parallel, to the high order register 160.

When k is equal to m, the linear network 171 is comprised only of EXCLUSIVE-OR gates. When k is not egual to m, the linear network 171 also includes linear sequential logic components. On each clock cycle, each register is shifted to the right one position and the leftmost positions of each register take the values at their inputs. The highest order register 160 receives a new parallel-loaded value from the linear network 171 once per m-bit data symbol. Operation continues as described until the last data symbol on data path 168 has been completely clocked into the circuit. Then the REDUNDANCY TIME signal 175 is asserted, which disables gates 164 and 165 (because of INVERTER circuit 178) and changes multiplexer 166 to pass the check symbols (k bits per clock) from the output of the modulo-two summing circuit 169 to the data/redundancy path 167. Clocking of the circuit continues until all redundancy symbols have been transferred to the data/redundancy path 167. The result of the operation described above is that the information polynomial I(x) is divided by the code generator polynomial G(x) to generate a redundancy polynomial R(x) which is appended to the information polynomial I(x) to obtain the codeword polynomial C(x). This operation can be described mathematically as follows:

$$R(x)=(x^m*I(x)) \text{ MOD } G(x)$$

$$C(x)=x^m*I(x)\oplus R(x)$$

In receive mode, the circuit of FIG. 2 operates as for a transmit operation except that after all data symbols have been clocked into the circuit, RECEIVE MODE signal 176, through OR gate 177, keeps gate(s) 165 enabled while REDUNDANCY TIME signal 175 disables gate(s) 164 and changes multiplexer 166 to pass time domain syndromes from the output of modulo-two summing circuit 169 to the data-redundancy path 167. The circuit can be viewed as generating transmit redundancy (check bits) during transmit, and receive redundancy. during receive. Then the time domain syndromes can be viewed as the modulo-two difference between transmit redundancy and receive redundancy. The time domain syndromes are decoded to obtain error locations and values which are used to correct data. Random access memory (RAM) could be used as a substitute for registers 160, 161, 162, and 163.

SUMMARY OF THE INVENTION

Apparatus and methods are disclosed for providing an improved system for encoding and decoding of Reed-Solomon and related codes. The system employs a k-bit-serial shift register for encoding and residue generation. For decoding, a residue is generated as data is read. Single-burst errors are Corrected in real time by a k-bit-serial burst trapping decoder that operates on this residue. Error cases greater than a single burst are corrected with a non-real-time firmware decoder, which retrieves the residue and converts it to a remainder, then converts the remainder to syndromes, and then attempts to compute error locations and values from the syndromes. In the preferred embodiment, a new low-order-first, k-bit-serial, finite-field constant multiplier is employed within the burst trapping circuit. Also, code symbol sizes are supported that need not egual the information byte size. Also, the implementor of the methods disclosed may choose time-efficient or space-efficient firmware for multiple-burst correction.

In accordance with the foregoing, an object of the present invention is to reduce the implementation cost and complexity of real-time correction of single-burst errors by employing a k-bit-serial external-XOR burst-trapping circuit which, in the preferred embodiment, uses a least-significant-bit first, finite-field constant multiplier.

Another object of the present invention is to provide a high-performance, cost-efficient implementation for Reed-Solomon codes that allows the same LFSR to be used for both encoding and decoding of Reed-Solomon codes, more particularly, that utilizes the same k-bit-serial, external-XOR LFSR circuit as is used in encoding operations in decoding operations to generate a residue that can subsequently be transformed into the time-domain syndrome (or remainder) known in the prior art (see Glover et al, U.S. Pat. 4,839,896).

Another object of the present invention is to provide a polynomial determining a particular Reed-Solomon code that supports a high degree of data integrity with a minimum of media capacity overhead and that is suitable for applications including, but not limited to, on-the-fly correction of magnetic disk storage.

Another object of the invention is to provide a means for extending the error correction power of an error correction implementation by implementing erasure correction techniques.

Another object is to provide an implementation of Reed-Solomon code encoding and decoding particularly suitable for implementation in an integrated circuit.

Another object is to support error identification (i.e., determining the location(s) and pattern(s) of error(s)) of single-burst errors exceeding m+l bits in length, where m is the code symbol size, using a k-bit-serial error-trapping circuit.

Another object of the present invention is to provide a cost-efficient non-real-time implementation for multiple-burst error correction which splits the correction task between hardware and firmware.

Another object is to support both time-efficient and firmware space-efficient computation for multiple-burst error identification (i.e., determination of error locations and values) with the choice depending on the predetermined preference of the implementor of the error identification apparatus.

Another object is a method for mapping between hardware finite-field computations and software finite-field computations within the same error-identification computation such that the hardware computations reduce implementation cost and complexity and the software computations reduce firmware table space.

Another object is to reduce the implementation cost and complexity of the storage or transmission control circuitry by allowing the LFSR used in encoding and residue generation, in addition, to be used in encoding and decoding of information according to other codes such as computer generated codes or cyclic redundancy check (CRC) codes.

Another object is to support larger information polynomials without excessive amounts of redundancy by eliminating the prior-art requirement that the number of bits in the information word be a multiple of the size of the code symbol by including one or more pad fields in the codeword polynomial, i.e., the word generated by concatenating the information polynomial with the redundancy polynomial and with the pad field(s).

Another object is to achieve the above objectives in a manner that supports improved protection against burst errors and longer information polynomials by allowing the code symbols of the information polynomial to be interleaved, as is known in the prior art, among a plurality of codeword polynomials, each containing its own independent redundancy polynomial.

These and other objects of the invention will become apparent from the detailed disclosures following herein.

BRIEF DESCRIPTION OF THE DRAWINGS

FIG. 19A is a chart illustrating bit-by-bit syndrome reversal.

FIG. 19B is a chart showing symbol-by-symbol syndrome reversal.

FIG. 19C is a chart illustrating a burst error that spans two adjacent symbols in the recording or transmission media. FIG. 19D is a chart illustrating the same burst error fragmented in the same symbols as transformed by symbol-by-symbol reversal.

DESCRIPTION OF THE PREFERRED EMBODIMENT

The following description is of the best presently contemplated mode of carrying out the instant invention. This description is not to be taken in a limiting sense but is made merely for the purpose of describing the general principles of the invention. The scope of the invention should be determined with reference to the appended claims.

SYSTEM BLOCK DIAGRAM

Figure 3:
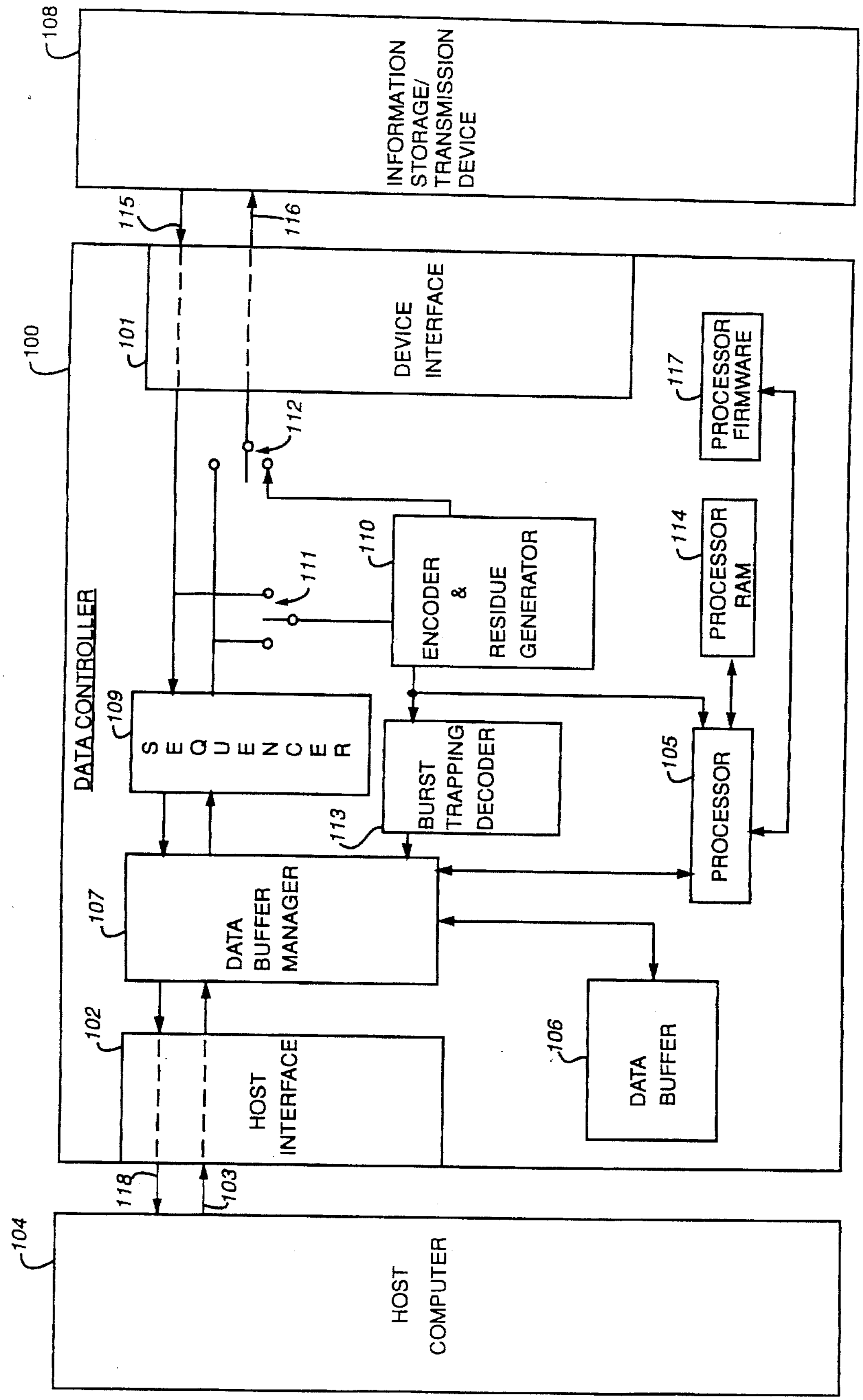
FIG. 3 is a block diagram showing an application of the present invention in the encoding, decoding, and error correction of information transferred to/from a host computer and a storage/transmission device.

Referring to FIG. 3, a data controller 100 having a host interface 102 is connected to a host computer 104. The data controller 100 also has a device interface 101 which connects the data controller 100 to an information storage/transmission device 108. In the process of writing data onto the storage/transmission device 108, an information word (or polynomial) from the host computer 104 is transferred to the data controller 100 through an information channel 103, through the host interface 102, through a data buffer manager 107, and into a data buffer 106. The information word is then transferred through a sequencer 109 into an encoder and residue generator circuit 110 where the redundancy word is created. At the same time the information word is transferred into the encoder 110, it is transferred in parallel through switch 12, through device interface 101, and through device information channel 116, to the information storage/transmission device 108. After the information word is transferred as described above, switch 112 is changed and the redundancy word is transferred from the encoder 110, through switch 112, through device interface 101, through device information channel 116, and written on information storage/transmission device 108.

For reading information from information storage/transmission device 108, the process is reversed. A received polynomial from information storage/transmission device 108 is transferred through device information channel 115, through the device interface 101, through switch 111 into the residue generator 110. At the same time the received word is being transferred into the residue generator 110, it is transferred in parallel through sequencer 109, and through data buffer manager 107 into the data buffer 106. After the received word has been transferred into the data buffer 106, if the residue is non-zero, then while the next received codeword polynomial is being transferred from storage/transmission device 108, the residue is transferred from the residue generator 110 to the burst trapping decoder 113, which then attempts to identify the location and value of a single-burst error. If this attempt succeeds, then the error location and value are transferred to the data buffer manager 107, which then corrects the information polynomial in the data buffer 106 using a read-modify-write operation. If this attempt fails, then the processor 105 can initiate a re-read of the received codeword polynomial from information storage/transmission device 108, can take other appropriate action, or can use the residue bits from the residue generator 110 to attempt to correct a double-burst error in the information word in data buffer 106. After correction of any errors in the data buffer 106, the data bits are transferred through the host interface 102, through the information channel 118 to the host computer 104.

ENCODER AND RESIDUE GENERATOR

Figure 4:
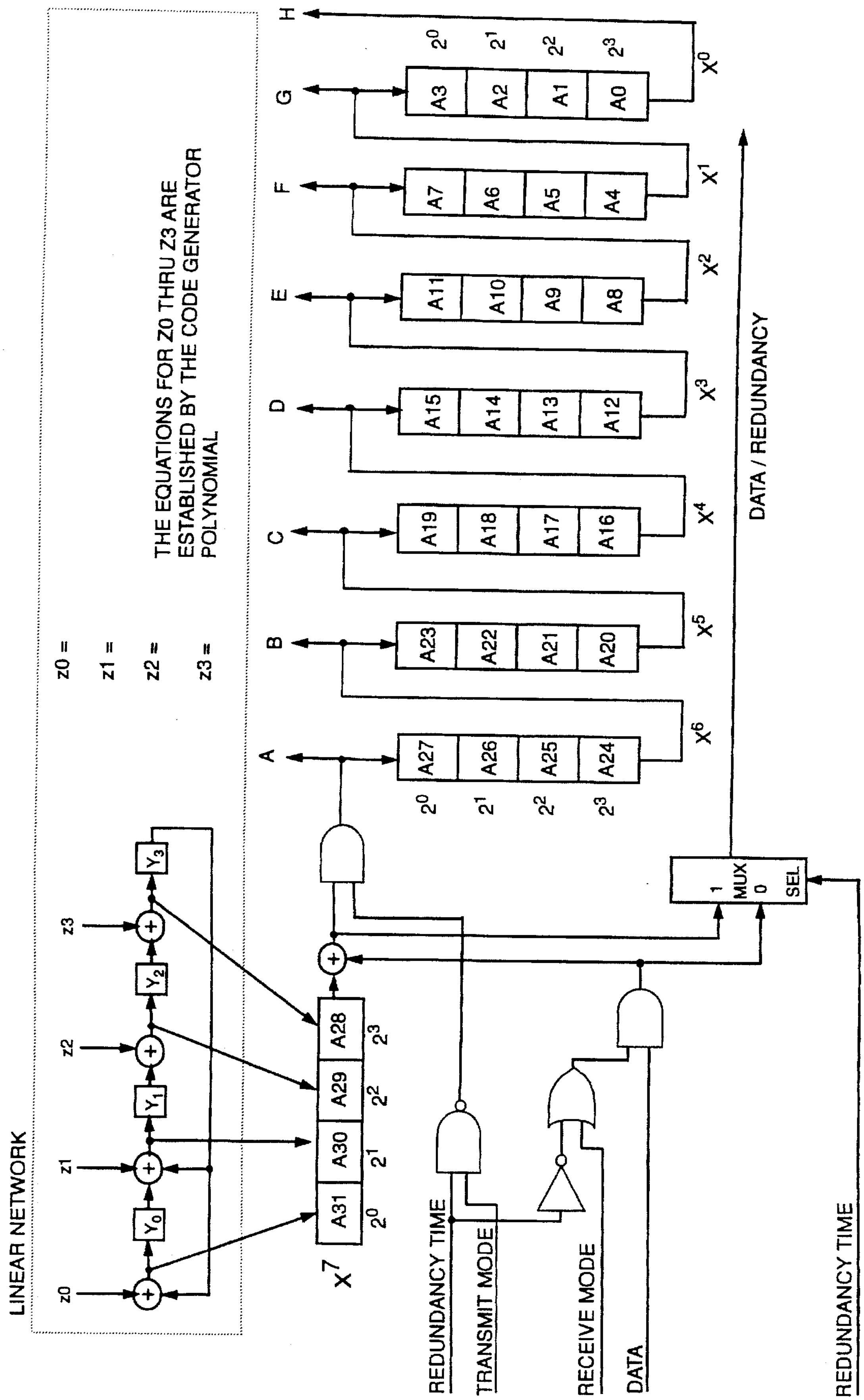
FIG. 4 is a logic diagram of the LFSR for an external-XOR, 1-bit-serial encoder and residue generator employing a high-order first, finite-field constant multiplier.

FIG. 4 shows an external-XOR LFSR circuit using bit-serial techniques, including a high-order first, bit-serial multiplier, which is shared for both encoding and residue generation functions. Similar external-XOR bit-serial LFSR circuits which are shared for encoding and remainder generation are known in the prior art (see 4,777,635 for example). These prior art circuits transform a residue within the LFSR to a remainder by disabling feedback in the LFSR but continuing to clock the LFSR during the redundancy time of a read. In contrast, the circuit of FIG. 4 continues, by leaving feedback enabled, to develop a residue within the shift register during the redundancy time of a read. At the end of reading information and redundancy, the residue can be transferred to a burst-trapping circuit for real-time correction or the residue can be transferred to firmware for non-real-time correction.

The linear network comprises a high-order-first, multiple input, bit-serial multiplier. This type of multiplier is known in the prior art (see Glover, U.S. Pat. No. 4,777,635 for example).

The equations for z0 through z3 are established by the coefficients of the code generator polynomial.

Figure 5:
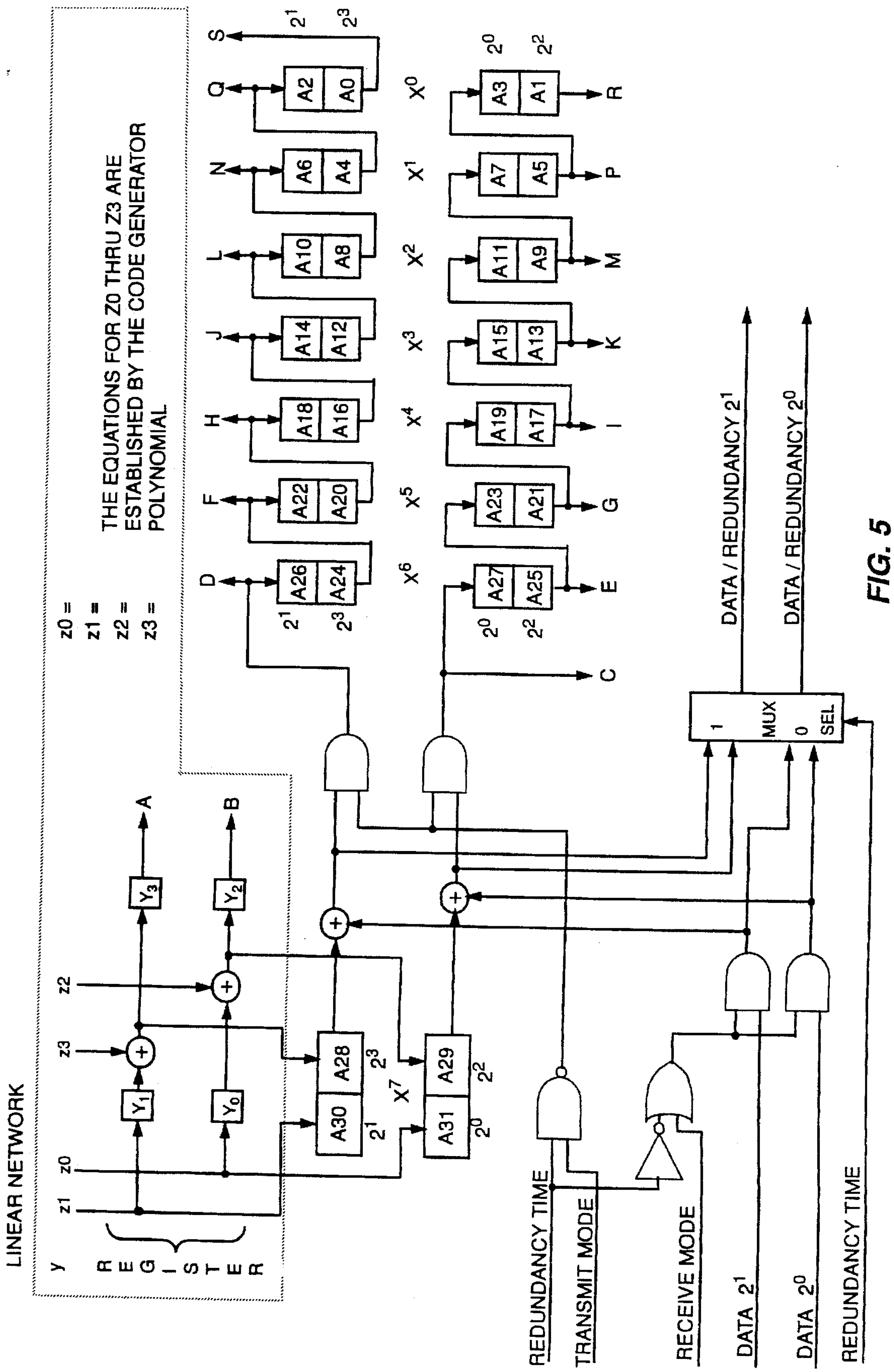
FIG. 5 is a logic diagram of the LFSR for an external-XOR, 2-bit-serial encoder and residue generator employing a high-order first, finite-field constant multiplier.

FIG. 5 shows an external-XOR LFSR circuit using 2-bit-serial techniques, including a high-order first, 2-bit-serial multiplier, which is shared for both encoding and residue generation functions. Similar external-XOR 2-bit-serial LFSR circuits which are shared for encoding and remainder generation are known in the prior art (see 4,777,635 for example). These prior art circuits transform a residue within the LFSR to a remainder by disabling feedback in the LFSR and continuing to clock the LFSR during the redundancy time of a read. The circuit of FIG. 5 continues, by leaving feedback enabled, to develop a residue within the shift register during redundancy time of a read. At the end of a read, the residue can be transferred to a burst-trapping circuit for real-time correction or the residue can be transferred to firmware for non-real-time correction.

HIGH-ORDER FIRST, BURST TRAPPING DECODER

Figure 6:
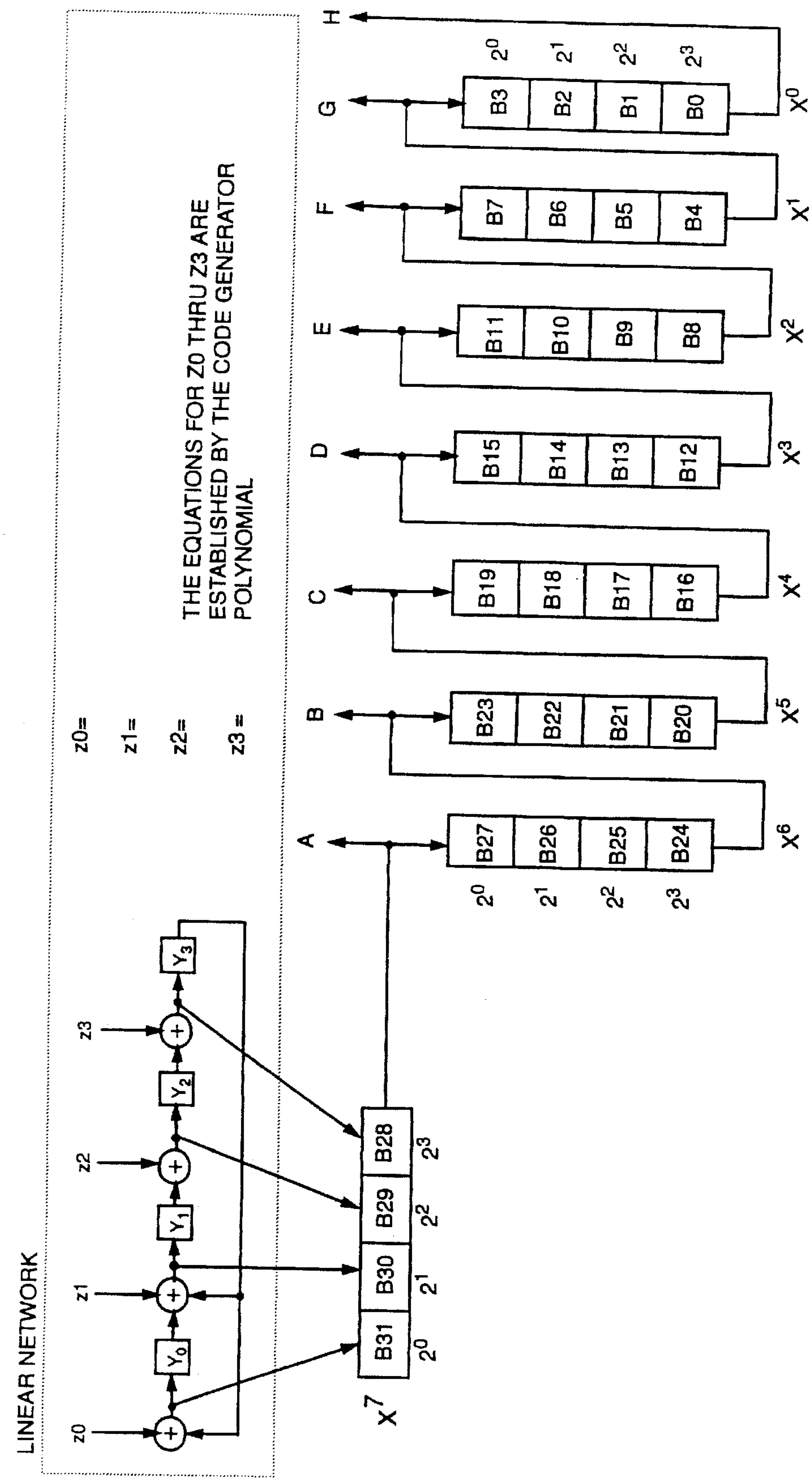
FIG. 6 is a logic diagram of the LFSR for an external-XOR, 1-bit-serial, single-burst error trapping decoder employing a high-order first, finite-field constant multiplier.

FIG. 6 shows an external-XOR LFSR circuit using bit-serial techniques, including a high-order first, bit-serial multiplier which accomplishes burst-trapping for single-burst errors. The linear network is a multiple input, high-order first, bit-serial multiplier. Such multipliers are known in the prior art (see Glover, U.S. Pat. No. 4,777,635). The use of such a multiplier in the external-XOR, bit-serial burst-trapping circuit is not taught in references known to applicants.

This type of burst-trapping circuit can be used within the current invention to accomplish real-time correction of single bursts that span two m-bit symbols.

Figure 19A:
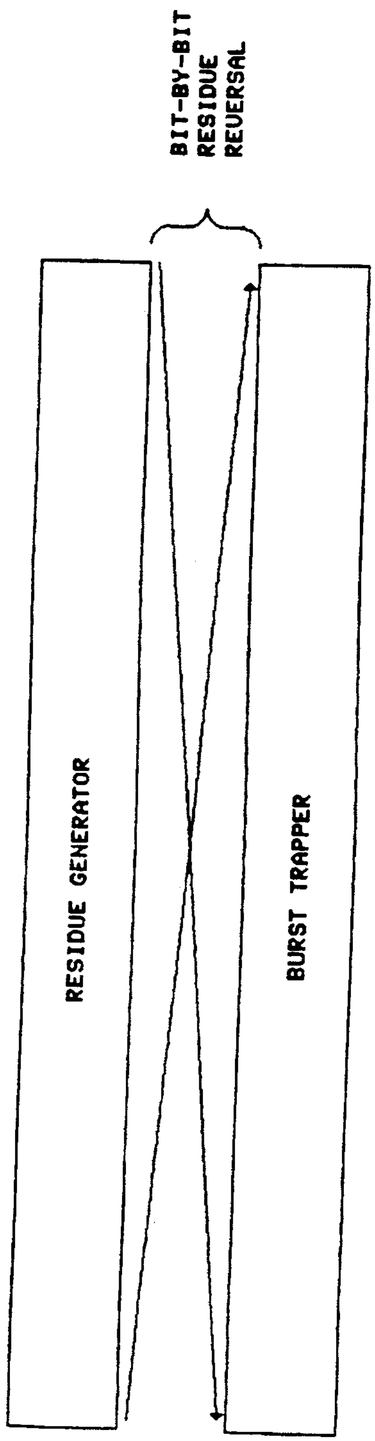
FIGS. 19A through 19D illustrate the use of a low-order first, finite-field constant multiplier in burst trapping. In particular.
Figure 19B:
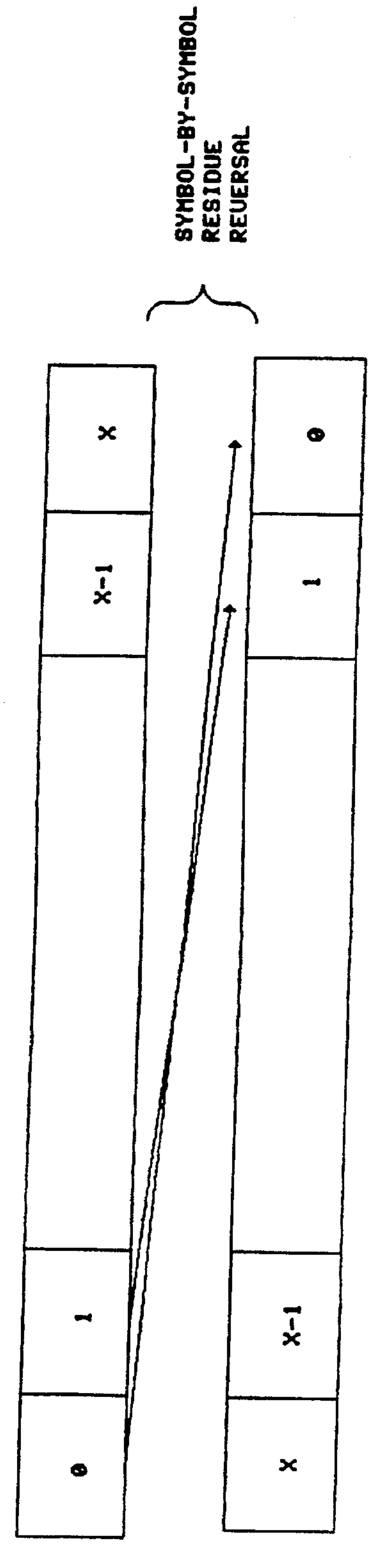
Figure 19C:
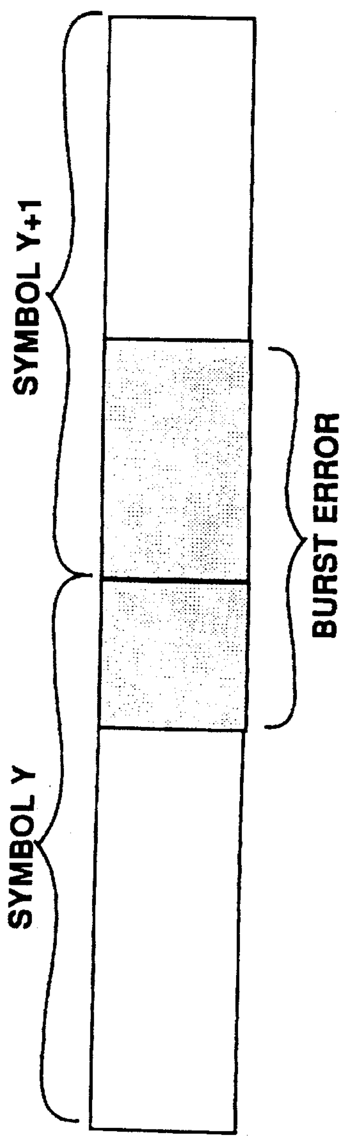
Figure 19D:
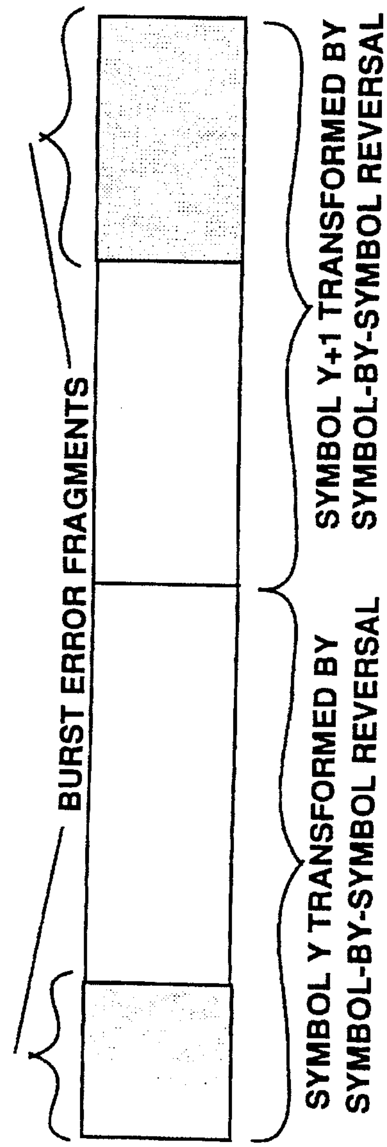
Figure 20:
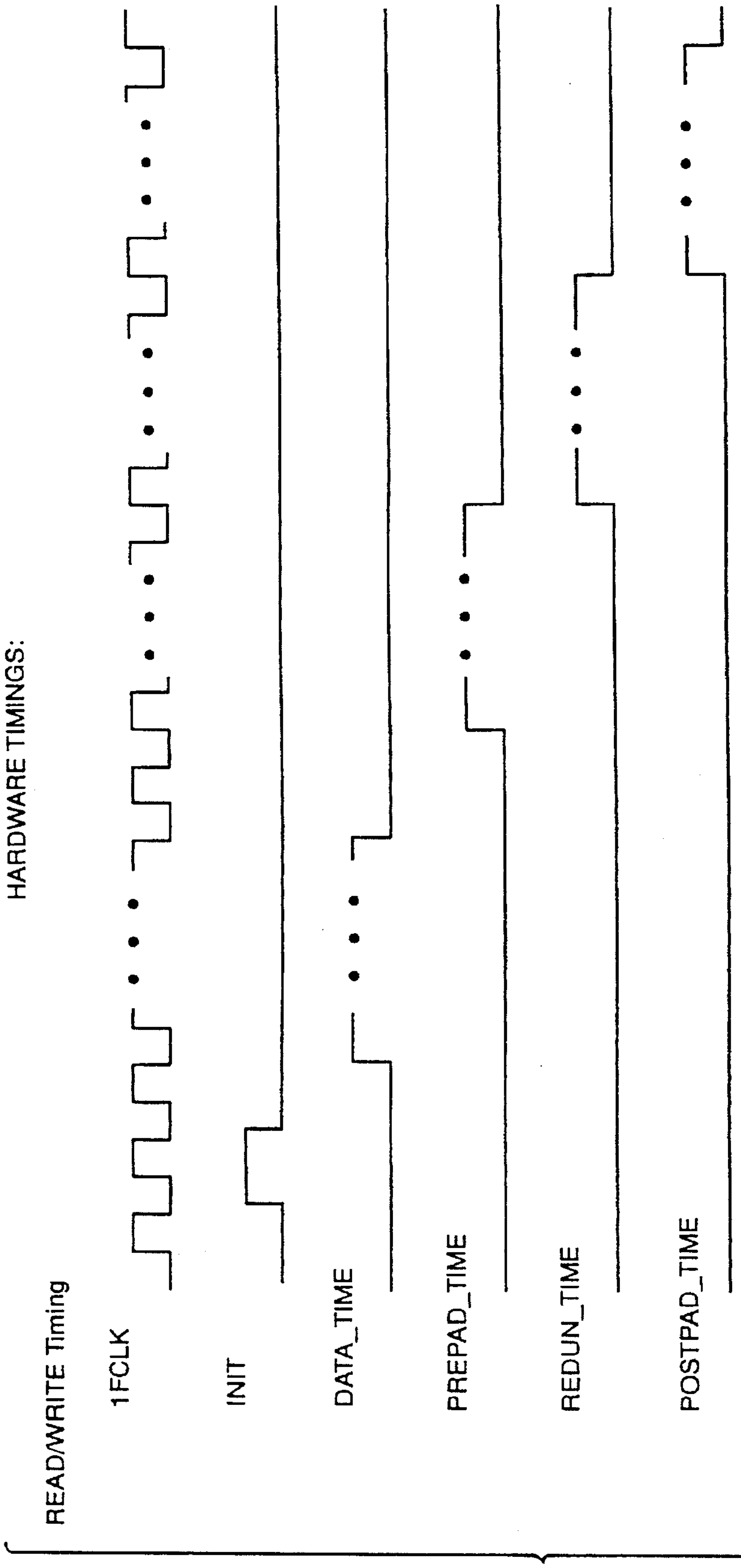
FIG. 20 Shows a read/write timing diagram.
Figure 21:
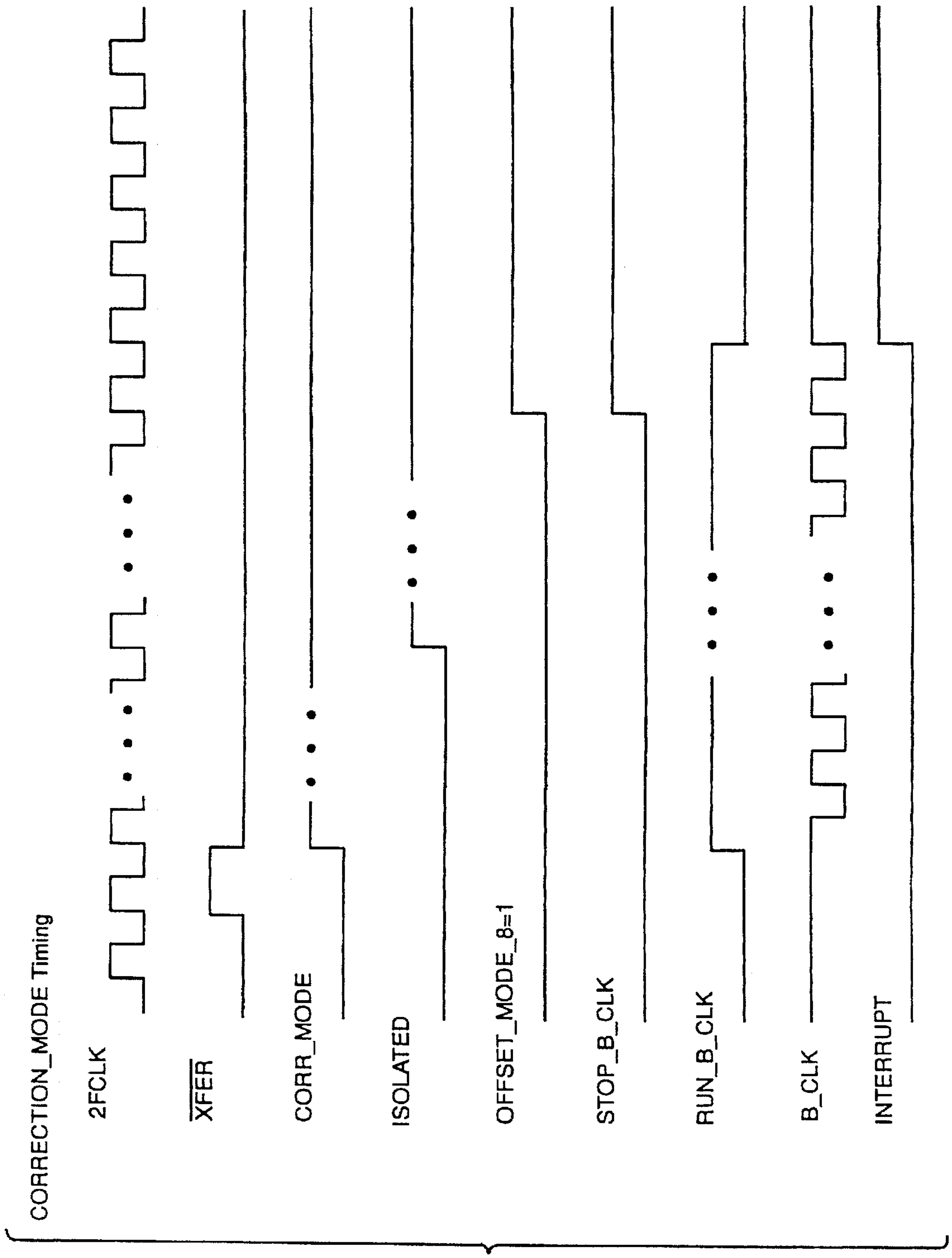
FIG. 21 shows a correction mode timing diagram.
Figure 22:
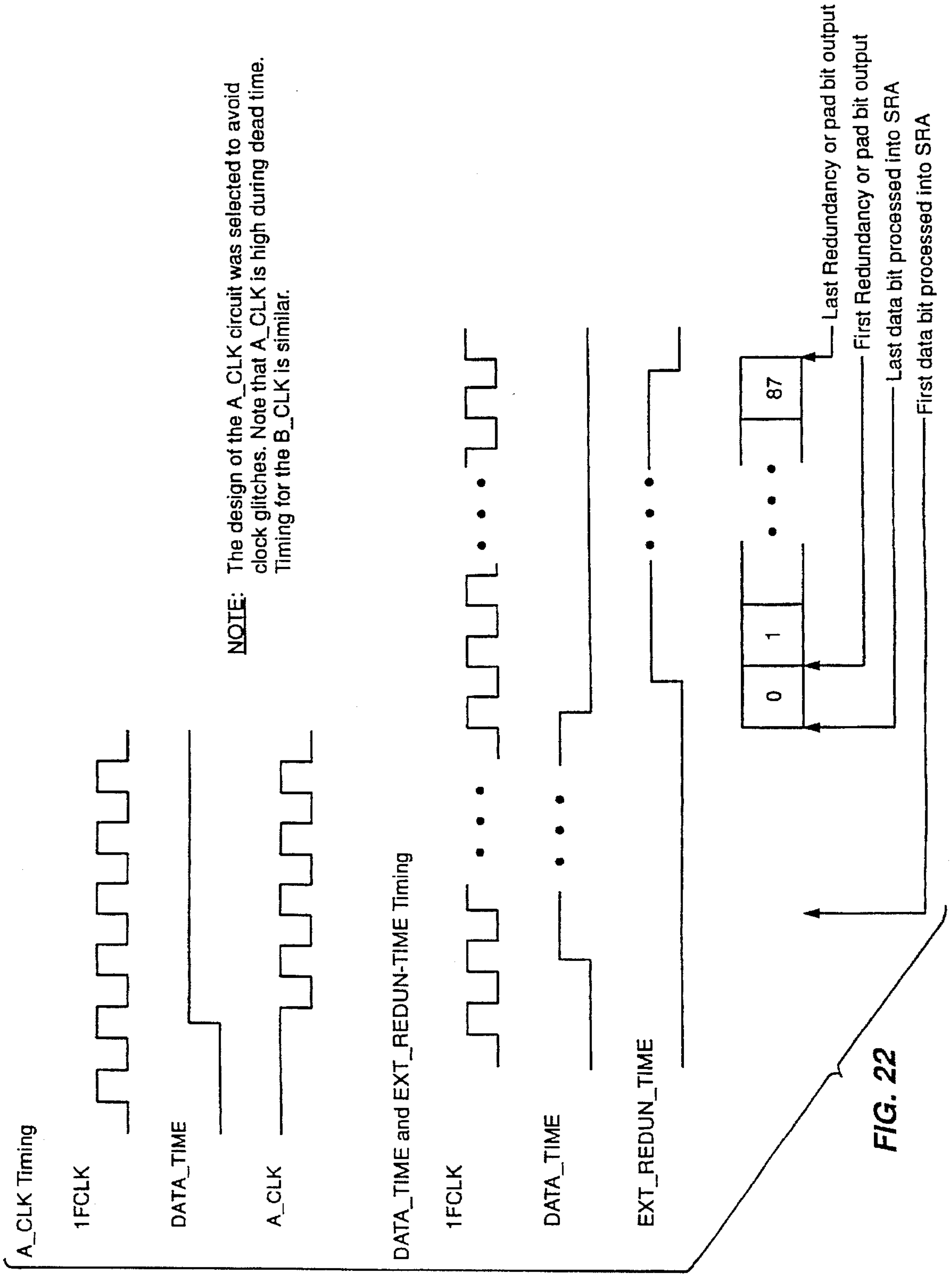
FIG. 22 shows a timing diagram for the A_CLK.

Circuit operation is as follows. First, the circuit is parallel loaded with a residue generated within a residue generator such as is shown in FIGS. 4 and 5. The residue from a circuit such as shown in FIGS. 4 and 5 must be symbol-by-symbol reversed (i.e., as shown in FIG. 19B, the position of each symbol is flipped end-to-end, the first symbol becoming the last, the last becoming the first and so on) as it is parallel loaded into the circuit of FIG. 6. Next the circuit of FIG. 6 is clocked. A modulo 4 (modulo m for the general case) counter keeps track of the clock count modulo 4 as clocking occurs. Points A through F are OR'd together and monitored as counting occurs. If this monitored OR result is zero for the four successive clocks of a symbol (counter value 0 through counter value m-1), then a single-burst spanning two symbols has been isolated. When this happens, control circuitry stops the clock and the error pattern is in bit positions B3 through B0 and B31 through B28. The number of clocks counted up until the clock is stopped is egual to the error location in bits plus some delta, where the delta is fixed for a given implementation and is easily computed empirically.

Figure 7:
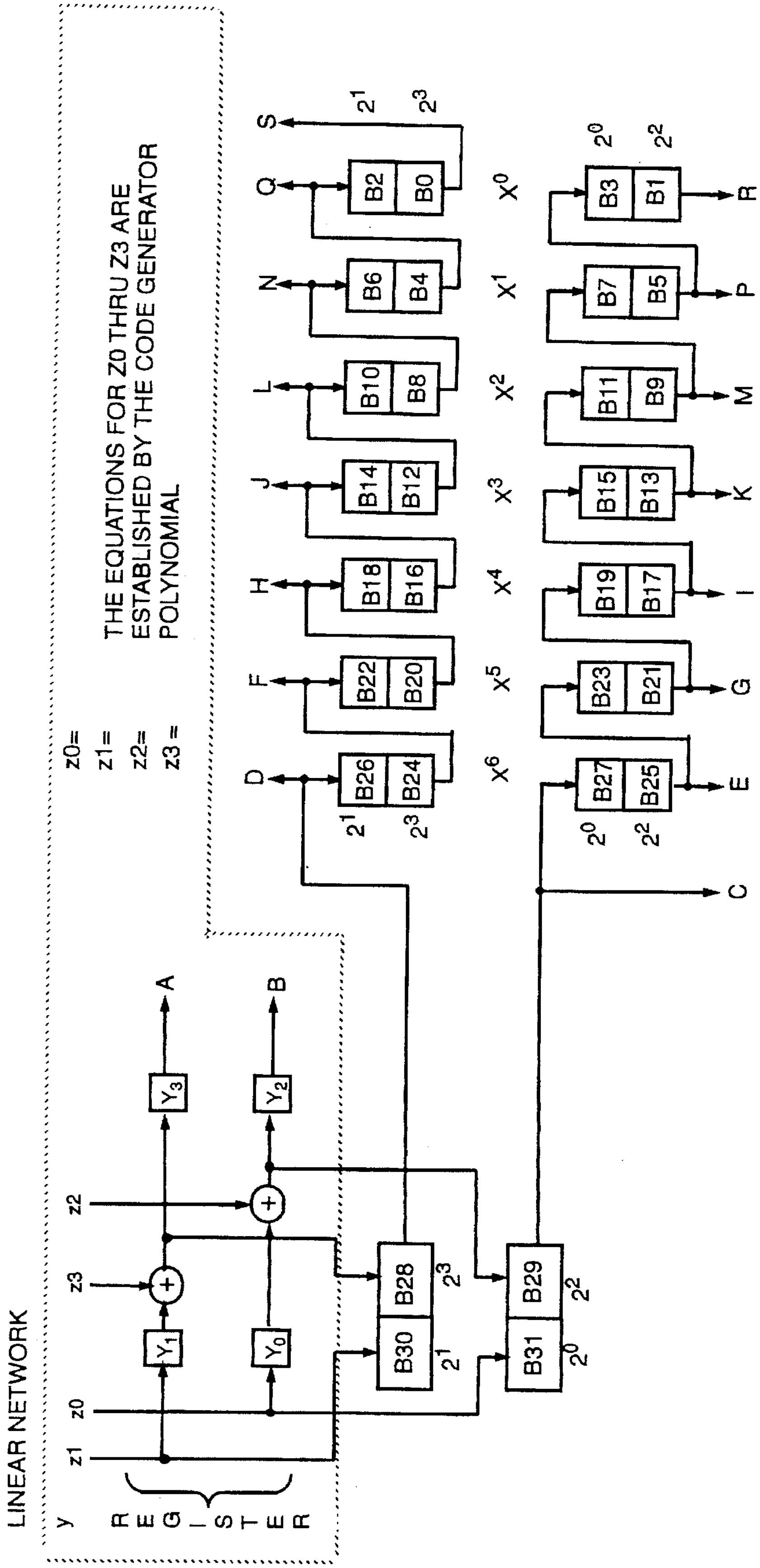
FIG. 7 is a logic diagram of the LFSR for an external-XOR, 2-bit-serial, single-burst error trapping decoder employing a high-order first, finite-field constant multiplier.

FIG. 7 shows an external LFSR circuit using 2-bit-serial techniques, including a high-order first, 2-bit-serial multiplier which accomplishes burst-trapping for single-burst errors. The linear network is a multiple input, high-order first, 2-bit-serial multiplier. Such multipliers are known in the prior art (see Glover, U.S. Pat. No. 4,777,635). The use of such a multiplier in the external-XOR 2-bit-serial burst-trapping circuit is not taught in references known to applicants.

This type of burst-trapping circuit can be used within the current invention to accomplish real-time correction of single bursts that span two m-bit symbols.

Circuit operation is as follows. First, the circuit is parallel loaded with a residue generated within a residue generator such as is shown in FIGS. 4 and 5. The residue from a circuit such as shown in FIGS. 4 and 5 must be symbol-by-symbol reversed as it is parallel loaded into the circuit of FIG. 7. Next the circuit of FIG. 7 is clocked. A modulo 2 (modulo (m/2) for the general case) counter keeps track of the clock count modulo 2 as clocking occurs. Points C through N are OR'd together and monitored as counting occurs. If this monitored OR result is zero for the two successive clocks of a symbol (counter value 0 through counter value m/2−1), then a single-burst spanning two symbols has been isolated. When this happens, control circuitry stops the clock and the error pattern is in bit positions B3 through B0 and B31 through B28. The number of clocks counted up until the clock is stopped is egual to the error location in (bits*2) plus some delta, where the delta is fixed for a given implementation and is easily computed empirically.

LOW-ORDER FIRST CONSTANT MULTIPLIER

Figure 8:
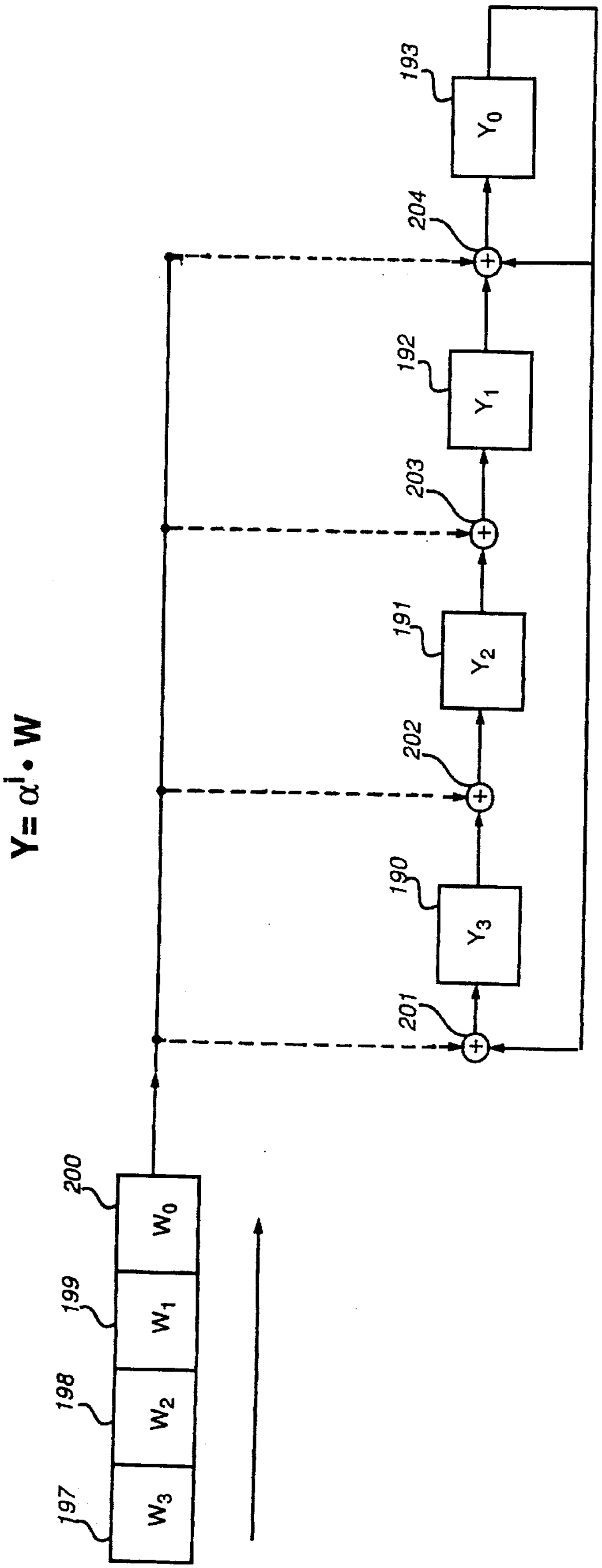
FIG. 8 is a logic diagram template of a 1-bit-serial low-order first, finite-field constant multiplier.

FIG. 8 is a template for the logic diagram of a 1-bit-serial, low-order first, constant multiplier for the example finite field given in Table 1.

TABLE 1

Vector Representation of Elements of Finite Field GF ($2^4$) Established by the Field Generator Polynomial $x^4+x+1$

| FINITE FIELD ELEMENT | VECTOR REPRESENTATION $\alpha^3$ | $\alpha^2$ | $\alpha^1$ | $\alpha^0$ |
|---|---|---|---|---|
| 0 | 0 | 0 | 0 | 0 |
| $\alpha^0$ | 0 | 0 | 0 | 1 |
| $\alpha^1$ | 0 | 0 | 1 | 0 |
| $\alpha^2$ | 0 | 1 | 0 | 0 |
| $\alpha^3$ | 1 | 0 | 0 | 0 |
| $\alpha^4$ | 0 | 0 | 1 | 1 |
| $\alpha^5$ | 0 | 1 | 1 | 0 |
| $\alpha^6$ | 1 | 1 | 0 | 0 |
| $\alpha^7$ | 1 | 0 | 1 | 1 |
| $\alpha^8$ | 0 | 1 | 0 | 1 |
| $\alpha^9$ | 1 | 0 | 1 | 0 |
| $\alpha^{10}$ | 0 | 1 | 1 | 1 |
| $\alpha^{11}$ | 1 | 1 | 1 | 0 |
| $\alpha^{12}$ | 1 | 1 | 1 | 1 |
| $\alpha^{13}$ | 1 | 1 | 0 | 1 |
| $\alpha^{14}$ | 1 | 0 | 0 | 1 |

Given an input field element W, the circuit of FIG. 8 computes an output field element Y, where $Y=\alpha^i \cdot W$ and where $\alpha^i$ is a predetermined constant chosen from the example finite field. The dotted lines in FIG. 8 indicate predetermined connections that are present or absent depending on the value chosen for $a^i$. To determine these connections, compute $\alpha^{m-1} \cdot a^i$, and look up its vector representation in Table 1. For example, if $\alpha^i$ is chosen to be $\alpha^7$, then $\alpha^{m-1} \cdot \alpha^i=\alpha^{4-1} \cdot \alpha^7$ (because m, the number of bits per symbol is 4 for the example finite field), which equals $\alpha^{10}$. The vector representation of $\alpha^{10}$ is 0111, which means that the XOR gates 202, 203, and 204 would have connections from the output of the W shift register 196, but XOR gate 201 would not have such a connection. In this manner, the template of FIG. 8 can be used to generate a constant multiplier circuit for any constant element of the example finite field.

The operation of the circuit of FIG. 8 is as follows: The 4-bit representation of W is assumed to be initially present in the four one-bit shift register stages $W_0$ through $W_3$, with the LSB of the representation in $W_0$. The one-bit shift register stages $Y_0$ through $Y_3$ are assumed to be initially zero. The W shift register 197–200 and the Y shift register 190–193 are each clocked synchronously 4 times, 4 being the symbol size. Then the value of Y can be read from the Y shift register.

Because of the specific feedback connections from the $Y_0$ bit (i.e. shift register stage 193) to the XOR gates 201 and 204, the logic diagram template of FIG. 8 only applies to the example finite field representation given in Table 1. To generalize FIG. 8 to other finite fields, it is necessary to add or remove bits in shift register Y and to add or remove corresponding XOR gates so that there are m bits and m XOR gates or trees, where m is the size of the symbols of the finite field chosen. To generalize FIG. 8 to other finite fields or to other representation of the finite field of order $2^4$ the feedback points from $Y_0$ must be predetermined by the vector representation of $\alpha^{(2^m-2)}$, i.e. the "last" element of the chosen finite field. Similar to the method in which the connections from the W shift register to the XOR gates are determined, connect the output of $Y_0$ to the input of the XOR gate preceding state $Y_i$ if and only if bit i of the vector representation of $\alpha(2m-2)$ is 1.

Figure 9:
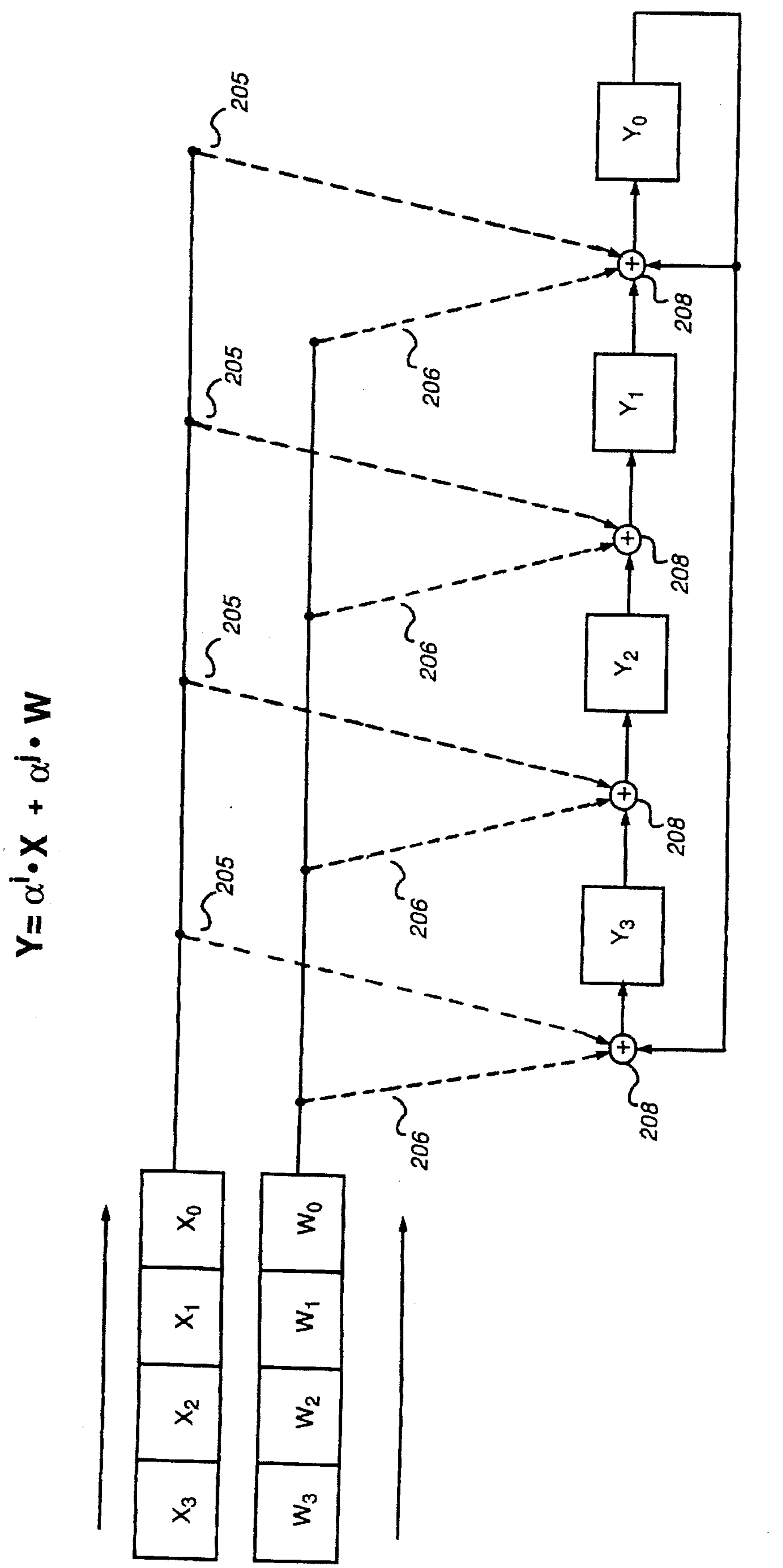
FIG. 9 is a logic diagram template of a 1-bit-serial, low-order first, finite-field, double-input, double-constant multiplier.

FIG. 9 is a template for the logic diagram of a 1-bit-serial, double-input, double-constant, multiply-and-sum circuit for the example finite field given in Table 1. Given two input field elements W and X, the circuit of FIG. 9 computes an output field element Y, where $Y=\alpha^i \cdot x+\alpha^j \cdot w$ and $\alpha^i$ and $\alpha^j$ are predetermined constants chosen from the example finite field. The dotted lines in FIG. 9 indicate predetermined connections that are present or absent depending on the values chosen for $\alpha^i$ and $\alpha^j$. The connections for each of $\alpha^i$ and $\alpha^j$ are independently determined in the same manner discussed for determining those for $\alpha^i$ in FIG. 8, i.e., by using the vector representations of the constants. In this manner, the template of FIG. 9 can be used to generate a constant multiplier circuit for any two constant elements of the example finite field.

The operation of the circuit of FIG. 9 is similar to that of FIG. 8 and is as follows: The 4-bit representation of W is assumed to be initially present in the four one-bit shift register stages $W_0$ through $W_3$, with the LSB of the representation in $W_0$. Similarly for $X_{0-3}$ being initialized to X. The one-bit shift register stages $Y_0$ through $Y_3$ are assumed to be initially zero. The X, W, and Y shift registers are each clocked synchronously 4 times, 4 being the symbol size. Then the value of Y can be read from the Y shift register.

As was the case in FIG. 8, the feedback connections in FIG. 9 from the $Y_0$ bit to two of the four XOR gates limit the circuit of FIG. 9 such that it applies only to the example finite field representation given in Table 1. To generalize FIG. 9 to other finite fields, it is necessary to add or remove bits in shift registers X and Y and to add or remove corresponding XOR gates so that there are m bits and gates, where m is the size of the symbols of the finite field chosen. The selection of the feedback points is the same as for FIG. 8, i.e., connect the output of $Y_0$ to the input of the XOR gate preceding stage $Y_i$ if and only if bit i of the vector representation of $\alpha^{(2^m-2)}$ is 1.

In the special ease where $\alpha^i$ equals $\alpha^j$, then the problem simplifies to the single constant case and the circuit of FIG. 9 is unnecessarily complex. In this case, $$Y=\alpha^i \cdot X+\alpha^i \cdot W$$

$$Y=\alpha^i(x+W)$$

Thus, we need merely XOR the outputs of $W_0$ and $X_0$ and use that in the place of the output of the $W_0$ stage 200 of FIG. 8.

The above method for designing 1-bit-serial low-order first, finit field, double-input, double-constant, multiply-and-sum circuits can be generalized for any number of inputs and constants. The connections from each input shift register are independent from each other and each depends only on the multiplier constant chosen for that input.

Figure 10:
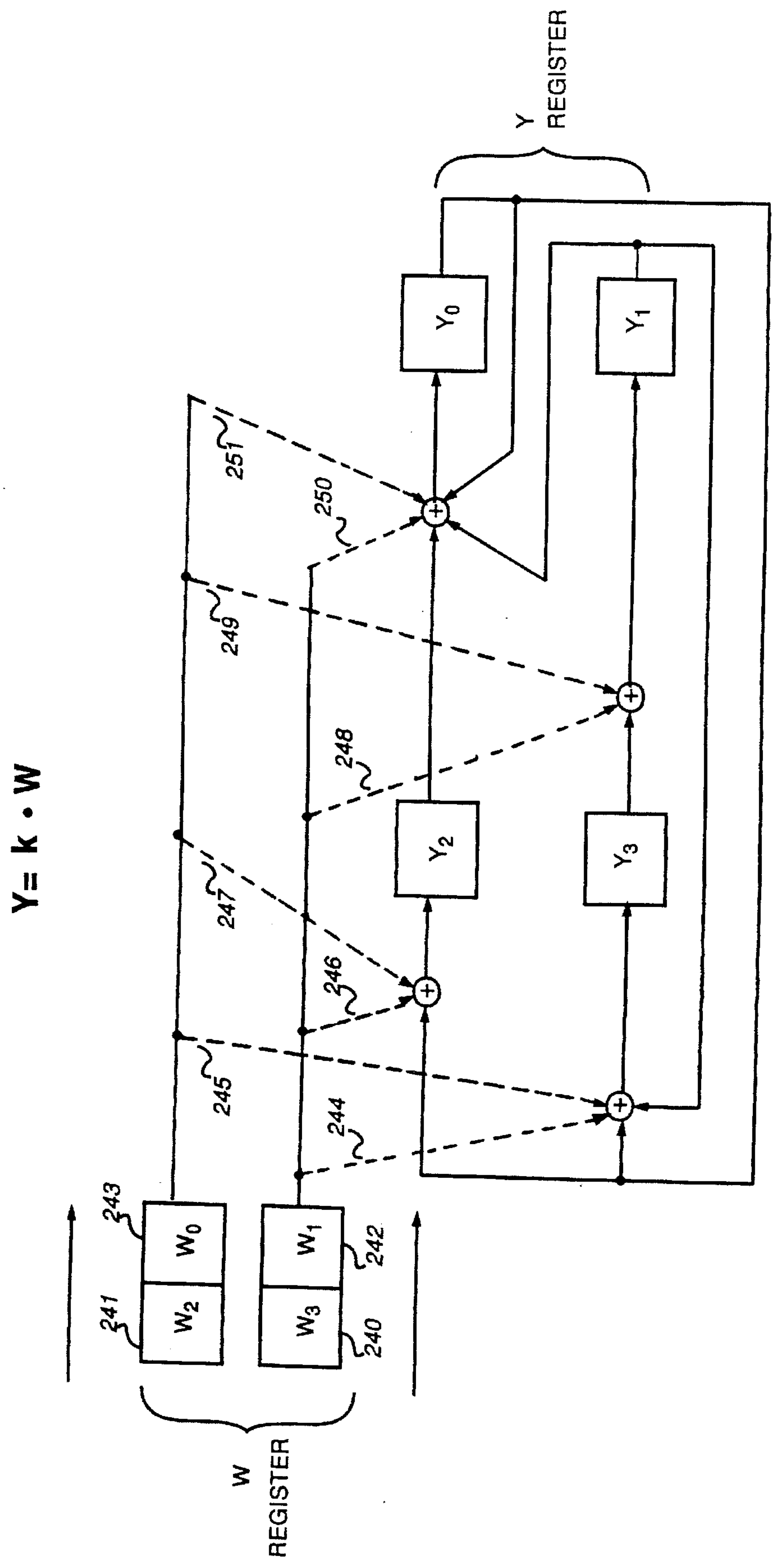
FIG. 10 is a logic diagram template of a 2-bit-serial, low-order first, finite-field, constant multiplier.

FIG. 10 is a template for the logic diagram of a 2-bit-serial, constant multiplier for the example finite field given in Table 1. Like the circuit of FIG. 8, given an input field element W, the circuit of FIG. 10 computes an output field element Y, where $Y=\alpha^i \cdot W$ and $\alpha^i$ is a predetermined constant chosen from the example finite field. Unlike the circuit of FIG. 8, which is 1-bit-serial, the circuit of FIG. 10 accepts two adjacent bits of W during each clock cycle. The dotted lines in FIG. 10 indicate predetermined connections from $W_0$ 243 and $W_1$ 242 that are present or absent depending on the value chosen for $\alpha^i$.

To determine the connections from $W_0$ 243, compute $\alpha^{(m-2)} \cdot \alpha^i$, and look up its vector representation in Table 1. To determine the connections from $W_1$ 242, compute $\alpha^{(m-1)} \cdot \alpha^i$ and look up its vector representation in Table 1. For example, if $\alpha^i$ is chosen to be $\alpha^7$, then $\alpha^{(m-2)}\cdot\alpha^i=\alpha^{(4-2)}\cdot\alpha 7$ (because m, the number of bits per symbol is 4 for the example finite field), which equals $\alpha^9$. Similarly, $\alpha^{(m-1)}\cdot\alpha^i=\alpha^{10}$. The vector representation of $\alpha^9$ is 1010, which means that connections 245 and 249 would be made from the ouput of $W_0$ 243 to the XOR gates preceeding $Y_3$ and $Y_1$. Similarly, the vector representation of $\alpha^{10}$ is 0111, which means that the connections 246, 248, and 250 would be made from the output of $W^1$ 242 to the XOR gates preceding $Y_2$, $Y_1$, and $Y_0$. In this manner, the template of FIG. 10 can be used to generate a constant multiplier circuit for any predetermined element of the example finite field.

The operation of the circuit of FIG. 10 is as follows: The 4-bit representation of W is assumed to be initially present in the four one-bit shift register stages $W_0$ through $W_3$, with the LSB of the representation in $W_0$. The one-bit shift register stages $Y_0$ through $Y_3$ are assumed to be initially zero. The W shift register 240–243, and the Y shift register are each clocked synchronously twice, 2 being the symbol size (i.e., 4) divided by k (i.e., 2), Then the value of Y can be read from the Y shift register.

The logic diagram template of FIG. 10 only applies to the example finite field representation given in Table 1, because of the feedback connections from the $Y_0$ and $Y_1$ bits to the XOR gates preceding $Y_3$, $Y_2$, and $Y_0$. To generalize FIG. 10 to other finite fields, it is necessary to add or remove bits in shift register Y and to add or remove corresponding XOR gates so that there are m bits and gates, where m is the size of the symbols of the finite field chosen. To select the feedback points from $Y_0$, use the vector representation of $\alpha^{(2m-3)}$, i.e., similar to the method in which the connections from the W shift register to the XOR gates are determined, connect the output of $Y_0$ to the input of the XOR gate preceding stage $Y_i$ if and only if bit i of the vector representation of $\alpha^{(2m-3)}$ is 1. Use the vector representation of $\alpha^{(2m-2)}$ to determine the feedback from $Y_1$.

The above method of designing k-bit-serial, low-order first, constant multipliers with k=2 can be generalized for any k up to the symbol size m such that k evenly divides m. The input connections from each stage of W, $W_j$ for $0\leqq j\leqq k-1$, are determined as discussed above by the vector representation of the finite-field element given by the following formula:

$$\alpha^i\cdot\alpha^{(m-k+j)}$$

The feedback connections from each stage of Y, $Y_j$ for $0\leqq j\leqq k-1$, are determined as discussed above by the vector representation of the finite-field element given by the following formula:

$$\alpha^{(2m-k+j-1)}$$

Figure 11:
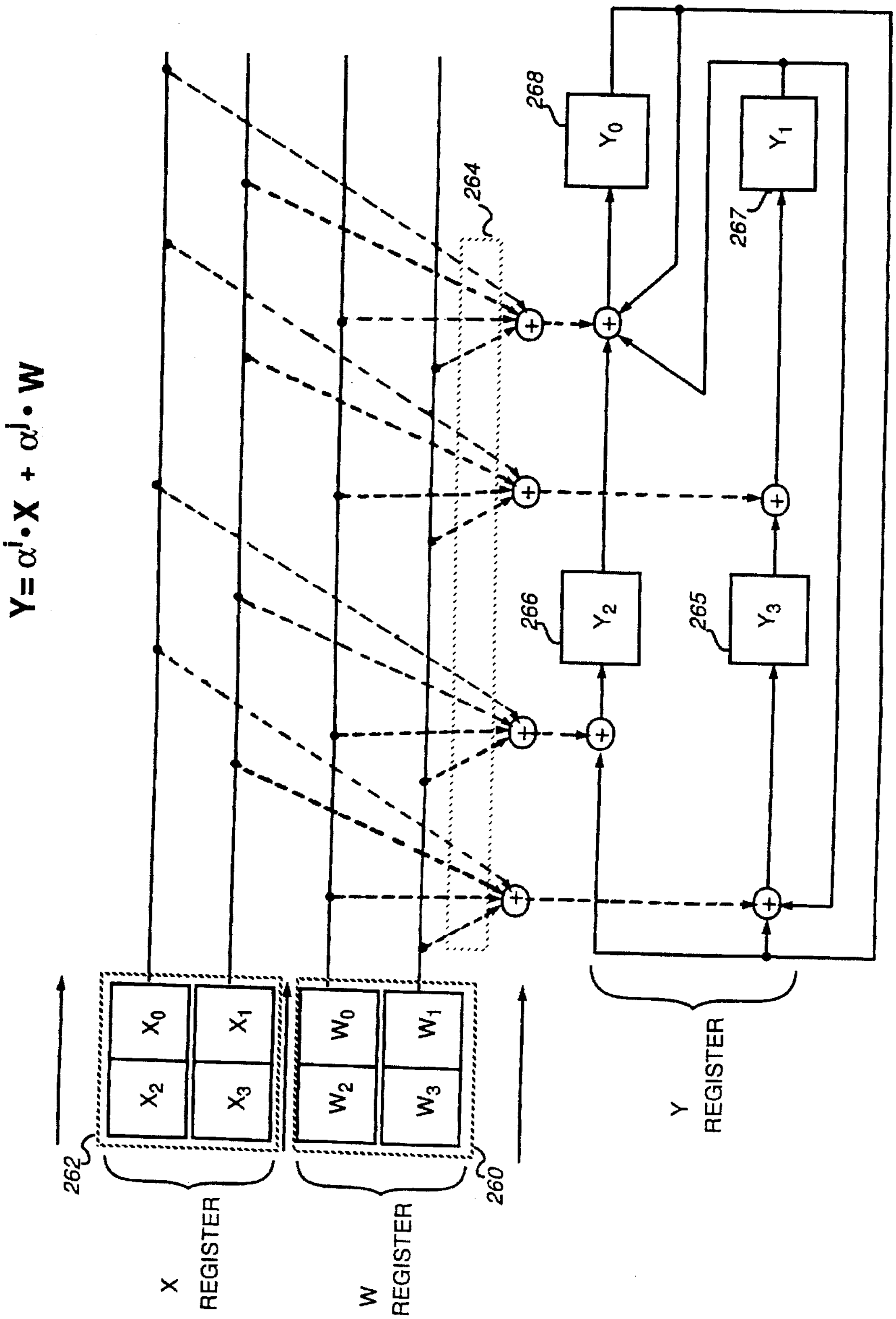
FIG. 11 is a logic diagram template of a 2-bit-serial, low-order first, finite-field, double-input, double constant multiplier.

FIG. 11 is a logic diagram template of a 2-bit-serial, low-order first, finite-field, double-input, double-constant multiply-and-sum circuit. It will be appreciated that the circuit of FIG. 11 essentially combines the features of the circuits of FIGS. 9 and 10. Like the circuit of FIG. 9, the circuit of FIG. 11 computes $Y=\alpha^i\cdot X+\alpha^j\cdot W$. Like the circuit of FIG. 10, the circuit of FIG. 11 accepts X and W and produces Y two bits in parallel within each clock cycle.

The discussion with regard to FIG. 10 of how to determine the connections from $W_0$ to the XOR gates preceding each stage of the shift register Y applies to determining the connections from each of $X_0$, $X_1$, $W_0$, and $W_1$ in FIG. 11. As was the case in FIG. 9, the connections from the $X_0$ and $X_1$ pair are independent of those of the $W_0$ and $W_1$ pair; each pair depends only on its respective constant $\alpha^i$ or $\alpha^j$.

The operation of the circuit of FIG. 11 is similar to those of FIGS. 9 and 10 and is as follows: the 4-bit representation of W is assumed to be initially present in the four one-bit shift register stages $W_0$ through $W_3$, with the LSB of the representation in W0. Similarly for X and $X_{0-3}$. The one-bit shift register stages $Y_0$ through $Y_3$ are assumed to be initially zero. The W shift register 260, the X shift register 262, and the Y shift register 265–268 are each clocked synchronously twice, 2 being the symbol size (i.e., 4) divided by k (i.e. 2). Then the value of Y can be read from the Y shift register.

As is the case with the circuit of FIG. 10, the circuit of FIG. 11 only applies to the case of the example finite-field representation of Table 1. It will be appreciated that the discussion of generalizing the circuit of FIG. 10 to other finite fields or other finite-field representations also applies to the circuit of FIG. 11.

The above method for designing k-bit-serial low-order first, finit field, double-input, double-constant, multiply-and-sum circuits with k=2 can be generalized for any k up to the symbol size m, such that k evenly divides m, and for any number of inputs and constants. The connections from each input H, $H_j$ for $0\leqq j\leqq k-1$, are independent from each other and each depends only on the multiplier constant $\alpha^h$ chosen for that input. The input connections are determined as discussed above by the vector representation of the finite-field element given by the following formula:

$$\alpha^h\alpha^{(m-k+j)}$$

The feedback connections from each stage of Y, $Y_j$ for $0\leqq j\leqq k-1$, are determined as discussed above by the vector representation of the finite-field element given by the following formula:

$$\alpha^{(2m-k+j-1)}$$

USE OF LOW-ORDER FIRST MULTIPLIER IN DECODING

The advantages of using a low-order (least-significant bit) first, finite-field constant multiplier in decoding is illustrated in FIG. 19. FIG. 19A shows the bit-by-bit syndrome reversal that is required by the mathematics of Reed-Solomon codes. If only high-order first, finite-field constant multipliers are used, then to accommodate this, a symbol-by-symbol syndrome reversal technique must be used as shown in FIG. 19B. However, the effect of this technique is to separate burst errors (i.e., a contiguous sequence of probably erroneous bits) into fragments as shown in FIGS. 19C and D. In FIG. 19C, symbols Y and Y+1 are shown as they are recorded or transmitted bit-serially through a media. In FIG. 19D, they are shown as transformed by symbol-by-symbol reversal, which corresponds to the bit-serial order of the received information or codeword polynomial. Using exclusively high-order first, finite-field constant multipliers in both the encode operation and in the burst trapping phase of the decode operation results in the bits included in a burst error introduced in the recording or transmission media not being adjacent during burst trapping, which substantially complicates computing the length of the burst error. Such computation is required to decide whether or not to correct, or to automatically correct, the error. The preferred embodiment of the present invention uses a high-order first, finite-field constant multiplier in encoding and residue generation, bit-by-bit reversal syndrome reversal, and a low-order first, finite-field constant multiplier in burst trapping. Clearly, an equally meritorious design would be to use a low-order first, finite-field constant multiplier in encoding and residue generating, bit-by-bit syndrome reversal, and a high-order first finite-field constant multiplier in burst trapping.

LOW-ORDER FIRST BURST-TRAPPING DECODER

Figure 12:
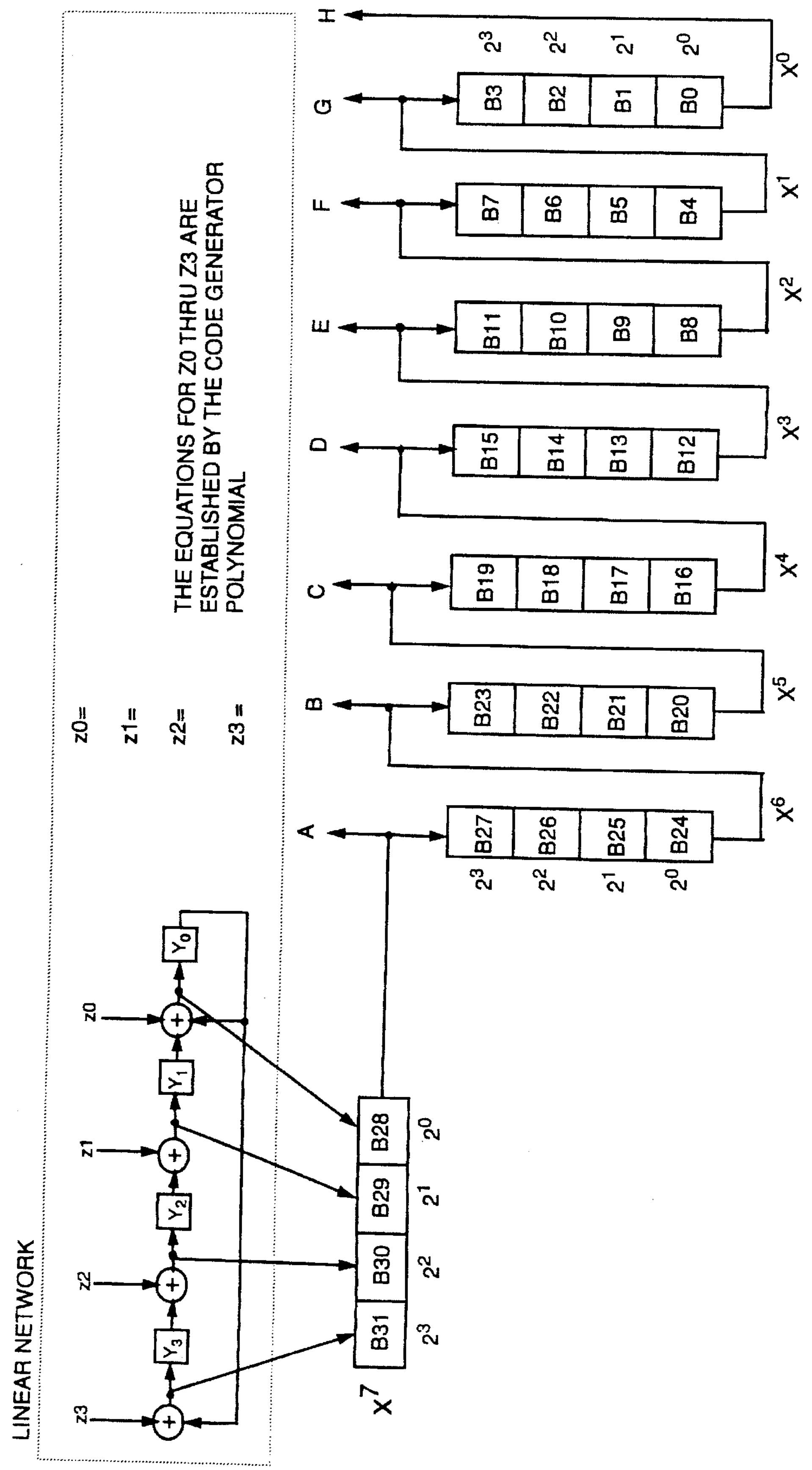
FIG. 12 is a logic diagram for the LFSR of an external-XOR 1-bit-serial, low-order first, single-burst error trapping decoder employing a low-order first, finite-field constant multiplier.

FIG. 12 shows an external-XOR LFSR circuit which accomplishes burst-trapping for single-burst errors and uses bit-serial techniques, including a low-order first, bit-serial multiplier. The linear network is a multiple input, low-order first, bit-serial multiplier. The use of such multipliers is not taught in any reference known to Applicants.

This type of burst-trapping circuit can be used within the current invention to accomplish real-time correction of single bursts that span two m-bit symbols.

Circuit operation is as follows. First, the circuit is parallel loaded with a residue generated within a residue generator such as is shown in FIGS. 4 and 5. The residue from a circuit such as shown in FIGS. 4 and 5 must be bit-by-bit reversed (i.e., as is shown in FIG. 19A, the position of each bit is flopped end-to-end, the first bit becoming the last, the last becoming the first and so on) as it is parallel loaded into the circuit of FIG. 12. Next, the circuit of FIG. 12 is clocked. A modulo 4 (modulo m for the general case) counter keeps track of the clock count modulo 4 as clocking occurs. Points A through F are OR'd together and monitored as counting occurs. If this monitored OR result is zero for the four successive clocks of a symbol (counter value 0 through counter value m-1), then a single-burst spanning two symbols has been isolated. When this happens, Control circuitry stops the clock and the error pattern is in bit positions B3 through B0 and B31 through B28. The number of clocks counted up until the clock is stopped is egual to the error location in bits plus some delta, where the delta is fixed for a given implementation and is easily computed empirically.

Figure 13:
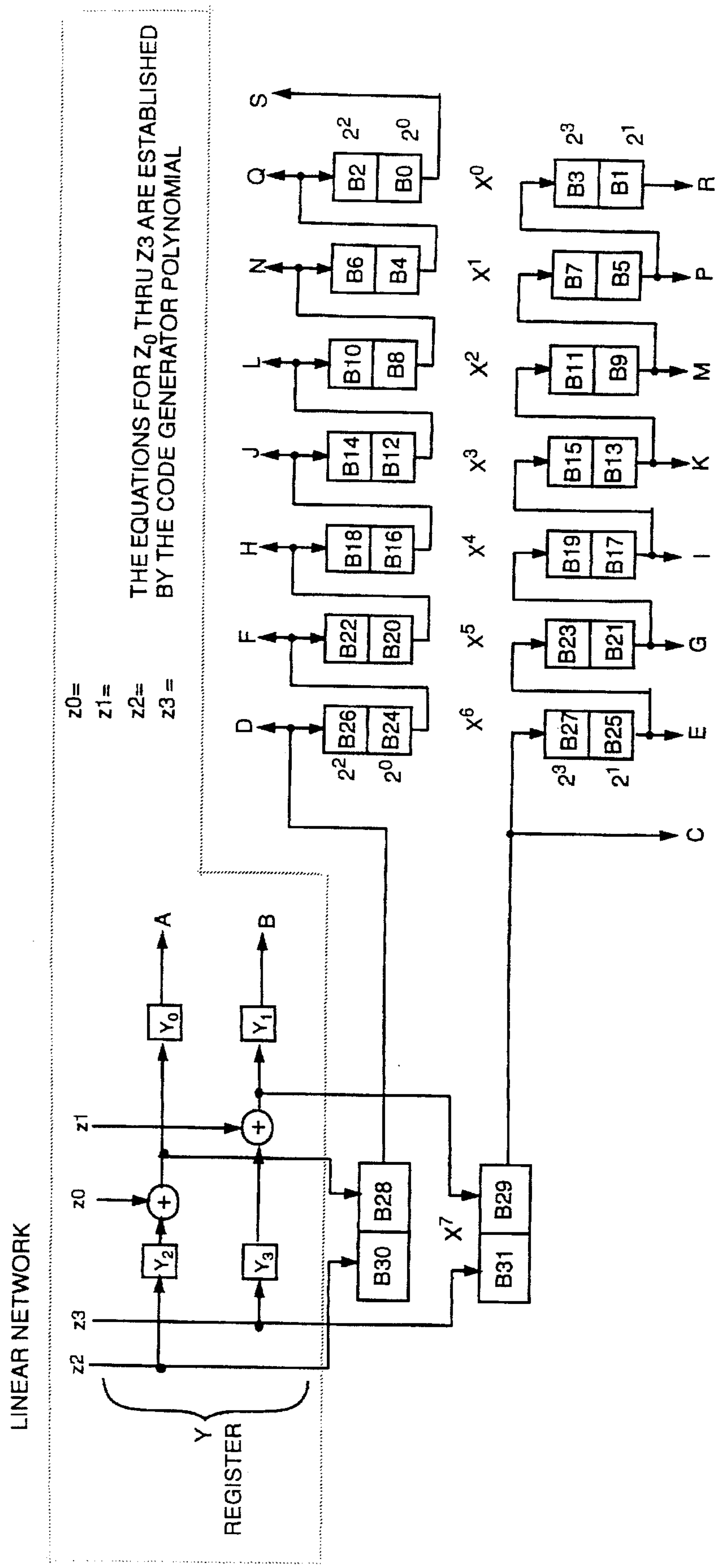
FIG. 13 is a logic diagram for the LFSR of an external-XOR 2-bit-serial, low-order first, single-burst error trapping decoder employing a low-order first, finite-field constant multiplier.

FIG. 13 shows an external LFSR circuit using 2-bit-serial techniques, including a low-order first, 2-bit-serial multiplier which accomplishes burst-trapping for single-burst errors. The linear network is a multiple input, low-order first, 2-bit-serial multiplier. The use of such multipliers is not taught in any reference known to Applicants.

This type of burst-trapping circuit can be used within the current invention to accomplish real-time correction of single bursts that span two m-bit symbols.

Circuit operation is as follows. First, the circuit is parallel loaded with a residue generated within a residue generator such as is shown in FIGS. 4 and 5. The residue from a circuit such as shown in FIGS. 4 and 5 must be bit-by-bit reversed as it is parallel loaded into the circuit of FIG. 13. Next the circuit of FIG. 13 is clocked. A modulo 2 (modulo (m/2) for the general case) counter keeps track of the clock count modulo 2 as clocking occurs. Points C through N are OR'd together and monitored as counting occurs. If this monitored OR result is zero for the two successive clocks of a symbol (counter value 0 through counter value m/2–1), then a single-burst spanning two symbols has been isolated. When this happens, control circuitry stops the clock and the error pattern is in bit positions B3 through B0 and B31 through B28. The number of clocks counted up until the clock is stopped is egual to the error location in bits*2 plus some delta, where the delta is fixed for a given implementation and is easily computed empirically.

DECODING SINGLE-BURST ERRORS SPANNING THREE ADJACENT SYMBOLS

Figure 14:
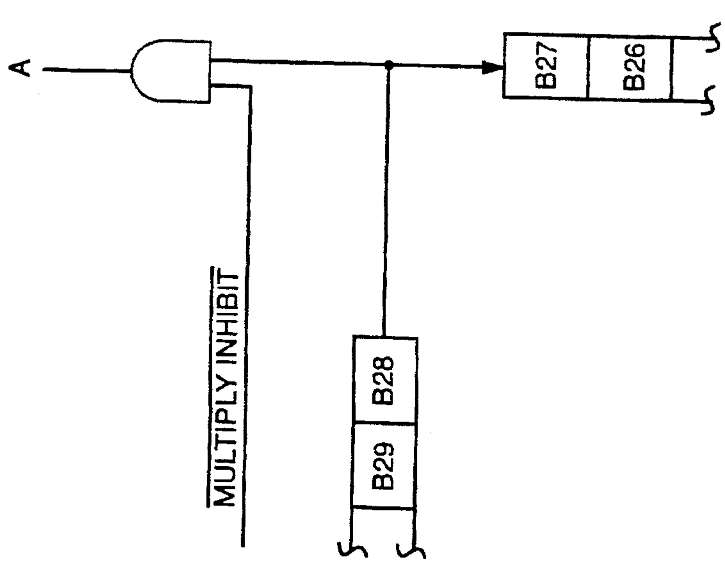
FIG. 14 is a logic diagram showing how the logic diagram of FIG. 12 can be modified to support correcting burst errors of length greater than m+1 bits.

FIG. 14 shows a modification for the circuit of FIG. 6 to allow the correction of bursts whose length spans up to three adjacent symbols. Operation of the circuit is changed as follows: points A through E are OR'd together instead of A through F. Also, after the clock stop criteria is met, as defined in the description of operation for FIG. 6, actual stopping of the clock is delayed by m (4 for the example of FIG. 6) clock periods, where m is the width of symbols in bits. During these extra m clock periods the $\overline{\text{MULTIPLY\_INHIBIT}}$ signal of FIG. 14 is held LOW. After the clock is stopped the error pattern resides in and can be retrieved from the low-order symbol position and the two high-order symbol positions of the shift register. For the current example, the error pattern would be in shift register bit positions B3 through B0 and B31 through B24.

Figure 15:
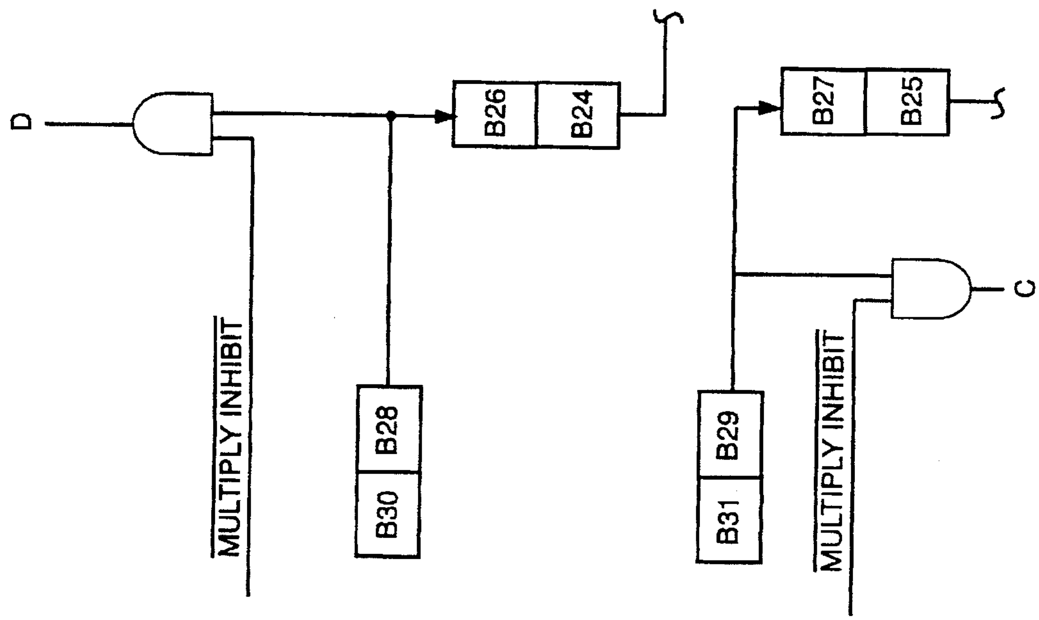
FIG. 15 is a logic diagram showing how the logic diagram of FIG. 13 can be modified to support correcting burst errors of length greater than m+1 bits.

FIG. 15 shows a modification for the circuit of FIG. 7 to allow the correction of bursts whose length spans up to three adjacent symbols. Operation of the circuit is changed as follows: points C through L are OR'd together instead of C through N. Also, after the clock stop criteria is met, as defined in the description of operation for FIG. 7, actual stopping of the clock is delayed by m/k clock periods (e.g. 4/2=2 for the example of FIG. 7), where m is the width of symbols in bits. During these extra m/k clock periods the $\overline{\text{MULTIPLY\_INHIBIT}}$ signal of FIG. 15 is held LOW. After the clock is stopped the error pattern resides in and can be retrieved from the low-order symbol position and the two high-order symbol positions of the shift register. For the current example, the error pattern would be in shift register bit positions B3 through B0 and B31 through B24.

PADDING

Figure 16:
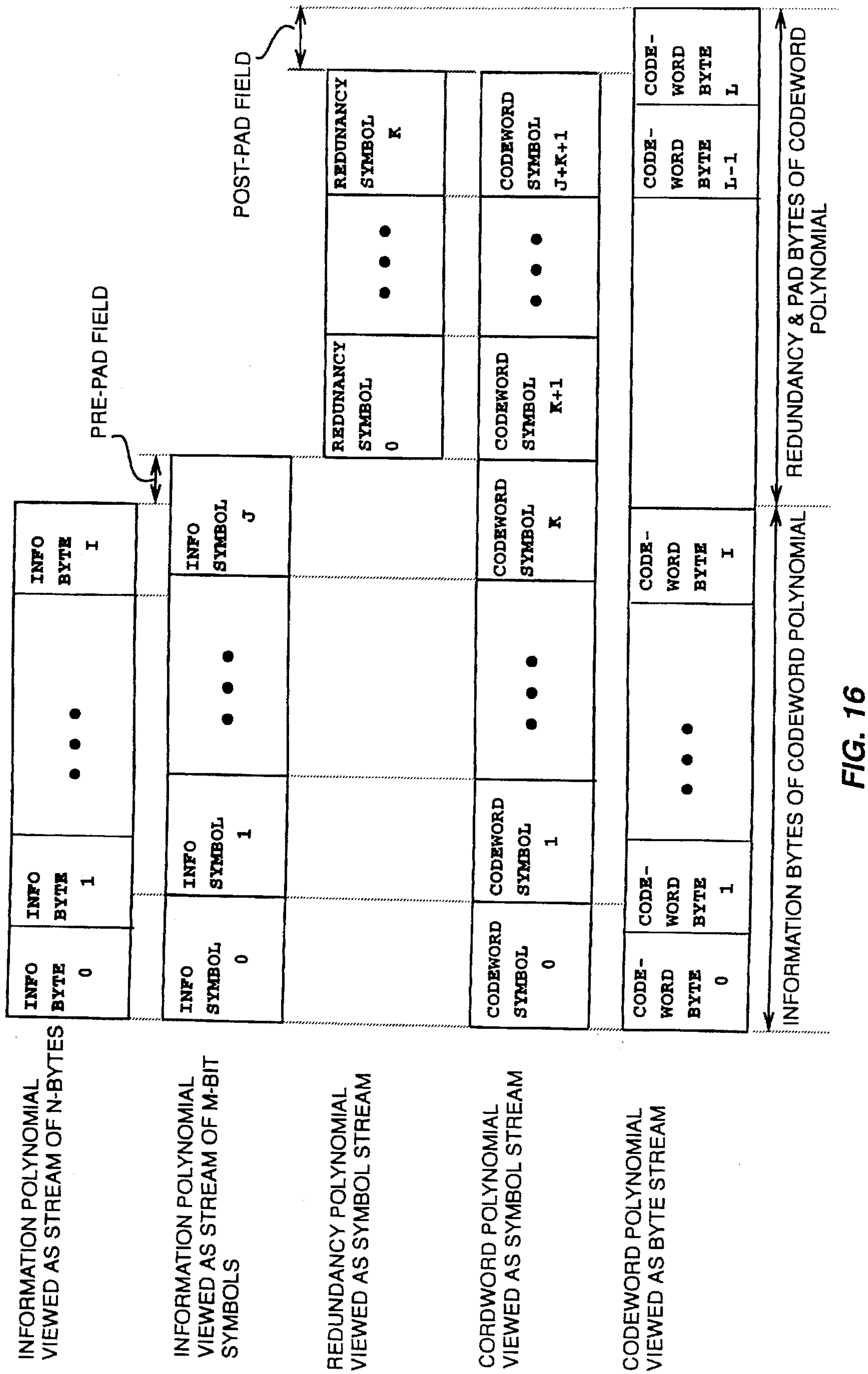
FIG. 16 is a chart showing the use of pre-pad and post-pad fields and the correspondence between n-bit bytes and m-bit symbols in the information, redundancy, and codeword polynomials.

FIG. 16 is a chart showing the use of pre-pad and post-pad fields and the correspondence between n-bit bytes and m-bit symbols in the information, redundancy, and codeword polynomials. In substantially all popular computer systems, data is handled in n-bit byte form, typically 8-bit bytes, and multiples thereof. Consequently, in a typical application of the present invention, information will be presented logically organized in n-bit bytes. The general case of the Reed-Solomon code is an m-bit symbol size, where m≠n. For the preferred embodiment, m>n, specifically n=8 and m=10.

At the top of FIG. 16, a series of n-bit bytes representing the information polynomial may be seen. The number of bytes times n bits per byte might be divisible by m, and thus the bits in the information polynomial might readily be logically organizable into an integral number of symbols. In the general case however, the number of bits in the information polynomial will not be divisible by m, and thus a number of bits comprising a pre-pad field is added to the information bits to allow the logical organization of the same into an integral number of m-bit information symbols. Since the redundancy is determined by a Reed-Solomon code using an m-bit symbol analysis, the redundancy symbols will be m-bit symbols. When the redundancy symbols are added to the symbols comprising the information bytes and the pre-pad field to make up the codeword polynomial, the resulting number of bits in the codeword polynomial may or may not be integrally divisible by n. If not, a post-pad field is added to the symbol codeword to forman integral number of bytes for subsequent transmission, storage, etc. in byte form. The post-pad field is dropped during decoding as only the codeword polynomial in symbol form is decoded. The contents of the pre-pad field may or may not be predetermined (in the preferred embodiment the pre-pad field is all zeros) "predetermined"(inthe preferred embodiment the pre-pad field is all zeros).

In the case of a variable number of bytes in the information polynomial (variable record length) and a fixed number of redundancy symbols, as might be used with variable-length sectors on a disk recording media, the pre-pad field length will vary with the record length, though the sum of the number of pre-pad bits and the number of post-pad bits will remain the same, or constant. The one exception is the special case where the codeword polynomial (which comprises the information, pre-pad, and redundancy polynomials or words) is an integral number of bytes. In this case the sum of the pre-pad and post-pad field lengths may be zero if the pre-pad field length is zero; otherwise the sum of the pre-pad and post-pad field lengths will be egual to one byte. In the preferred embodiment, the sum of the pre-pad and post-pad field lengths is always one byte.

INTERLEAVING

Figure 17:
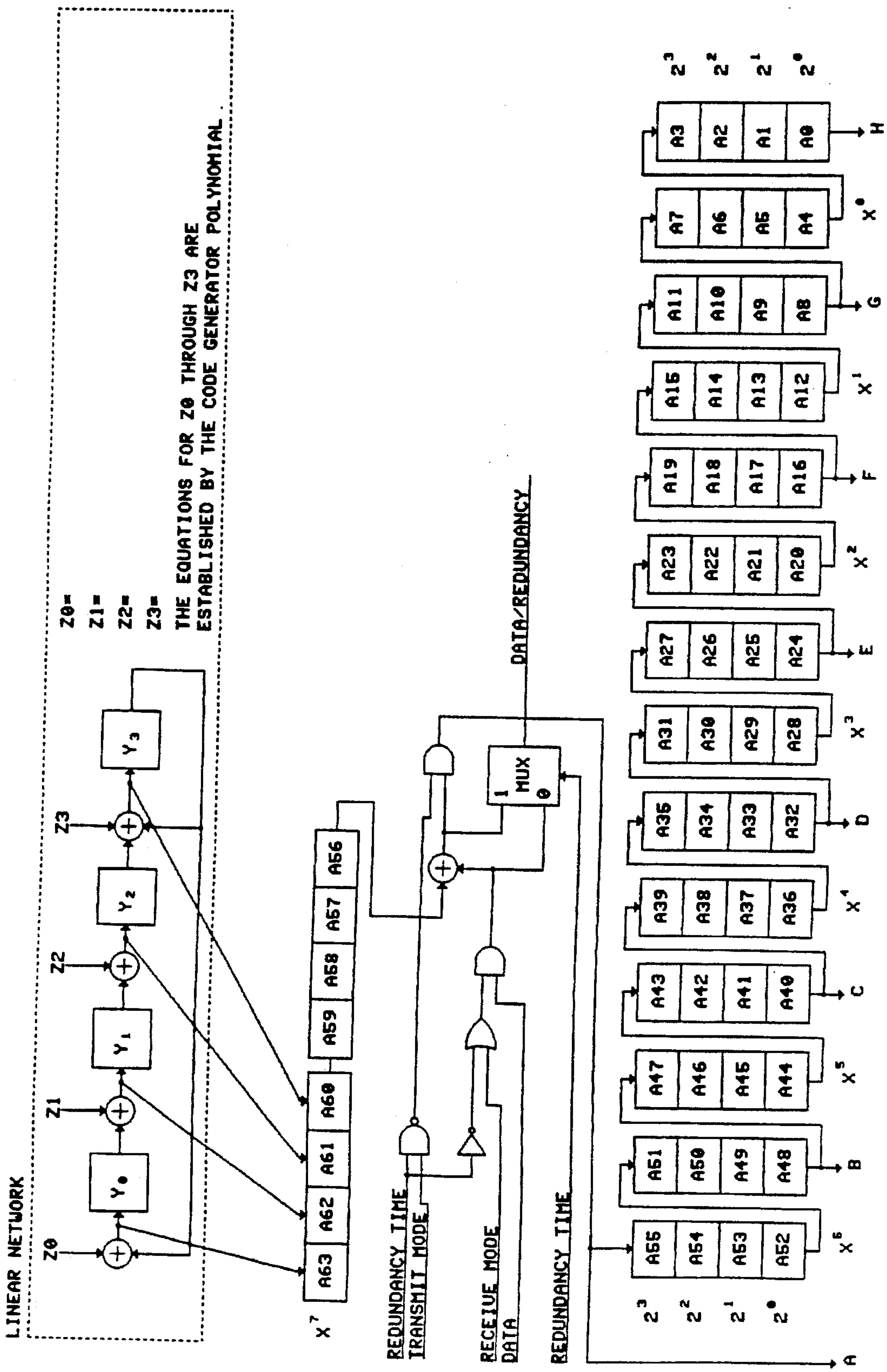
FIG. 17 is a logic diagram for the LFSR of a an external-XOR two-way interleaved, 1-bit-serial encoder and residue generator.

The technique of interleaving a single information polynomial among a multiplicity of codeword polynomials is well-known in the art (see Glover and Dudley, *Practical Error Correction Design for Engineers,* pages 270, 285, and 350, and Chen et al U.S. Pat. No. 4,142,174). FIG. 17 is similar to FIG. 4 in that both are logic diagrams of the LFSR of external-XOR, 1-bit-serial encoders. However, FIG. 17 shows a two-way interleave in which, if the symbols are numbered in their serial sequence, then every even-numbered symbol of the information polynomial is placed in a first codeword polynomial and every odd-numbered symbol of the information polynomial is placed in a second codeword polynomial.

Figure 18:
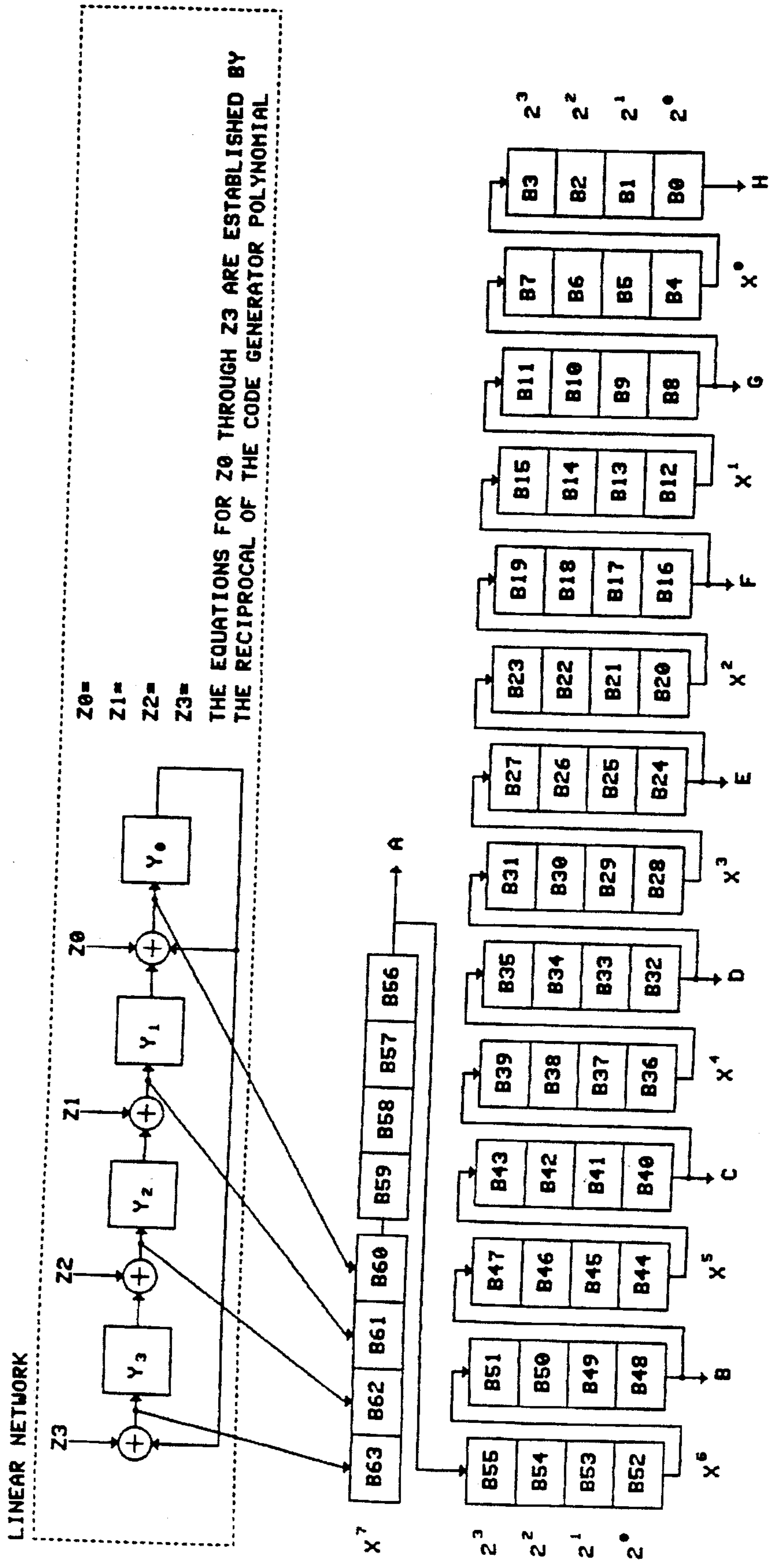
FIG. 18 is a logic diagram for the LFSR of an external-XOR two-way interleaved, 1-bit-serial, single-burst error trapping decoder employing a low-order first, finite-field constant multiplier.

Likewise, FIG. 18 is similar to FIG. 12 in that both are logic diagrams of the LFSR for external-XOR, 1-bit-serial, low-order first, single-burst error trapping decoders. However, FIG. 18 shows the same two-way interleave of FIG. 17.

There are numerous variations of interleaving techniques known in the prior art. The teachings of the present invention include, but are not limited to, k-bit-serial techniques and the use of both high-order first, finite-field constant multipliers and low-order first, finite-field constant multipliers in both encoding and decoding operations. It should be obvious to one knowledgable about interleaving techniques in Reed-Solomon codes how these variations can be combined.

REPRESENTATIVE IMPLEMENTATION ALTERNATIVES

There are a significant number of implementation alternatives available for the current invention. The encoder and residue generator can be implemented using k-bit serial techniques for any k which divides m, the symbol width. This, of course, includes the case where k=m.

The burst trapper can use k-bit serial techniques, where k, i.e. the number of bits processed per clock, need not be the same as used in the encoder and residue generator.

All of the constant multiplications of the encoder and residue generator, which are associated with code generator polynomial coefficients, can be accomplished with a single k-bit serial multiple-input, multiple-constant, multiply-and-sum circuit. This is true for the burst trapper circuit as well.

There are four choices associated with the order in which bits are processed within the k-bit serial, multiple-input, multiple-constant, multiply-and-sum circuits of the encoder and residue generator and the burst trapper.

| Choice | Encoder and Residue Generator | Burst Trapper |
|---|---|---|
| 1 | High order first | High order first |
| 2 | High order first | Low order first |
| 3 | Low order first | High order first |
| 4 | Low order first | Low order first |

If choice 1 or 4 is used, the residue is flipped end-on-end on a symbol-by-symbol basis as it is transferred from the encoder and residue generator to the burst trapper. If choice 2 or 3 is used, the residue is flipped end-on-end on a bit-by-bit basis as it is *transferred from the encoder and residue generator to the burst trapper.

There are also several choices associated with the firmware decoding. One choice uses large decoding tables and executes quickly. Another choice uses small decoding tables but executes more slowly.

It is also possible to share the LFSR of the encoder and residue generator with the encoding and decoding of other types of codes such as computer generated codes and/or CRC codes.

There are also choices associated with polynomial selection. It is possible to use one polynomial to establish a finite field representation for both hardware (encoding, residue generation, and burst trapping) and firmware decoding. In this case, any primitive polynomial with binary coefficients whose degree is egual to symbol width can be used. It is also possible to define the representation of the finite field differently for hardware and firmware decoding and to map between the two representations. In this case, the choice of polynomials is limited to a pair which share a special relationship.

The code generator polynomial of the preferred embodiment of the current invention is self-reciprocal. That is, the code generator polynomial is its own reciprocal.

There are several choices available with correction span. It is possible to limit correction performed by the burst trapper to two adjacent symbols. However, a small change extends the correction performed by the burst trapper to three adjacent symbols. Additional hardware extends correction to an even greater number of adjacent symbols. In addition, it is possible to establish correction span in bits instead of symbols.

Interleaving may or may not be employed. In the preferred embodiment interleaving is not employed. This avoids interleave pattern sensitivity and minimizes media overhead. See *Practical Error correction Design for Engineers,* (Glover and Dudley, Second Edition, Data Systems Technology Corp. (Broomfield, Colo. 1988)) p. 242 for information on interleave pattern sensitivity.

Another alternative is to implement a polynomial over a finite field whose representation is established by the techniques defined in the section entitled "Subfield Computation" herein, in both the hardware (encoder, residue generator, and burst trapper) and firmware decoder.

Figure 35:
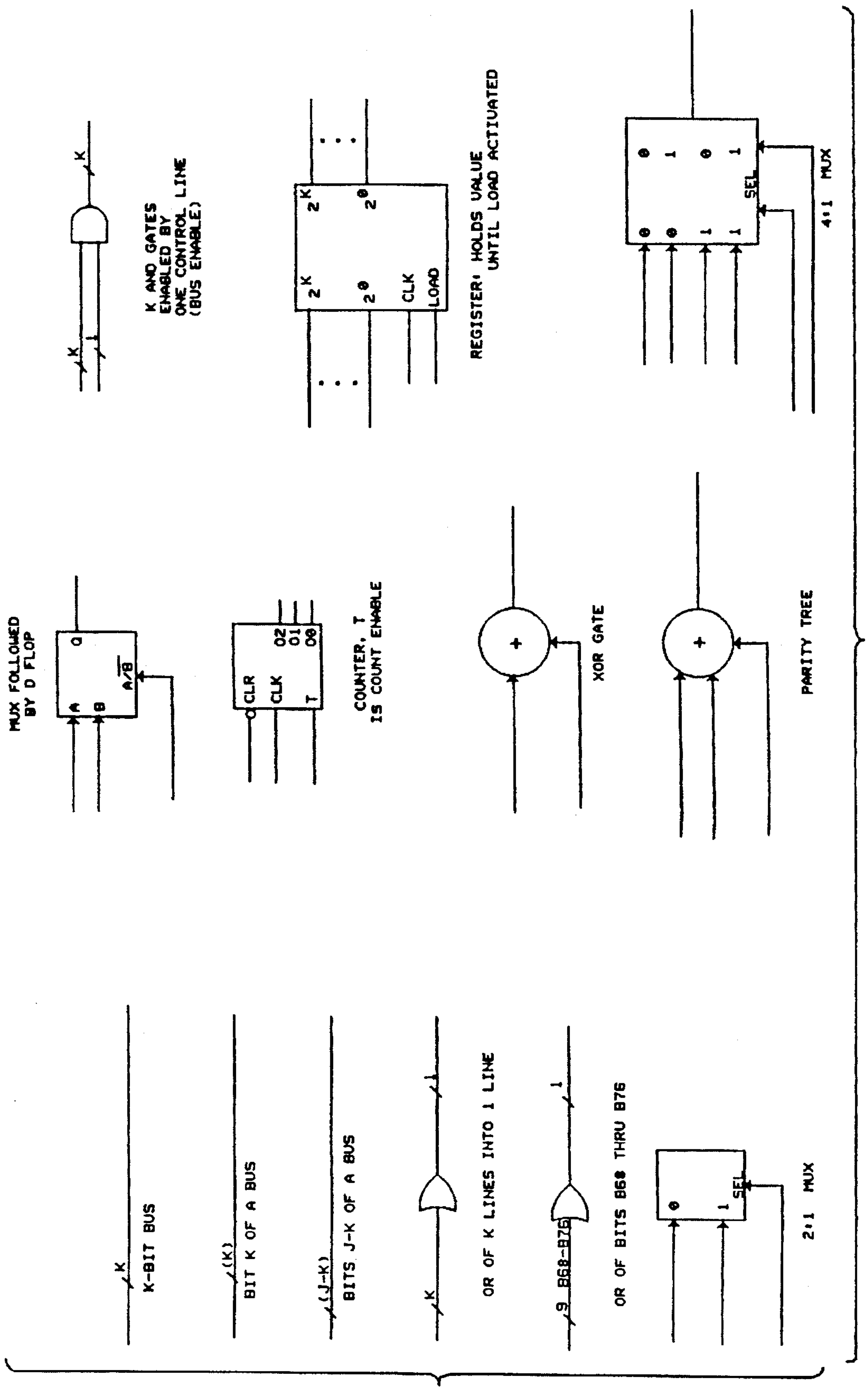
FIGS. 35 through 132 comprise three groups of figures which illustrate three different embodiments of the present invention, namely FIGS. 35 through 65 illustrating Version 1, FIGS. 66 through 97 illustrating Version 2 and FIGS. 98 through 132 illustrating Version 3, each version being an alternate embodiment of the invention.
Figure 36:
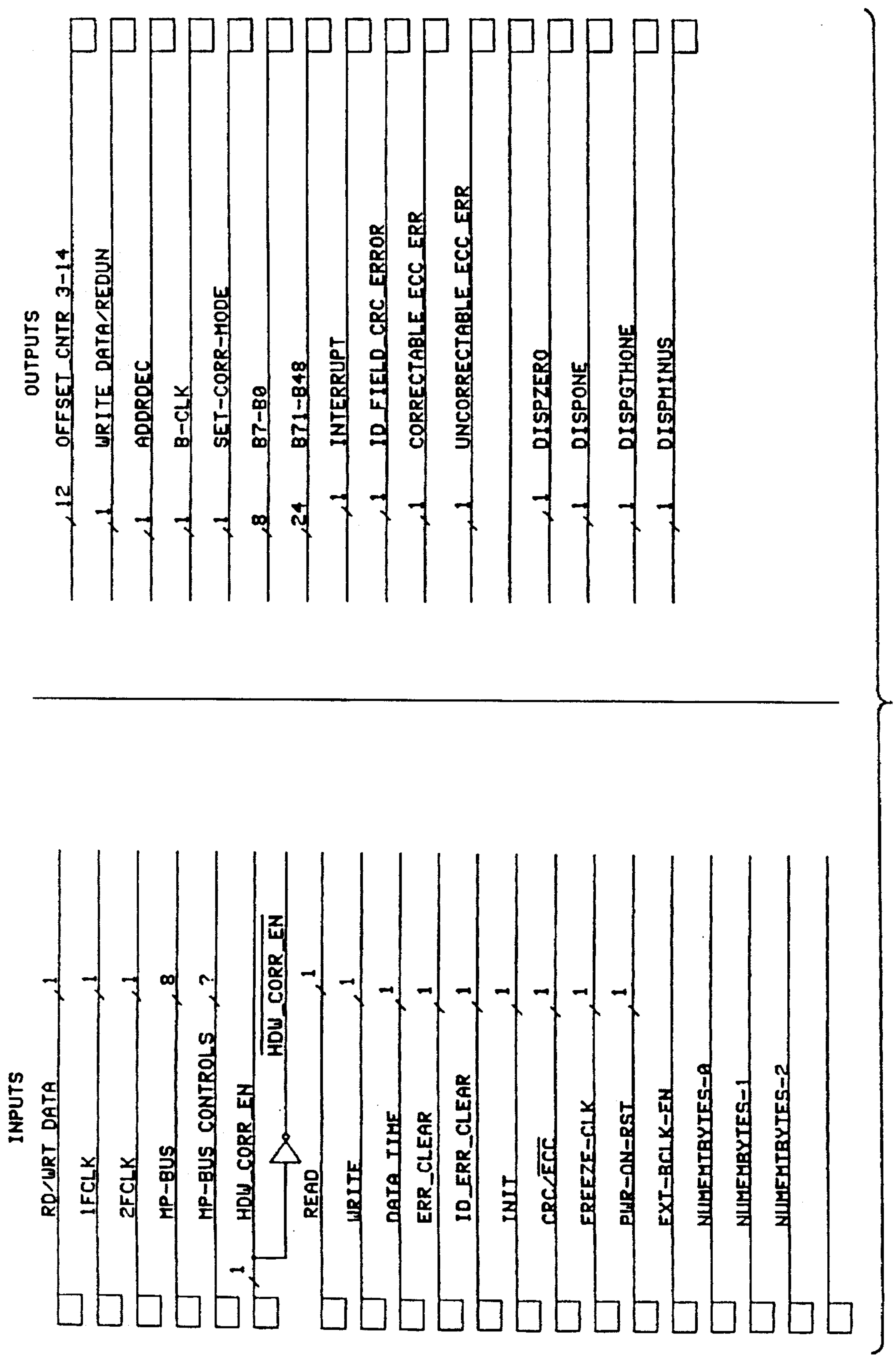
Figure 37:
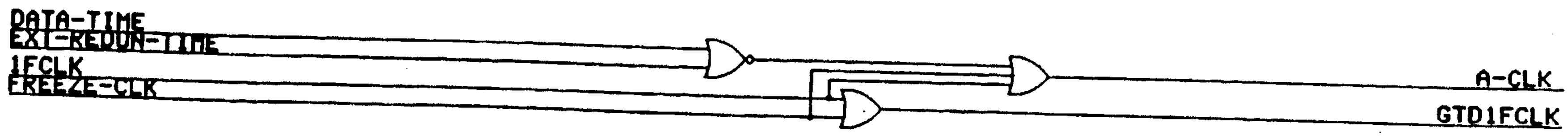
Figure 38:
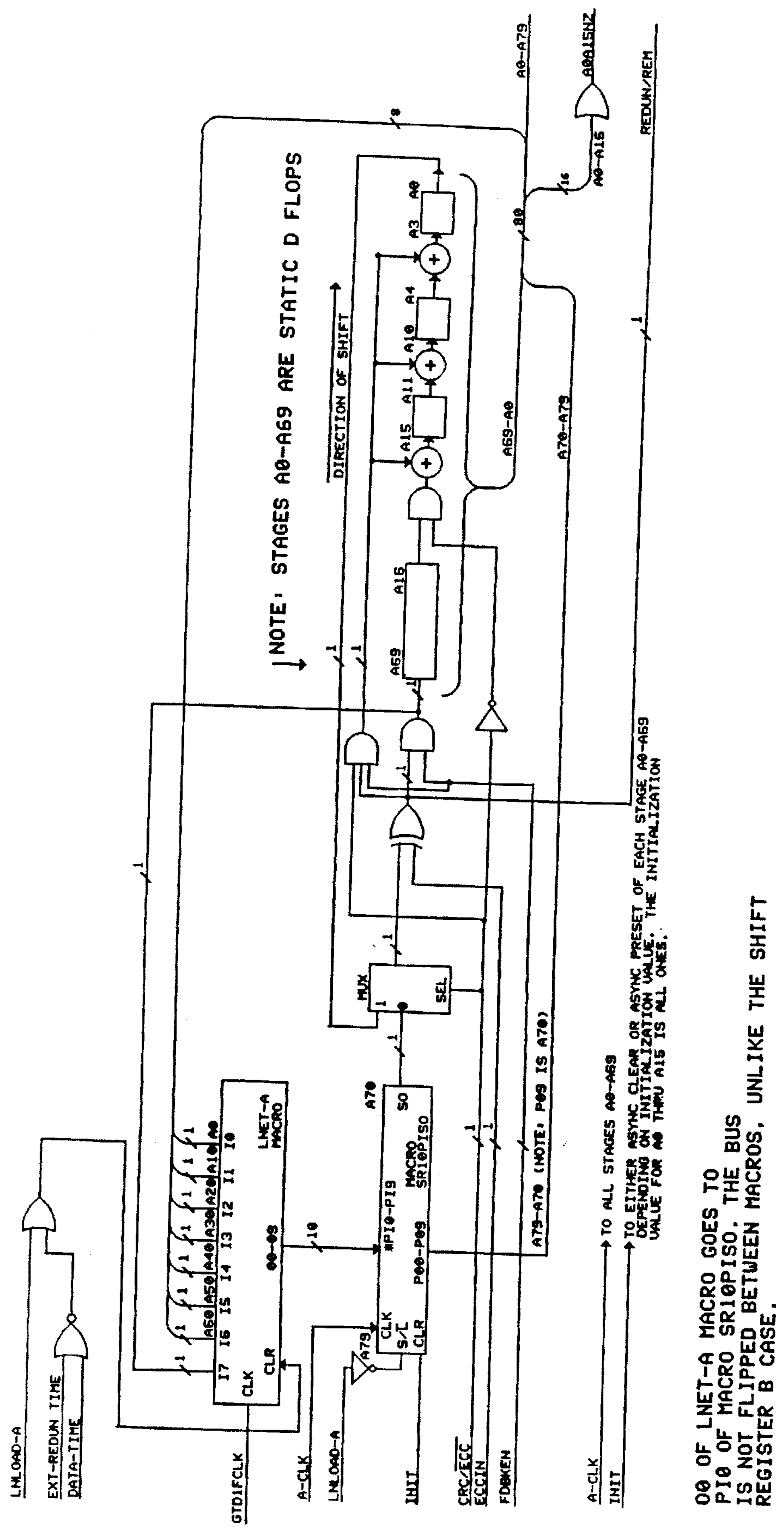
Figure 39:
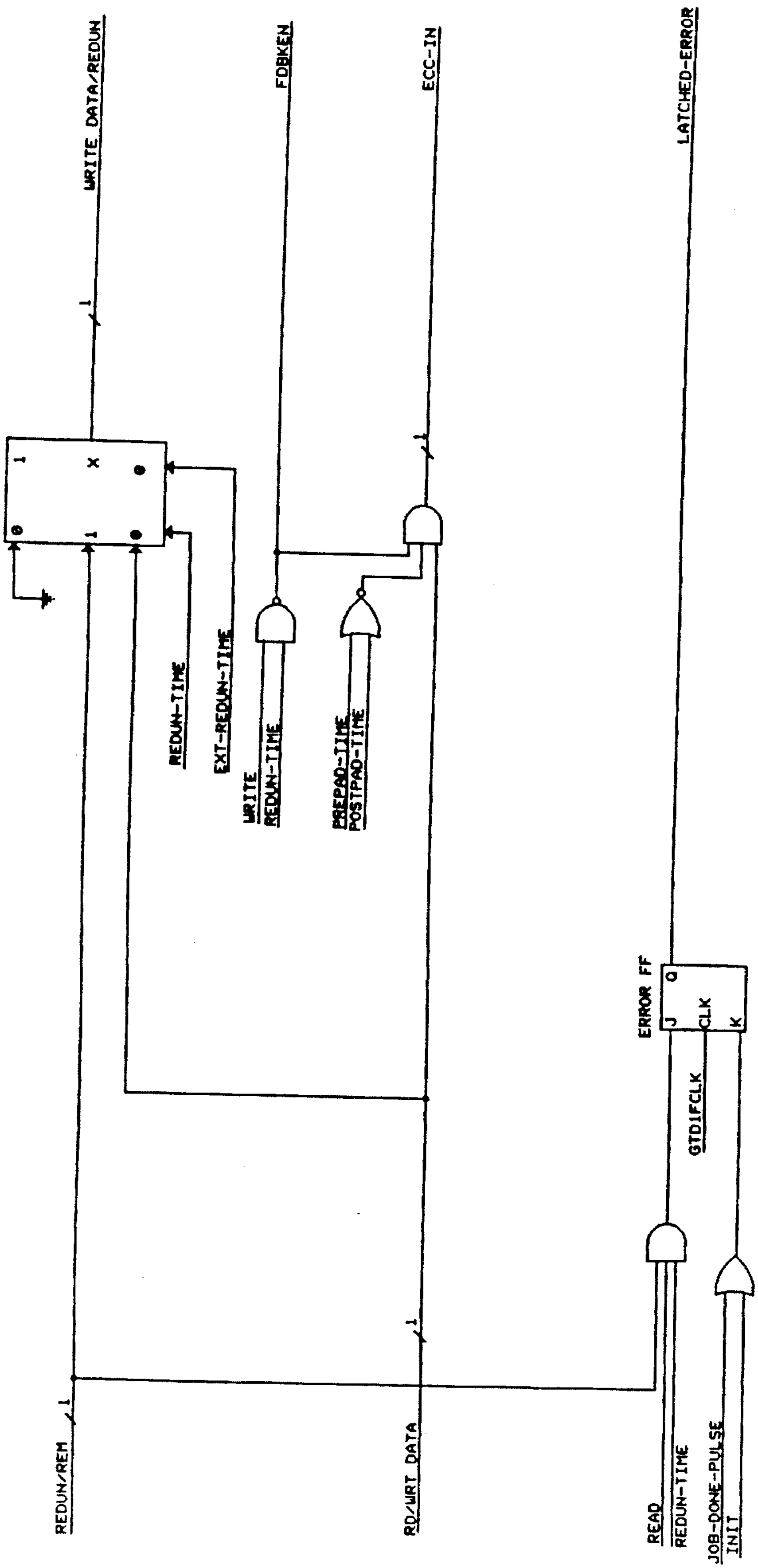
Figure 40:
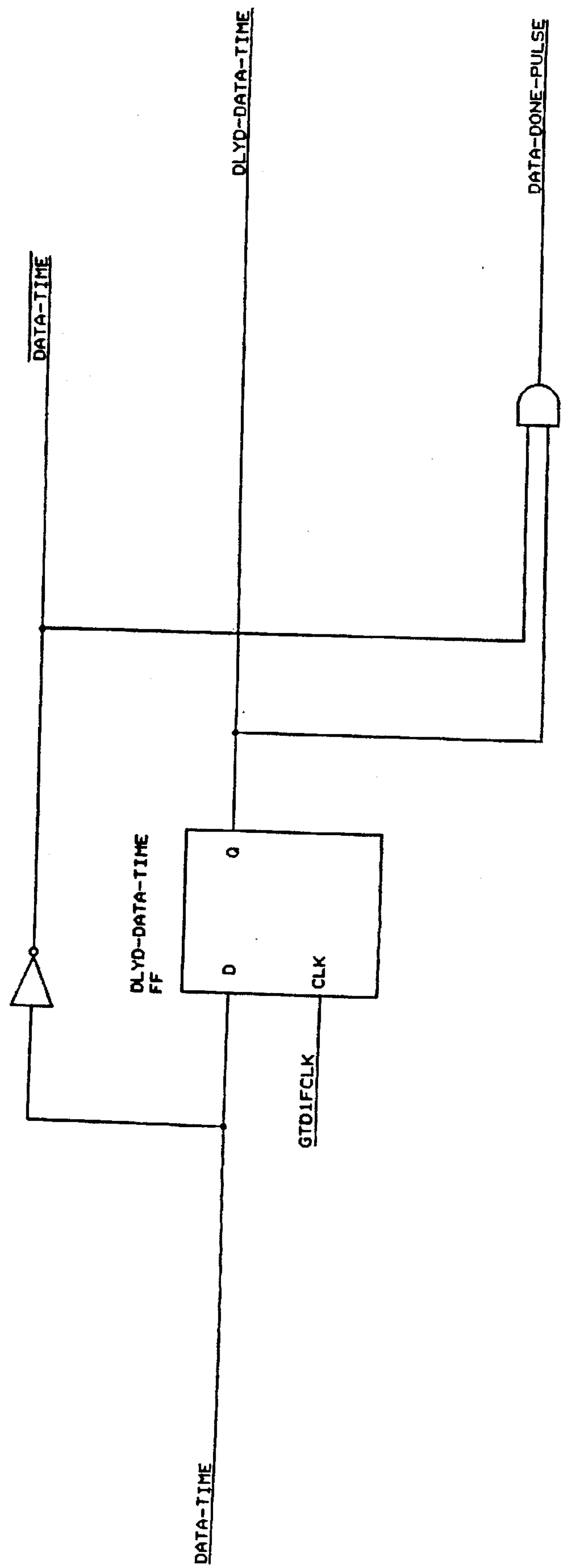
Figure 41:
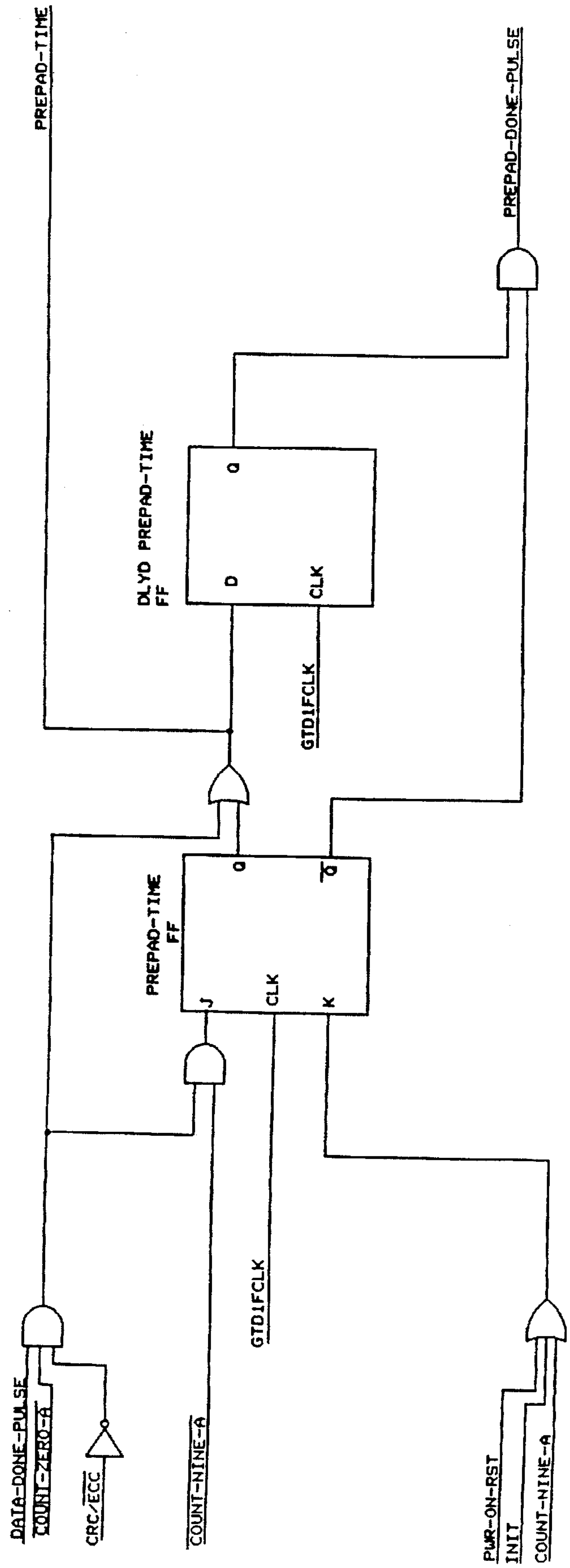
Figure 42:
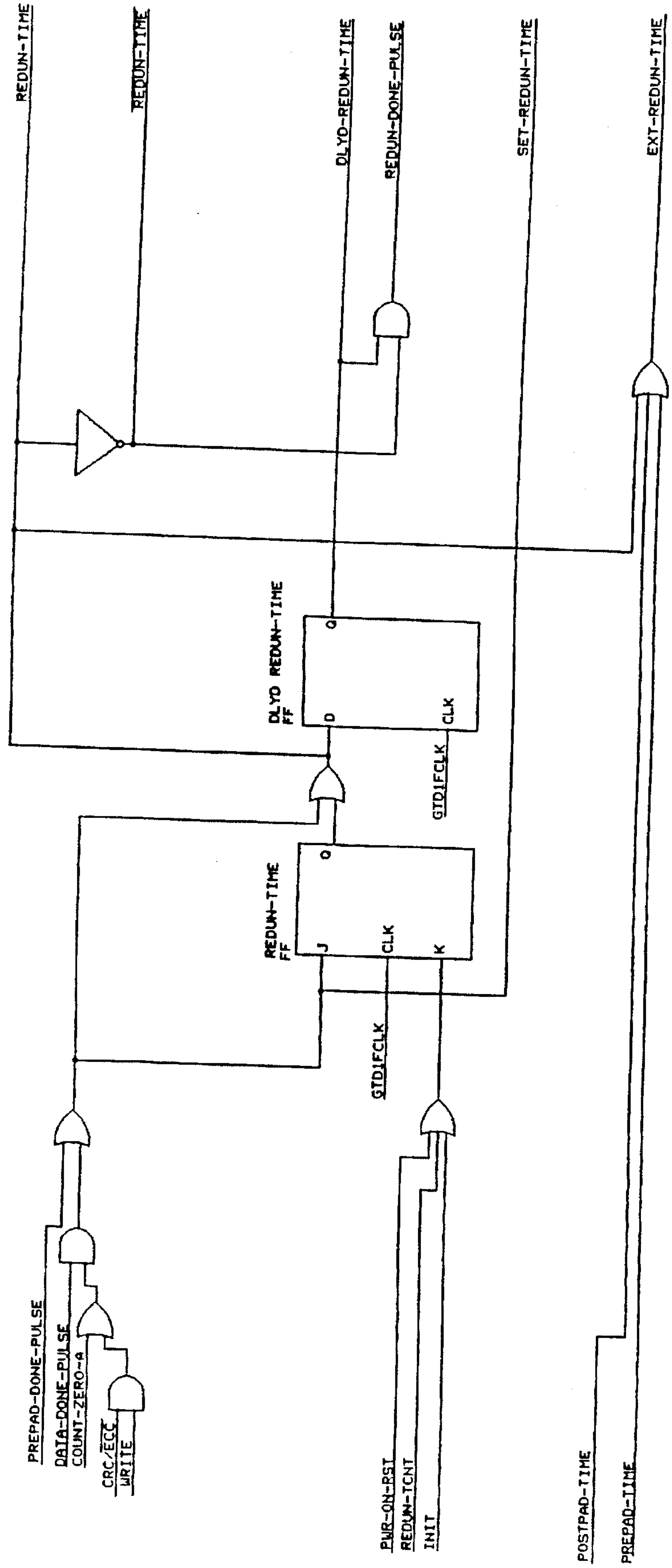
Figure 43:
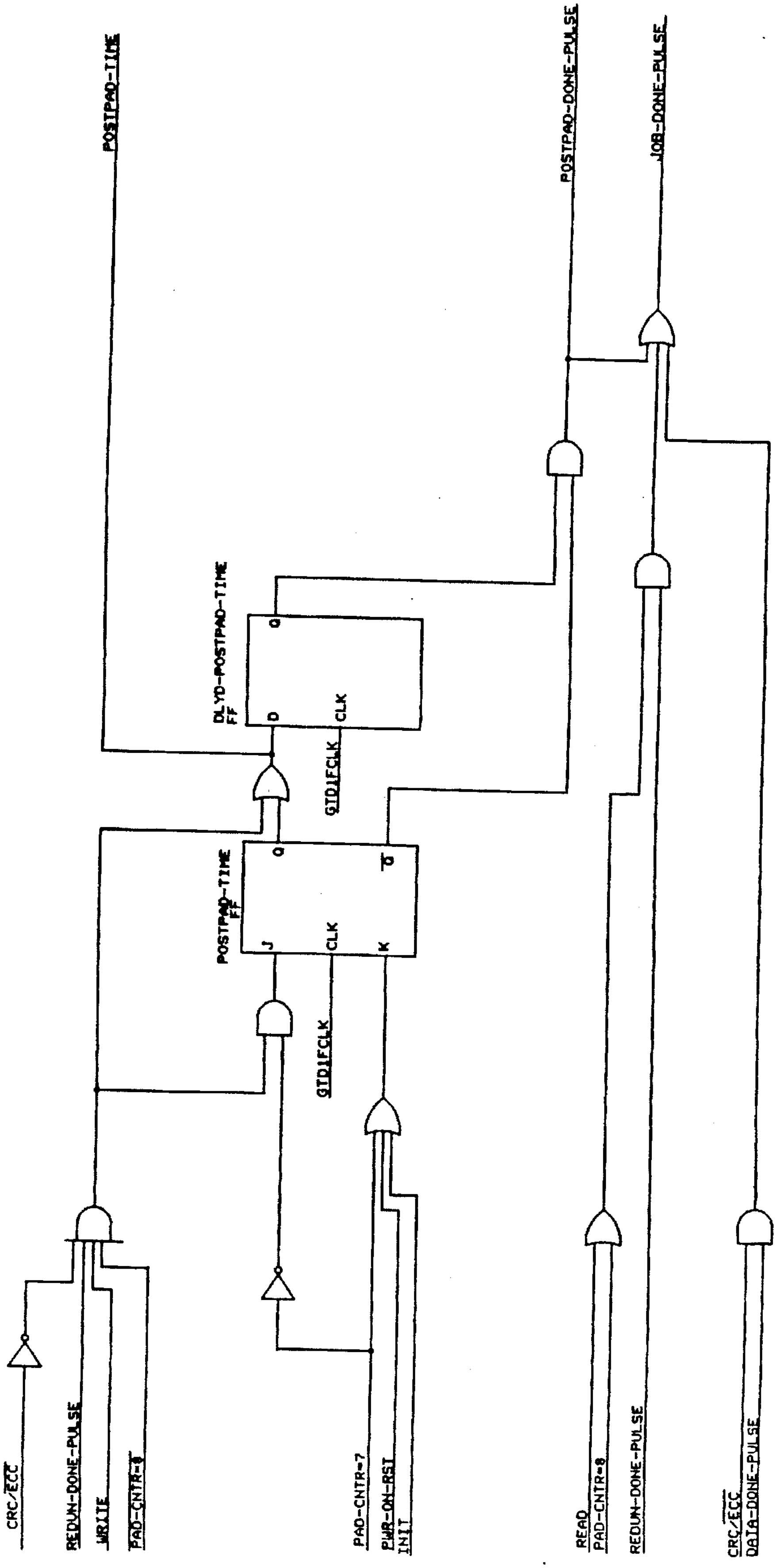
Figure 44:
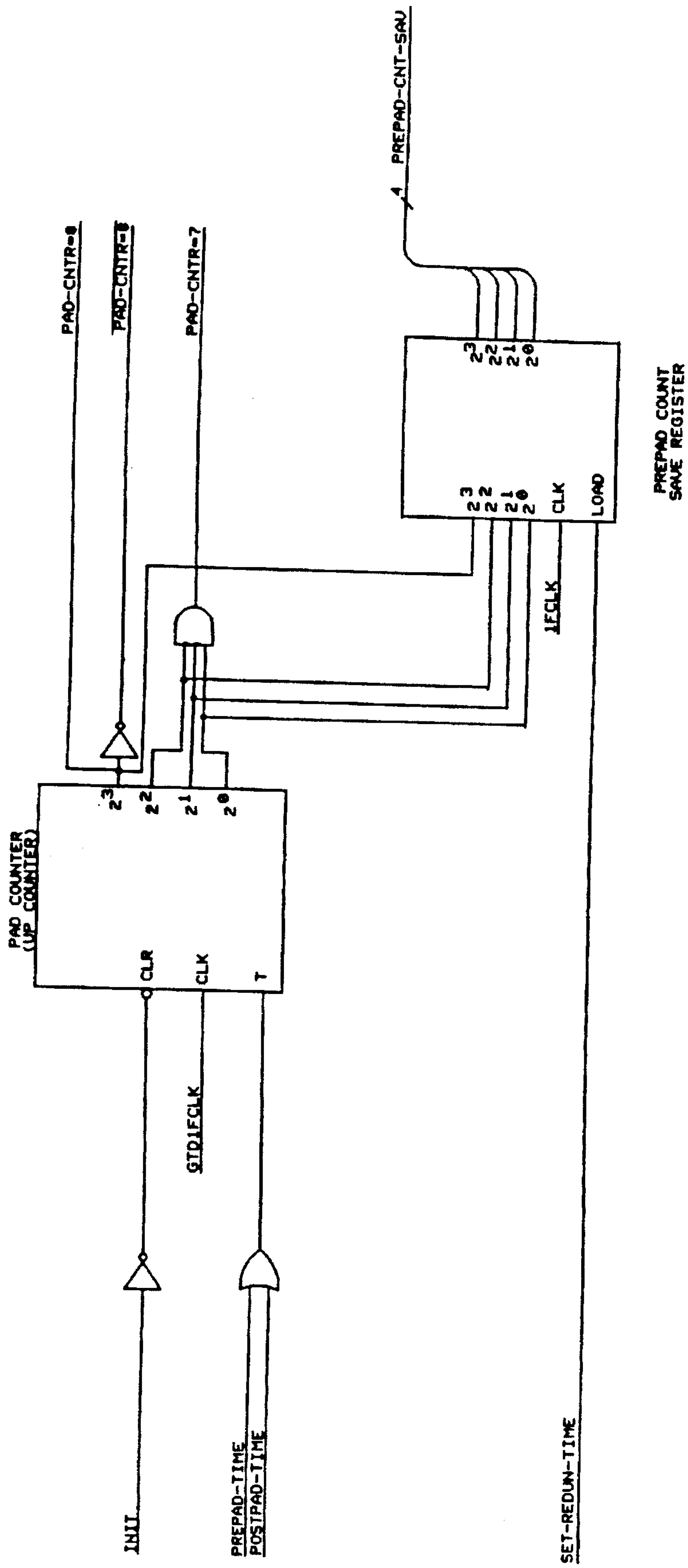
Figure 45:
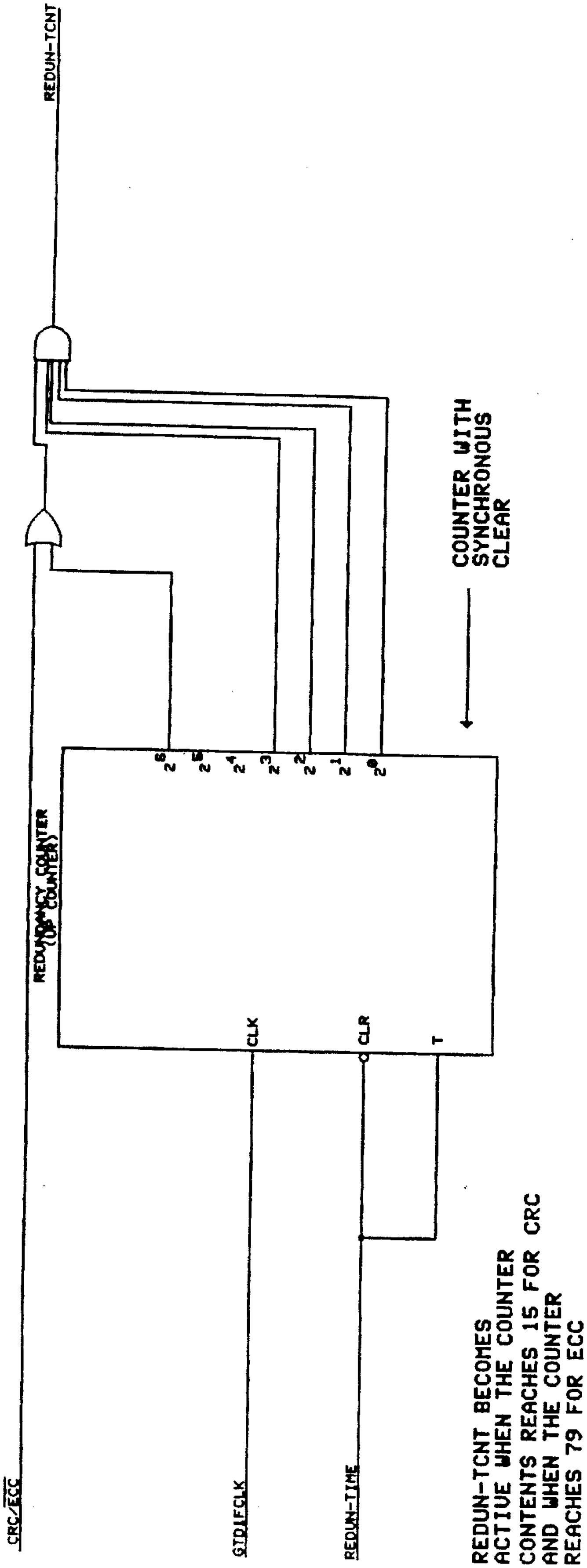
Figure 46:
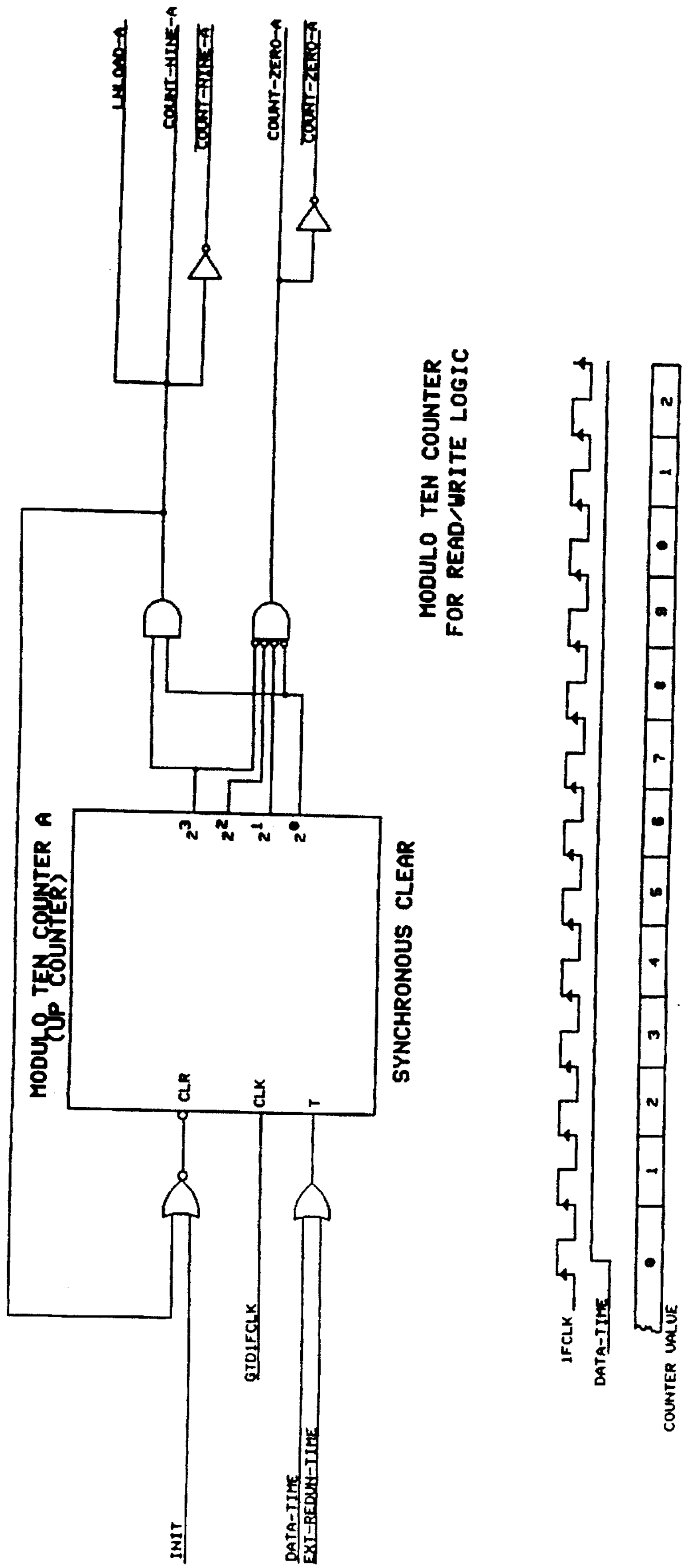
Figure 47:
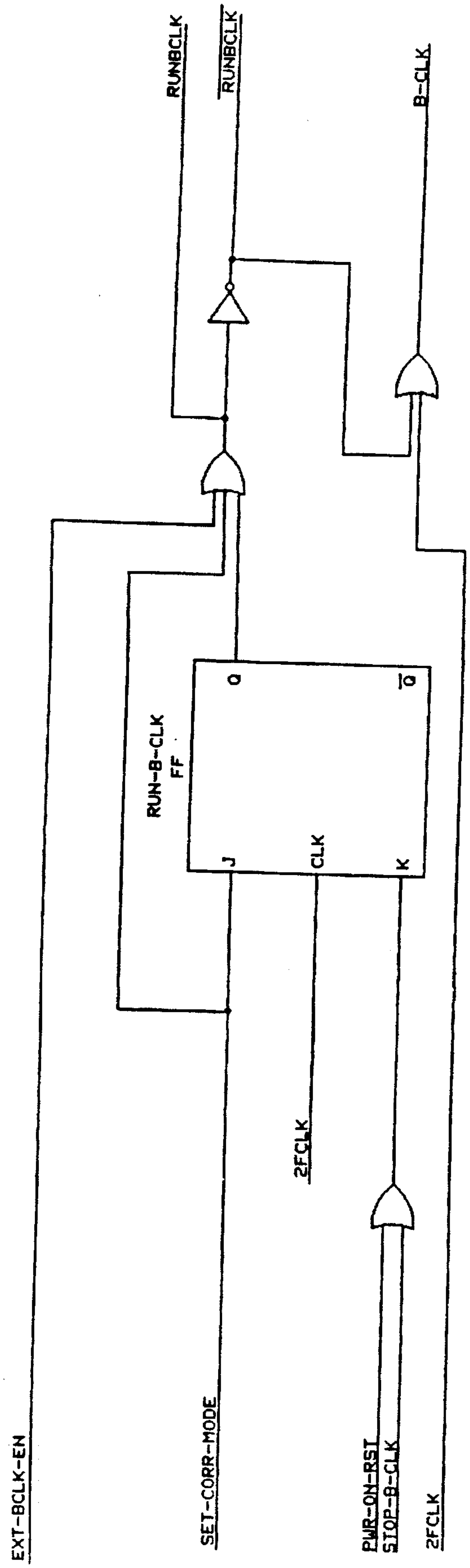
Figure 48:
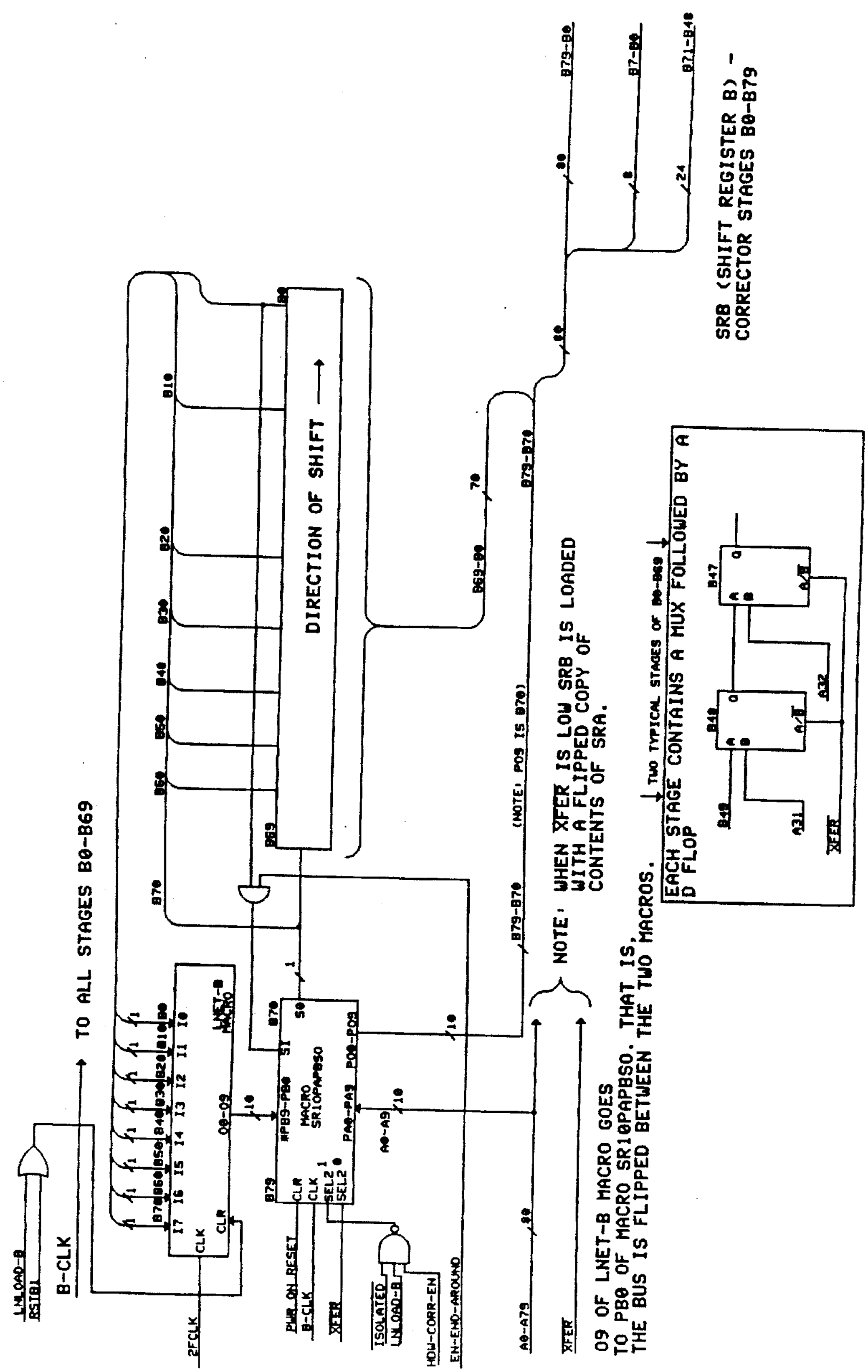
Figure 49:
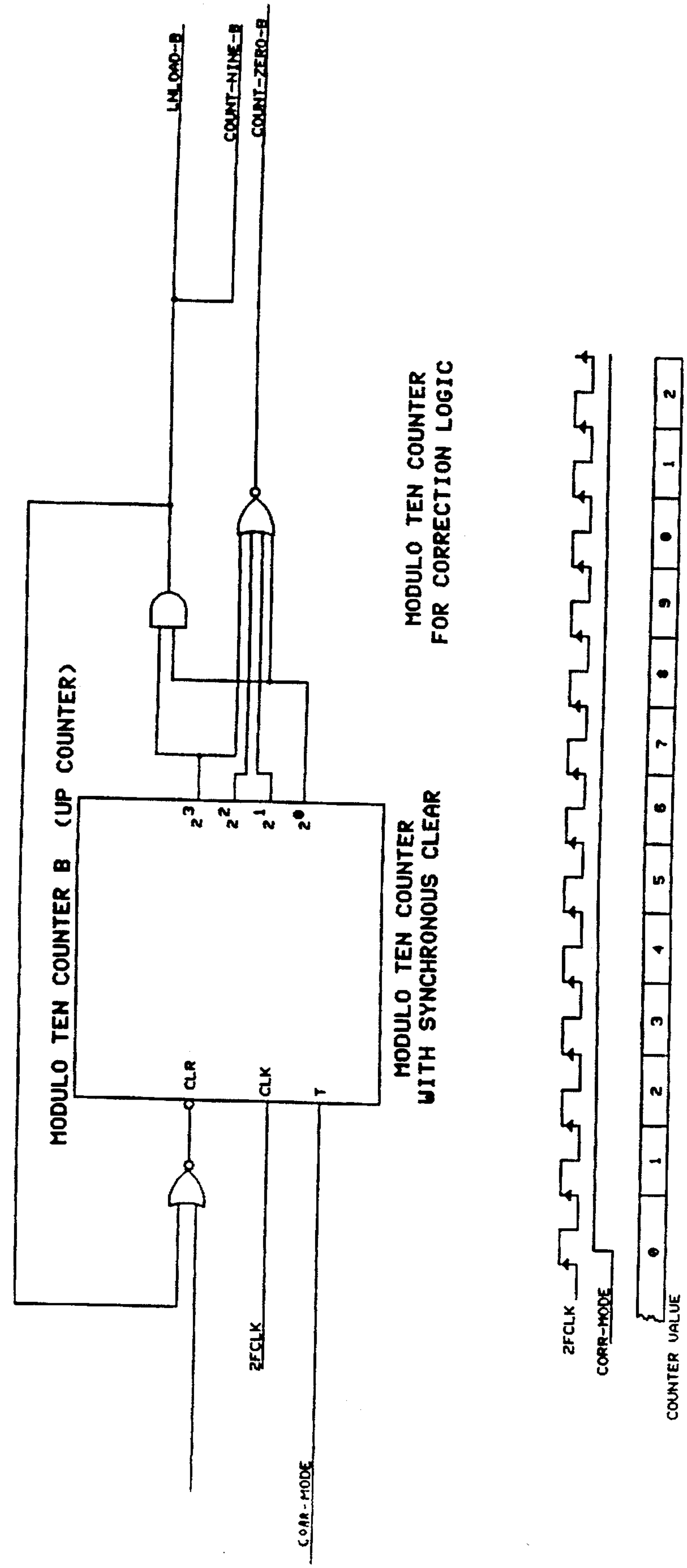
Figure 50:
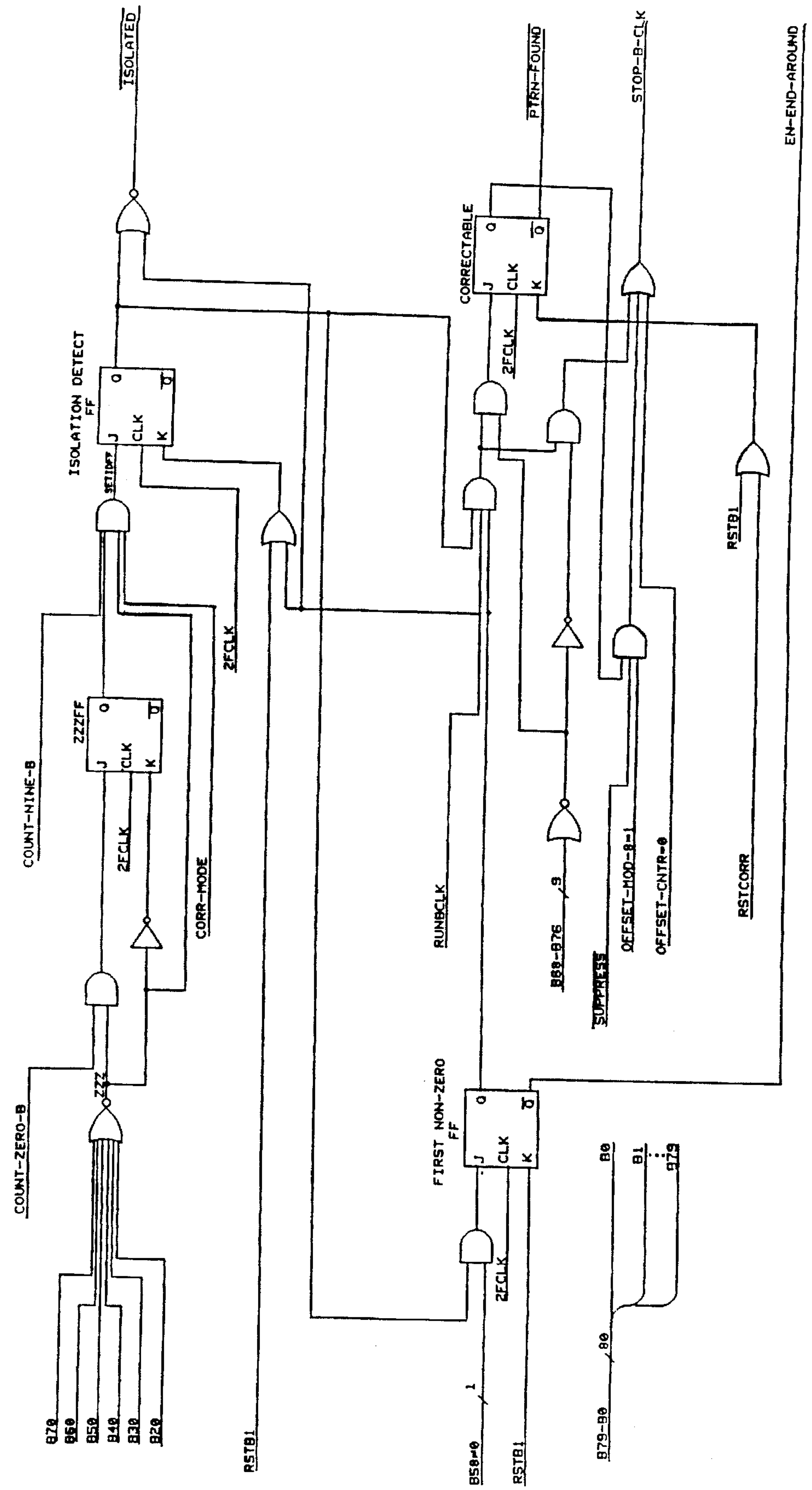
Figure 51:
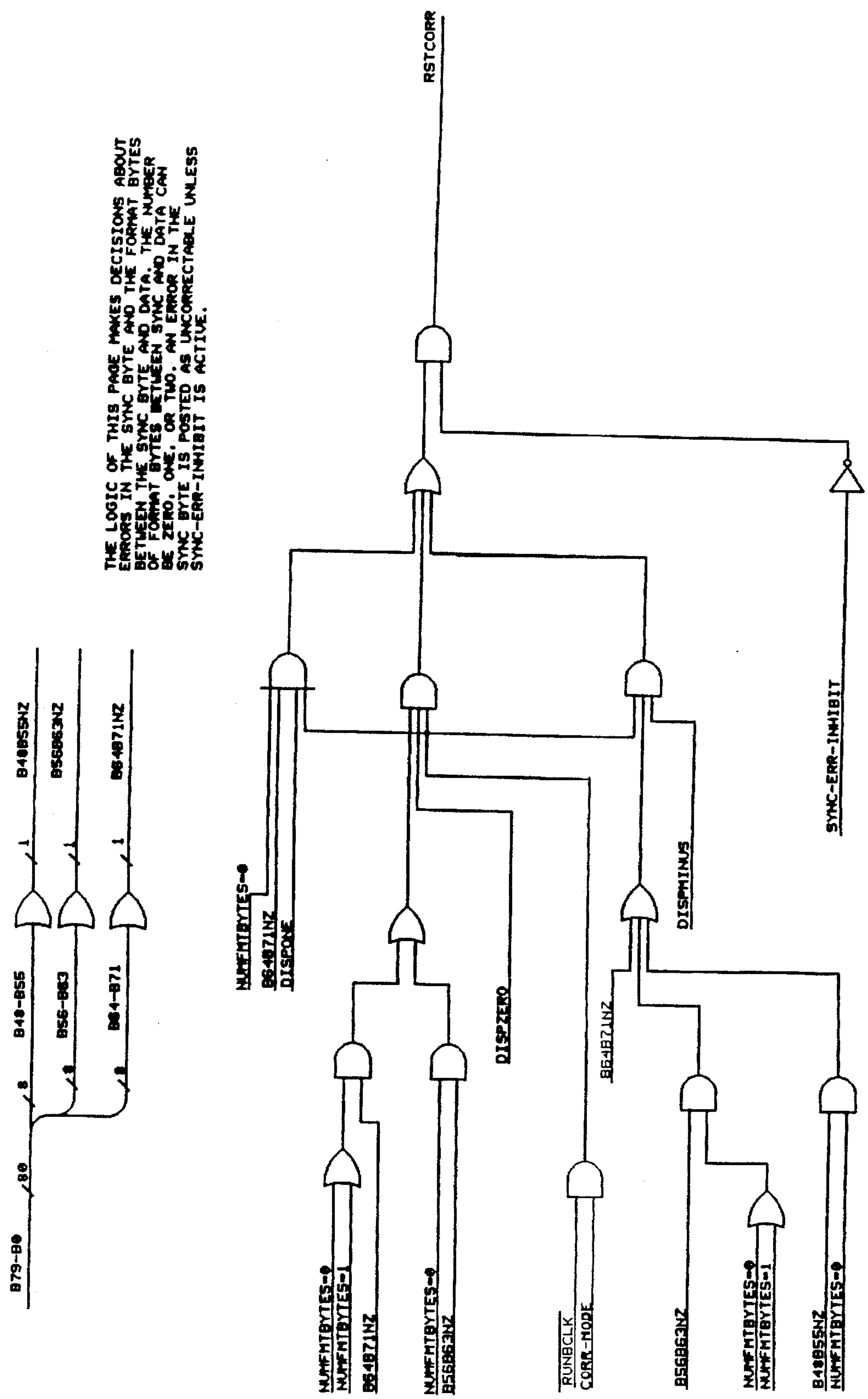
Figure 53:
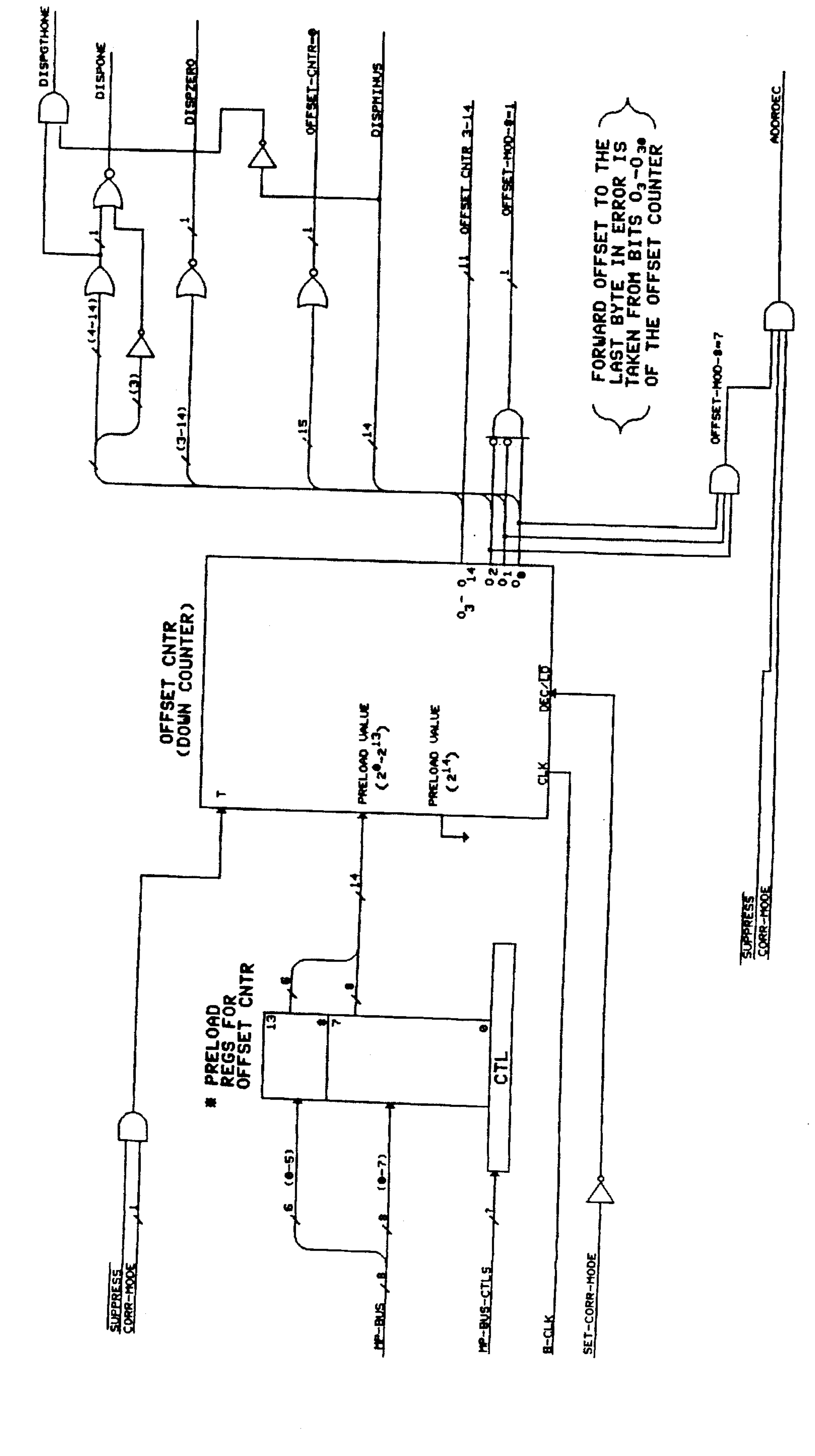
Figure 54:
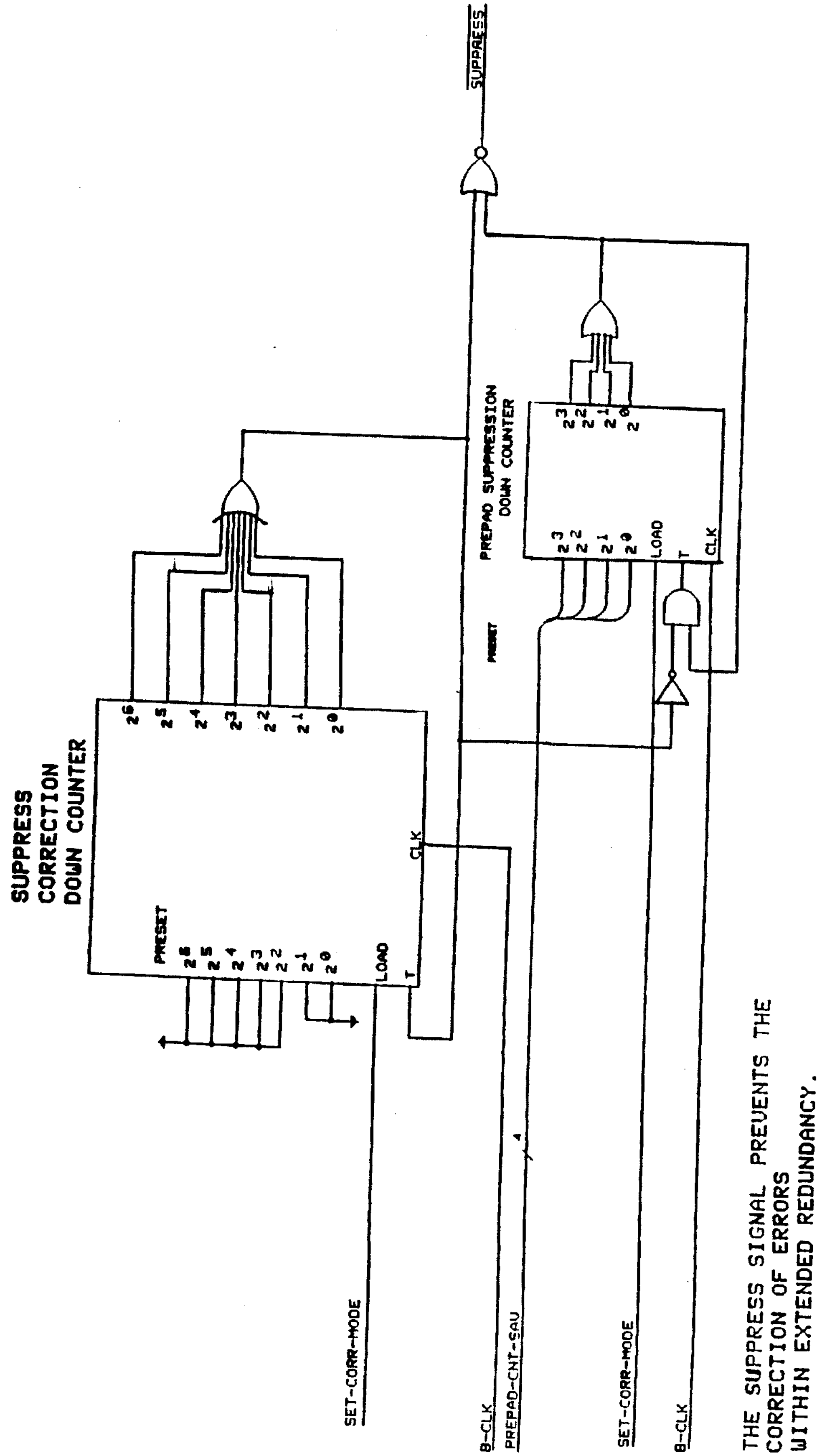
Figure 55:
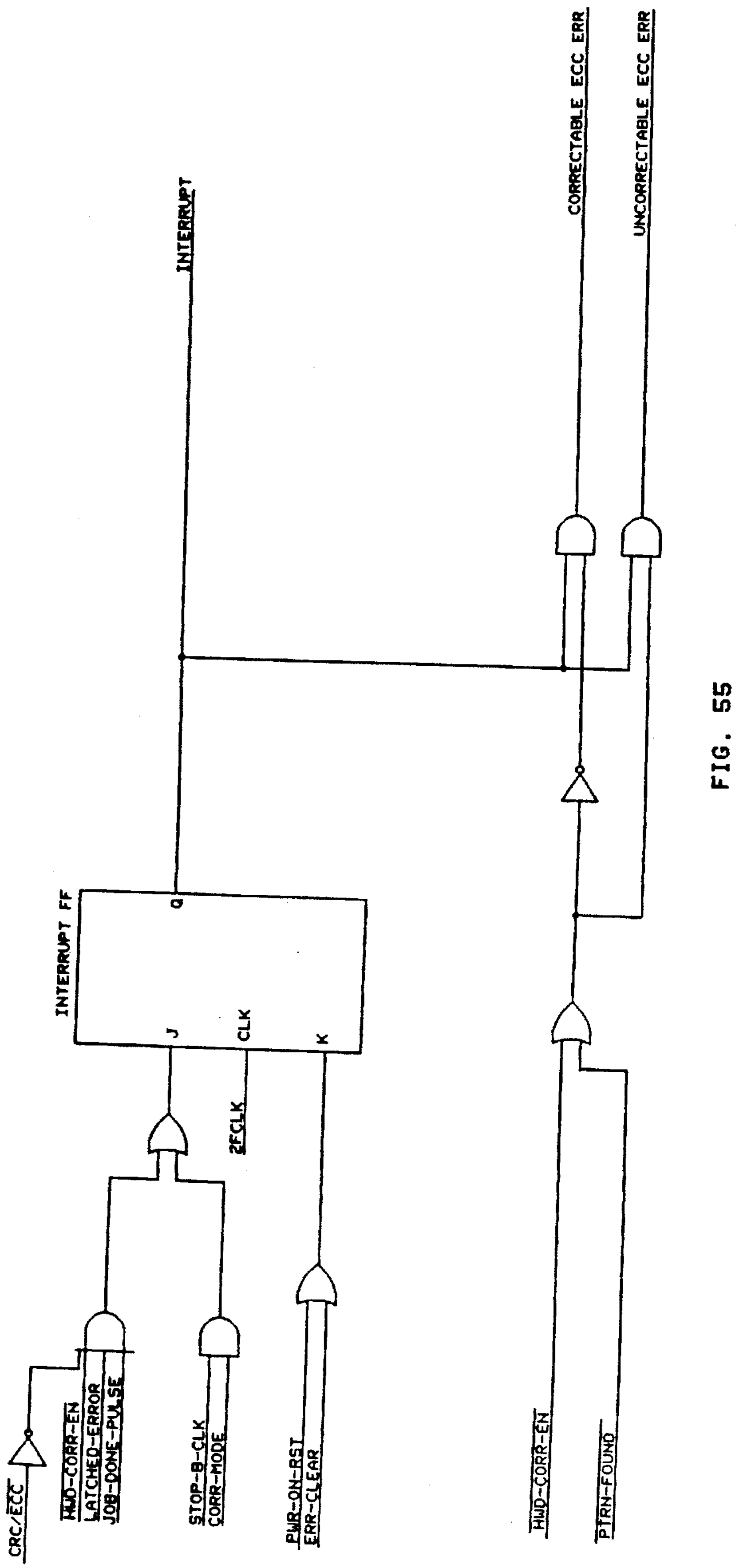
Figure 56:
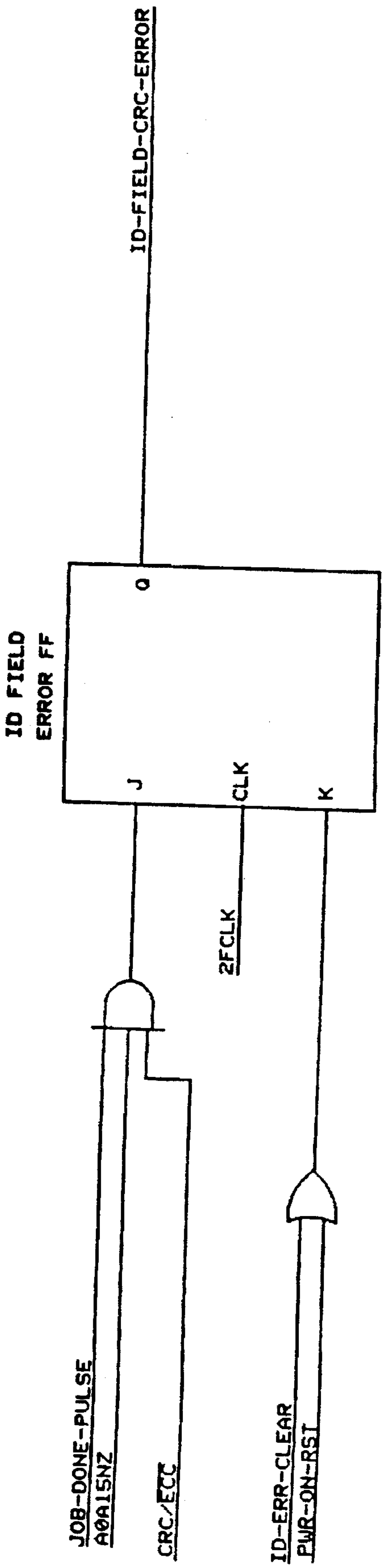
Figure 57:
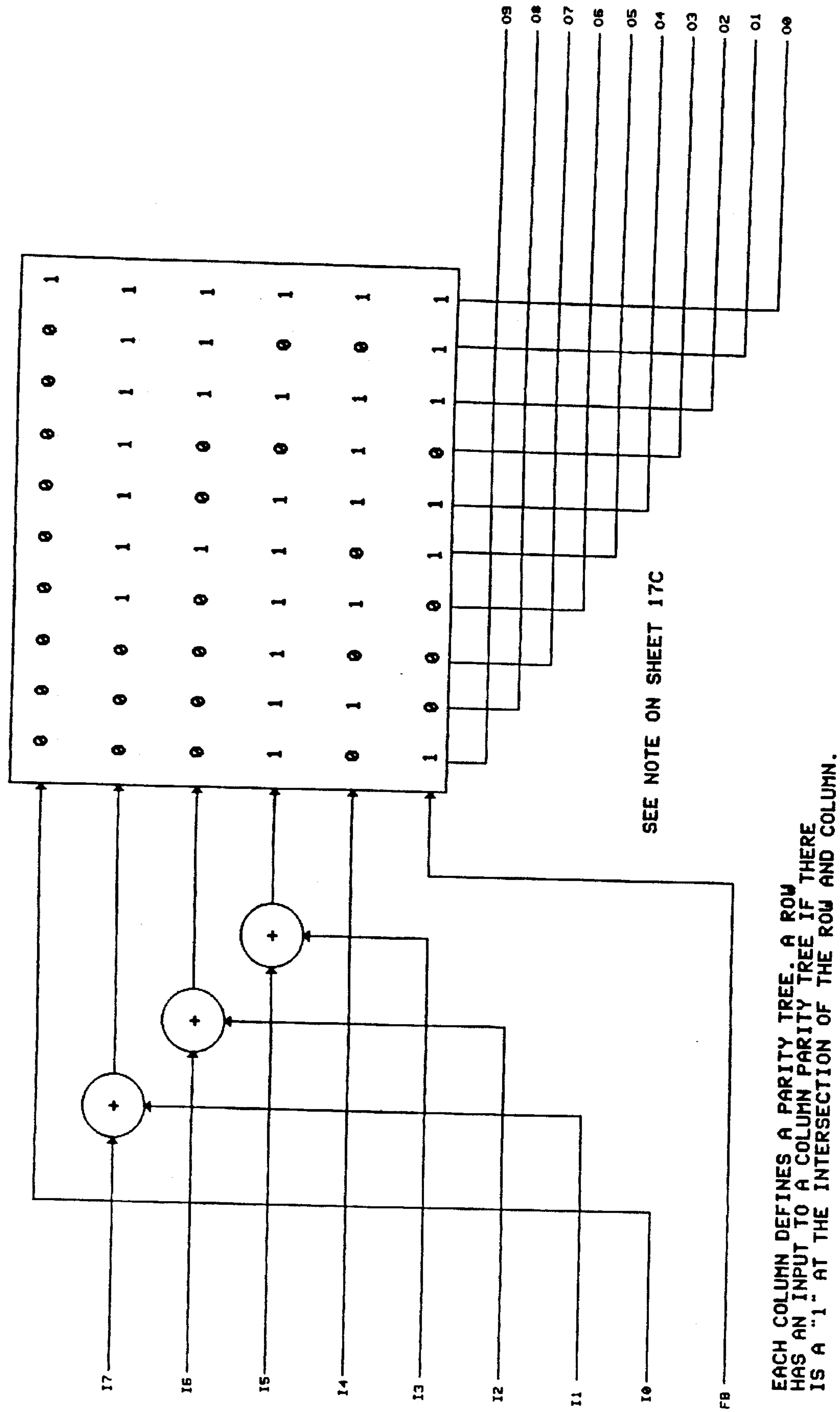
Figure 58:
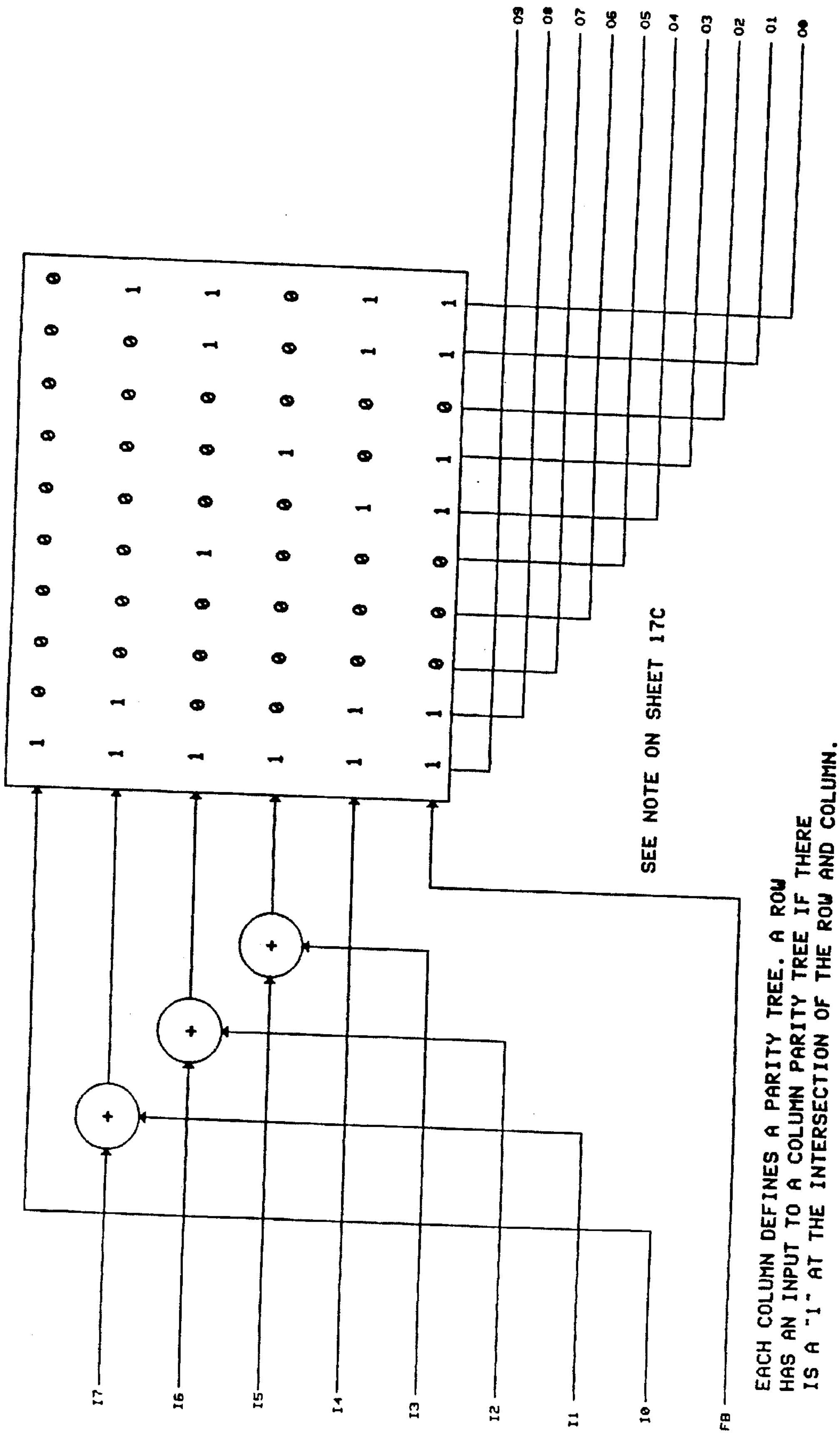
Figure 59:
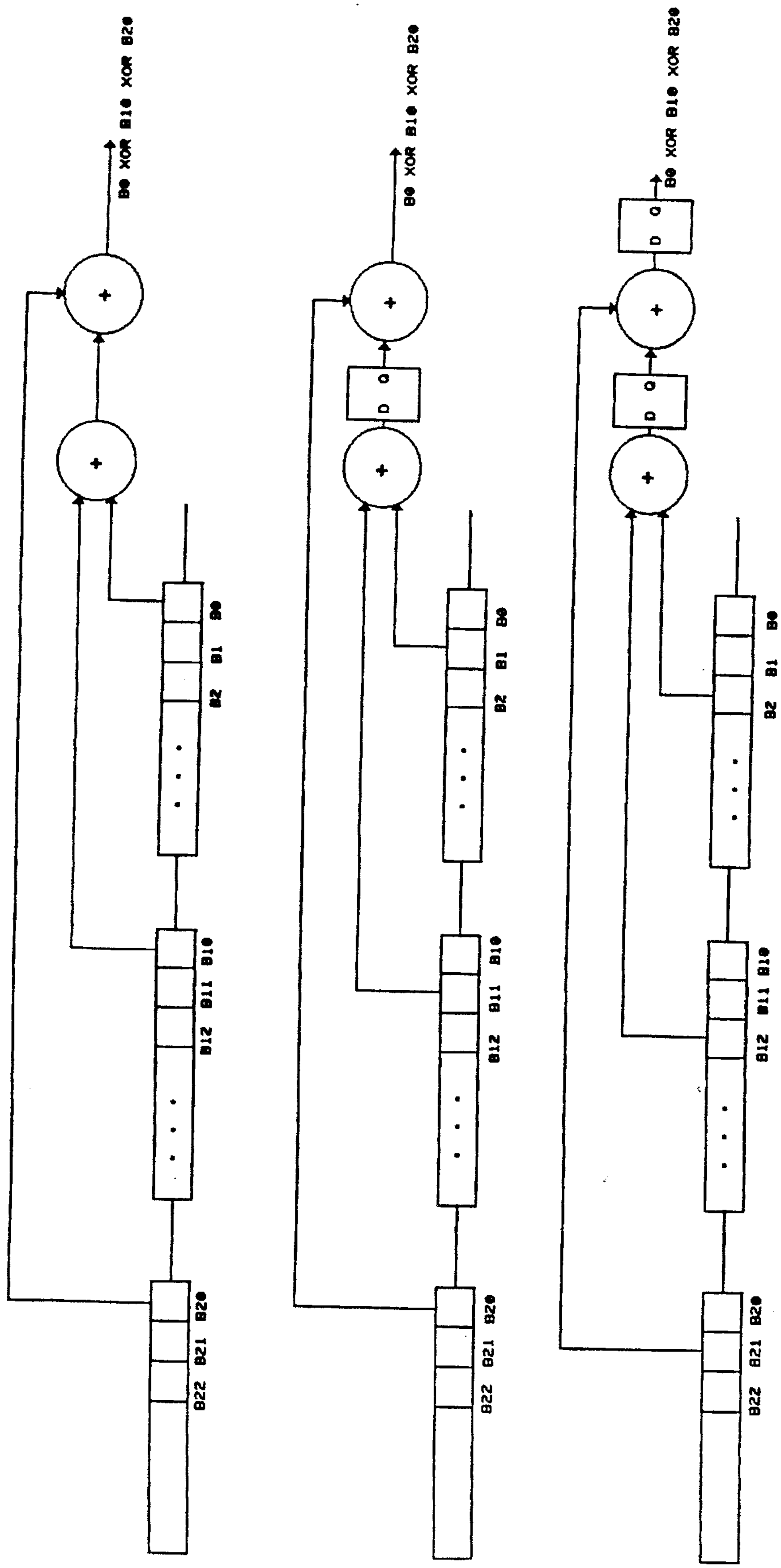
Figure 60:
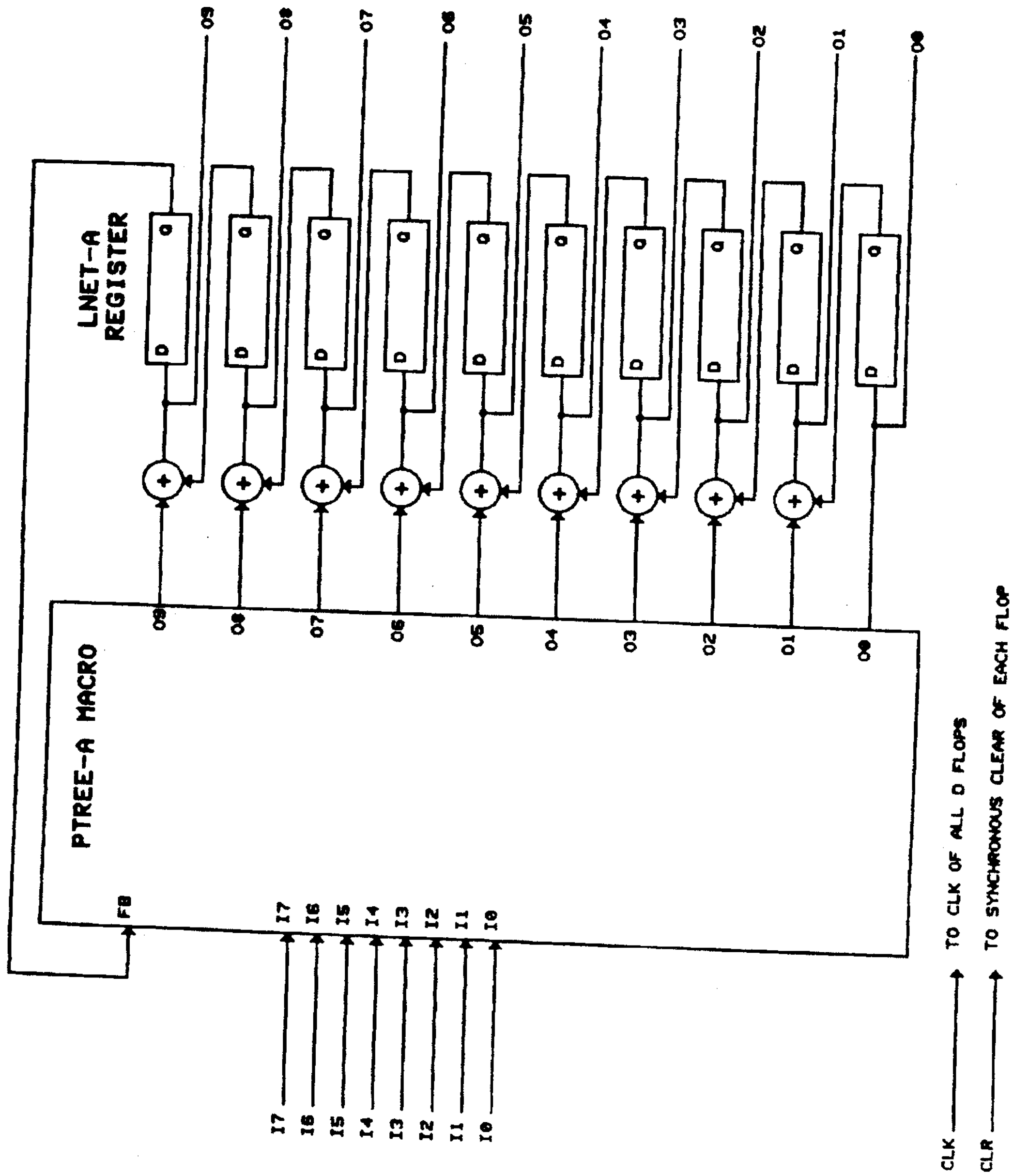
Figure 61:
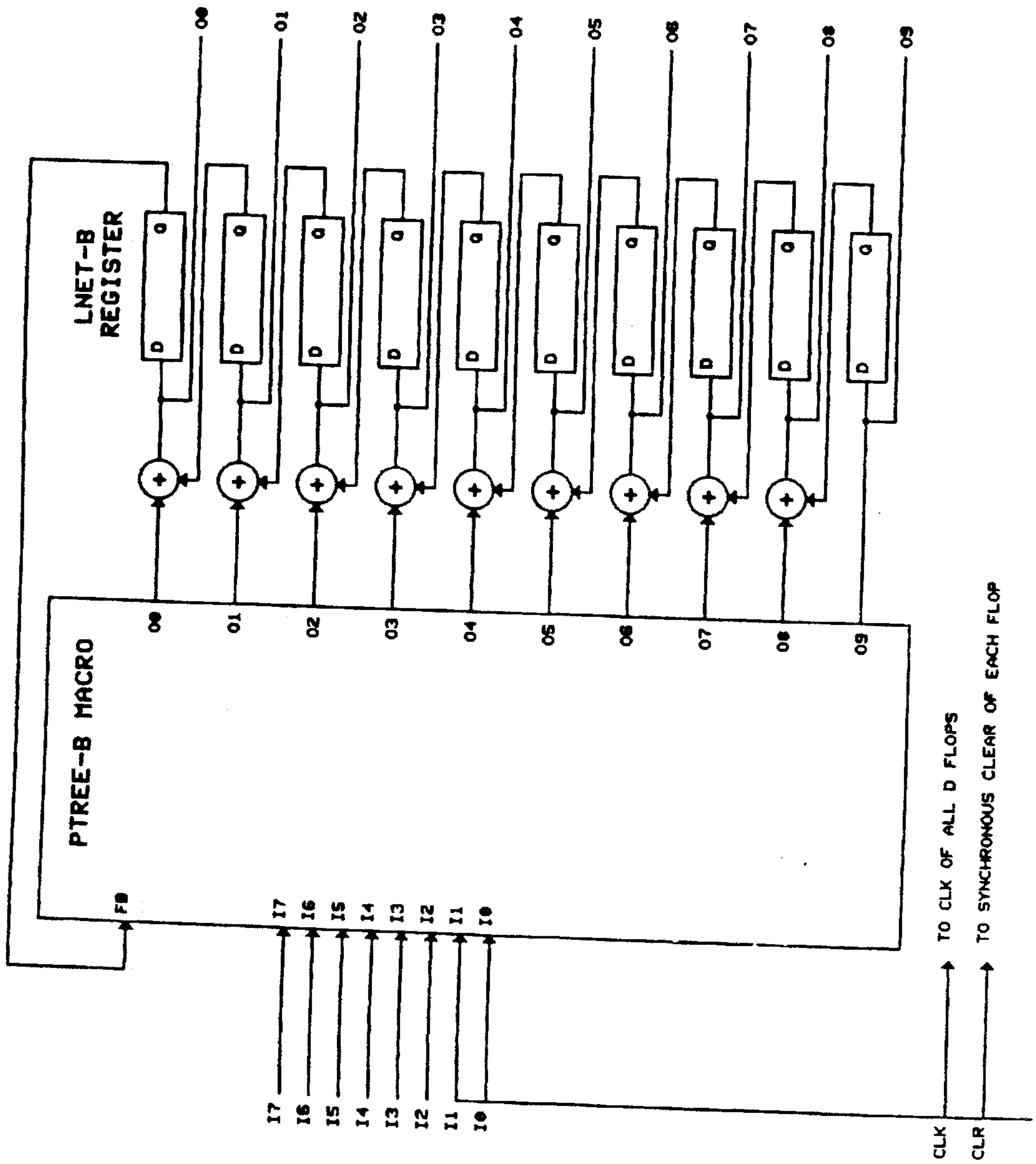
Figure 62:
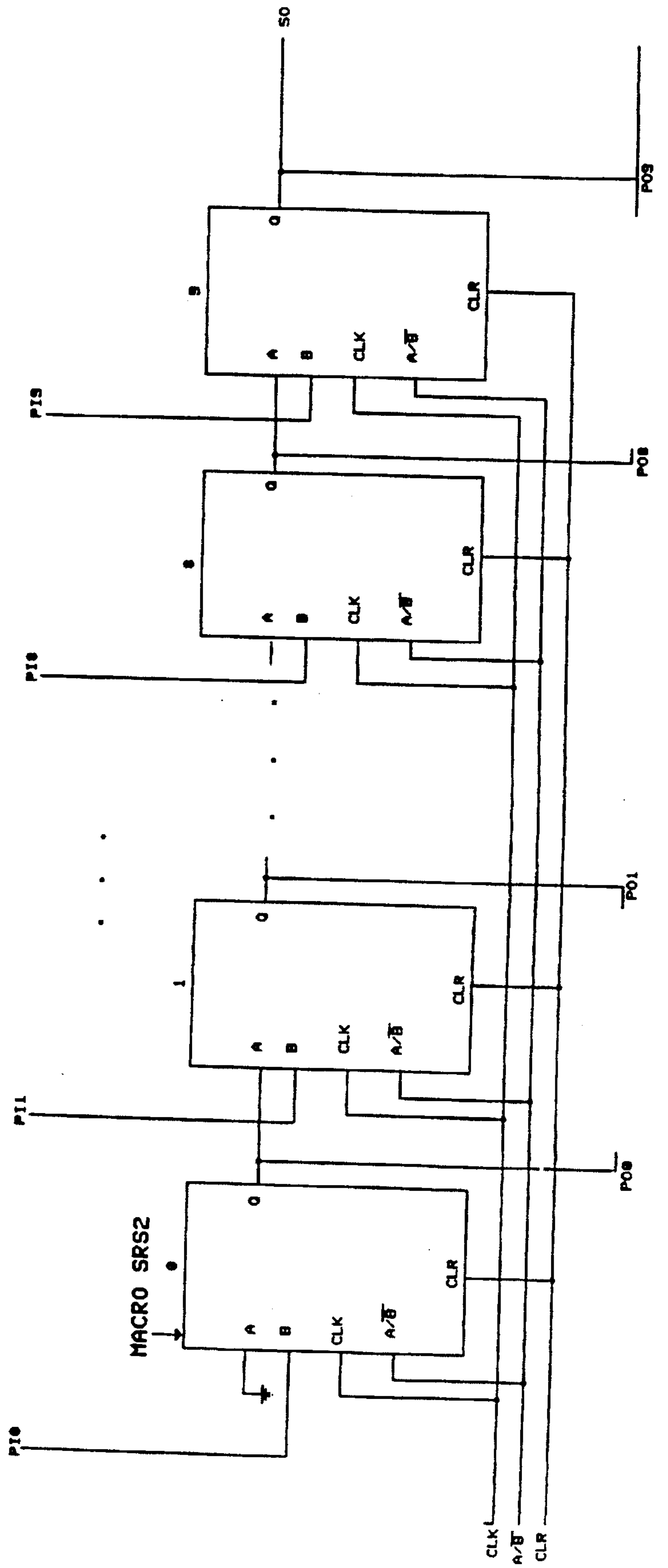
Figure 63:
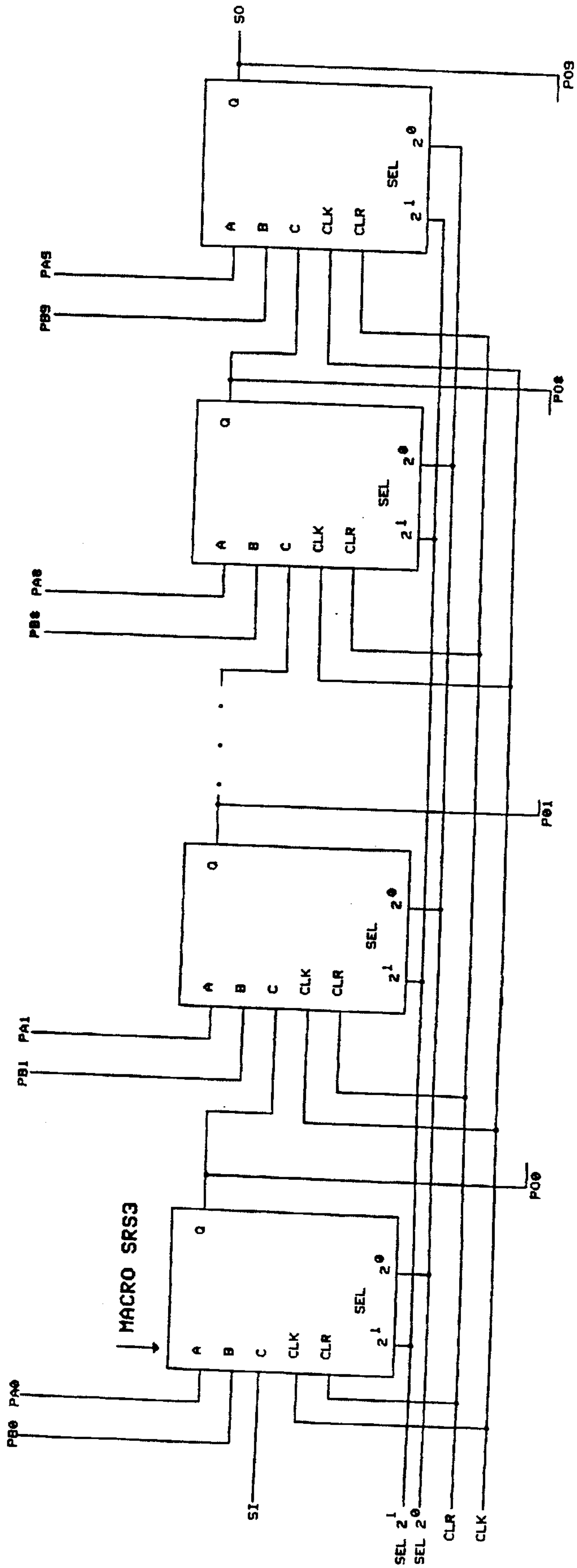
Figure 64:
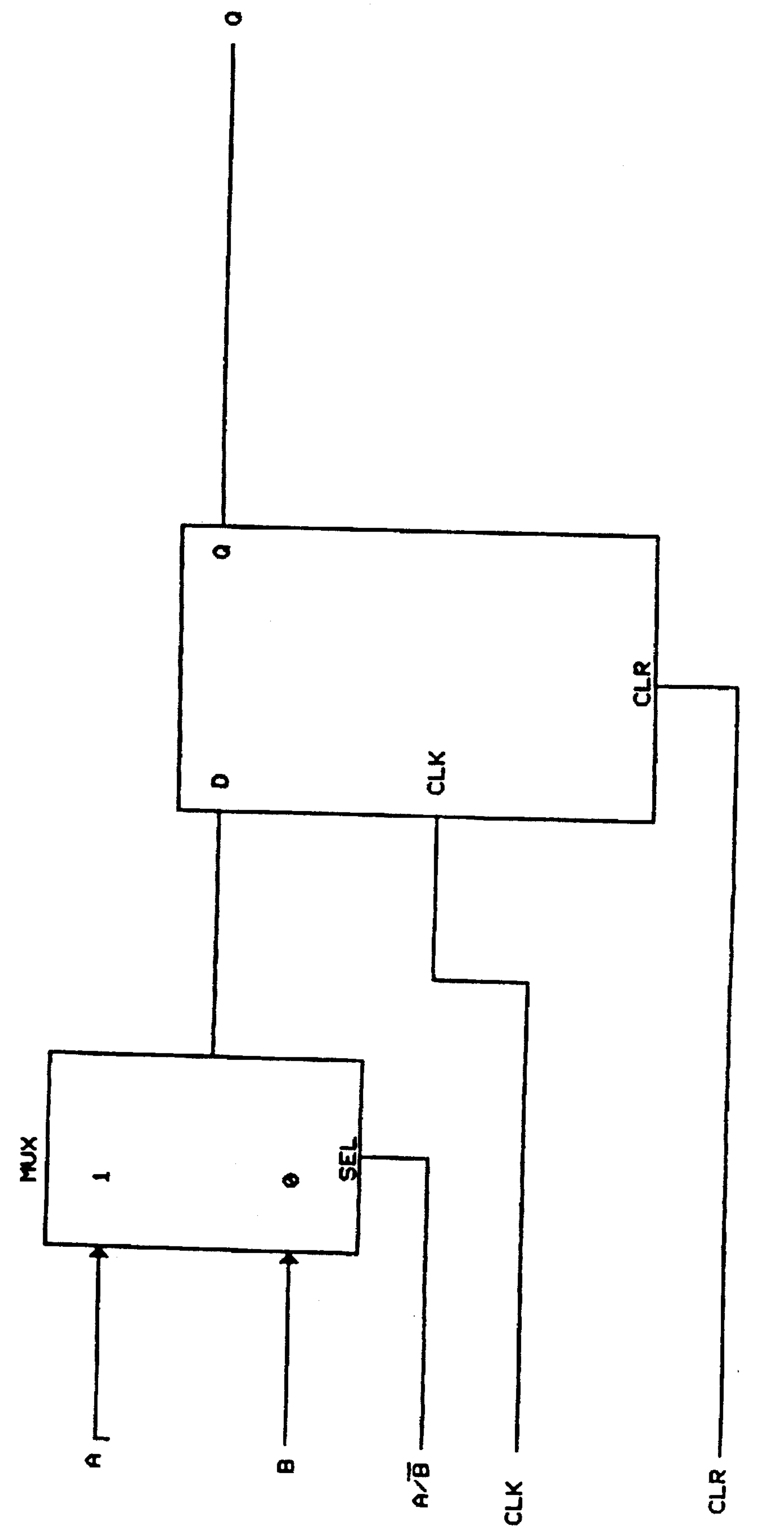
Figure 65:
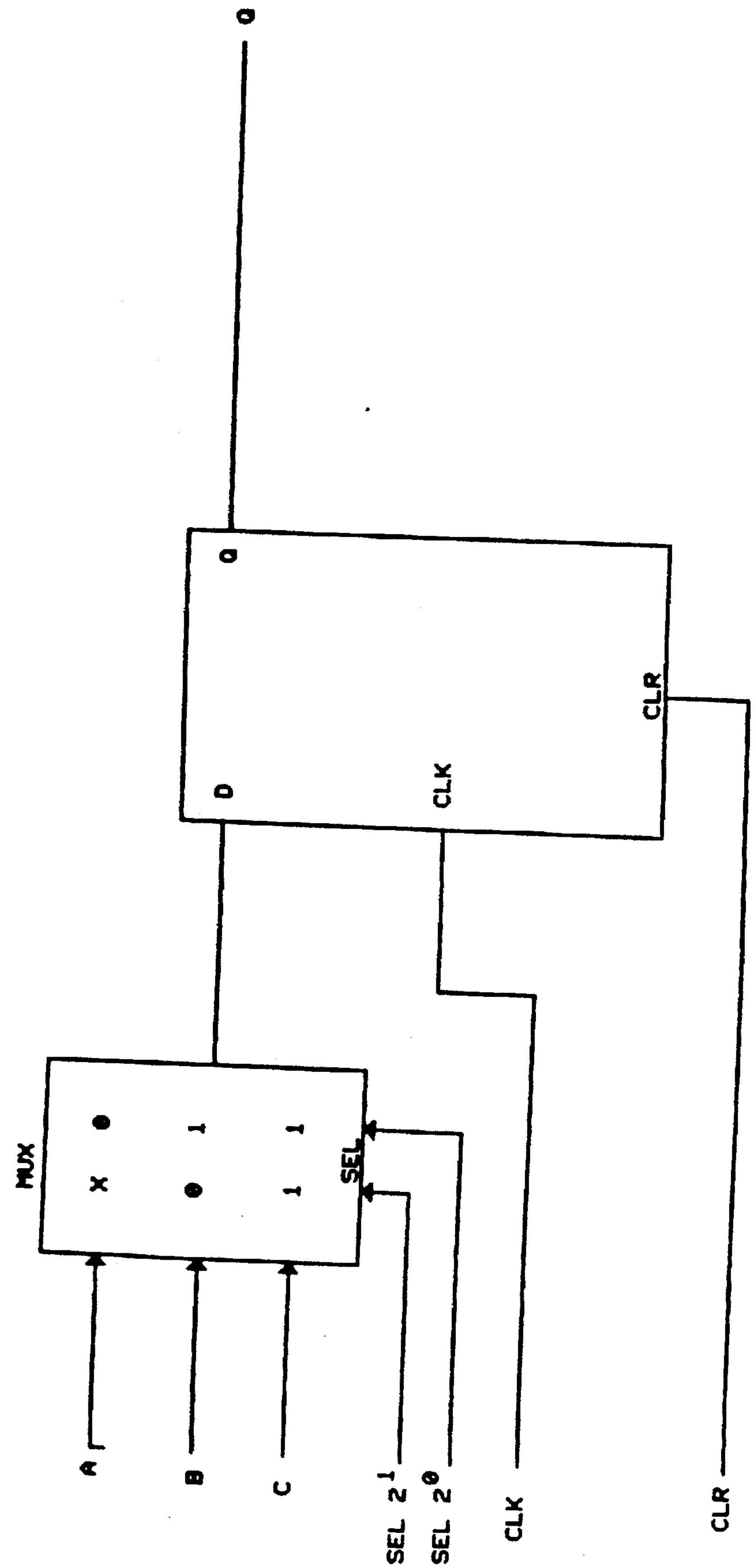
Figure 66:
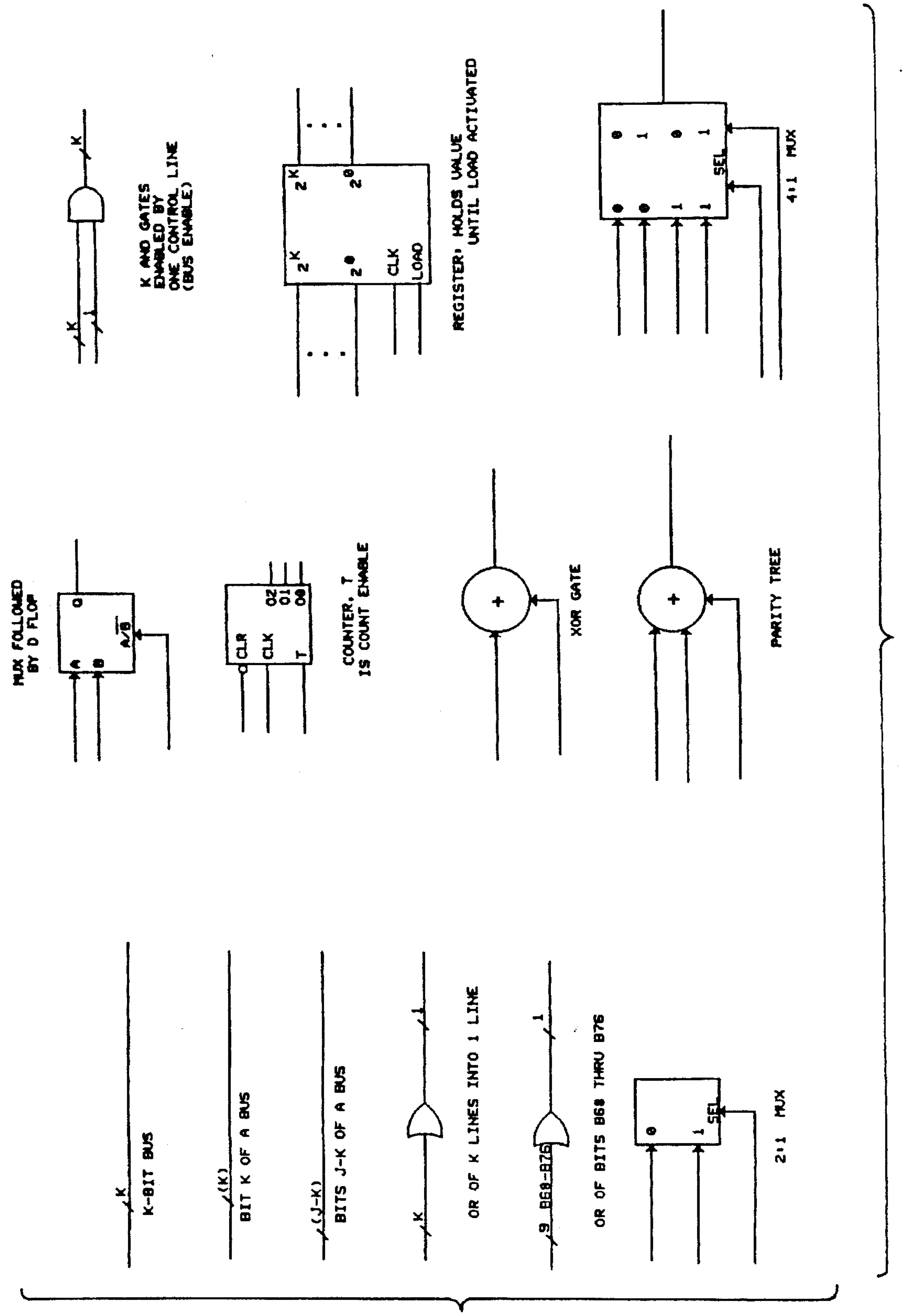
Figure 67:
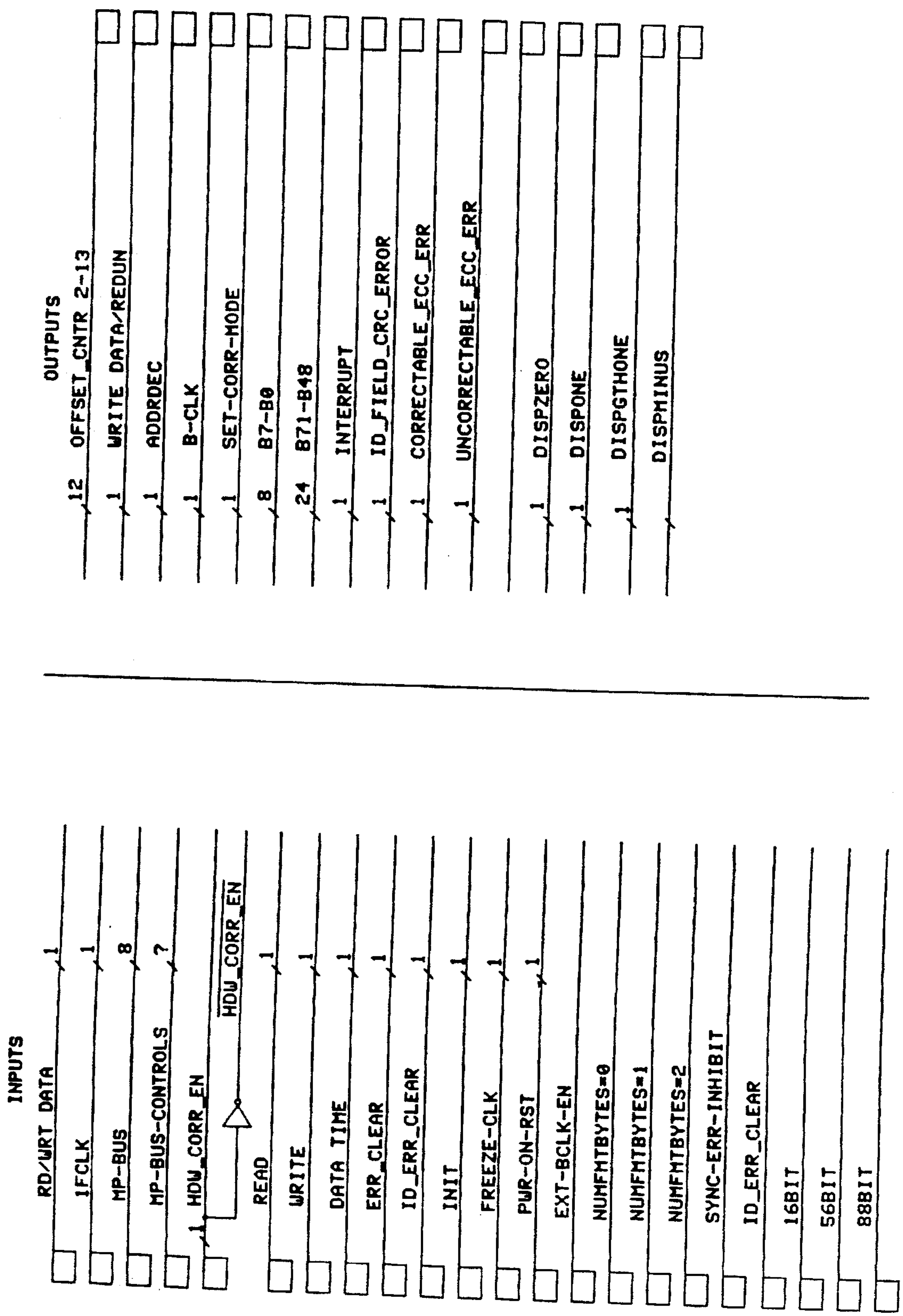
Figure 68:
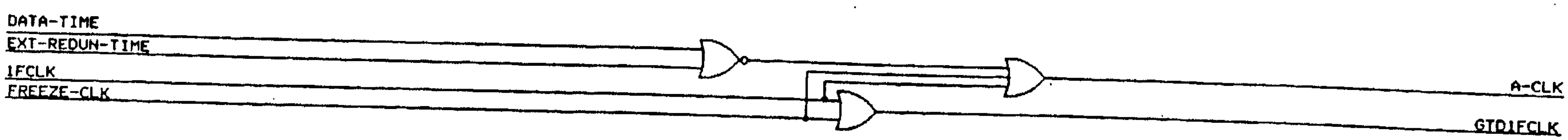
Figure 69:
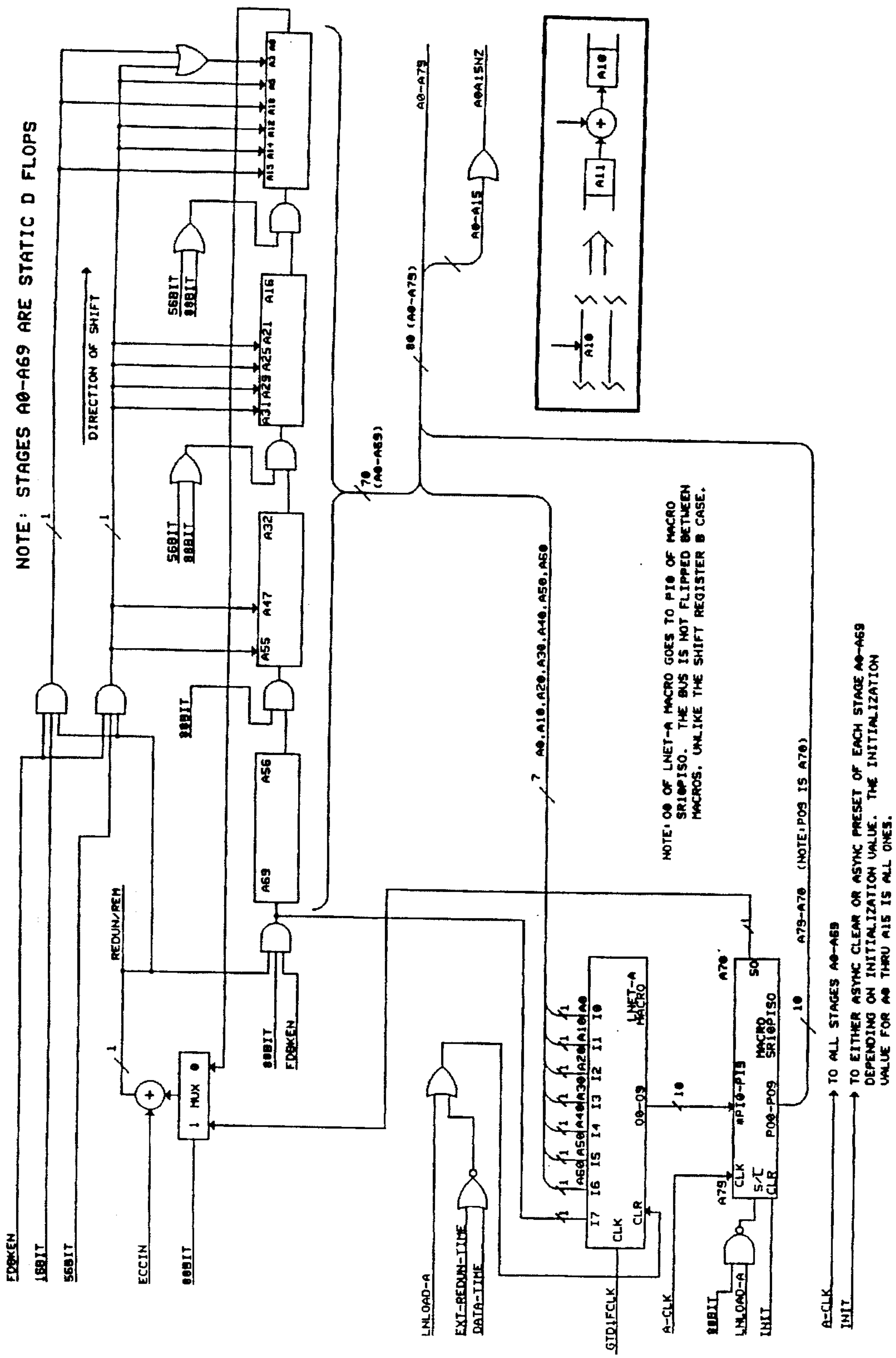
Figure 70:
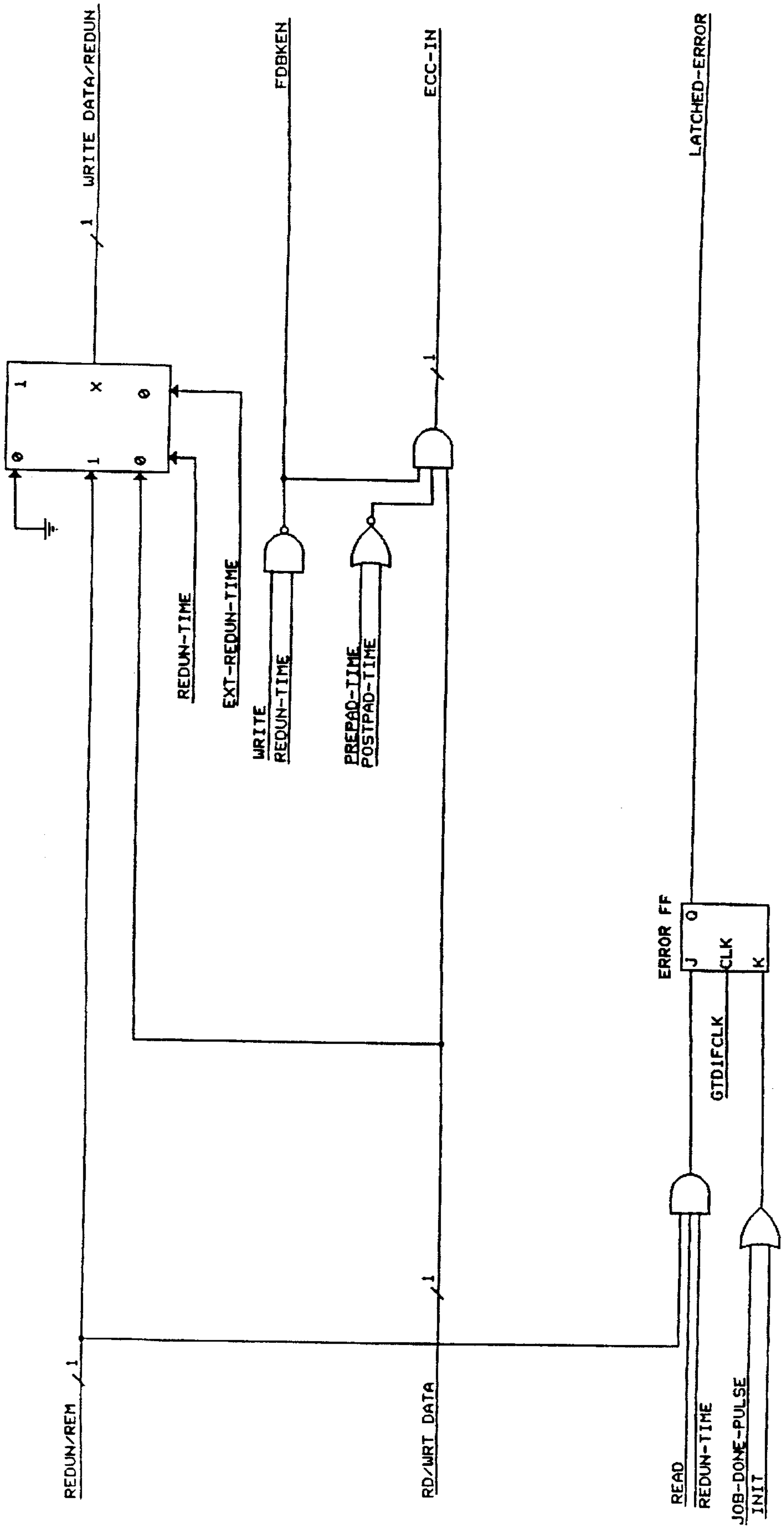
Figure 71:
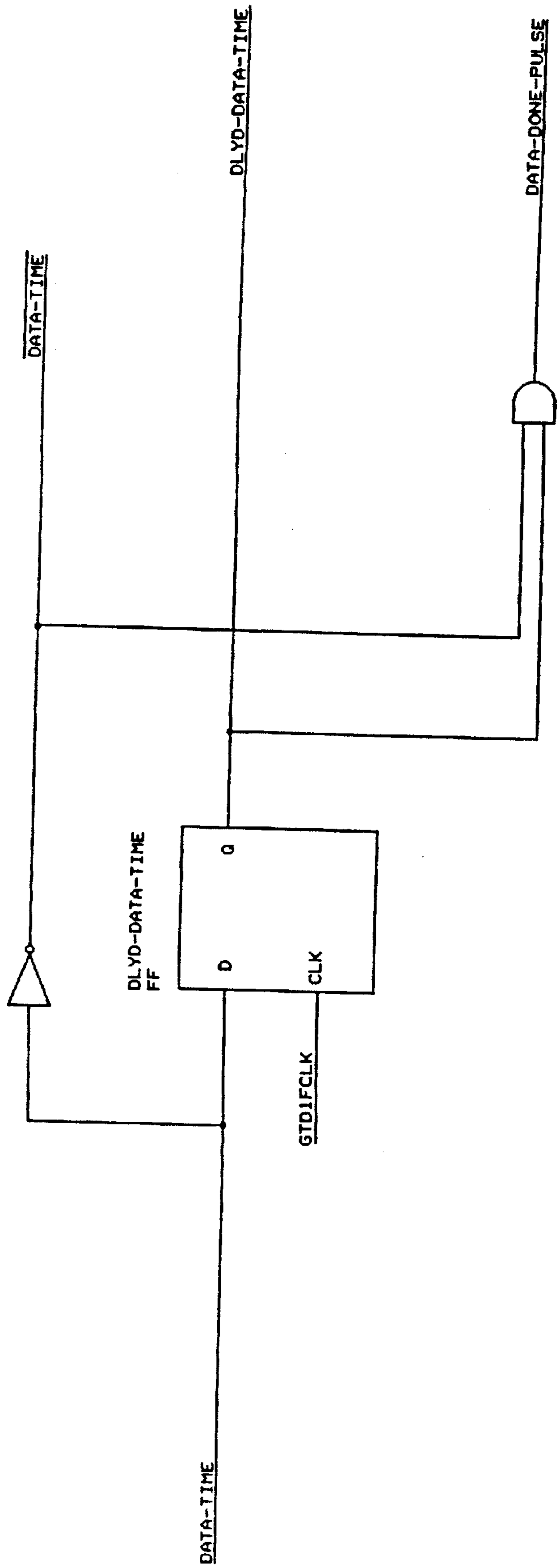
Figure 72:
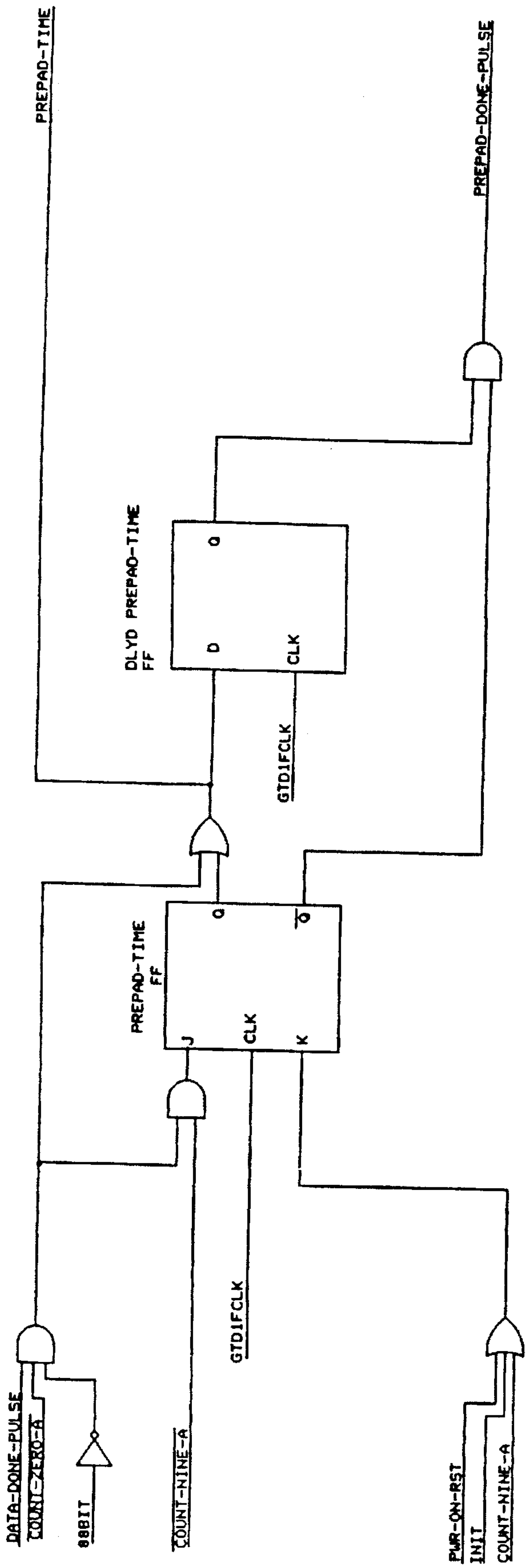
Figure 73:
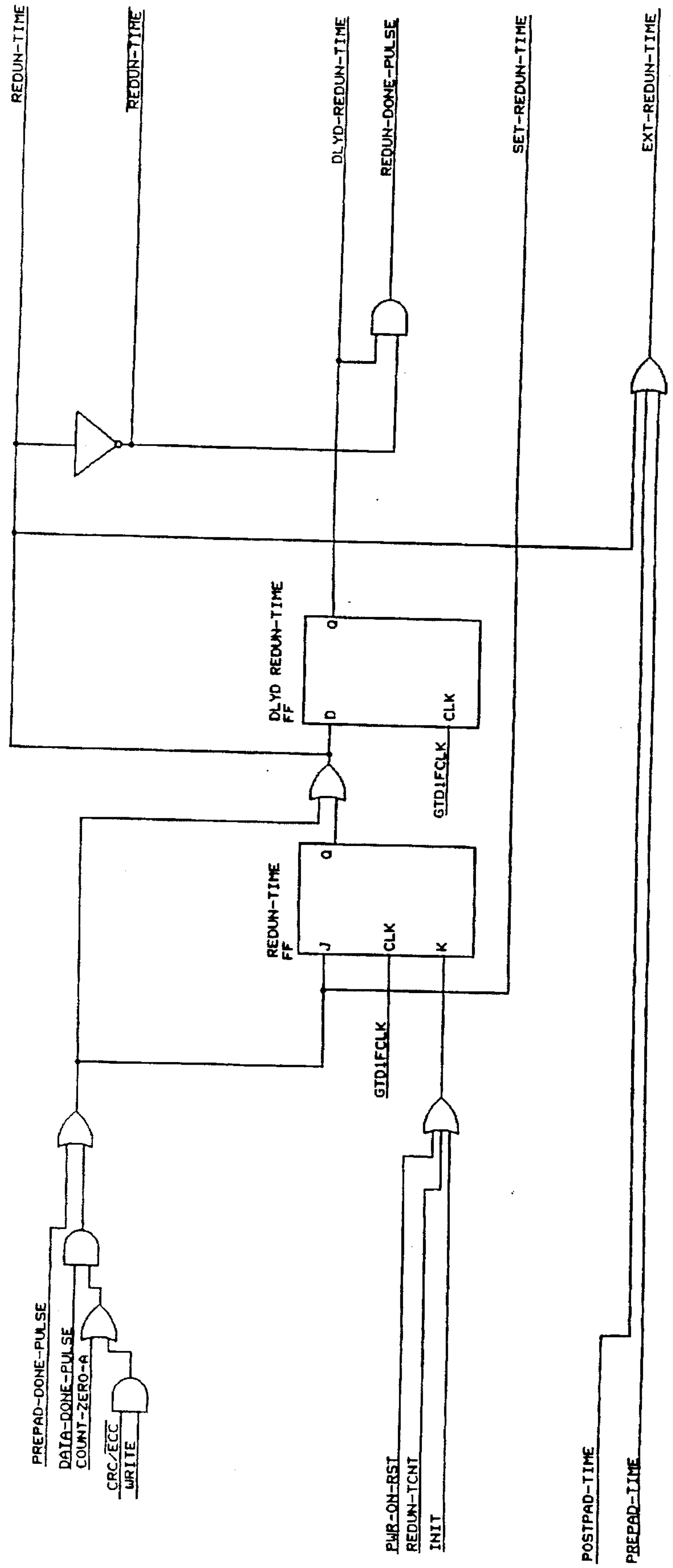
Figure 74:
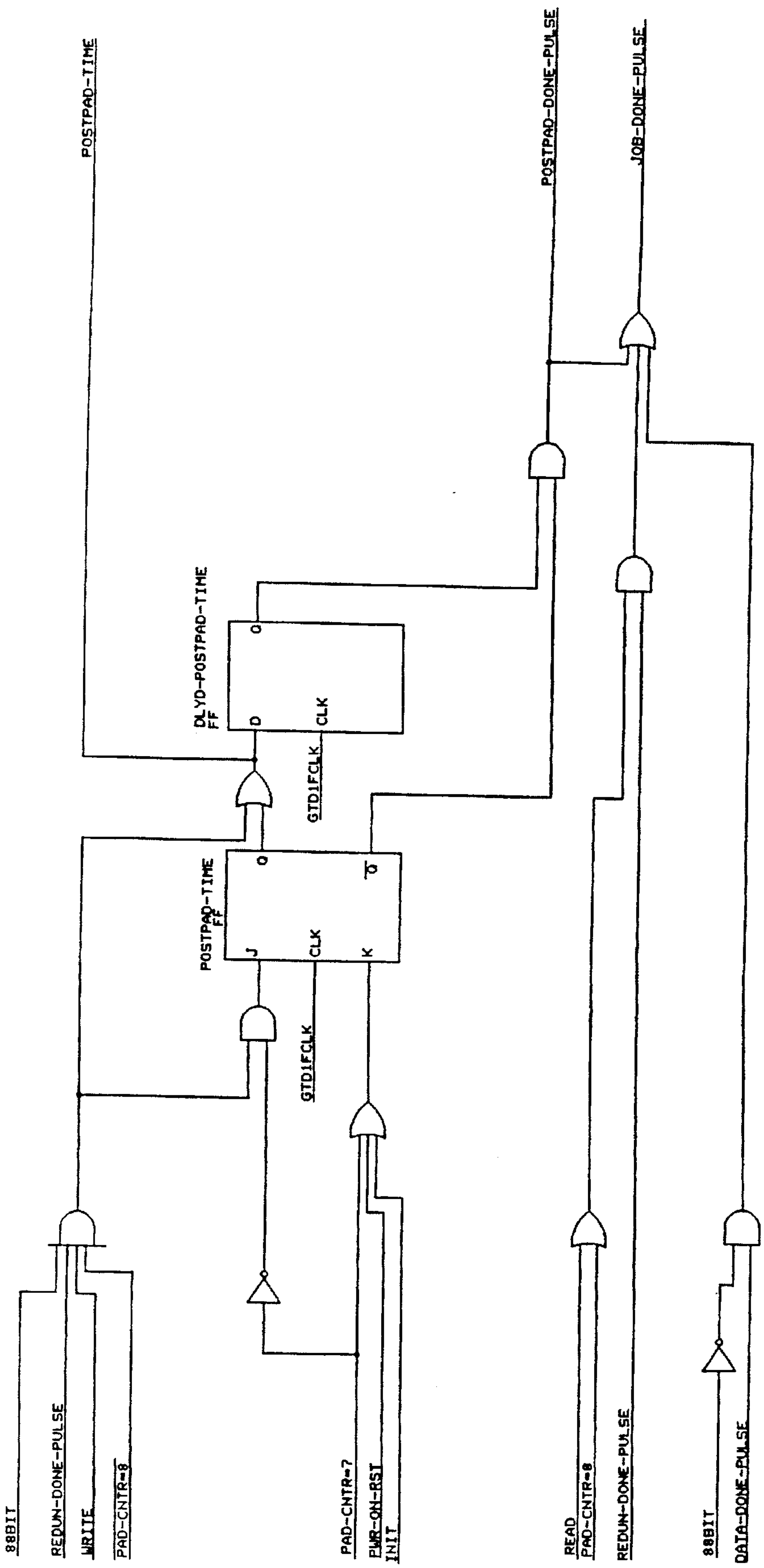
Figure 75:
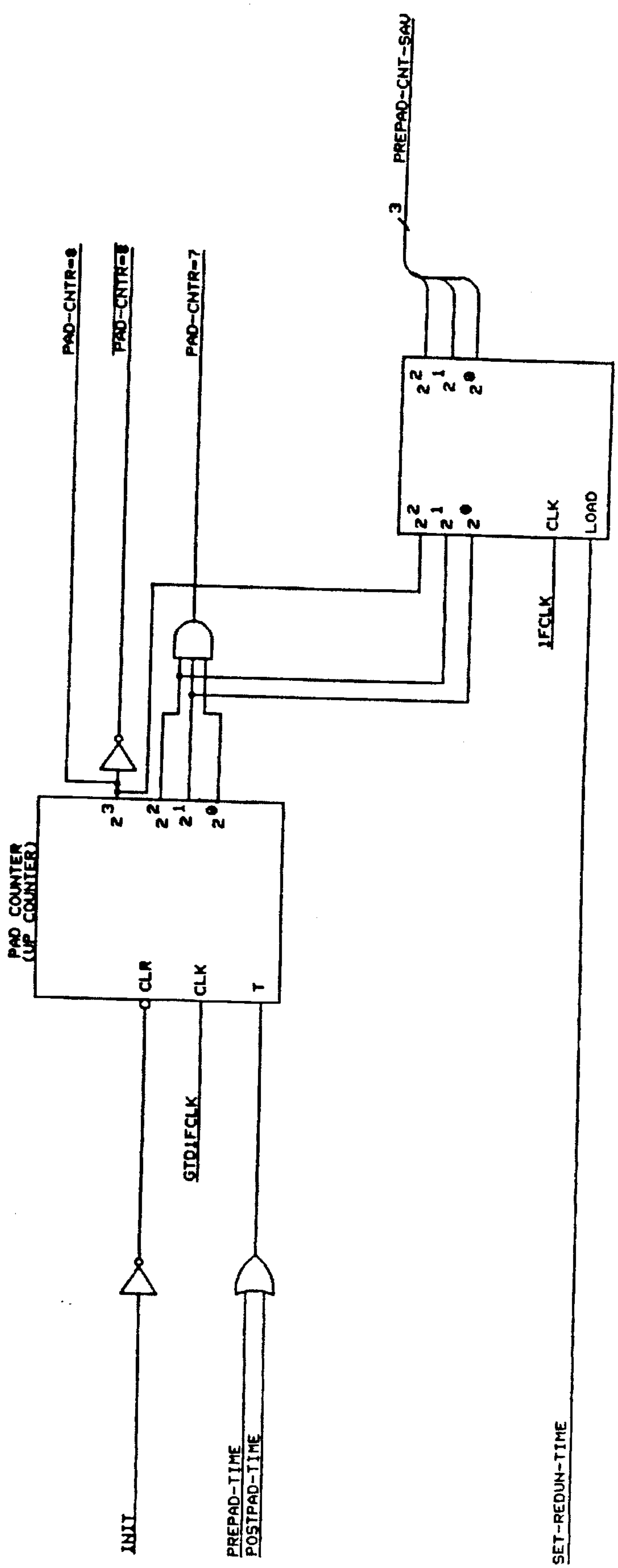
Figure 76:
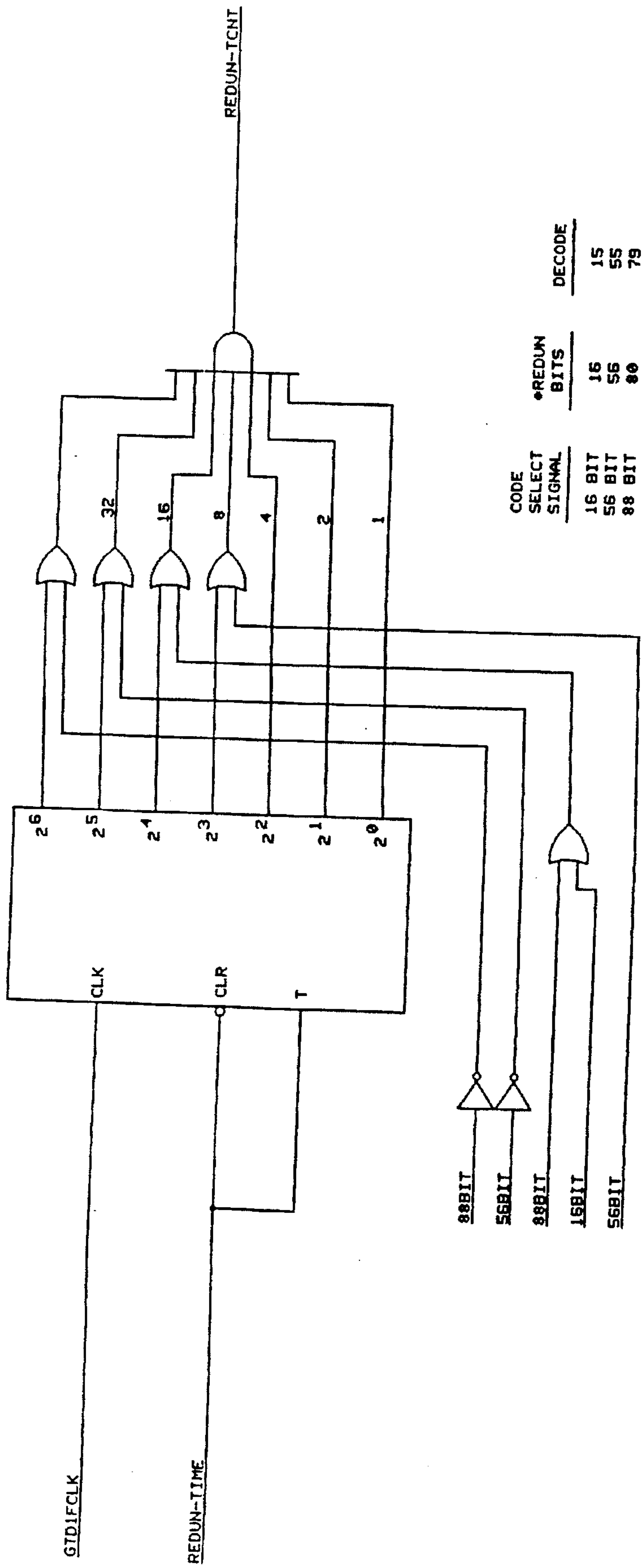
Figure 77:
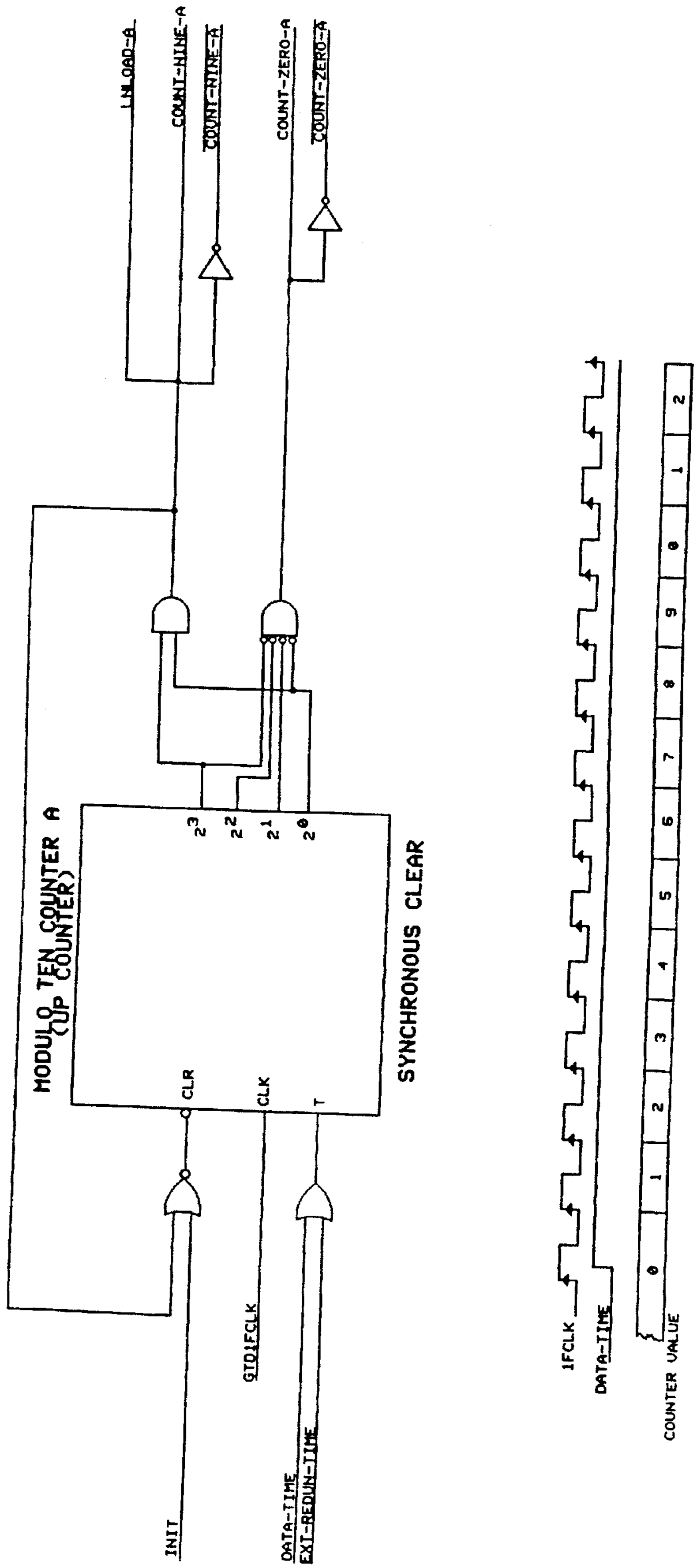
Figure 78:
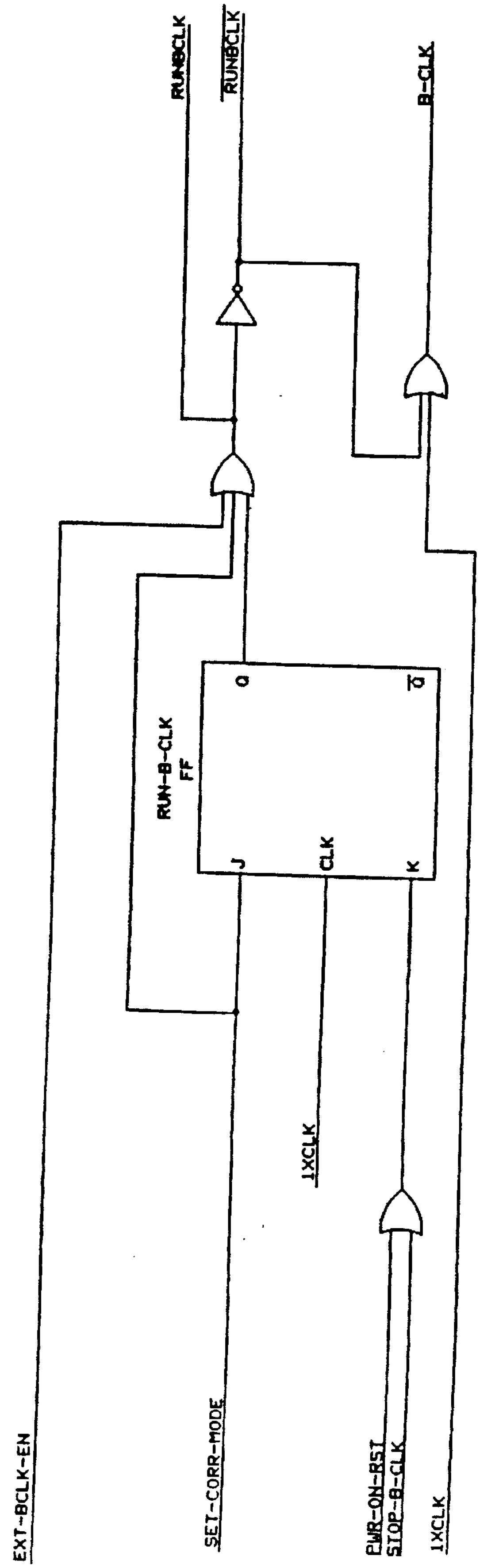
Figure 79:
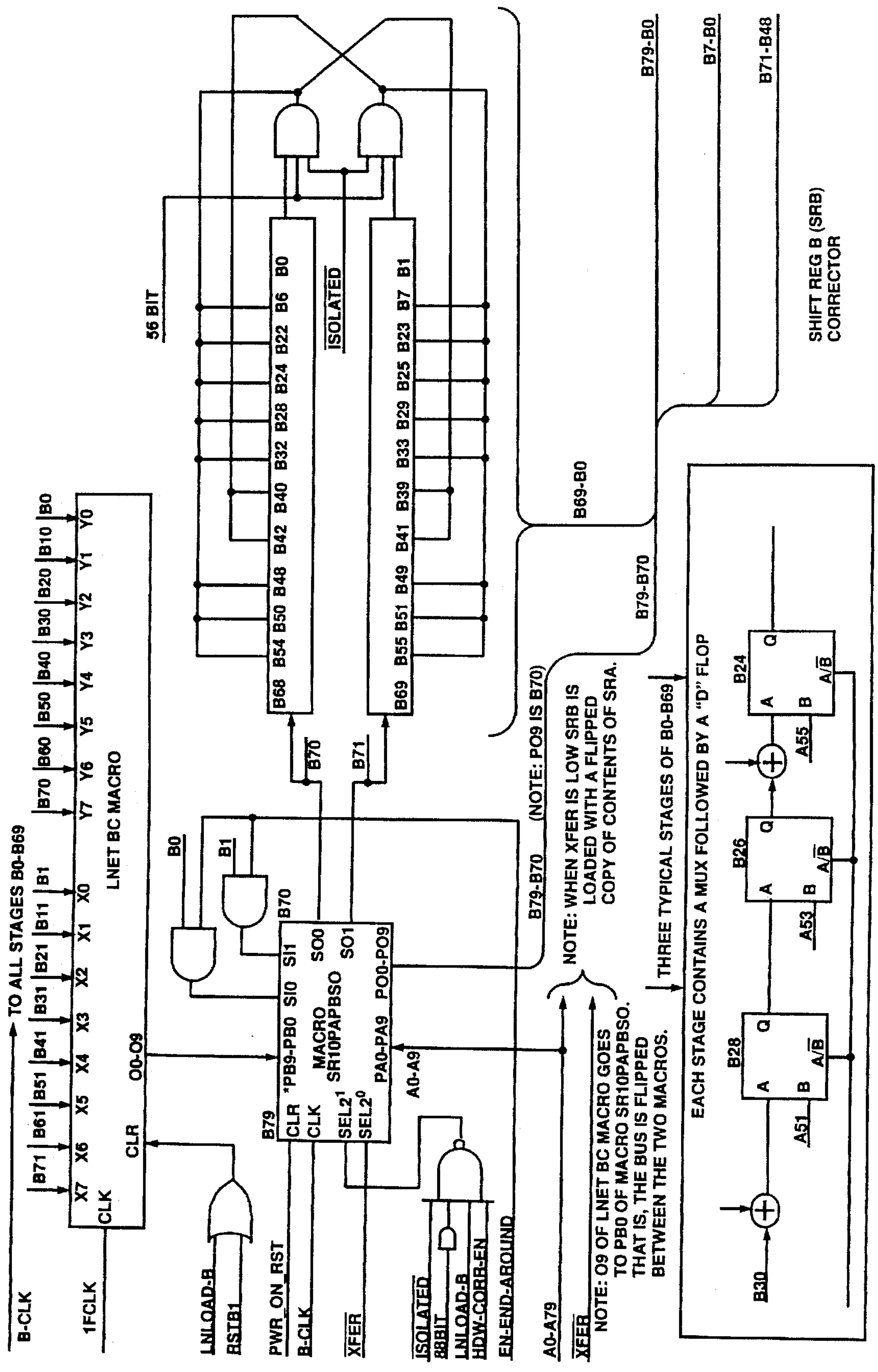
Figure 80:
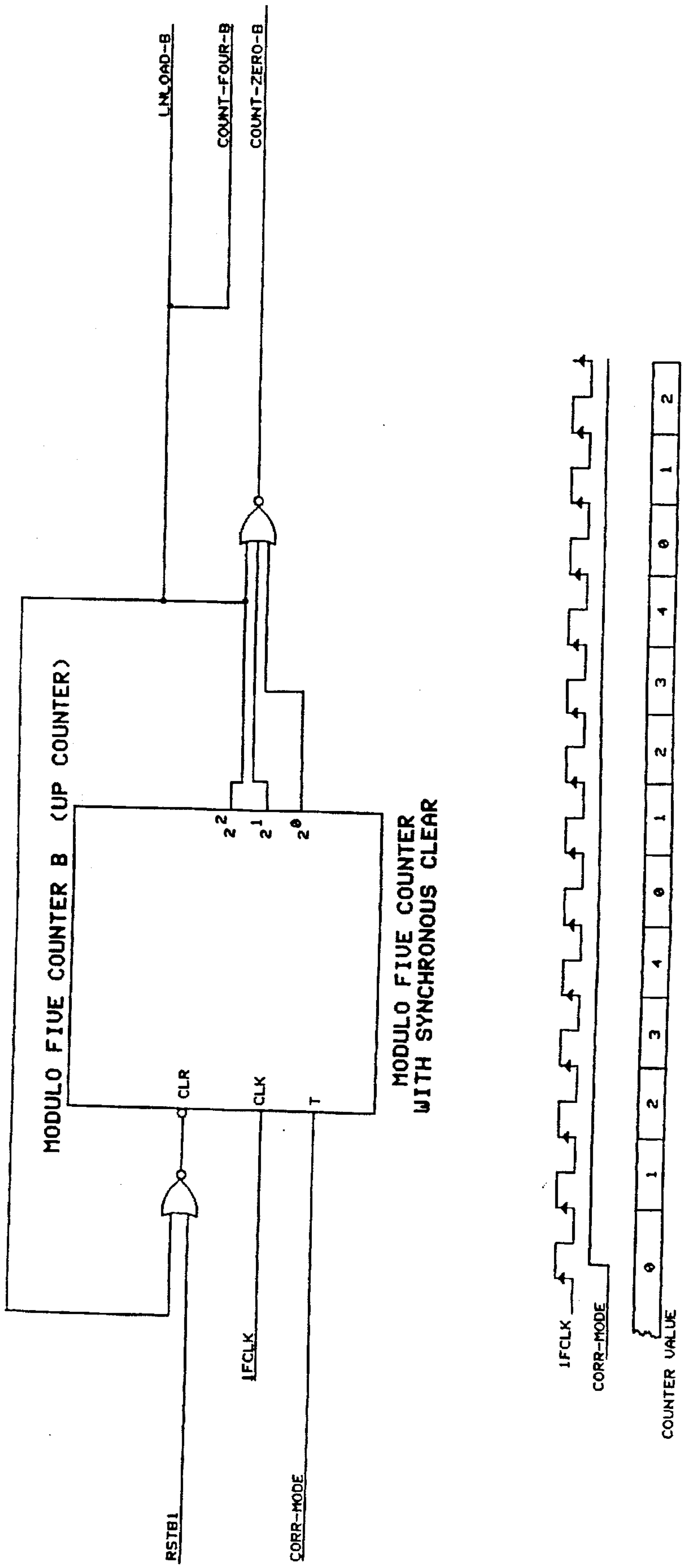
Figure 81:
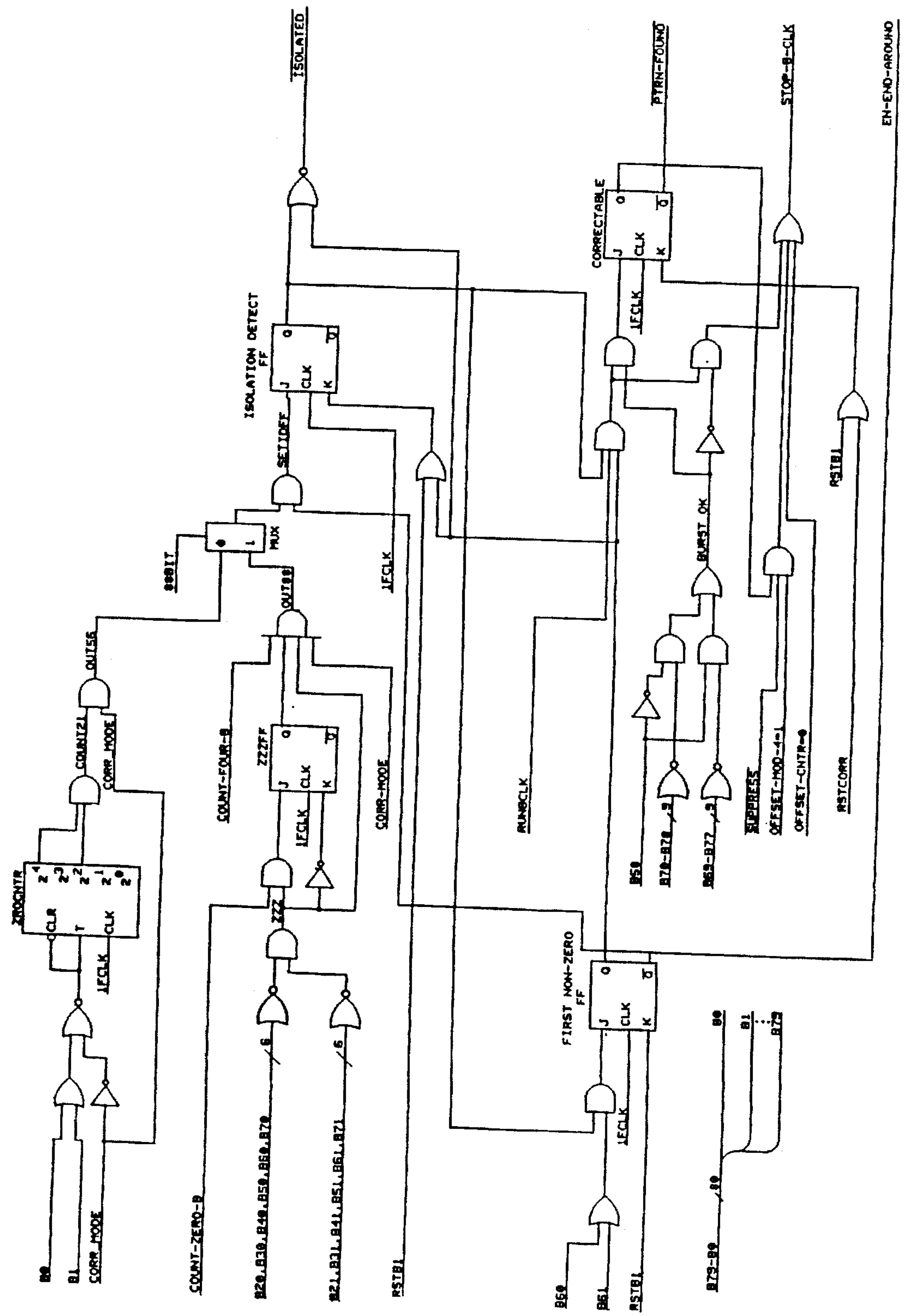
Figure 82:
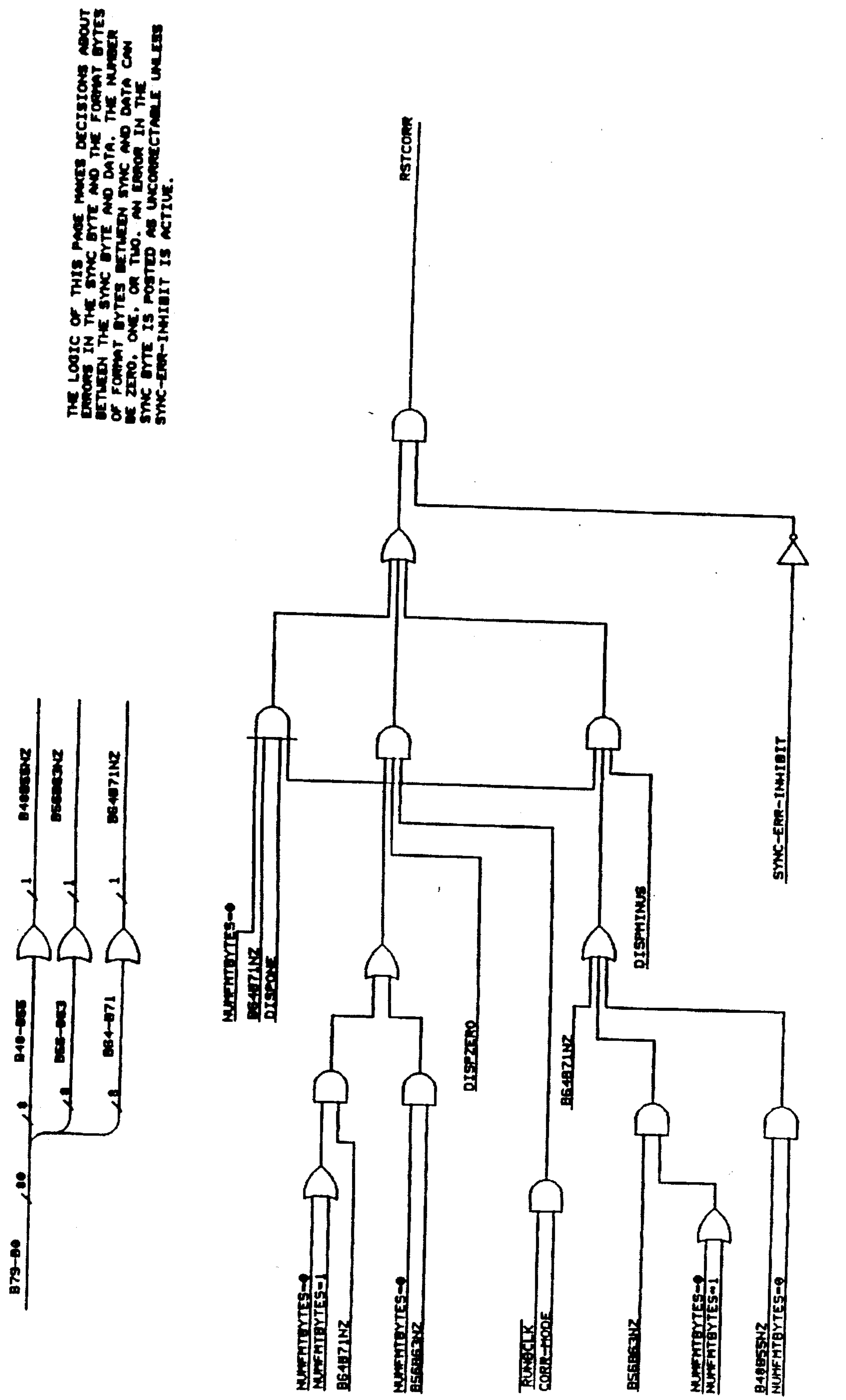
Figure 83:
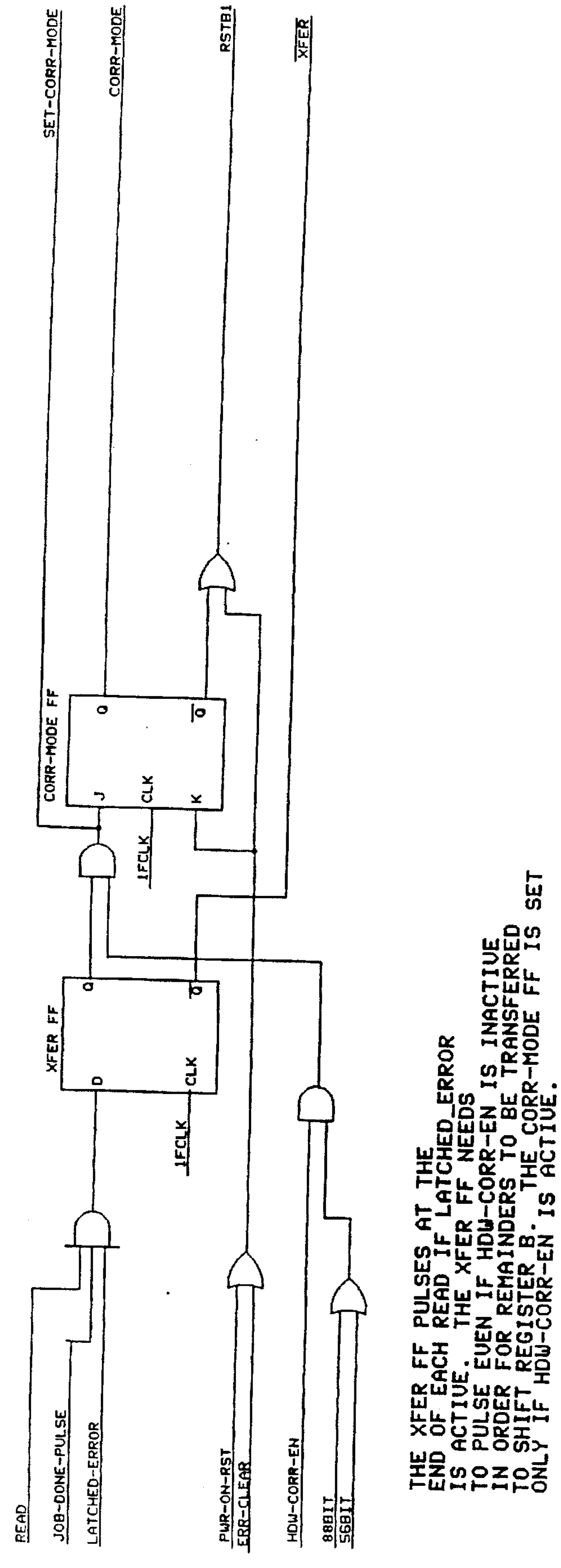
Figure 84:
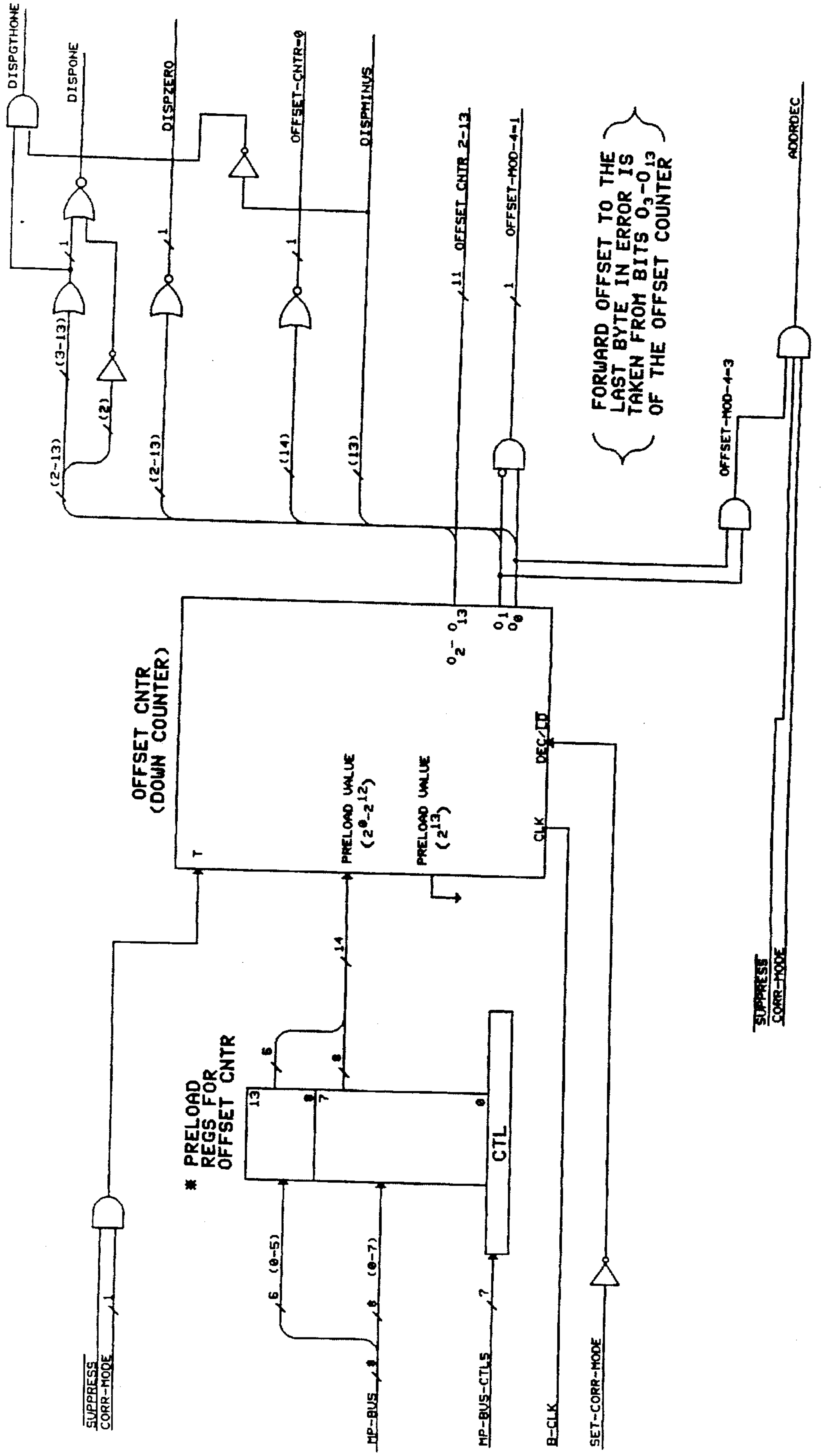
Figure 85:
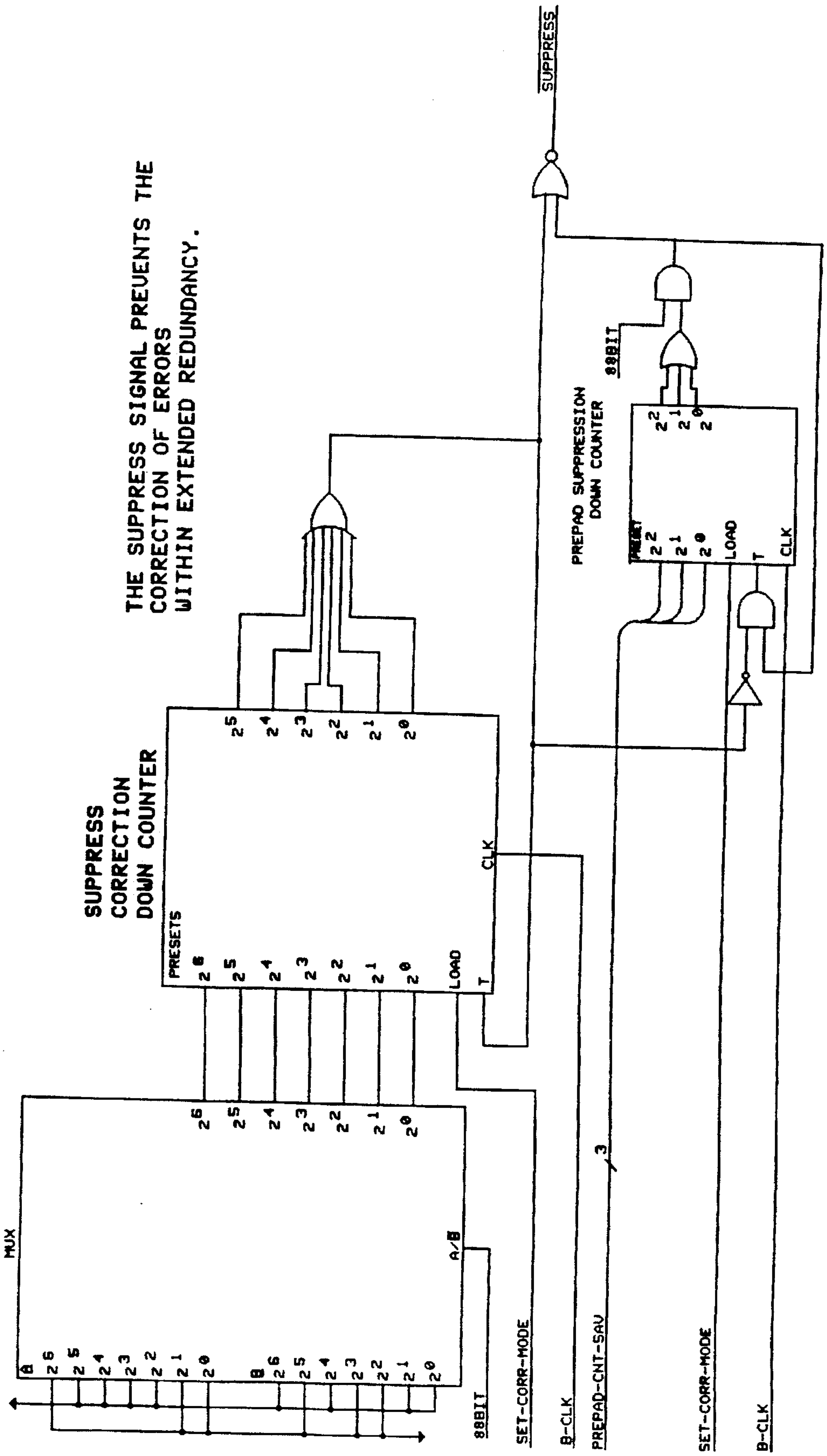
Figure 86:
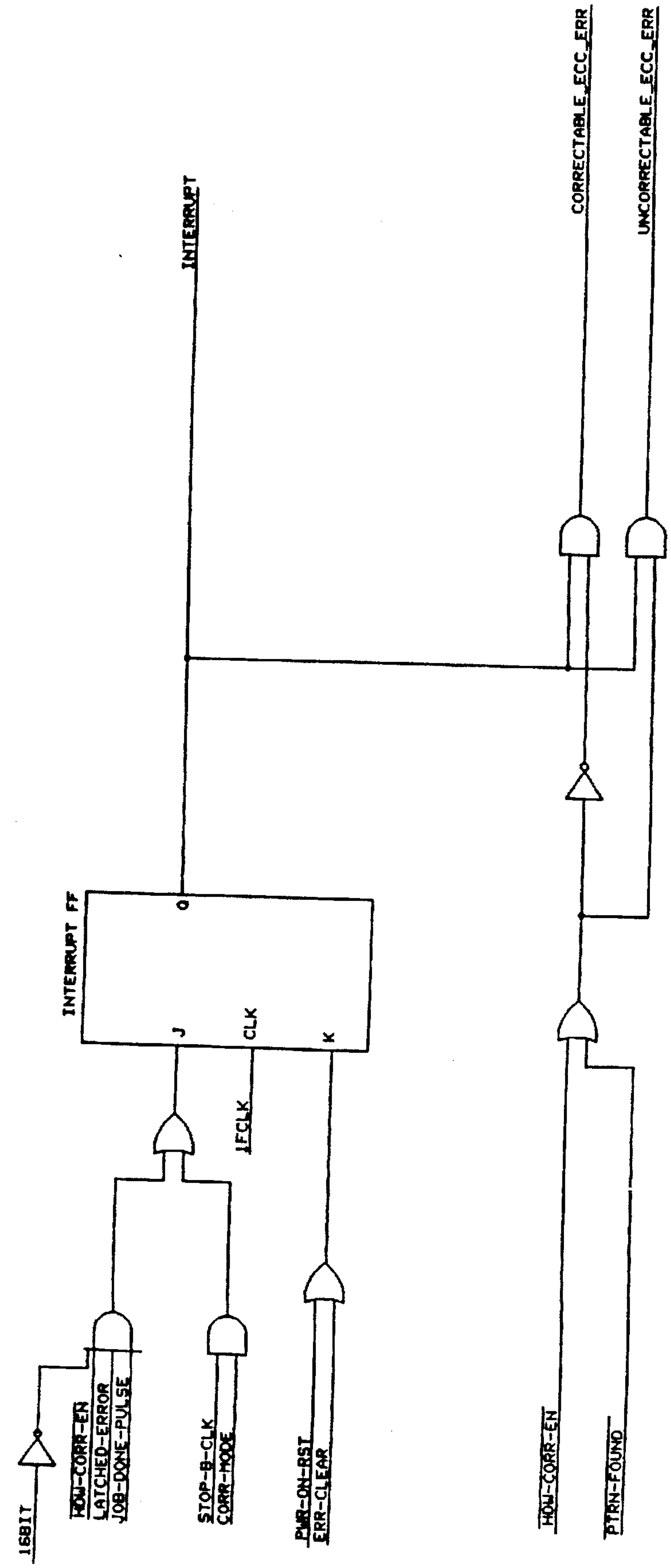
Figure 87:
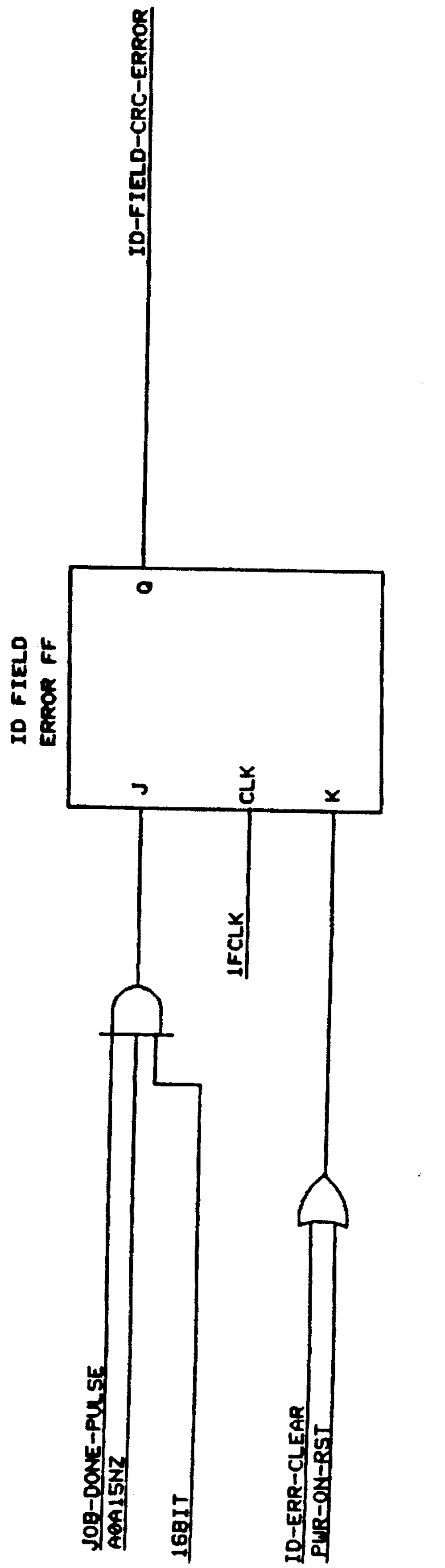
Figure 88:
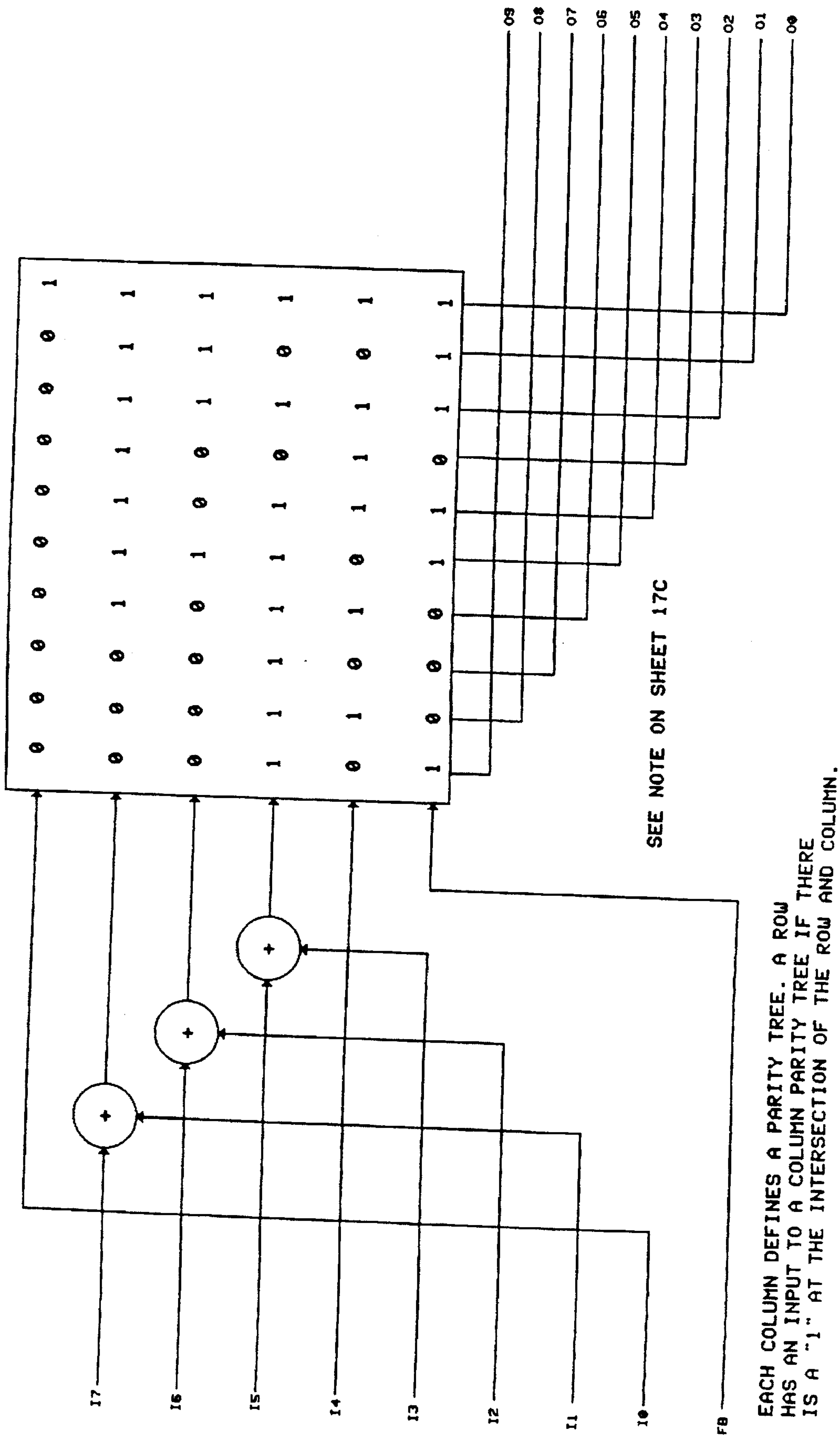
Figure 89:
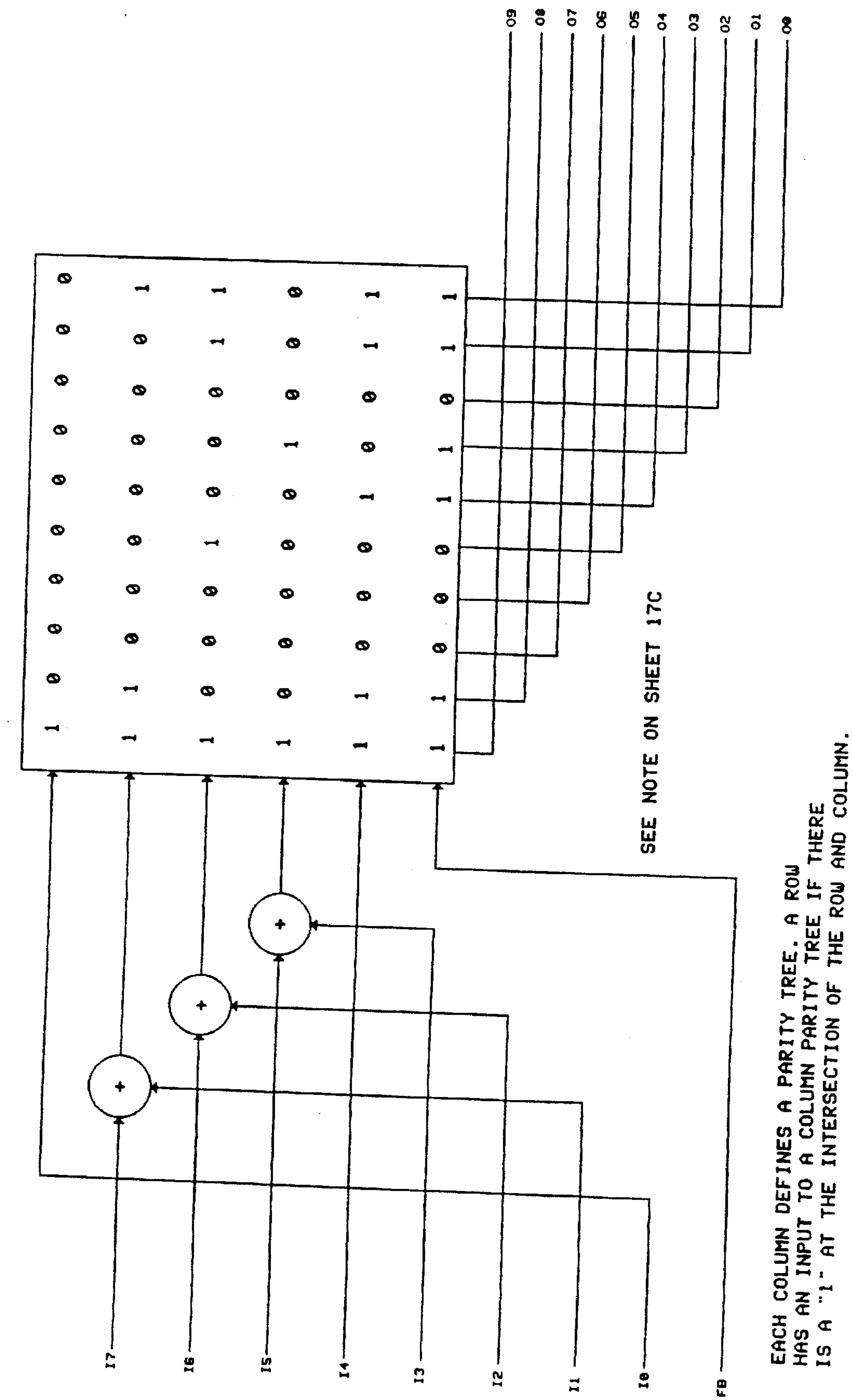
Figure 90:
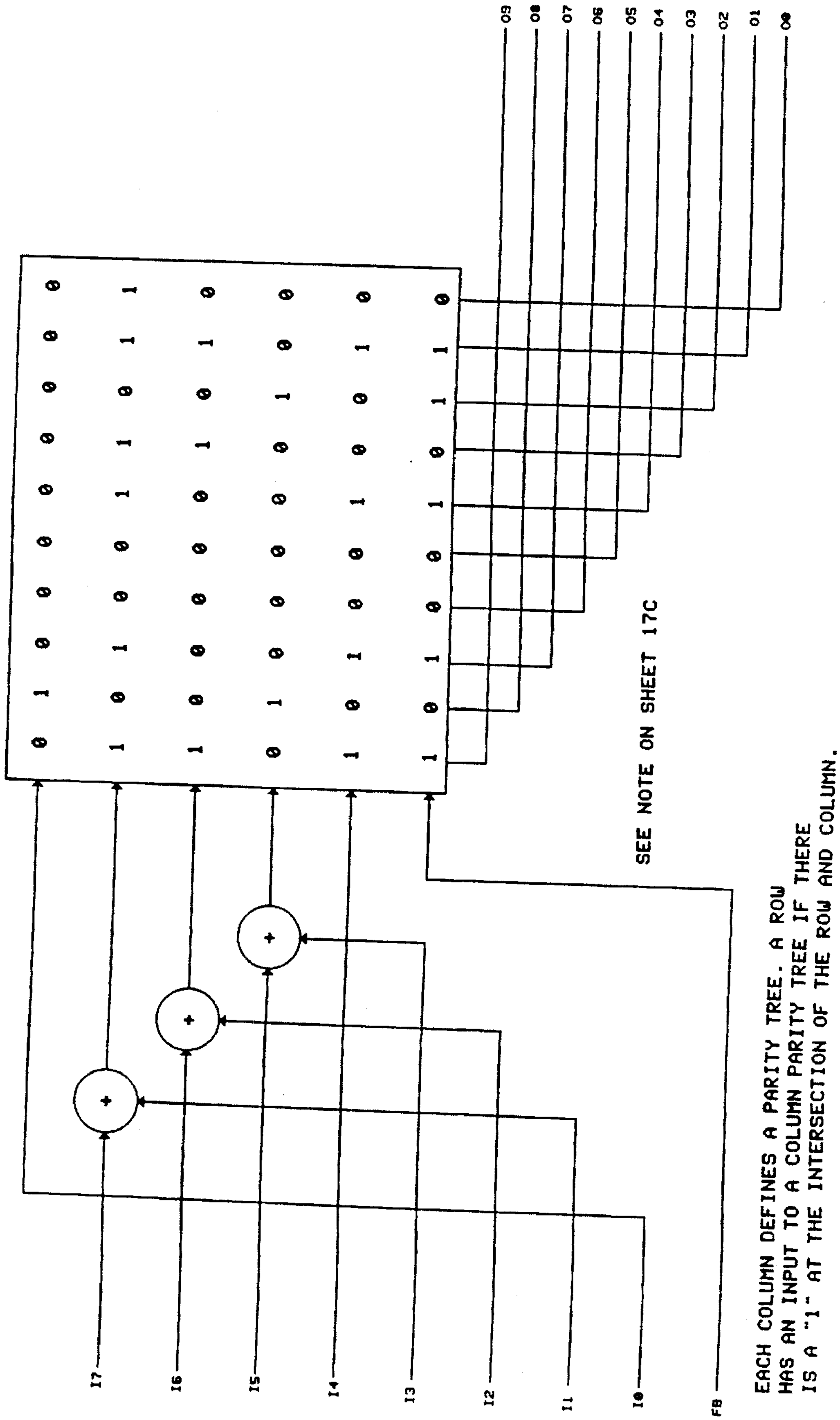
Figure 91:
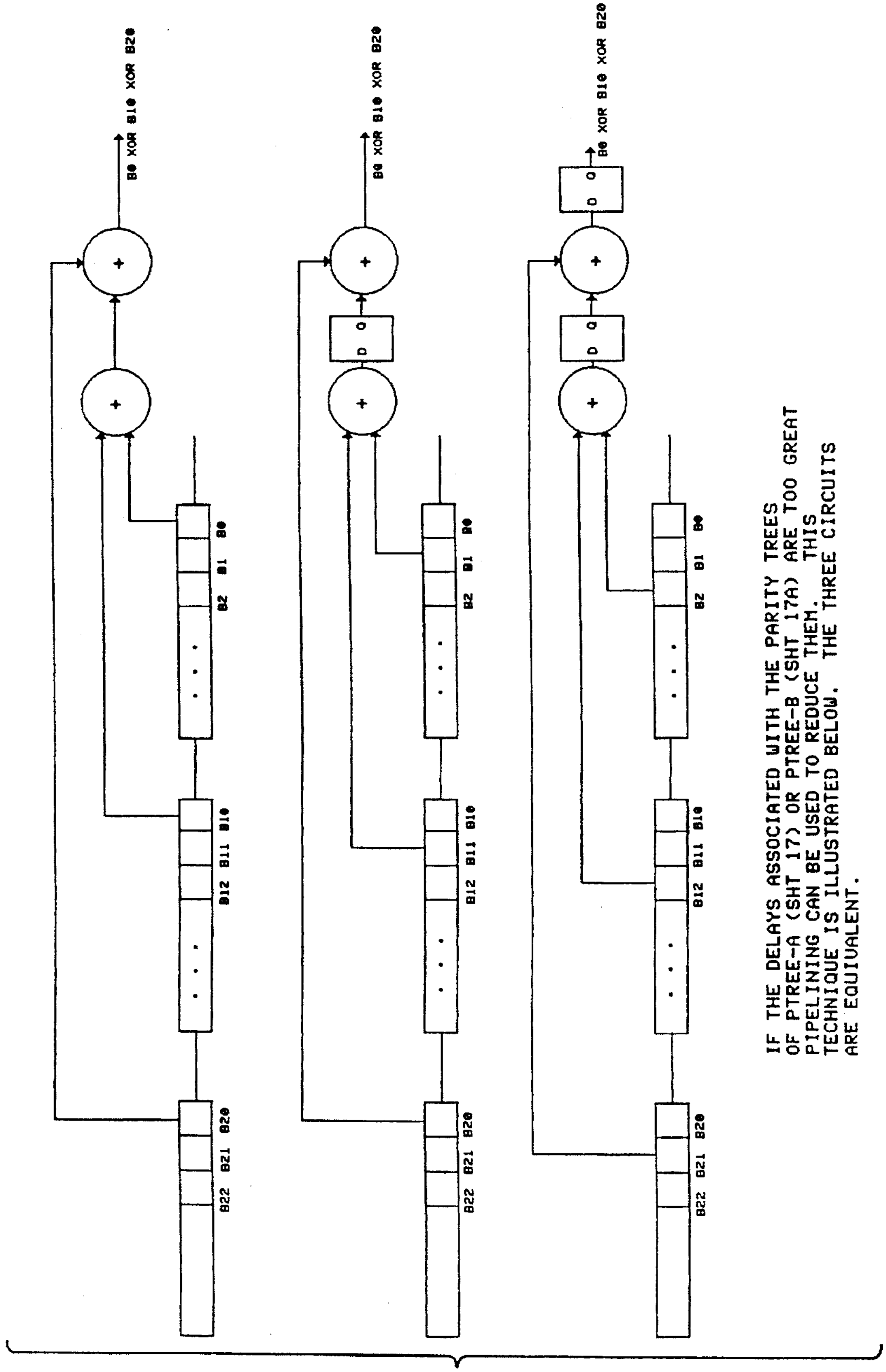
Figure 92:
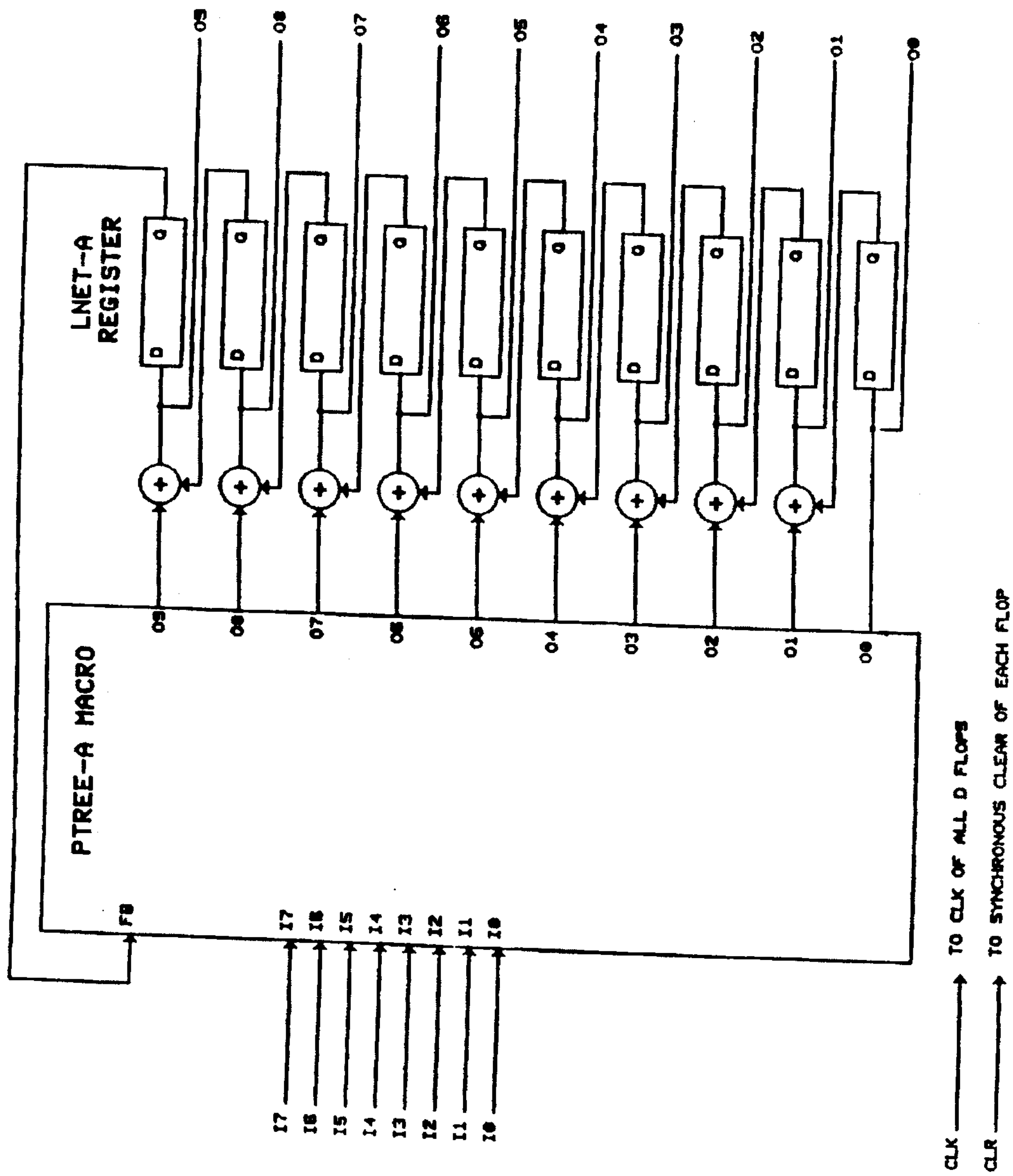
Figure 93:
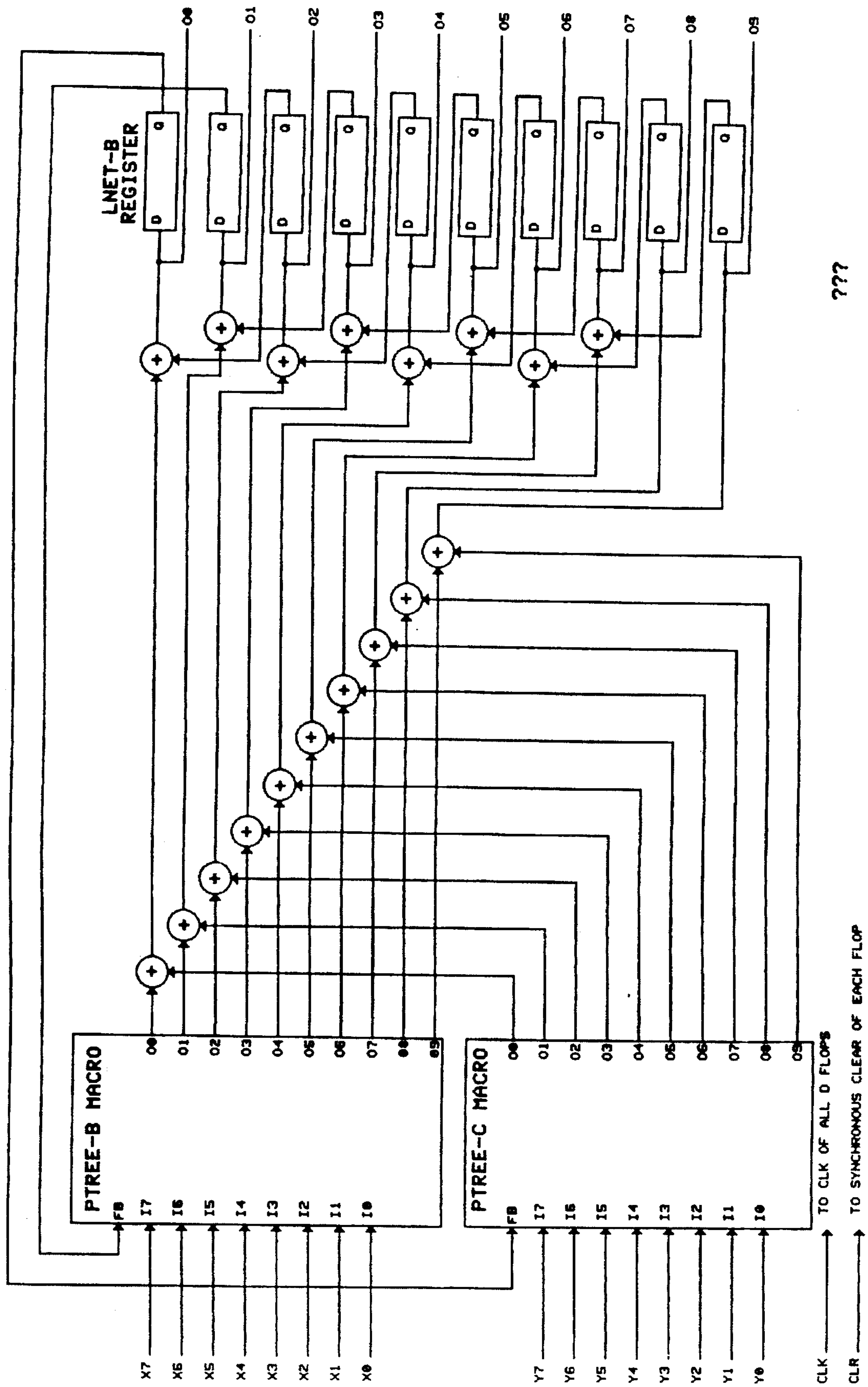
Figure 94:
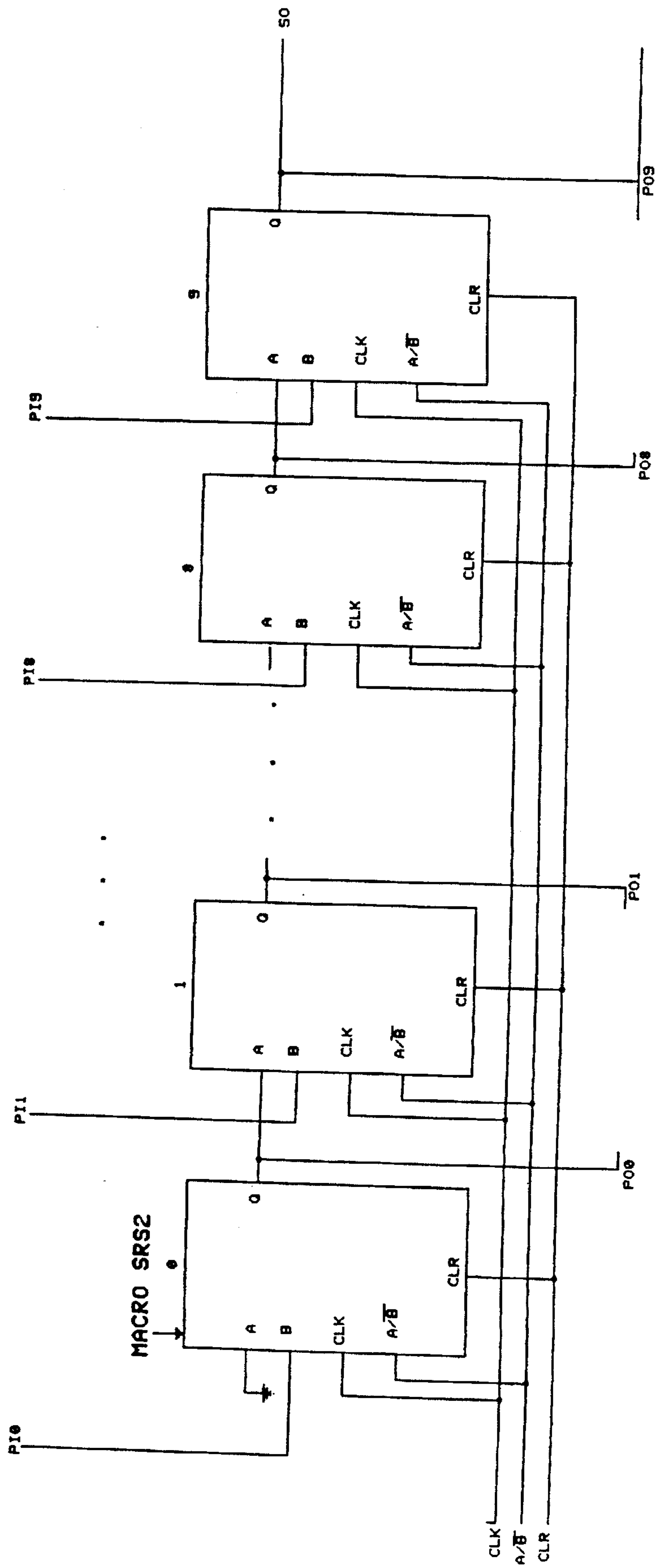
Figure 95:
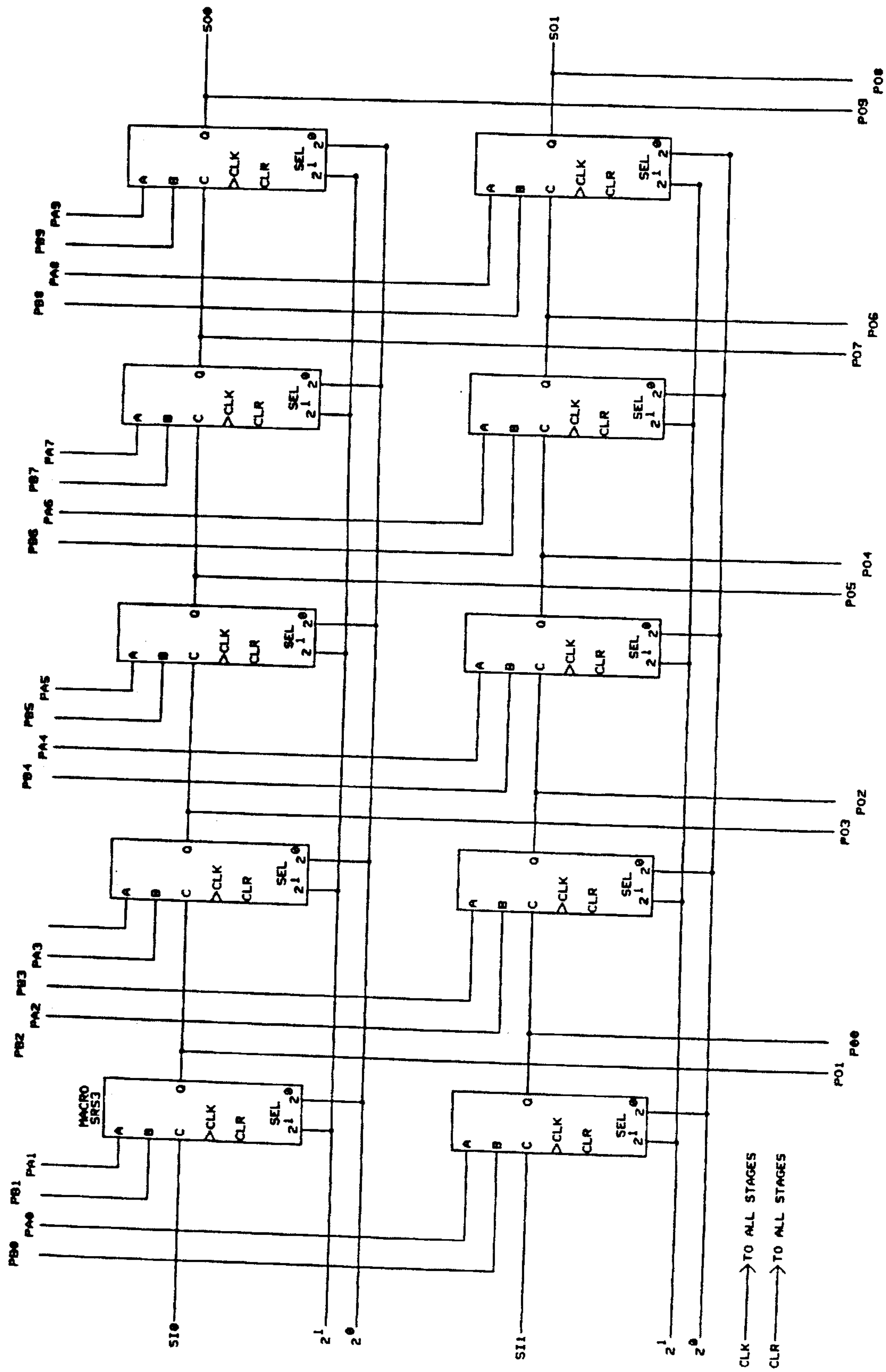
Figure 96:
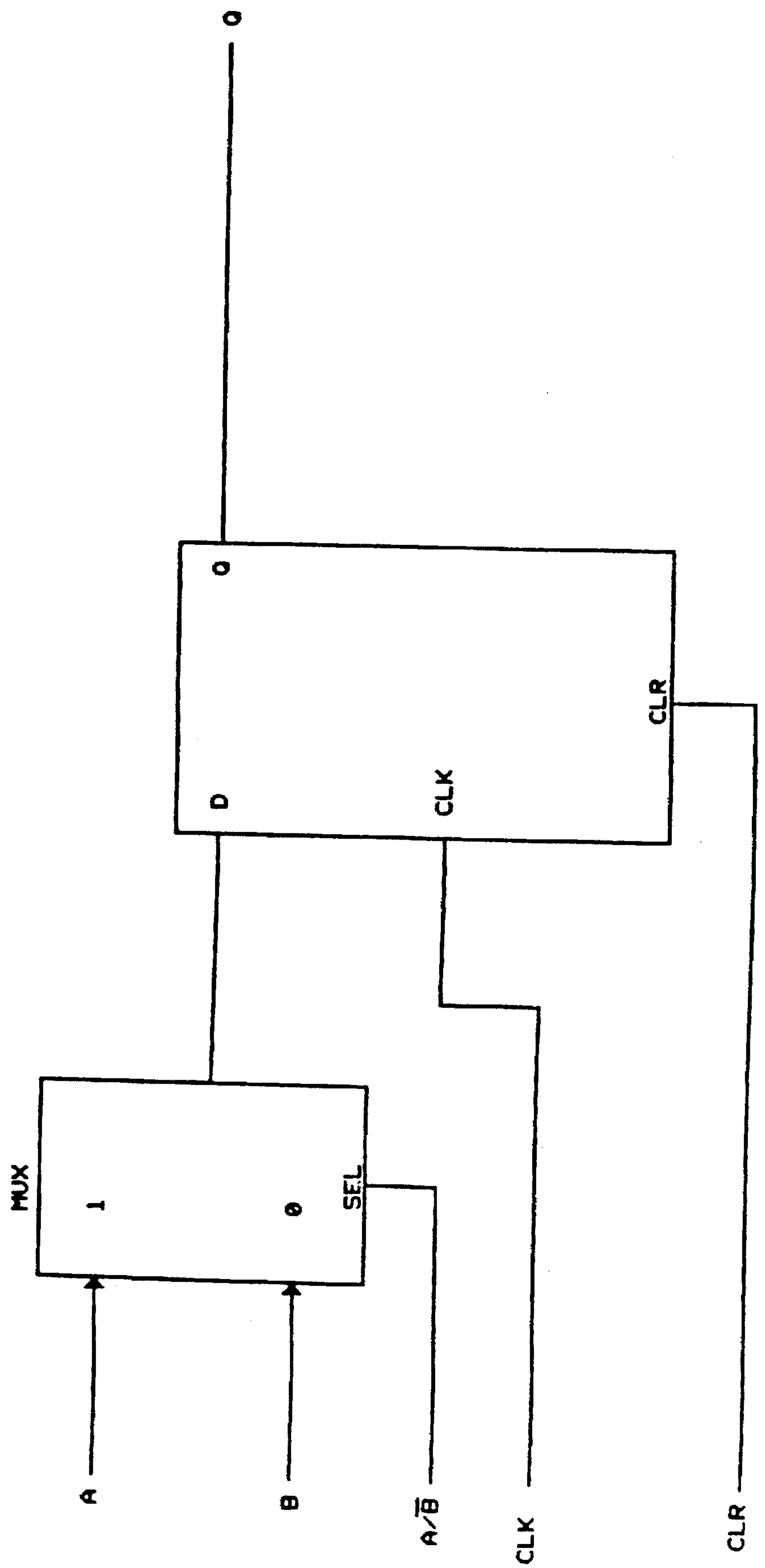
Figure 97:
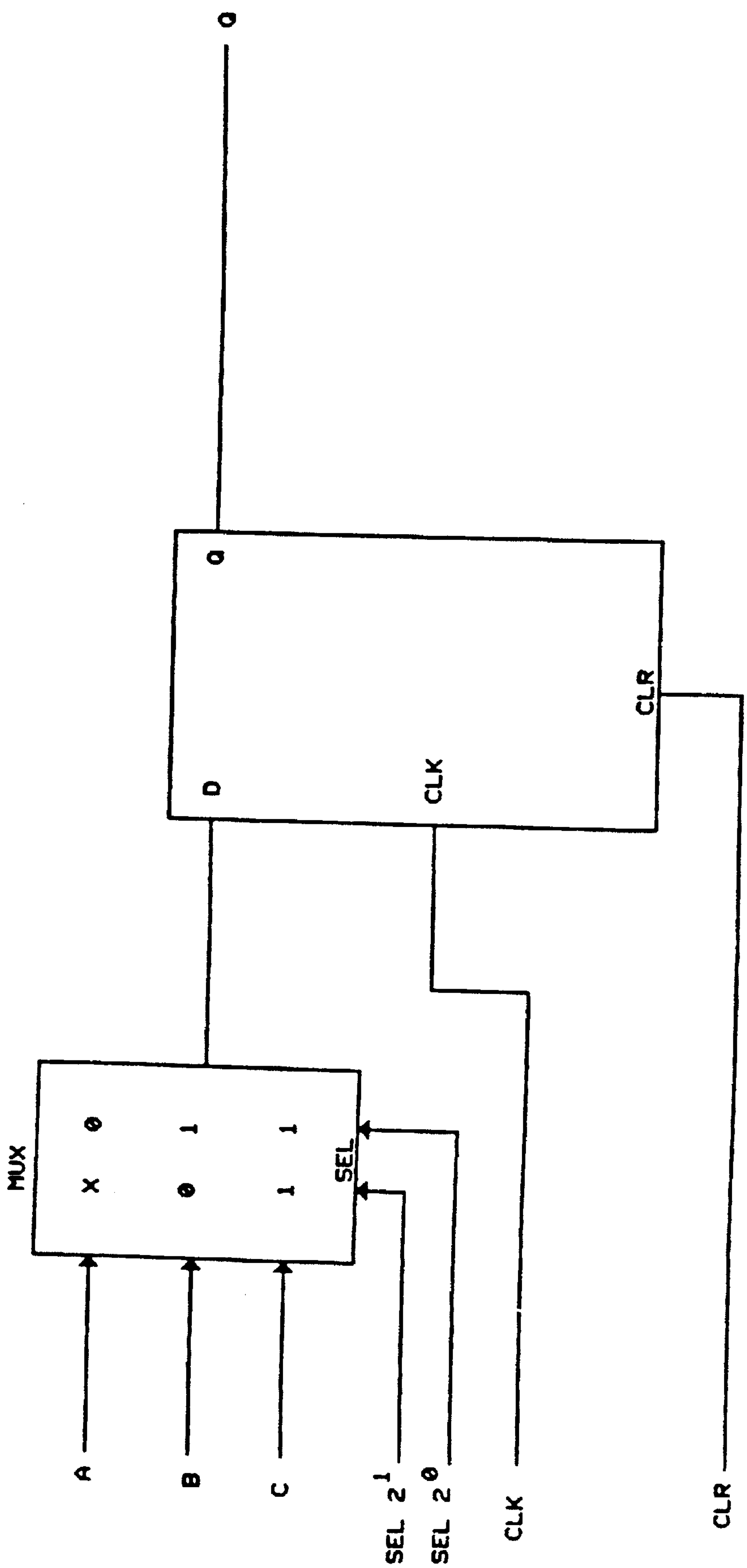
Figure 98:
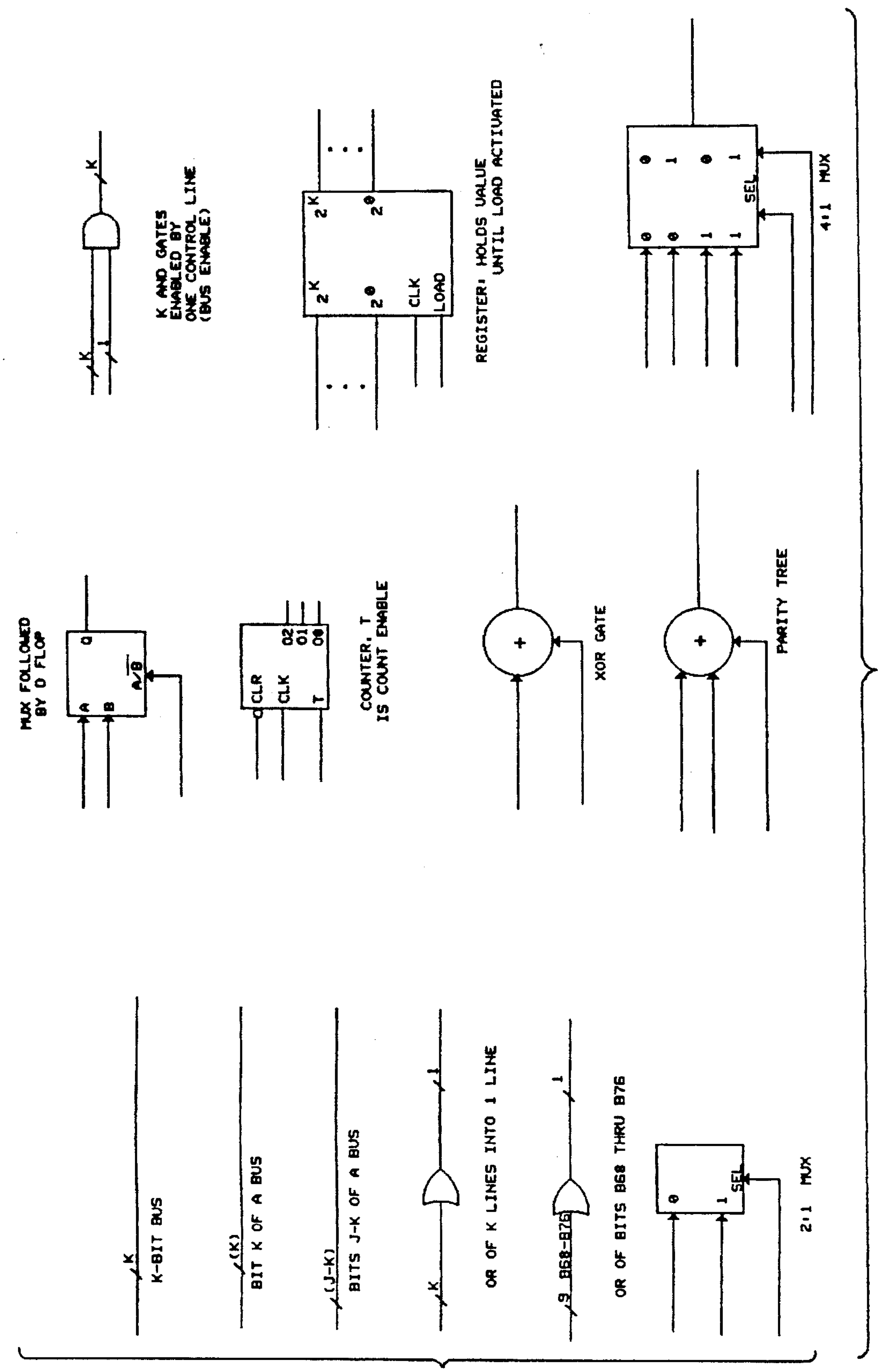
Figure 99:
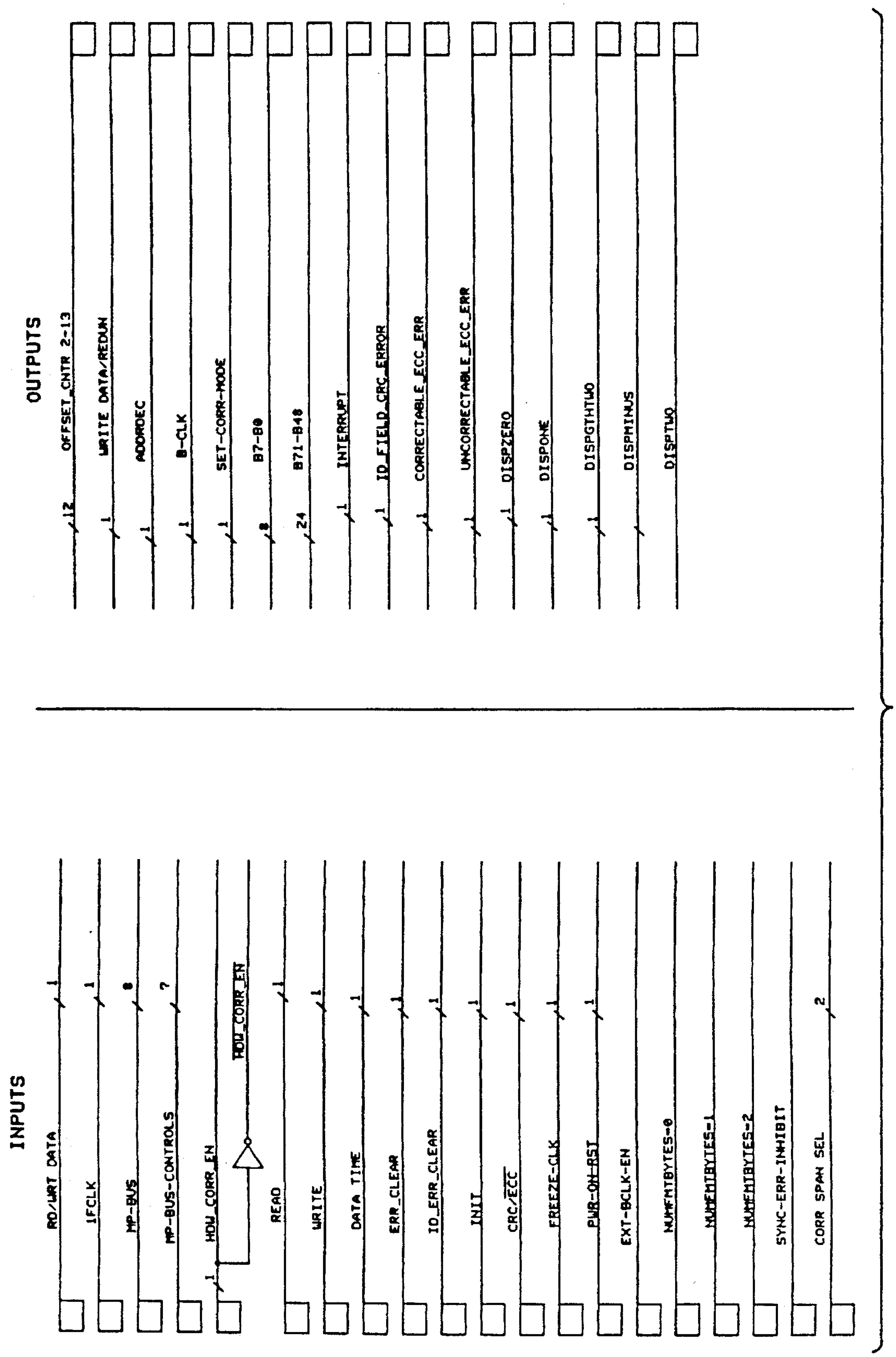
Figure 100:
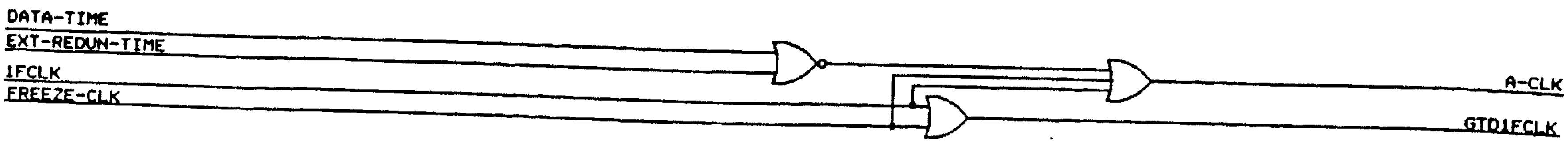
Figure 101:
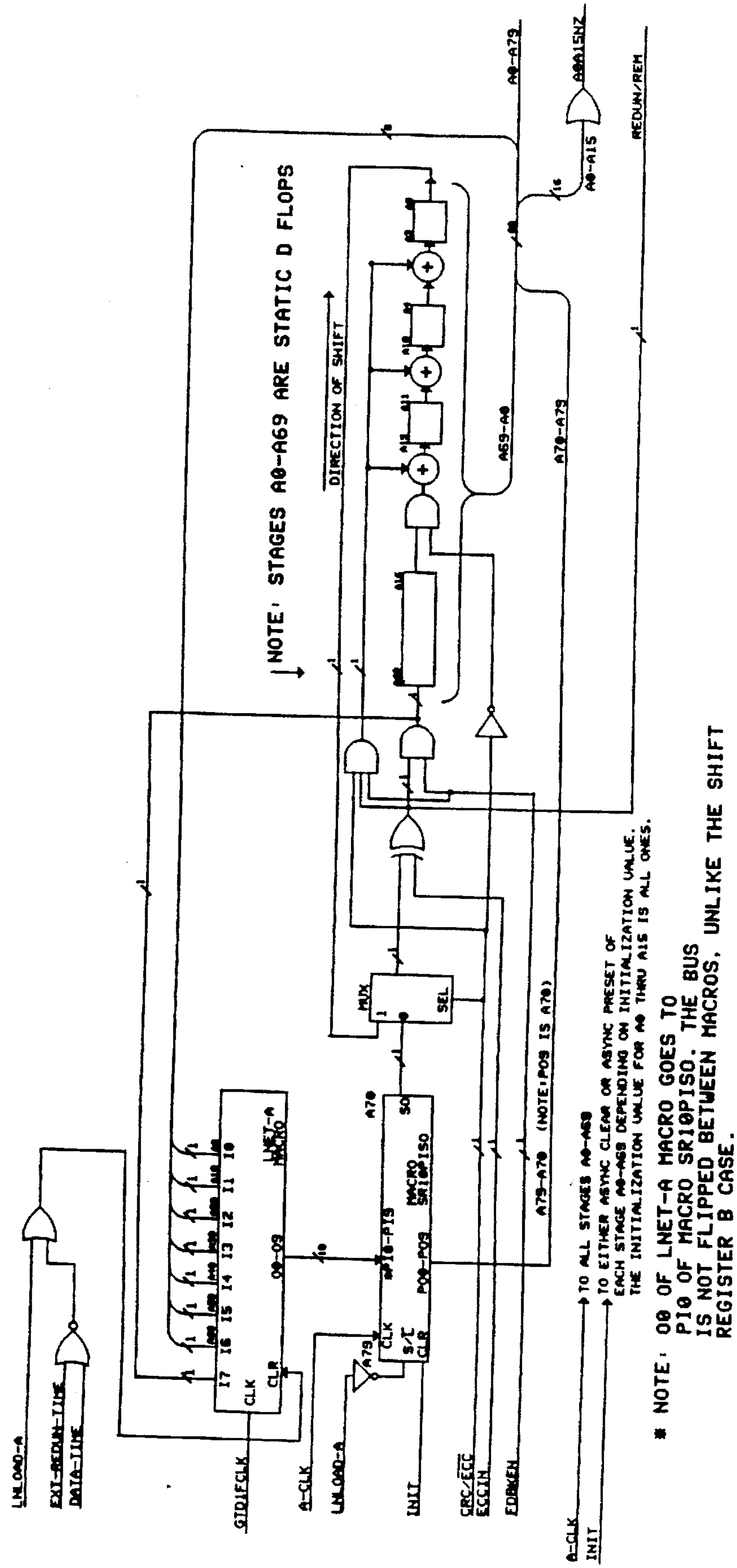
Figure 102:
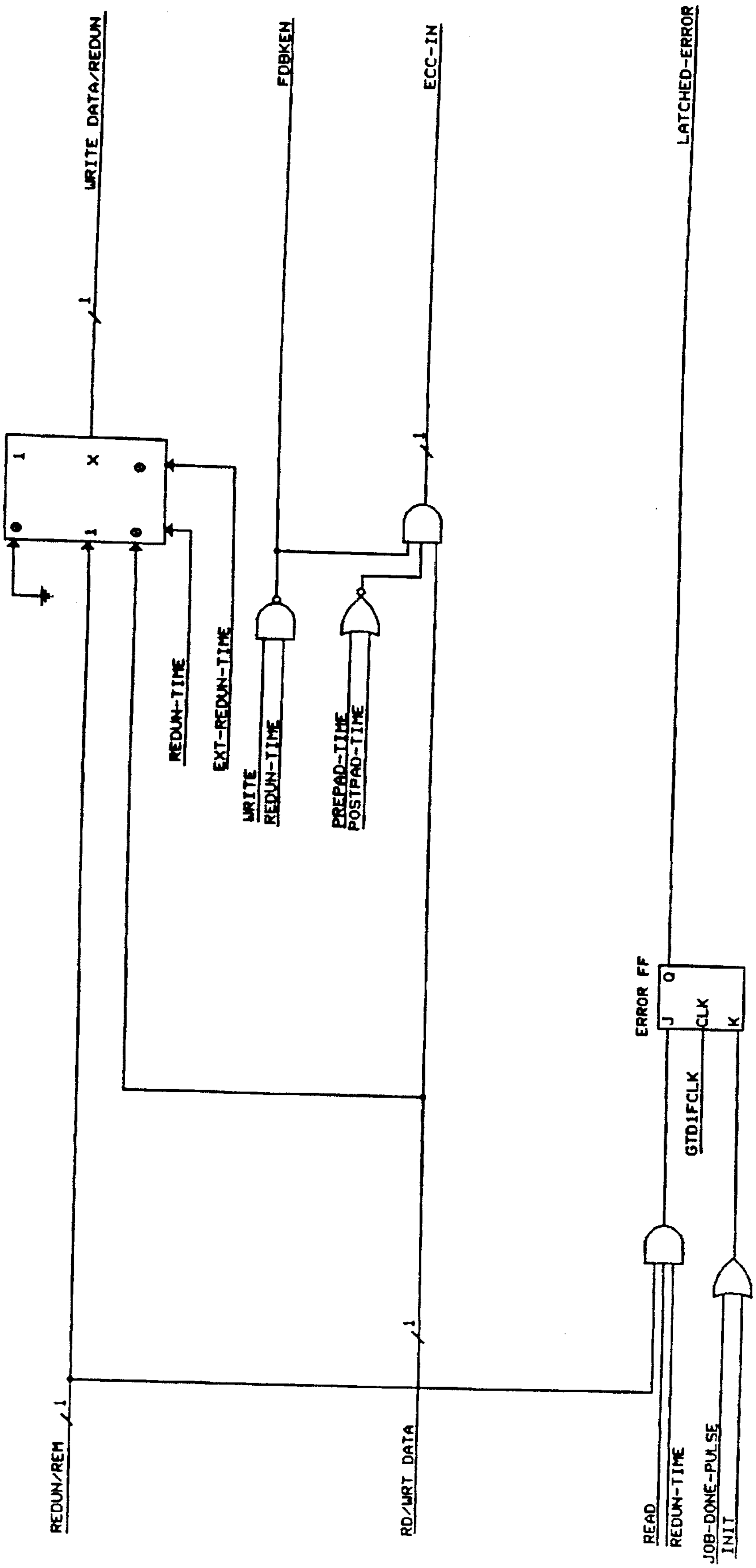
Figure 103:
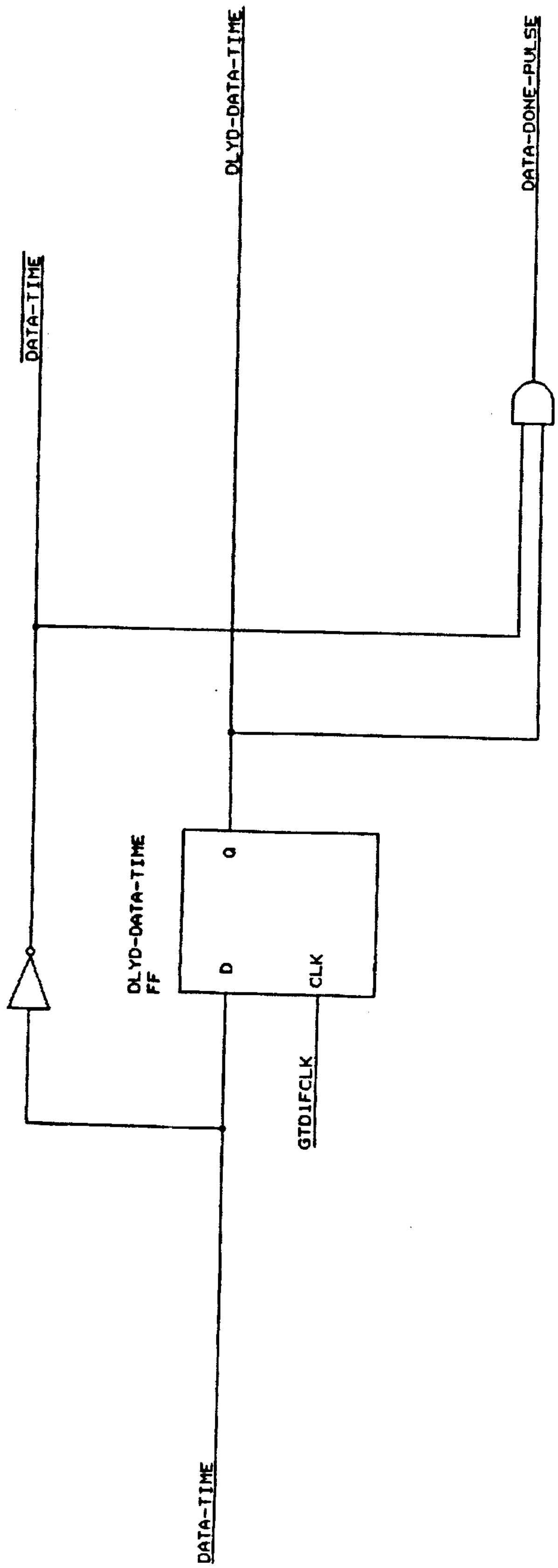
Figure 104:
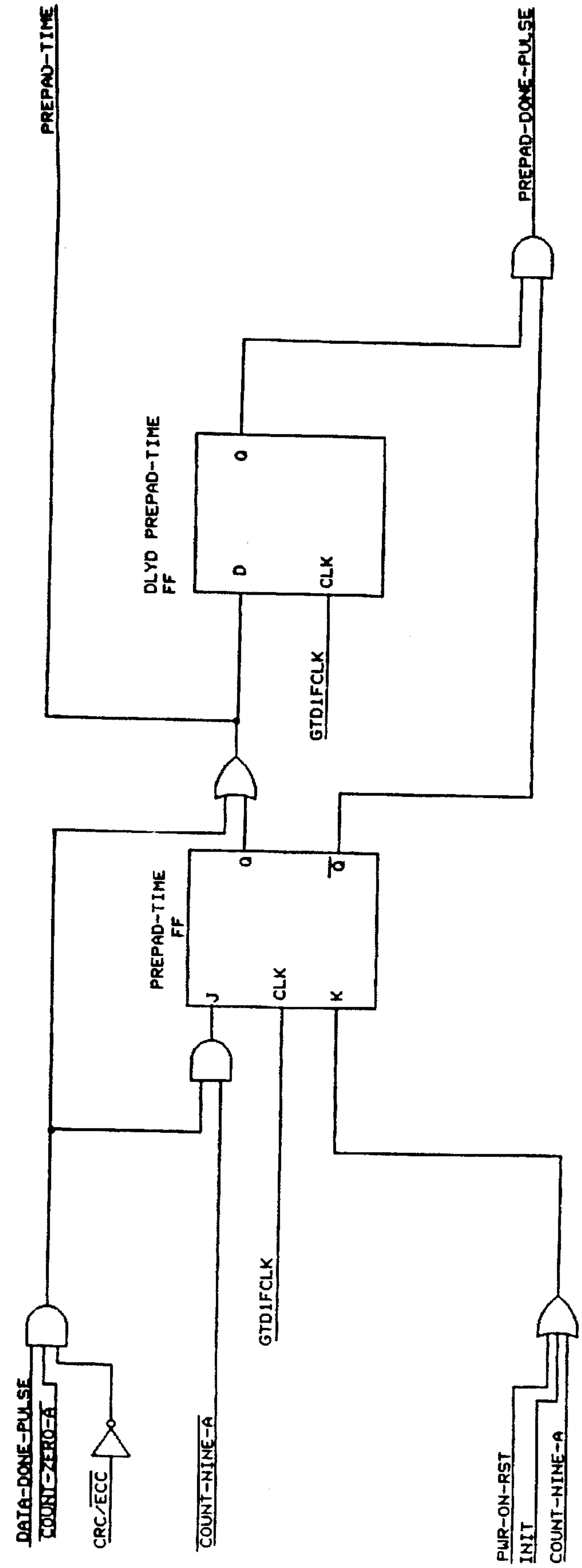
Figure 105:
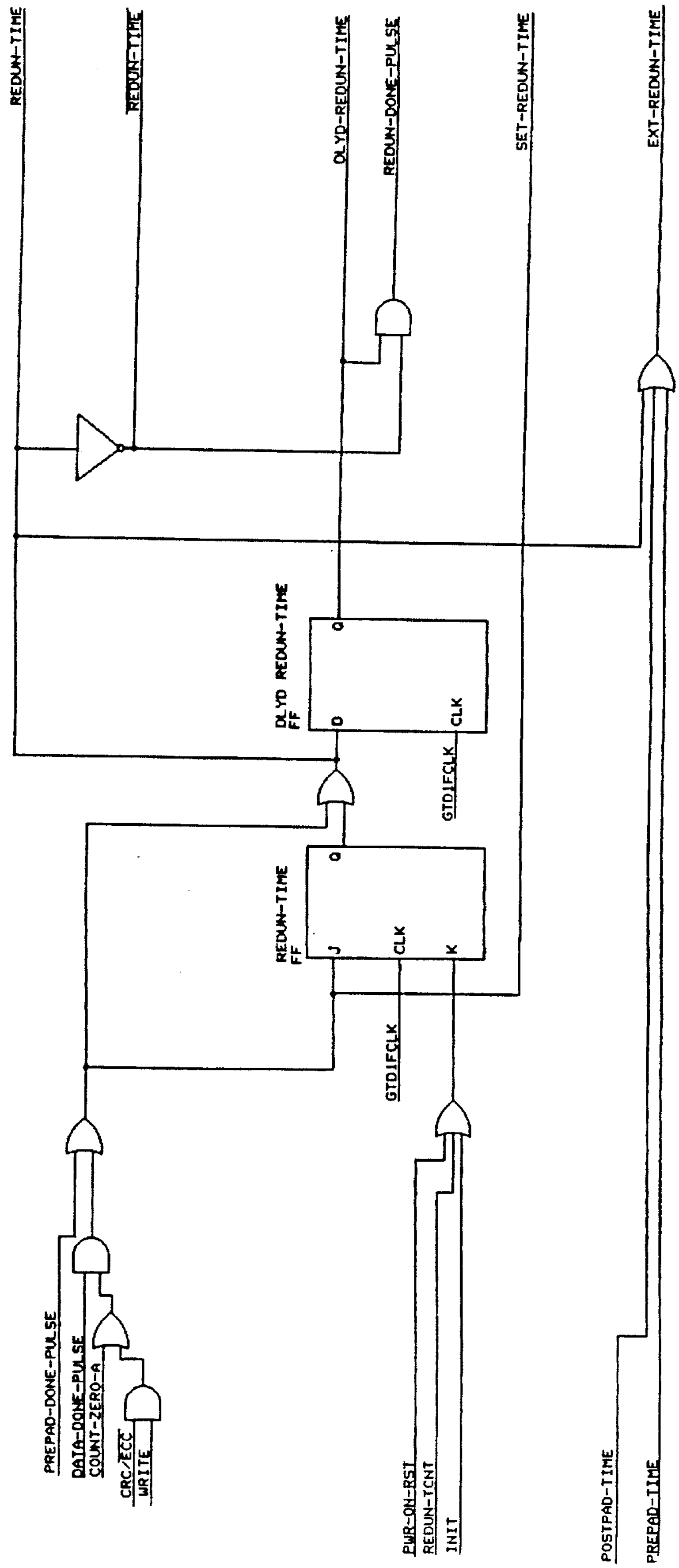
Figure 106:
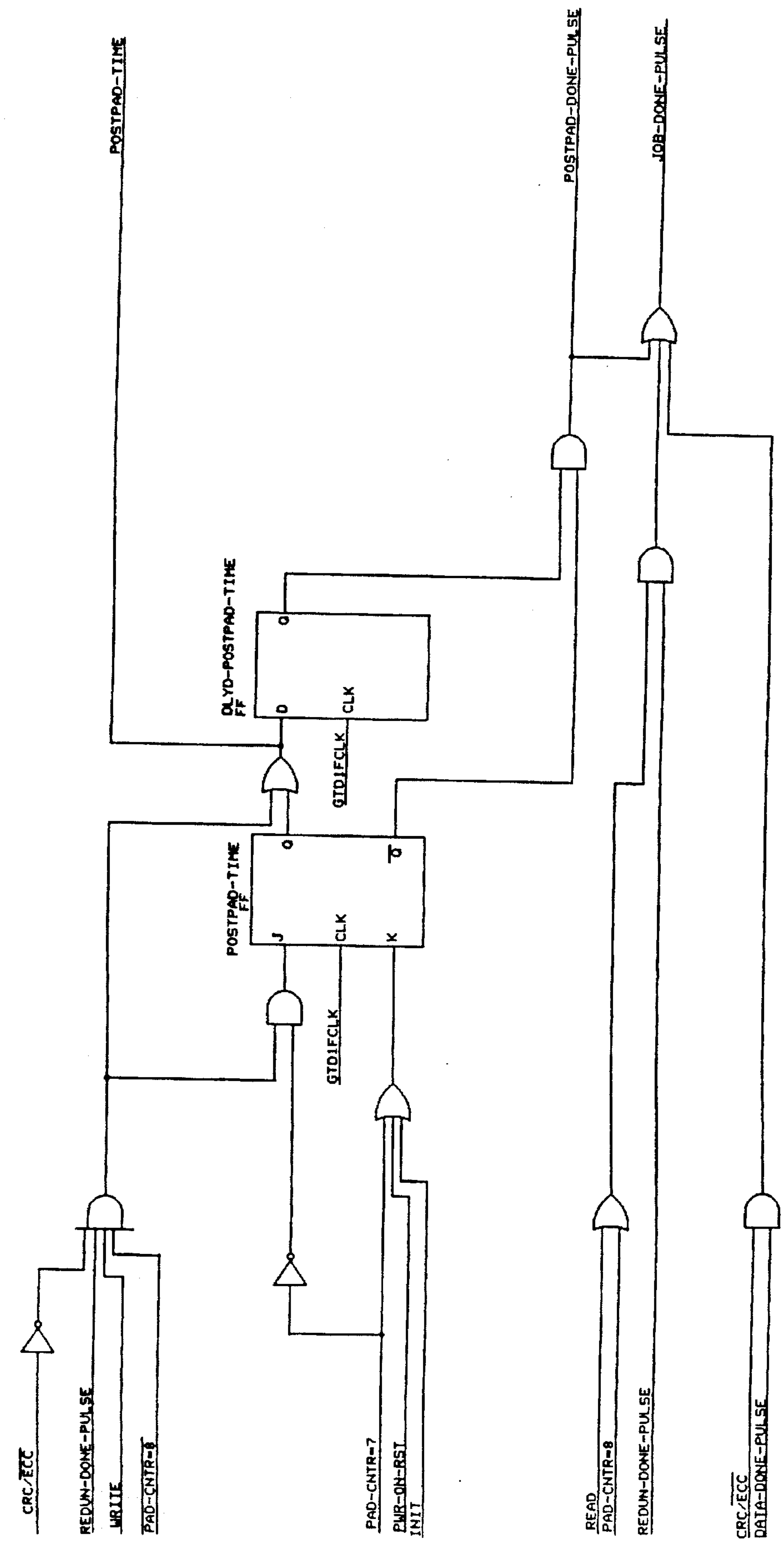
Figure 107:
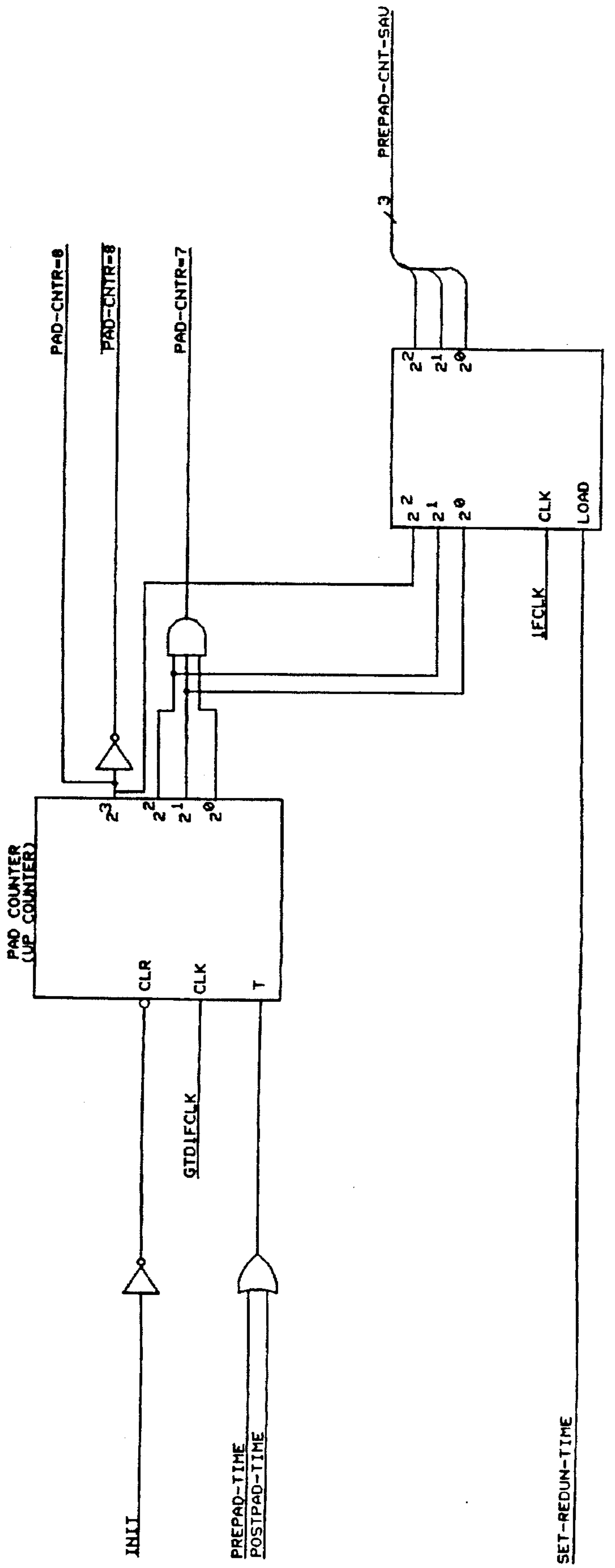
Figure 108:
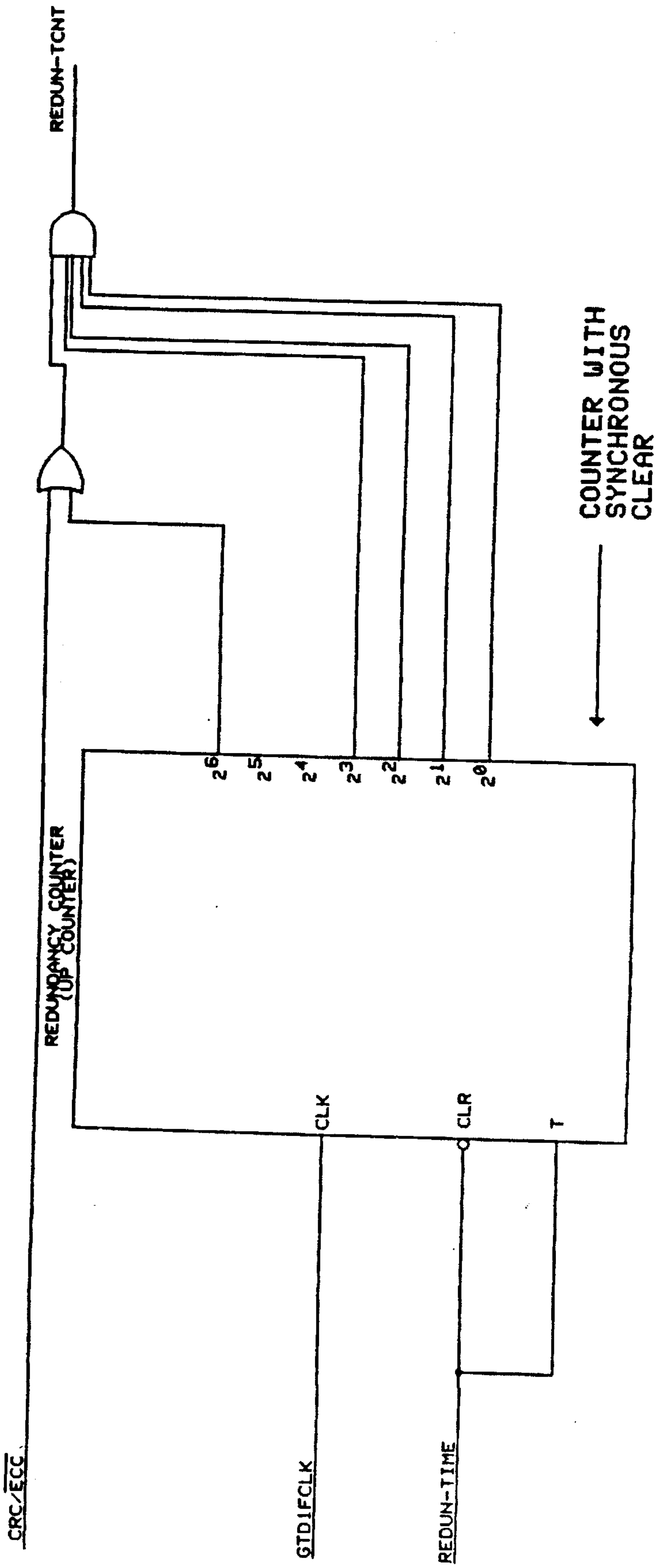
Figure 109:
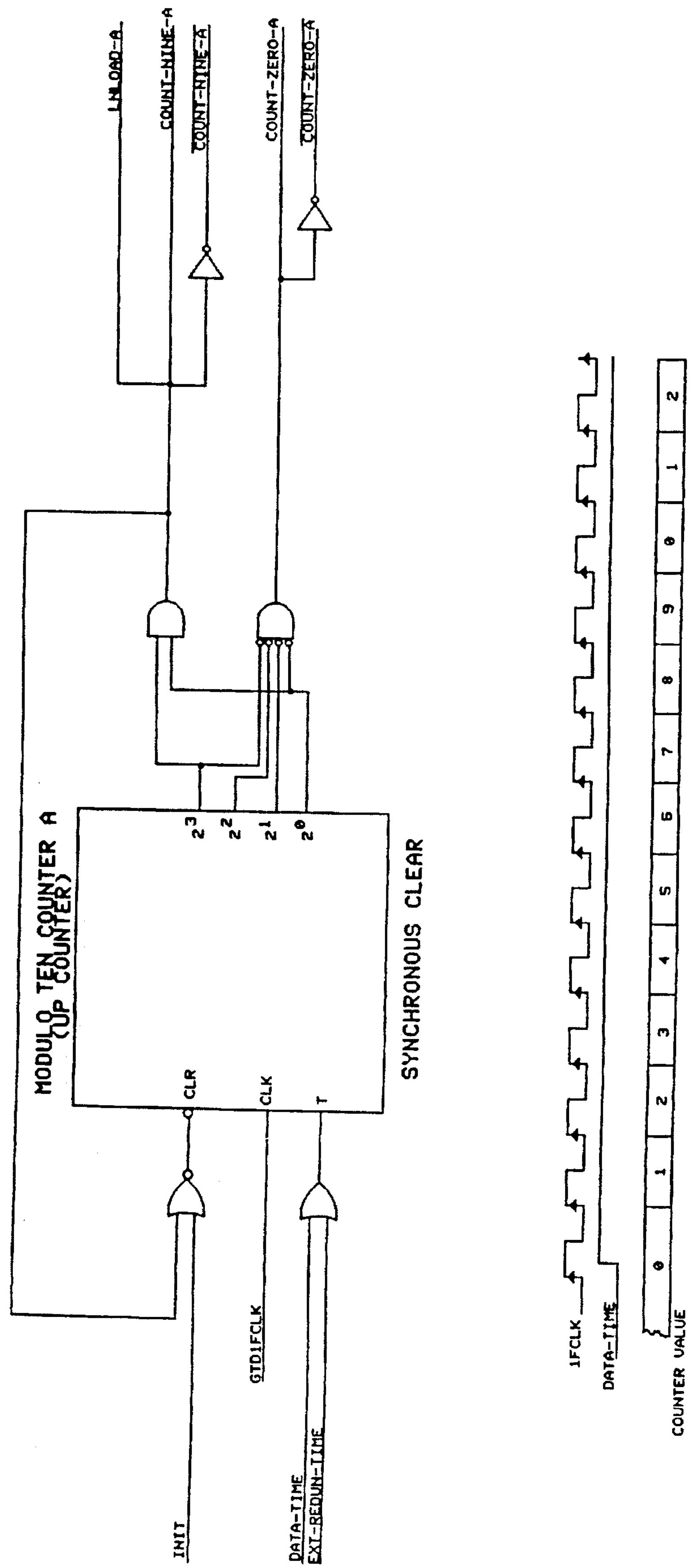
Figure 110:
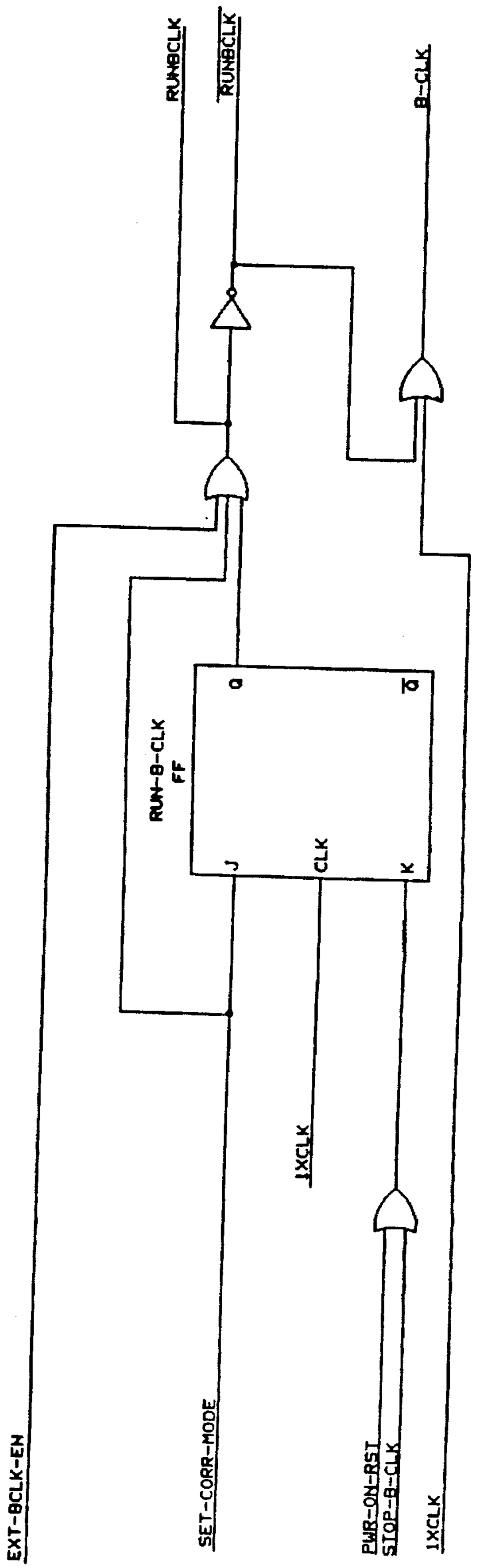
Figure 111:
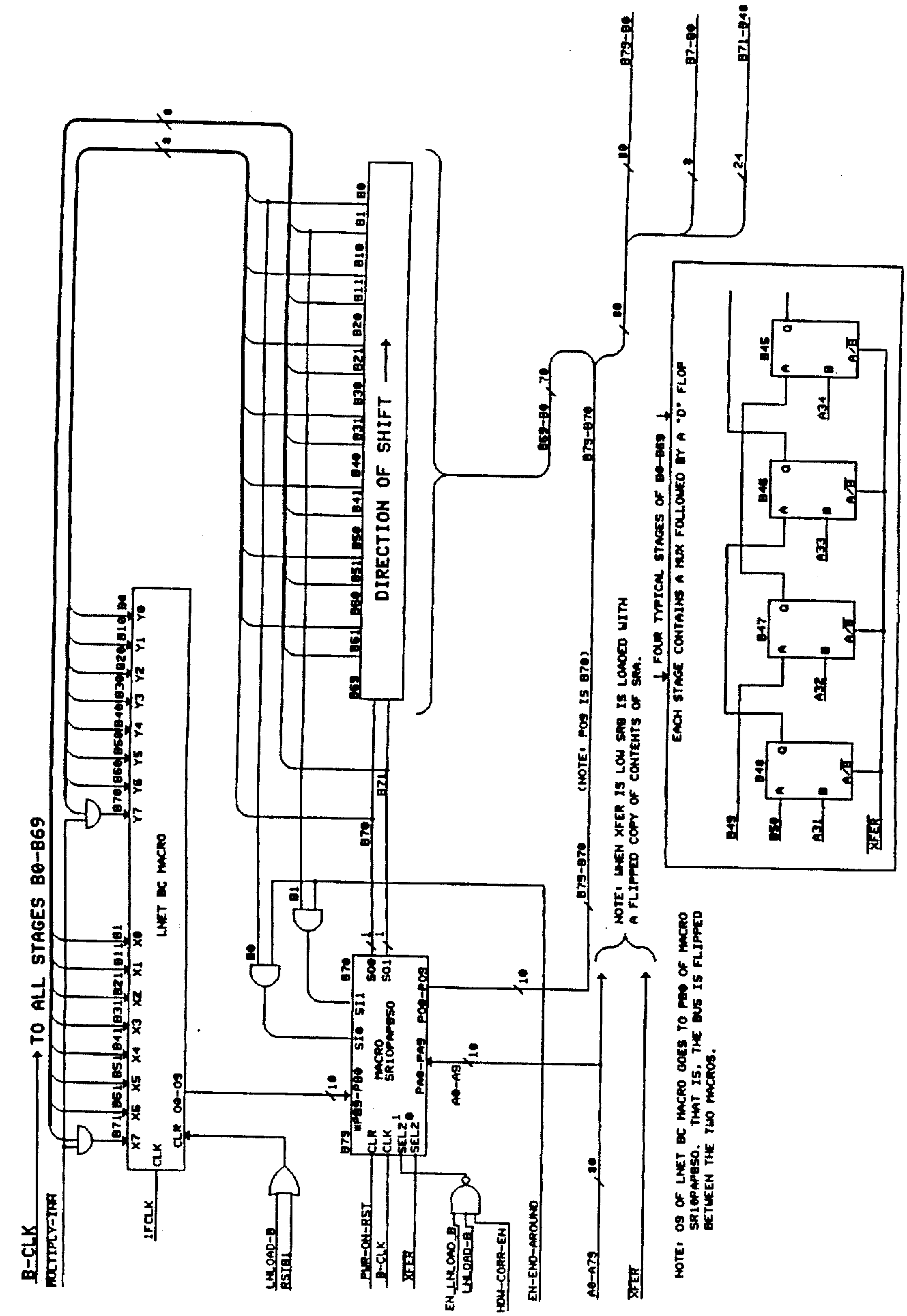
Figure 112:
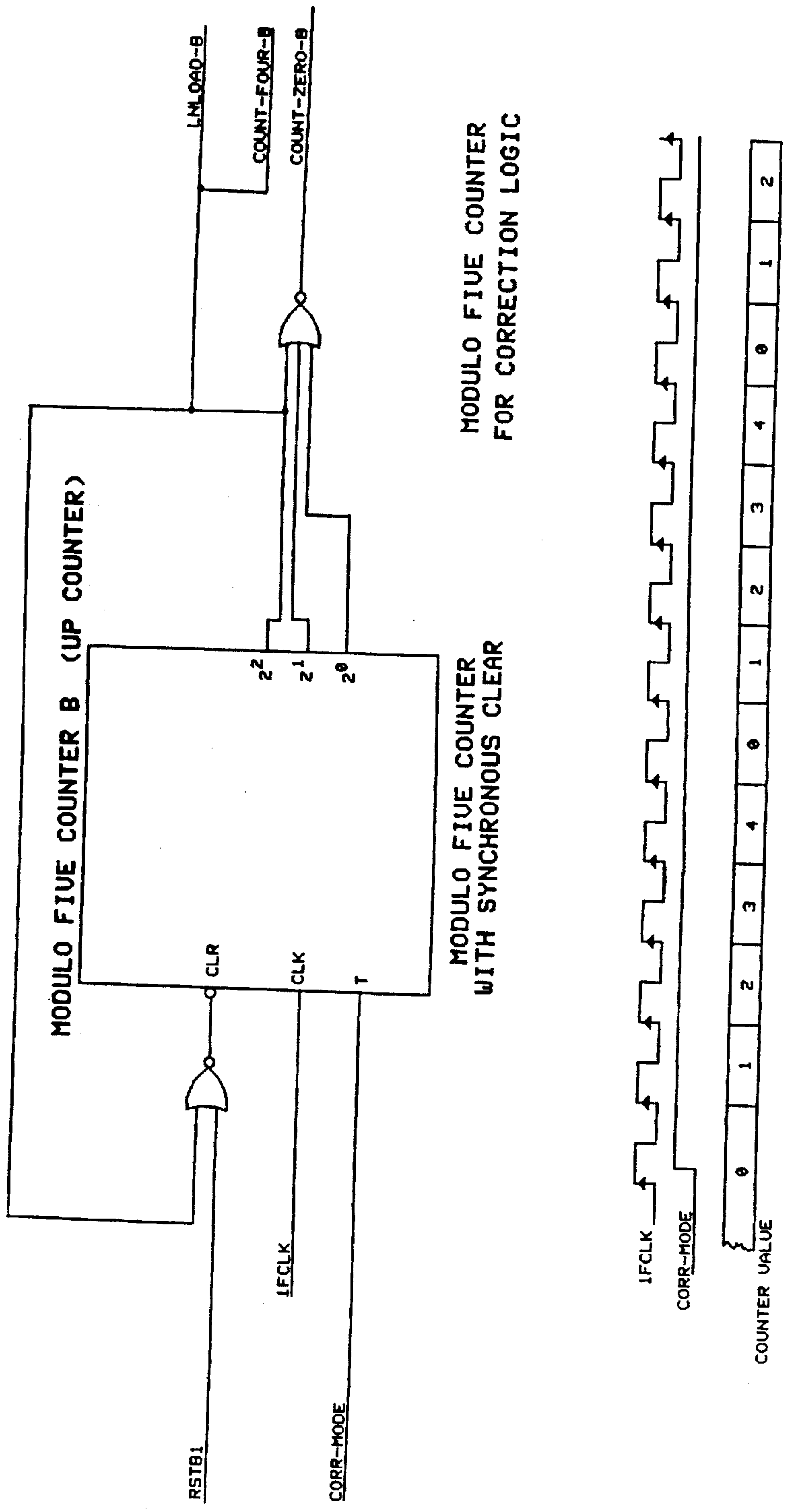
Figure 113:
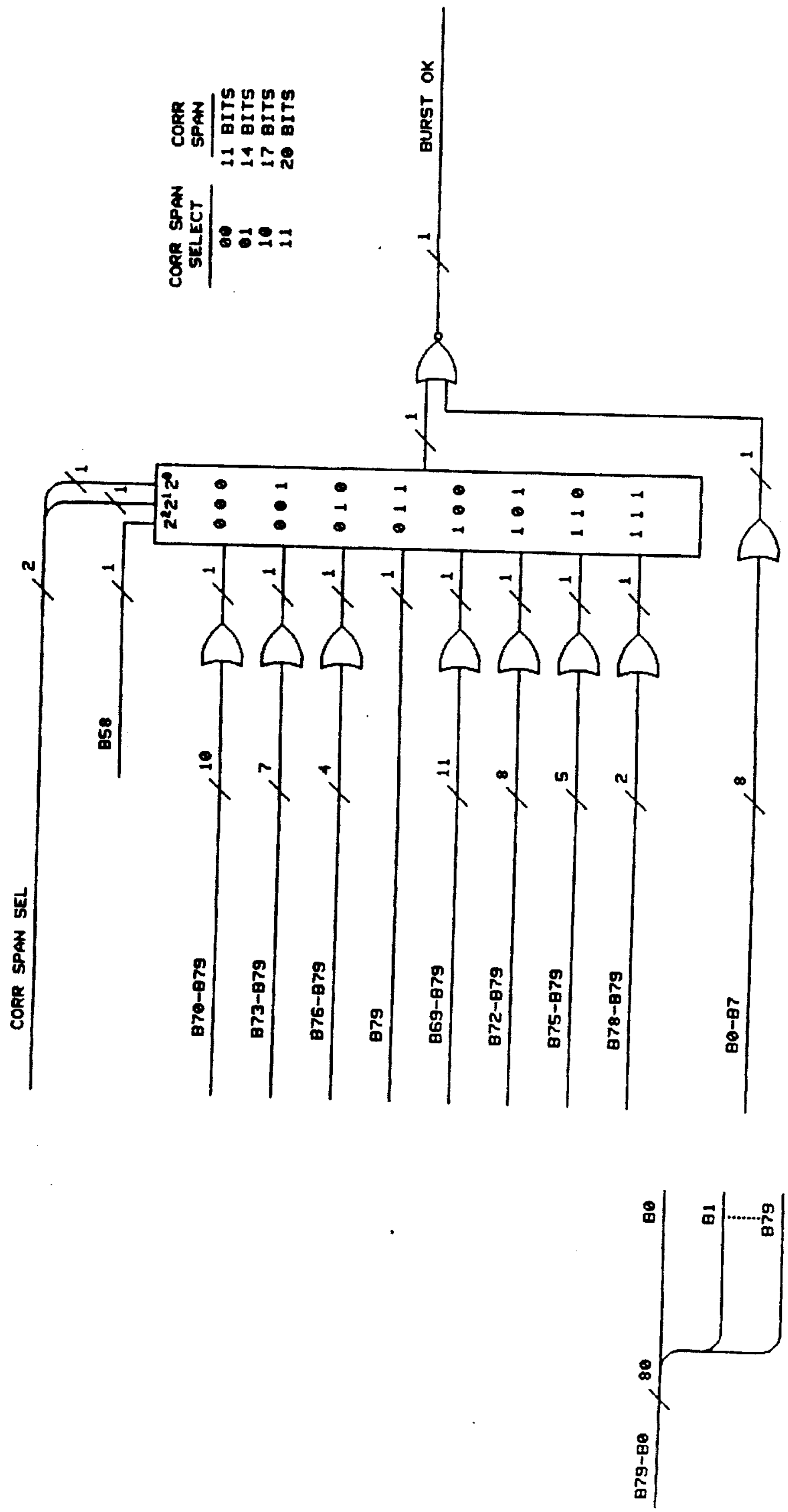
Figure 114:
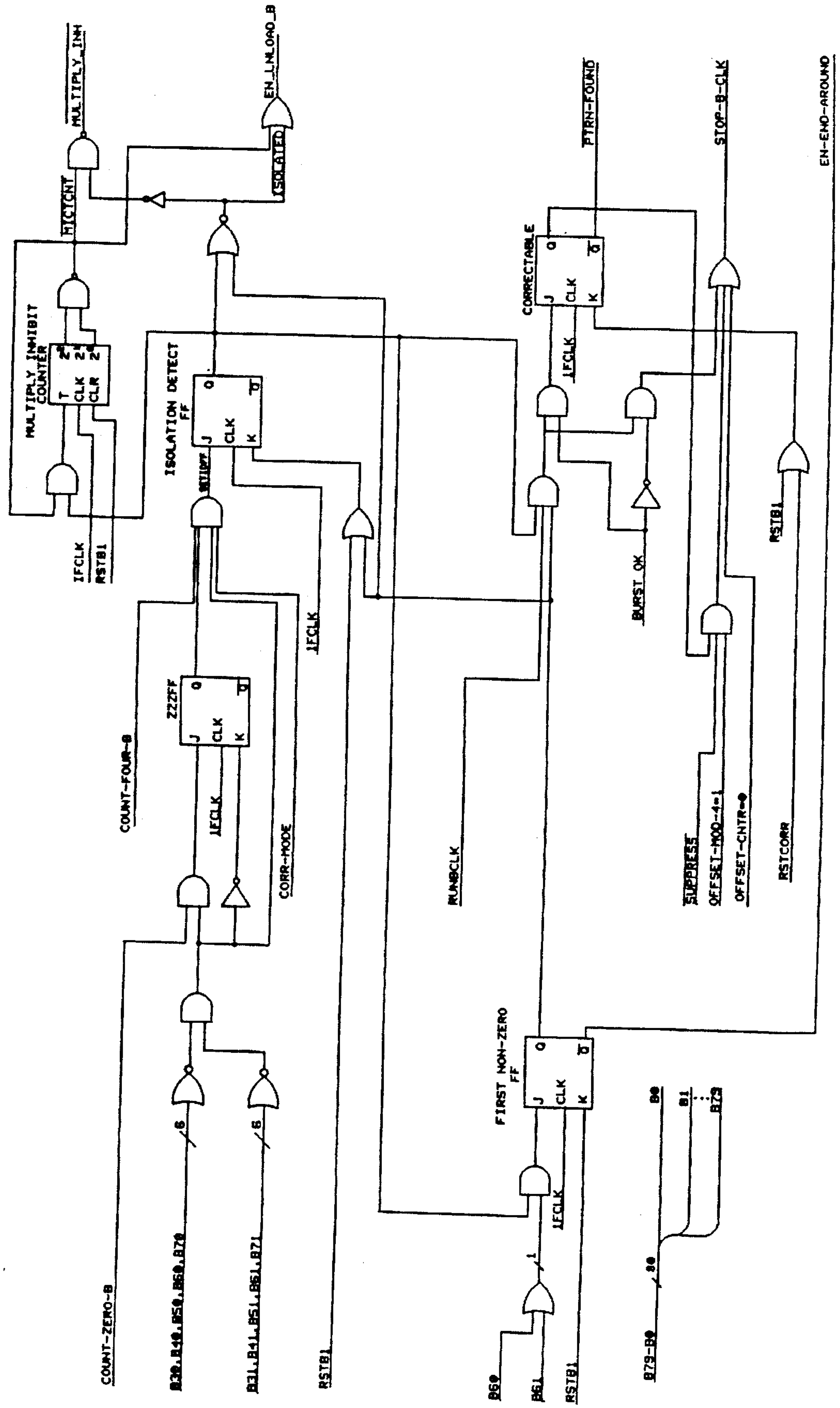
Figure 115:
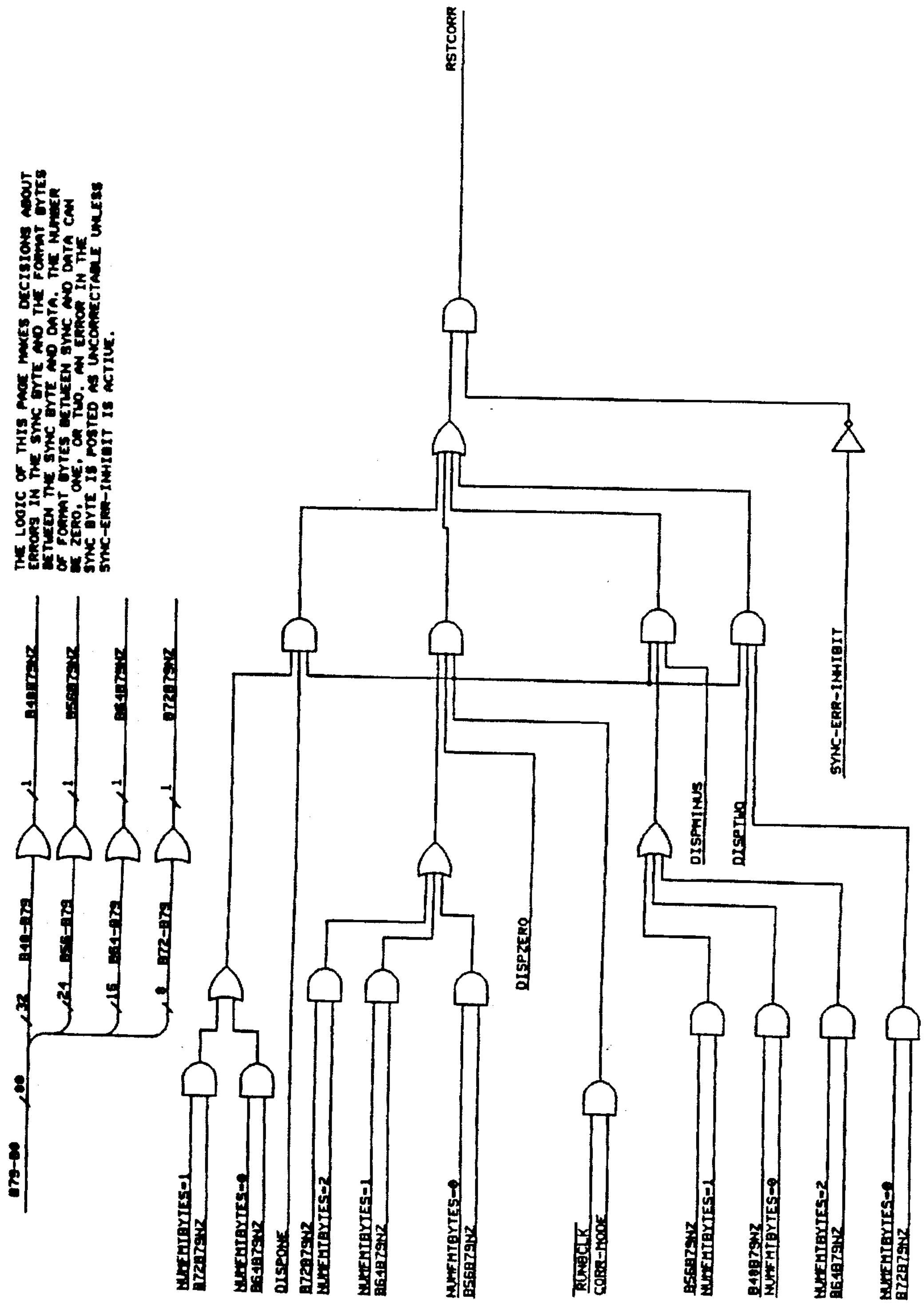
Figure 116:
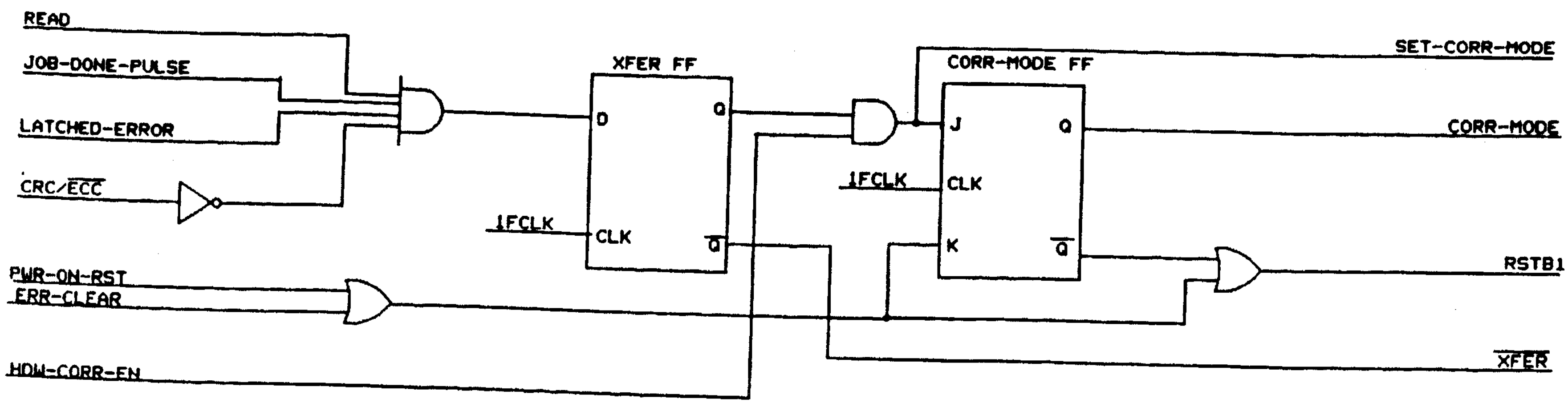
Figure 117:
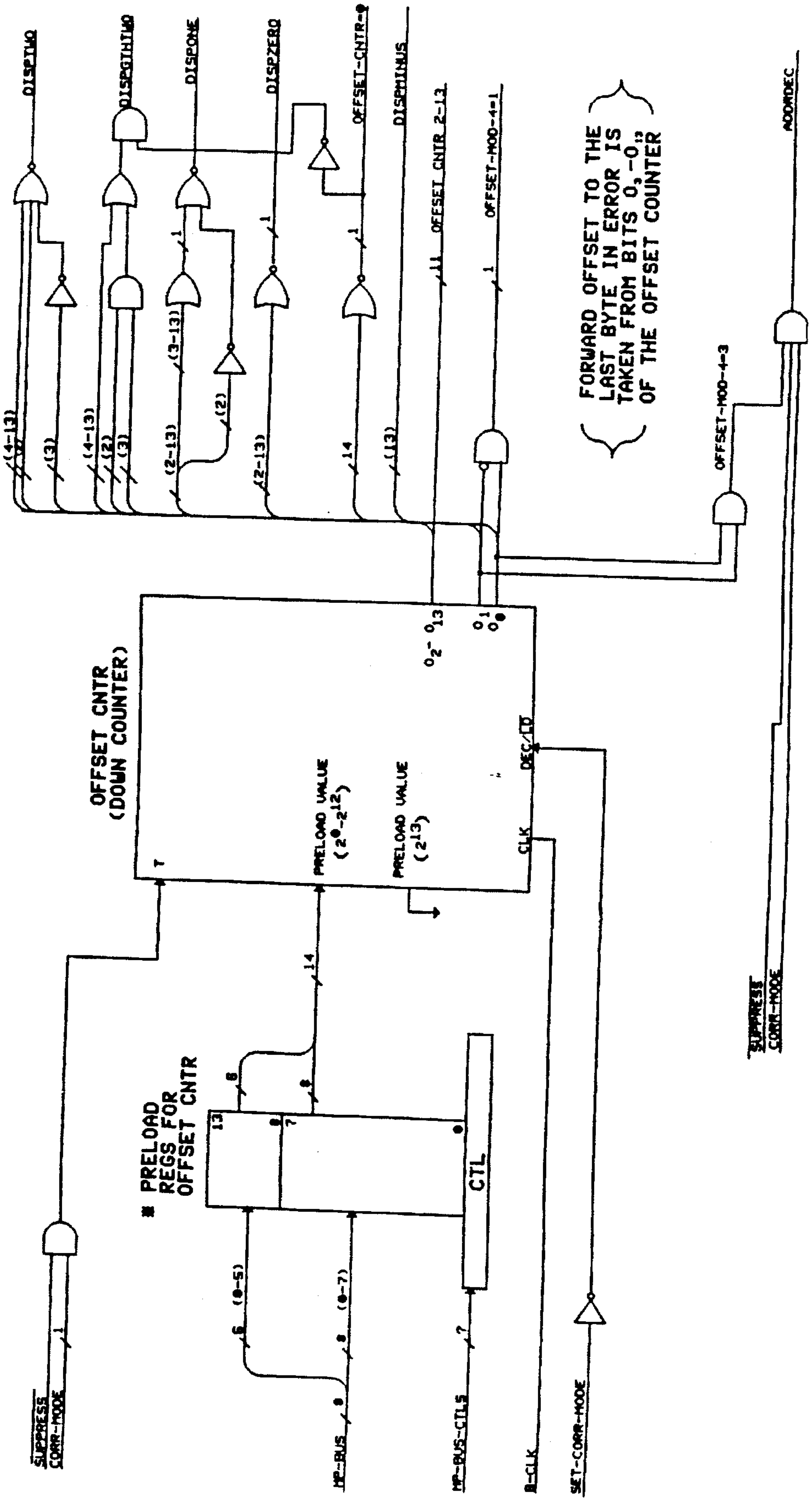
Figure 118:
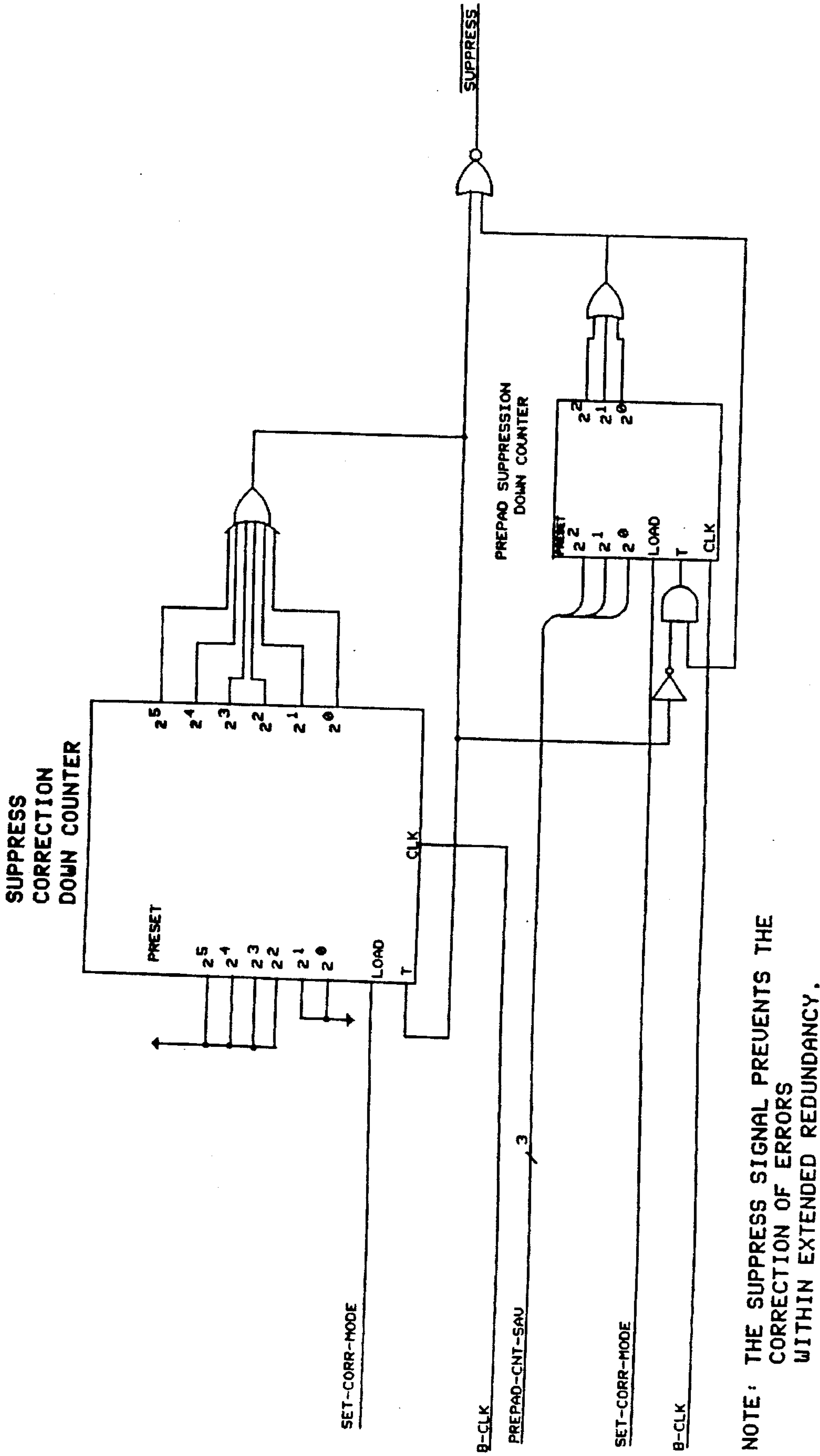
Figure 119:
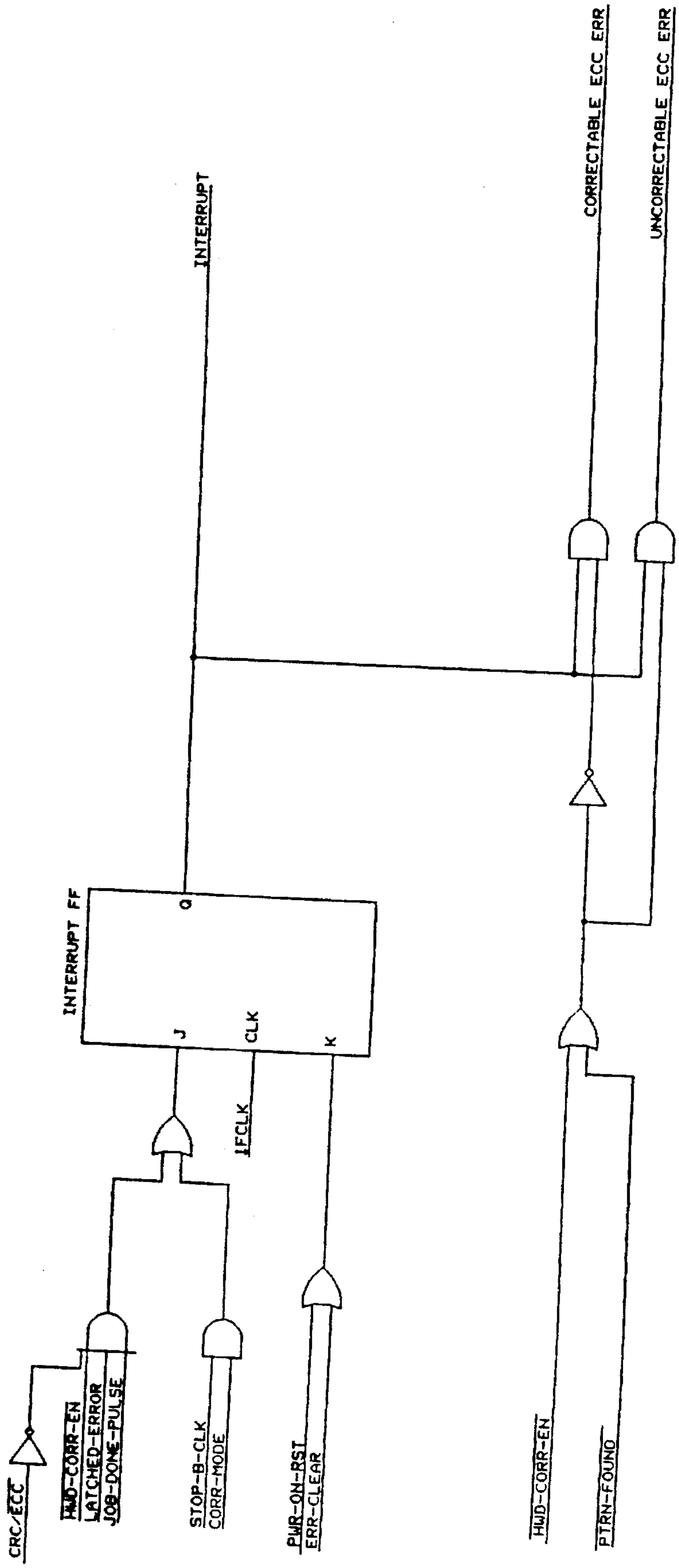
Figure 120:
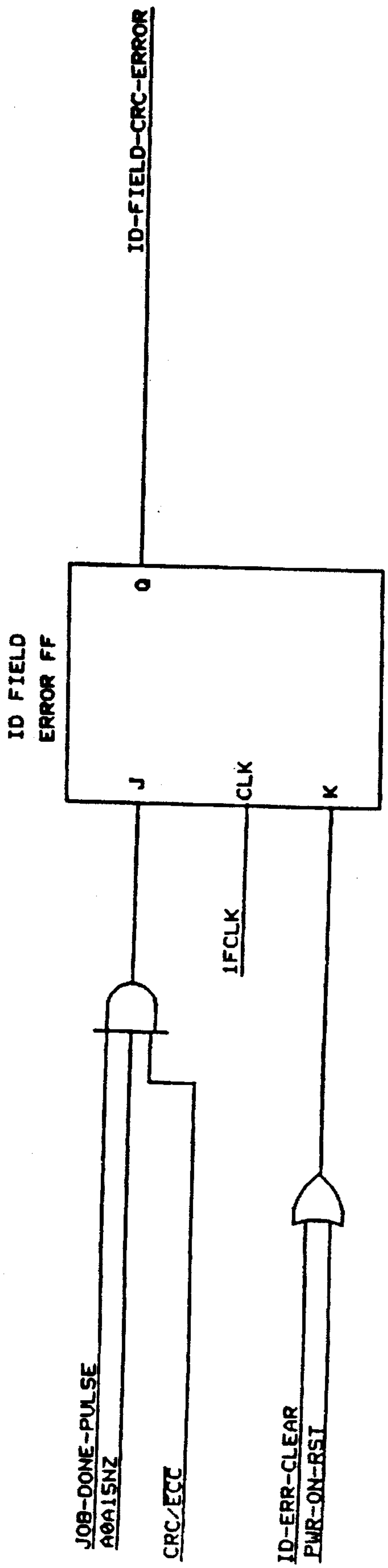
Figure 121:
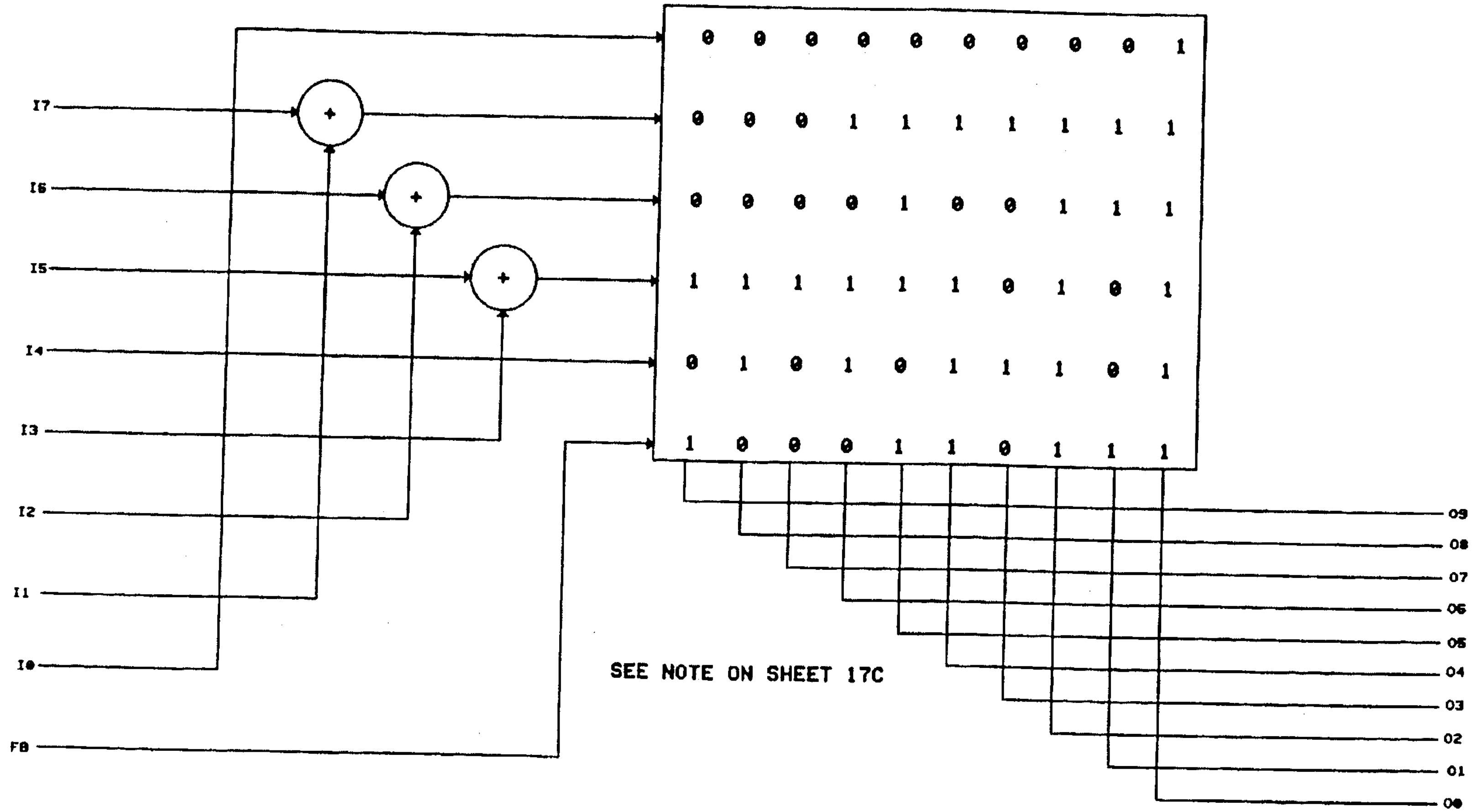
Figure 122:
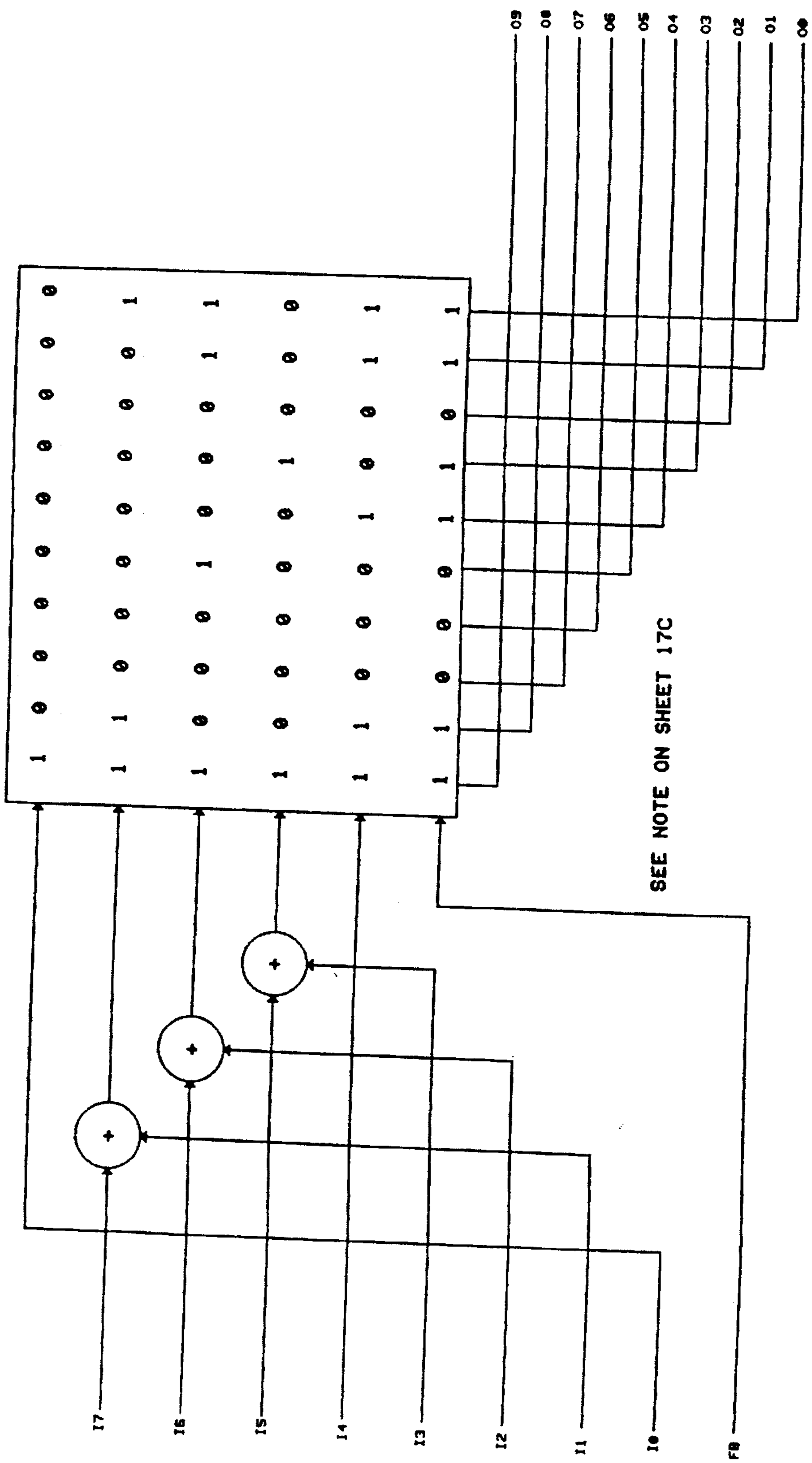
Figure 123:
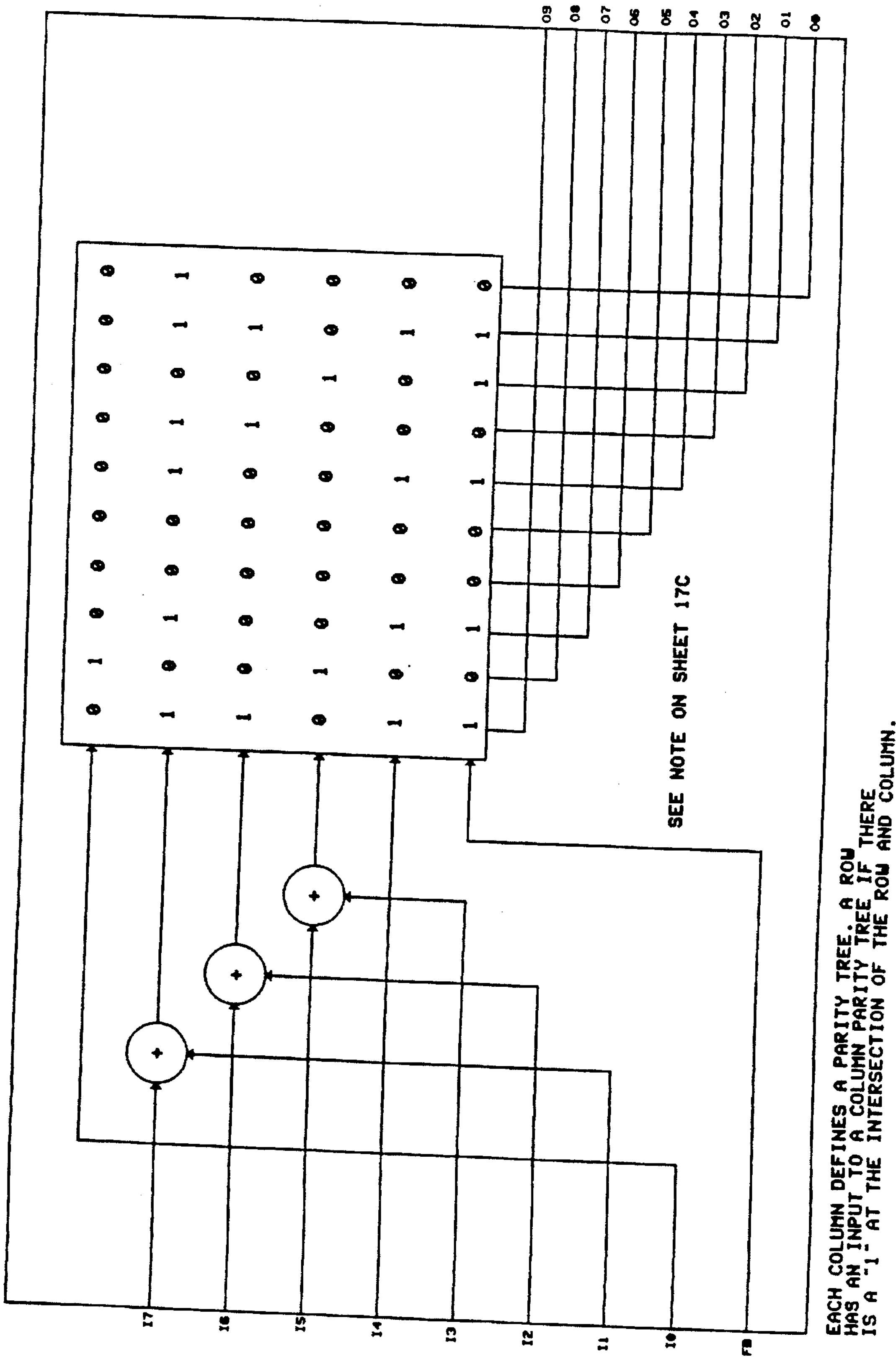
Figure 124:
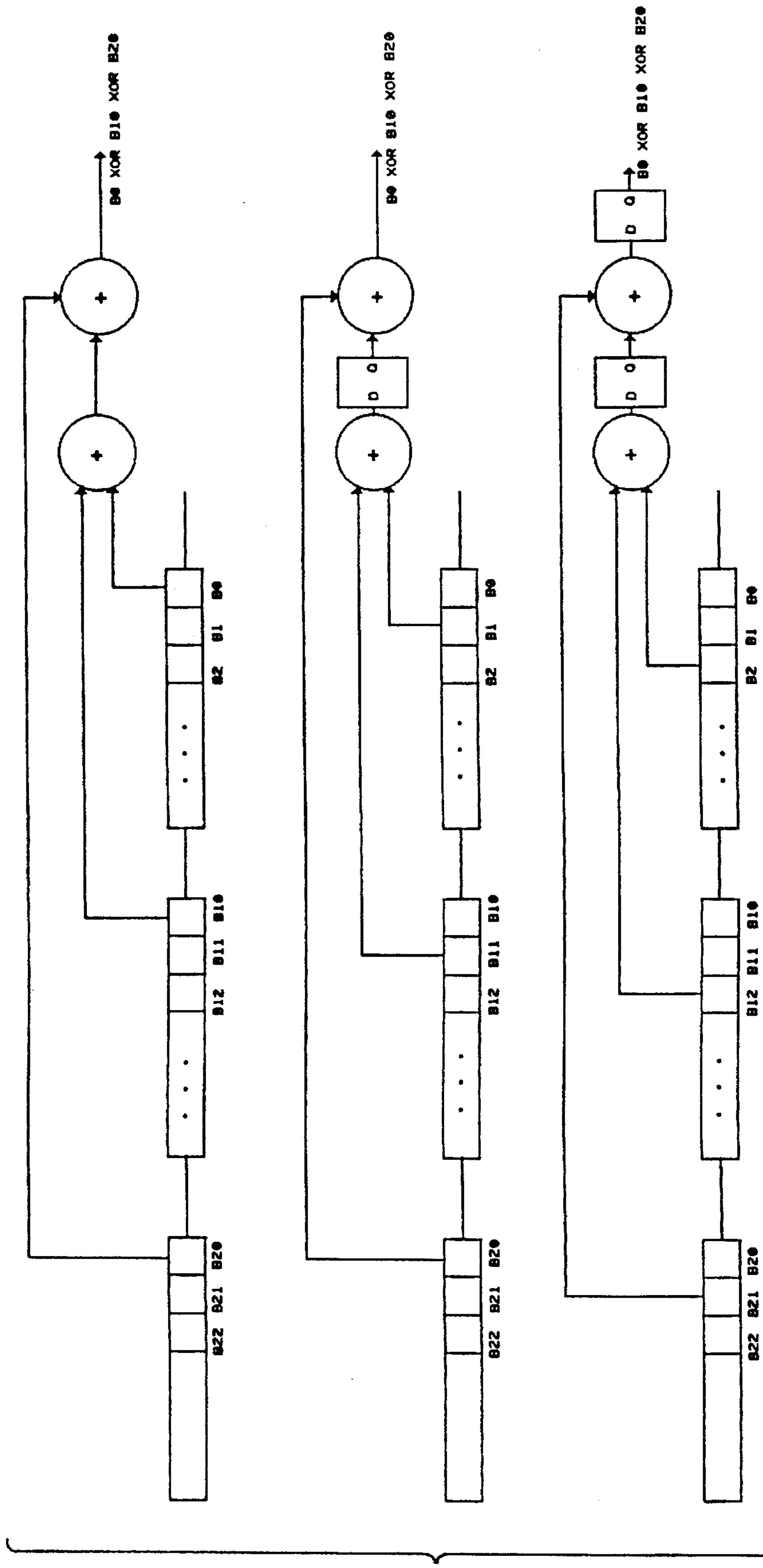
Figure 125:
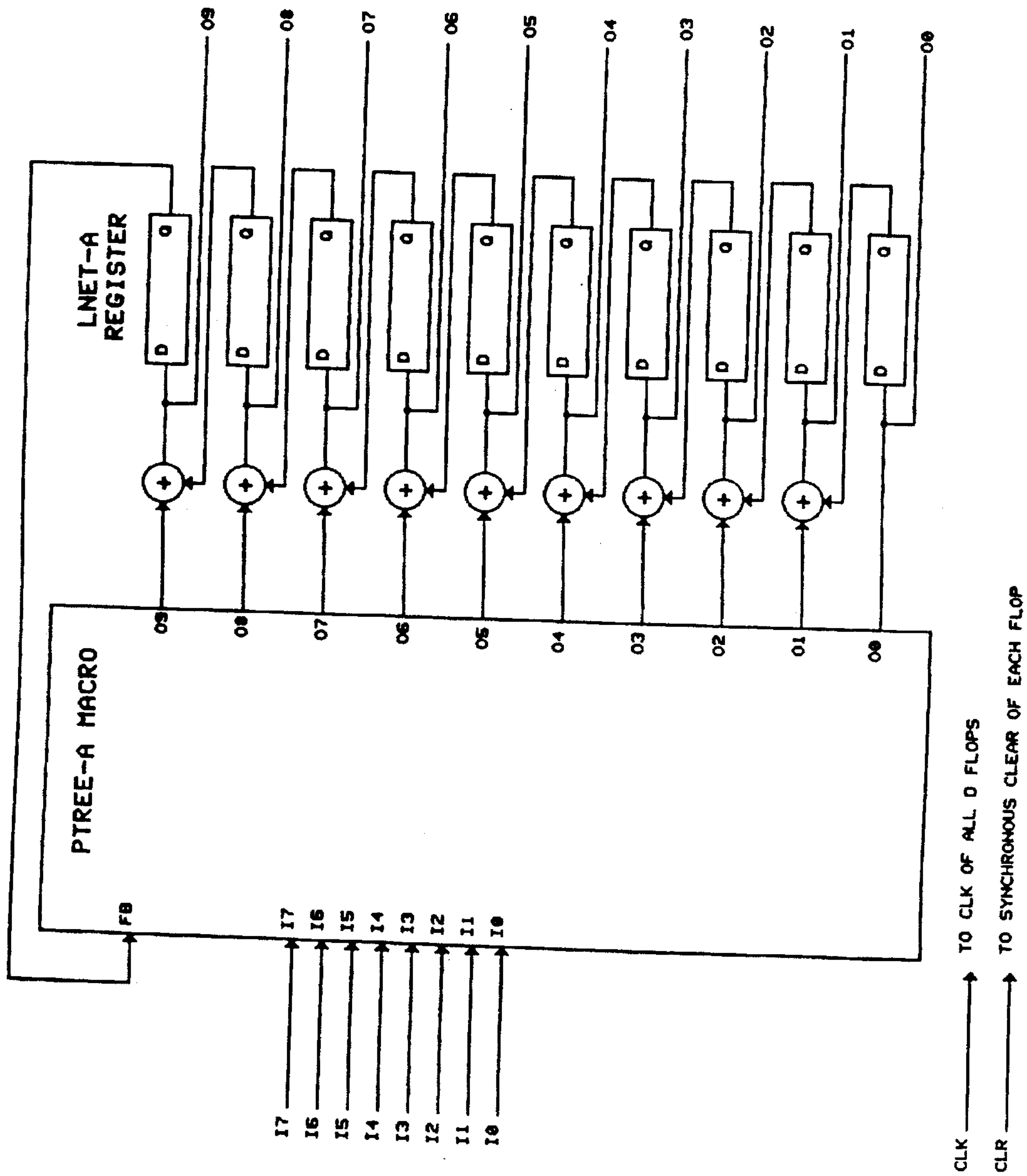
Figure 126:
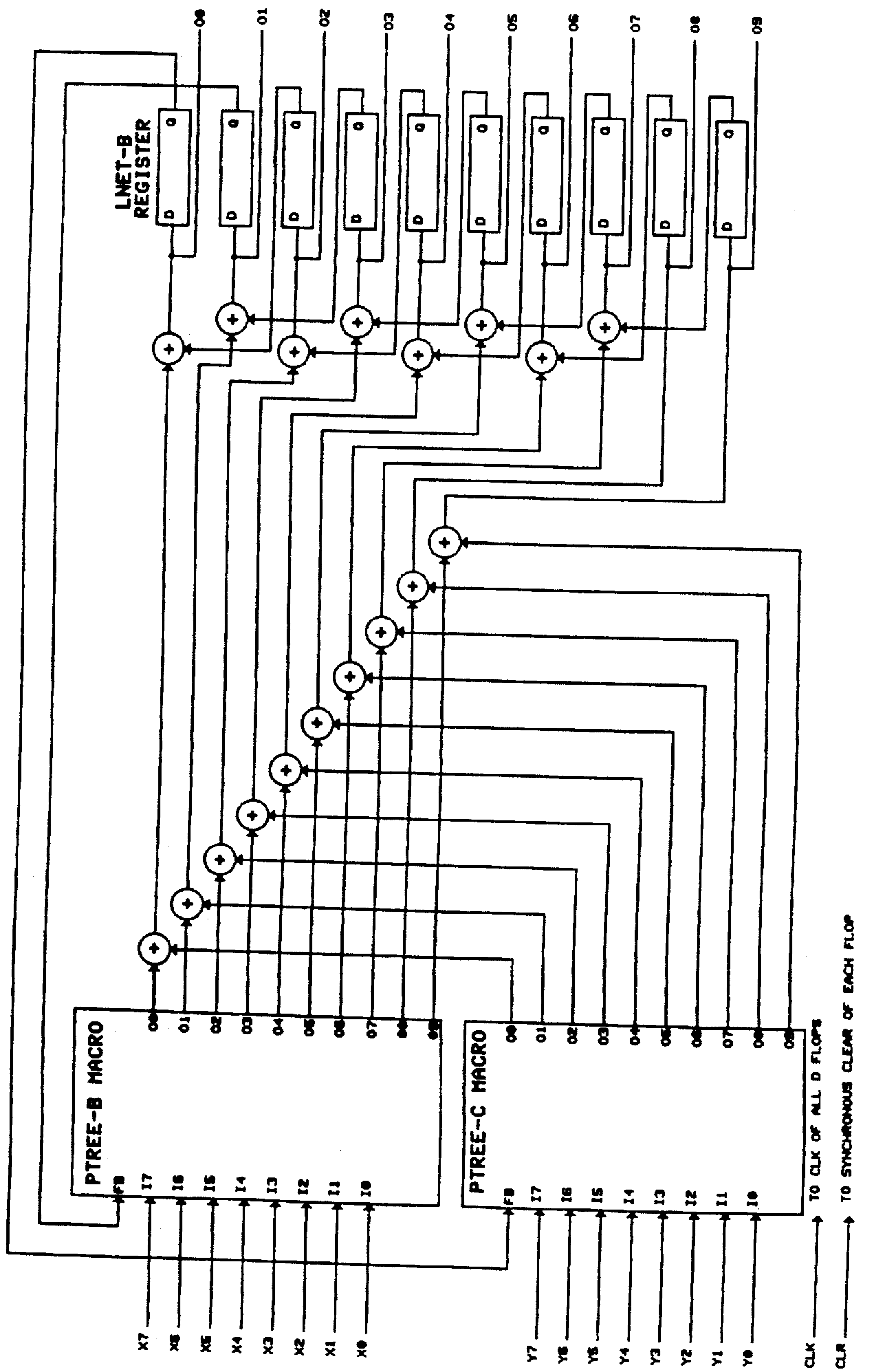
Figure 127:
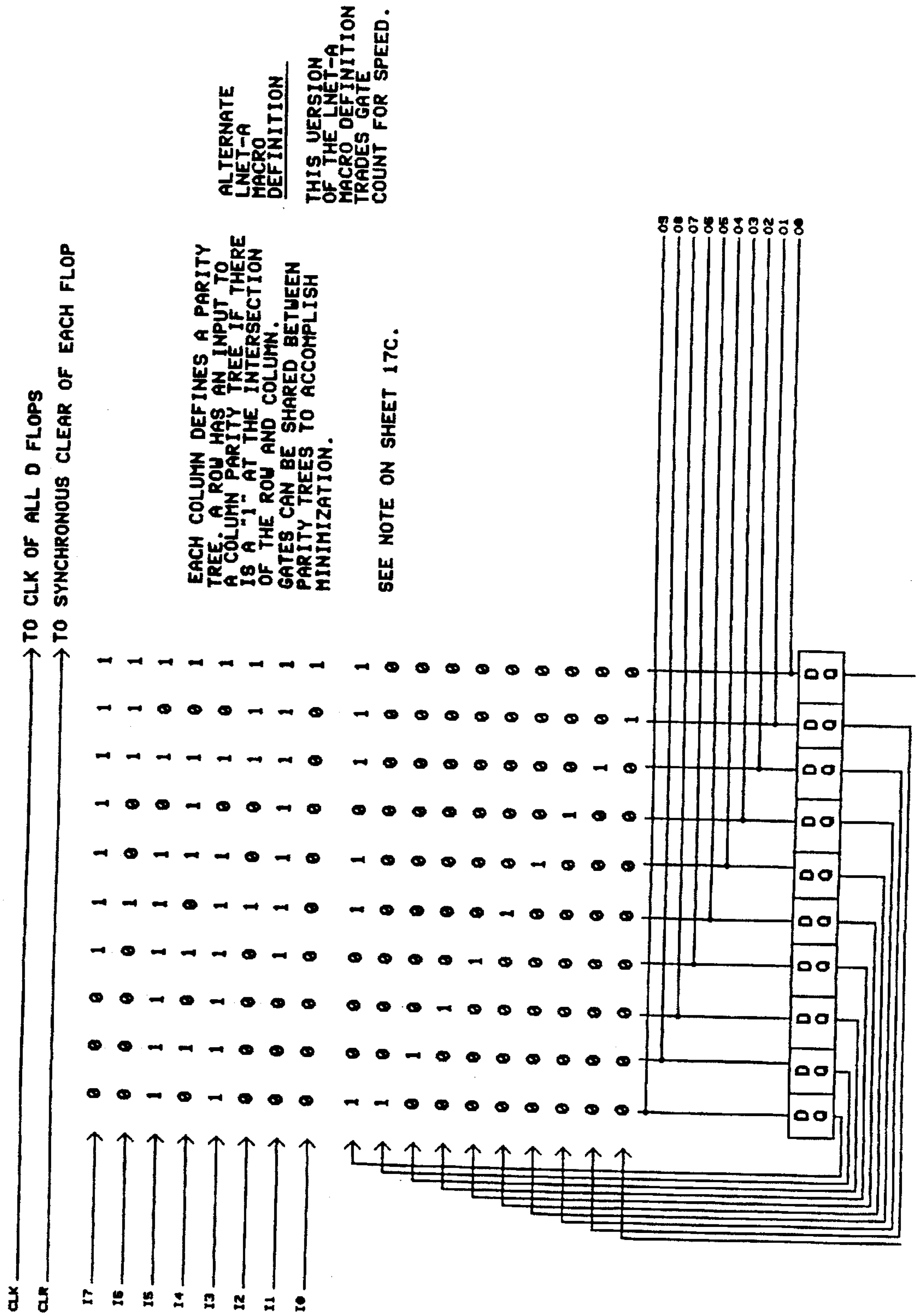
Figure 128:
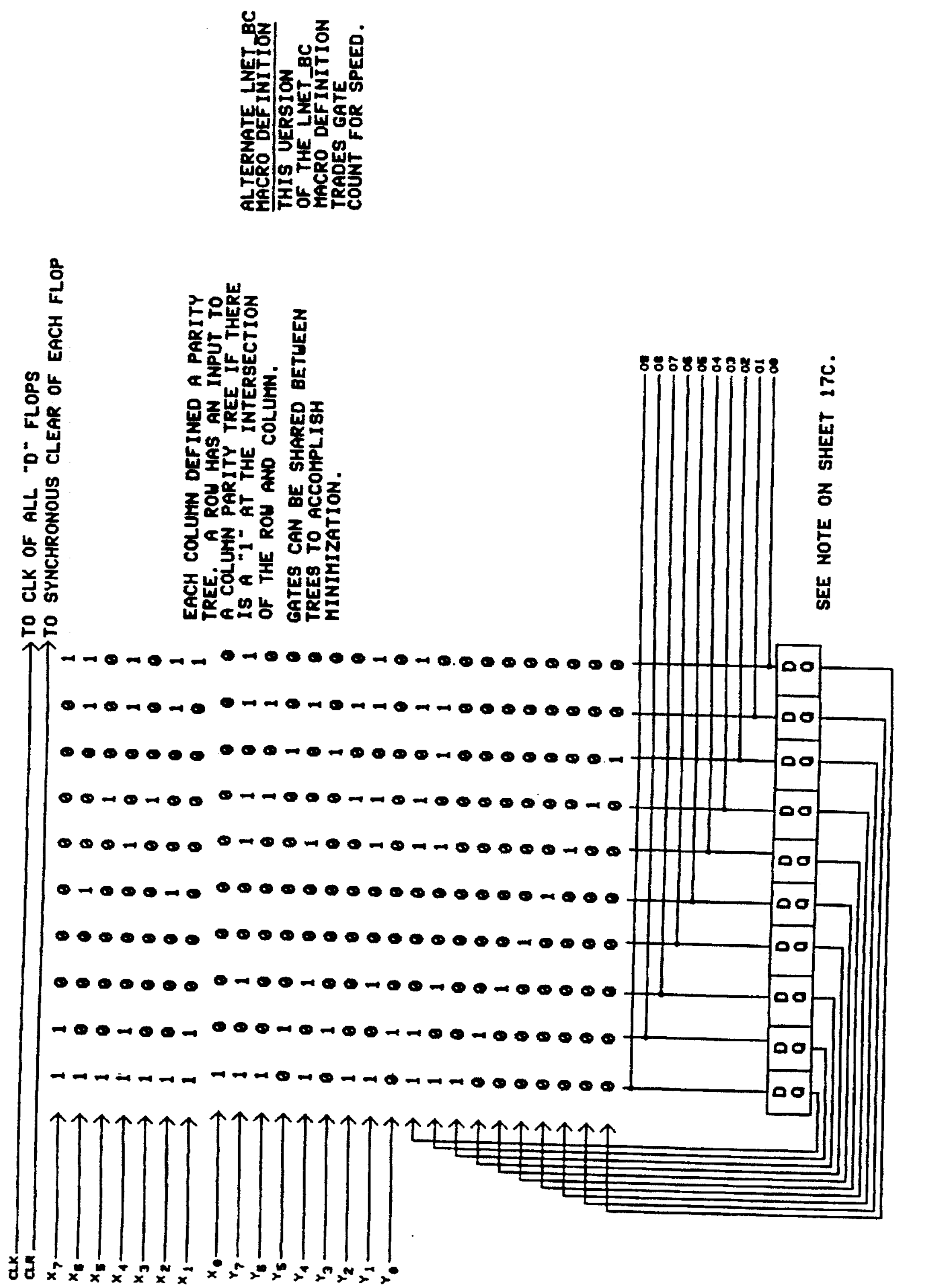
Figure 129:
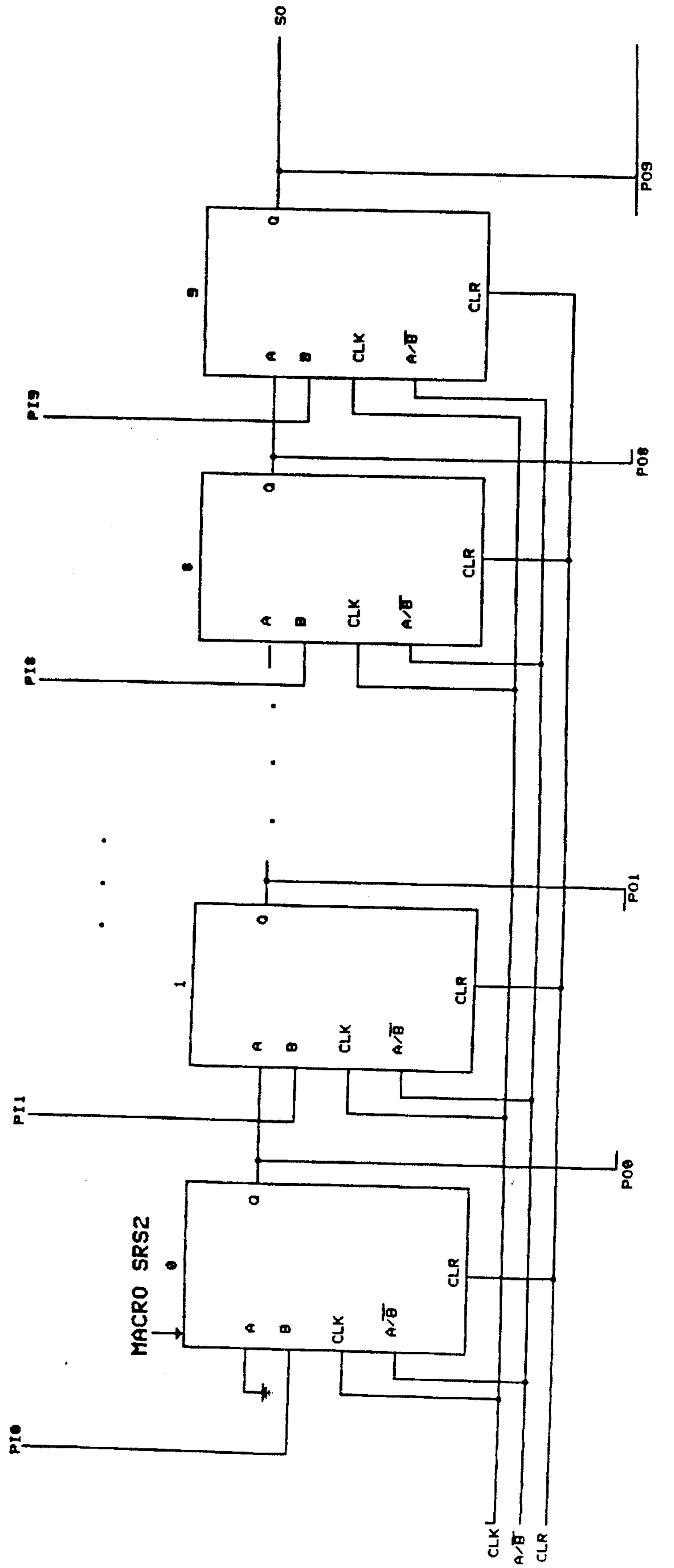
Figure 130:
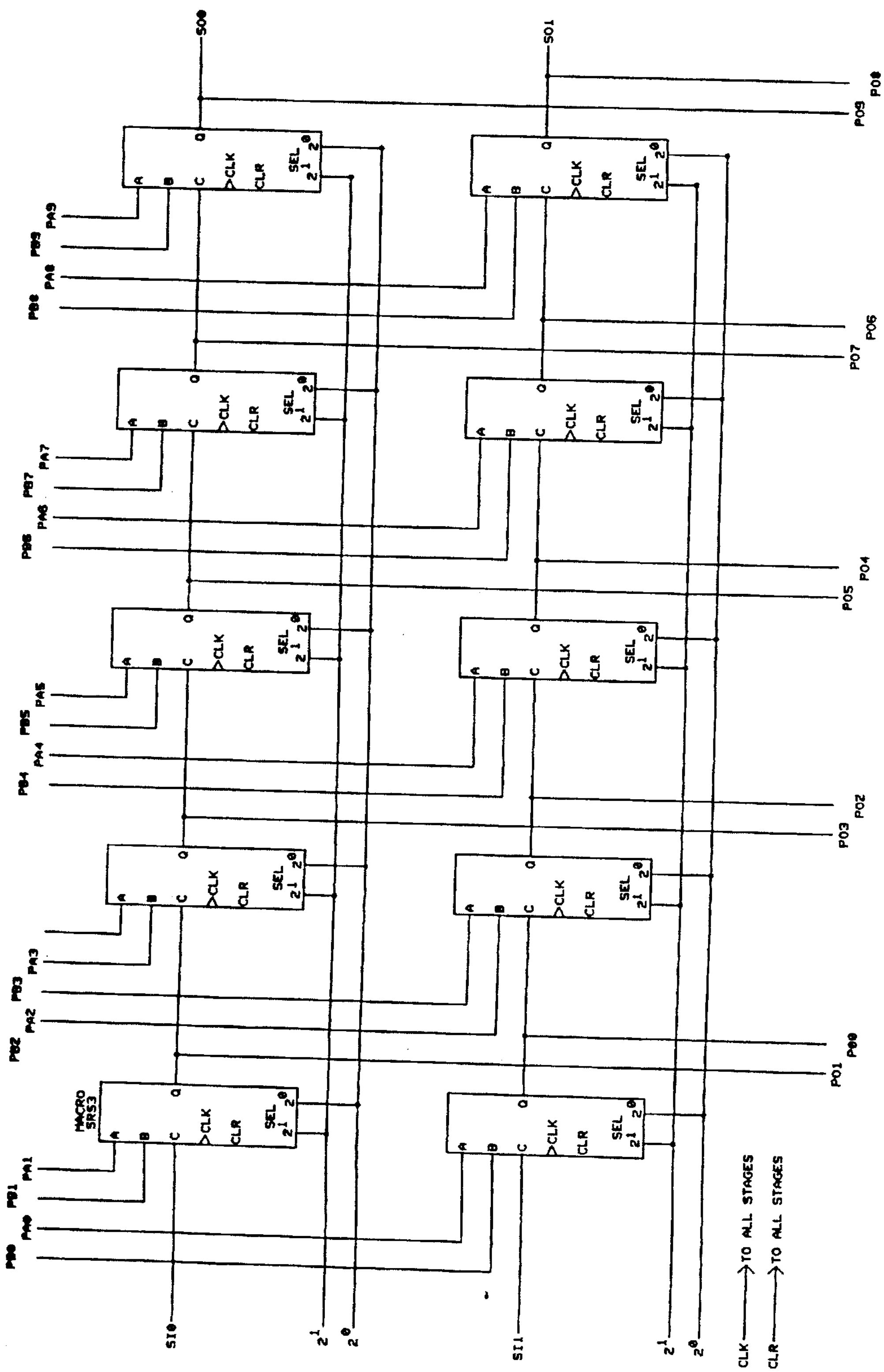
Figure 131:
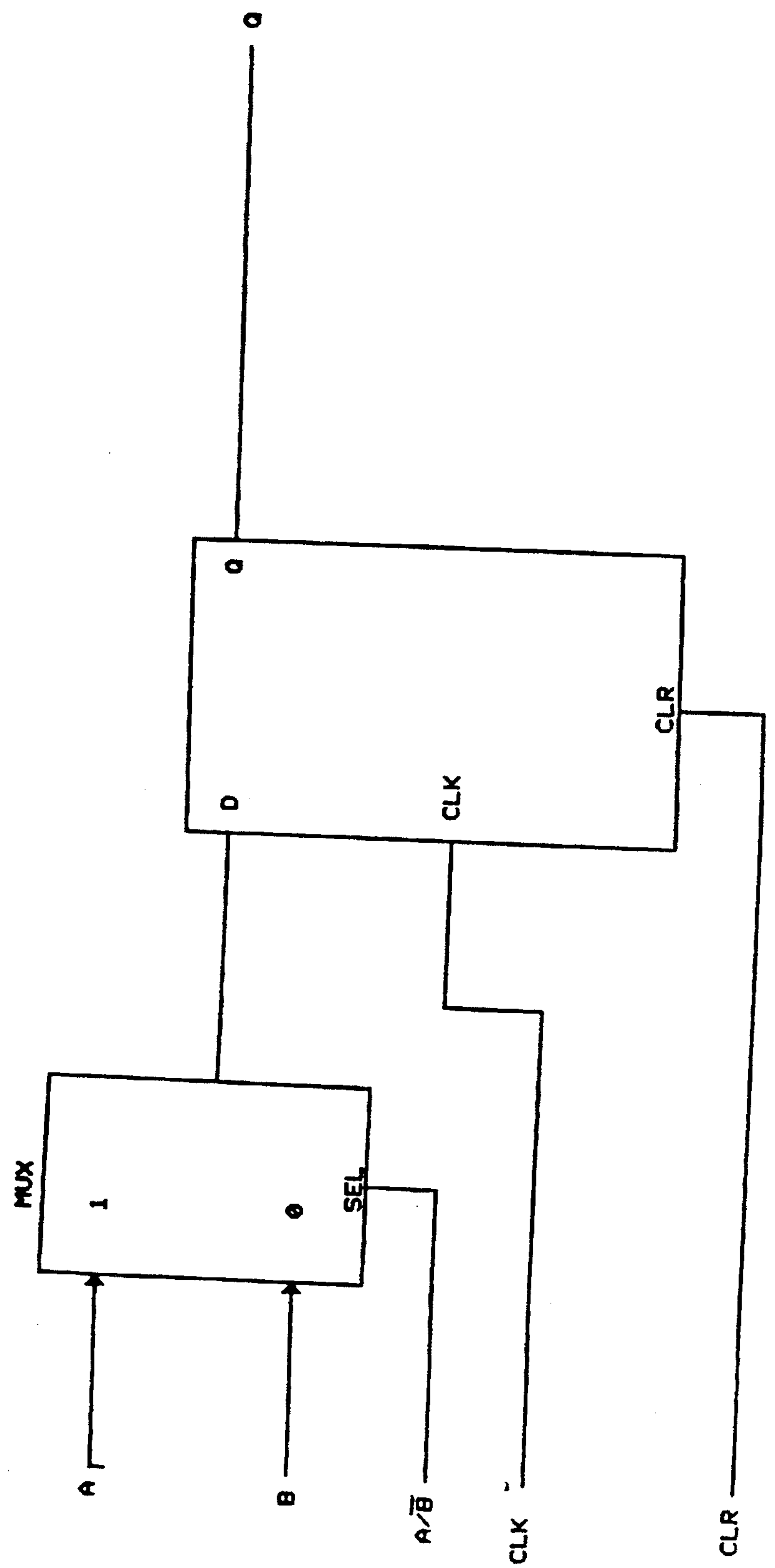
Figure 132:
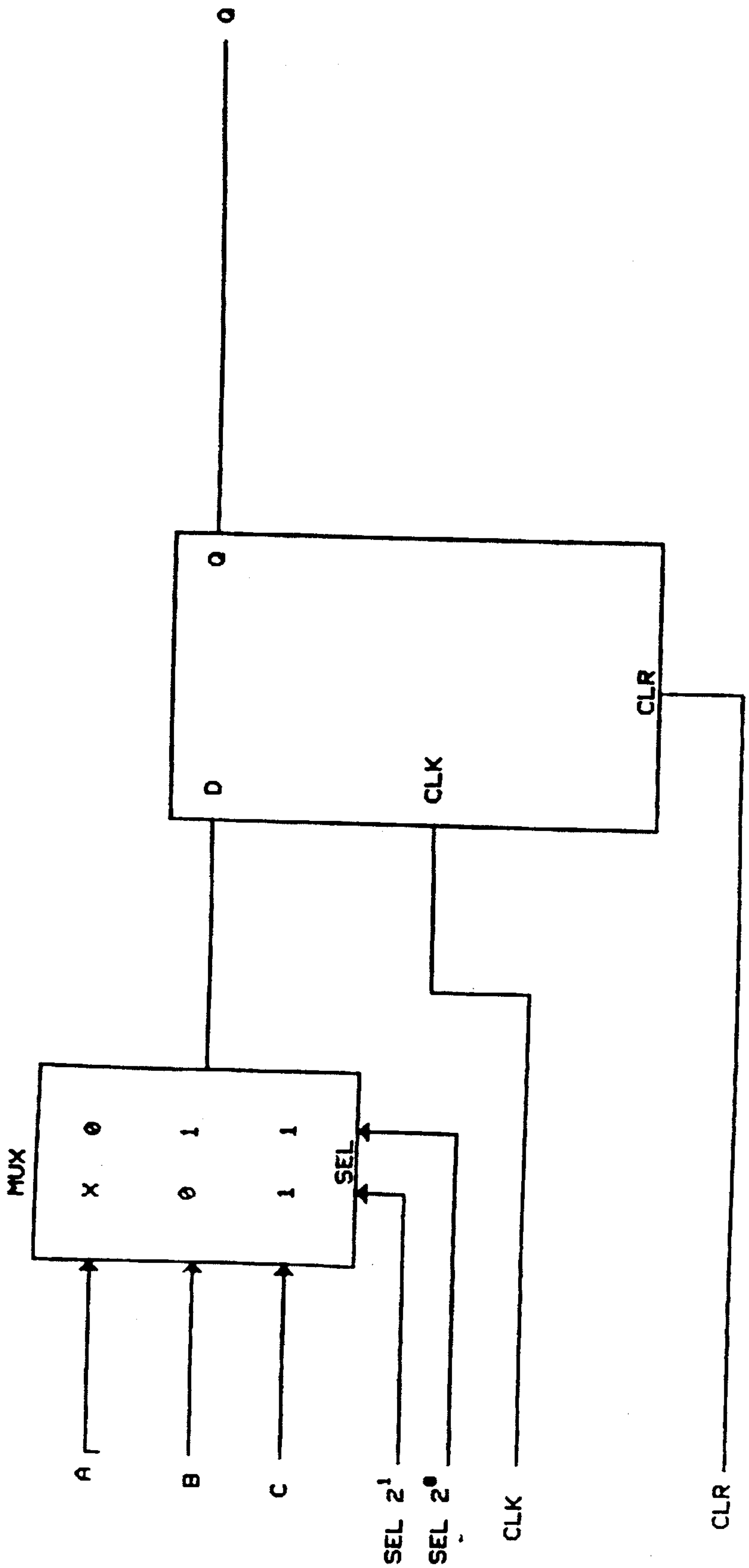

FIGS. 35 through 132 comprise three groups of figures which illustrate three different embodiments of the present invention namely FIGS. 35 through 65 illustrating Version 1, FIGS. 66 through 97 illustrating Version 2 and FIGS. 98 through 132 illustrating Version 3, each version being an alternate embodiment of the invention.

Version 1

Single burst correction real time.

Real time correction span 11 bits.

- Real time correction by burst trapping.
- Residue available for non-real time correction.
- 1-bit serial encoder and residue generator.
- 1-bit serial burst trapping.
- External XOR LFSR for encode and residue generation.
- External XOR LFSR for burst trapping.
- 1-bit serial, high order first, multiple-input, multiple-constant, multiply-and-sum circuit used in encoder and residue generator.
- 1-bit serial, low order first, multiple-constant, multiply-and-sum circuit used in burst trapping.
- 1F clock is used for encode and residue generation.
- 2F clock is used for burst trapping.
- Real time correction is accomplished in one-half sector time.

Version 2

- Single burst correction real time.
- Real time correction 11 bits.
- Real time correction by burst trapping.
- Residue available for non-real time correction.
- 1-bit serial encoder and residue generator.
- 2-bit serial burst trapping.
- External XOR LFSR for encode and residue generation.
- External XOR LFSR for burst trapping.
- 1-bit serial, high order first, multiple-input, multiple-constant, multiply-and-sum circuit used in encoder and residue generator.
- 2-bit serial, low order first, multiple-constant, multiply-and-sum circuit used in burst trapping.
- Also supports 32 and 56-bit computer-generated codes (shift register A is shared).
- Also supports CRC-CCITT CRC code (shift register A is shared).
- 1F clock is used for encode, residue generation, and burst trapping.
- Real time correction is accomplished in one-half sector time.

The 32-bit, 56-bit and CRC codes are as follows:

32-bit Computer-Generated Polynomial $x^{32}+X^{28}+X^{26}+X^{19}+X^{17}+X^{10}+X^{6}+X^{2}+X^{0}$ P 56-bit Computer-Generated Polynomial $x^{56}+x^{52}+x^{50}+x^{43}+x^{41}+x^{34}+x^{30}+x^{26}+x^{24}+x^{8}+1$ CRC Code $x^{16}+x^{12}+x^{5}+1$ Version 3

- Single burst correction real time.
- Real time correction span programmable from 11 to 20 bits in 3 bit increments.
- Real time correction by burst trapping.
- Residue available for non-real time correction.
- 1-bit serial encoder and residue generator.
- 2-bit serial burst trapping.
- External XOR LFSR for encode and residue generation.
- External XOR LFSR for burst trapping.
- 1-bit serial, high order first, multiple-input, multiple-constant, multiply-and-sum circuit used in encoder and residue generator.
- 2-bit serial, low order first, multiple-constant, multiply-and-sum circuit used in burst trapping.
- 1F clock is used for encode, residue generation, and burst trapping.
- Real time correction is accomplished in one-half sector time.

DETAILED HARDWARE LOGIC DIAGRAMS

The Hardware can be divided into two major sections, the generator and the corrector. The following description applies specifically to Version 1.

The Generator. The generator section of the logic consists of Shift Register A and control logic. The clock for Shift Register A is the A-CLK. The clock for the control logic is the 1FCLK. Shift Register A is used to compute redundancy during a write and to compute a residue during read.

The Corrector. The corrector section of the logic consists of Shift Register B and control logic. The clock for Shift Register B is the B-CLK. The clock for the control logic is the 2FCLK. If an ECC error is detected during a read, at the end of the read the contents of Shift Register A are flipped end-on-end, bit-by-bit, and transferred to Shift Register B then Shift Register B is clocked to find the error pattern. An offset register is decremented as Shift Register B is clocked. When the error pattern is found, clocking continues until the error pattern is byte- and right-aligned. When alignment is complete, the clock for Shift Register B is shut off and decrementing of the offset counter is stopped in order to freeze the error pattern and offset. In addition, the interrupt and CORRECTABLE_ECC_ERR signals are asserted. If the offset count is exhausted without finding the error pattern, the interrupt and UNCORRECTABLE_ECC_ERR signals are asserted. When the interrupt signal is asserted for a correctable error, stages B71-B48 of shift register B contain the error pattern and the offset counter contains the error displacement. The error displacement is the displacement in bytes from the beginning of the sector to the last byte in error. The logic prevents correction from being attempted on extended redundancy bytes (prepad, redundancy, or postpad bytes). Errors that span data and redundancy are also handled by the logic.

In order to avoid implementing an adder to add the offset to an address, the ECC circuit provides signals on its interface that can be used by the data buffer logic to decrement an address counter.

An error that is found to be uncorrectable by the hardware on-the-fly correction circuits may still be correctable by software. In the preferred embodiment, hardware on-the-fly correction is limited to a single burst of length 11 bits or less. Software algorithm correction is limited to the correction a single burst of length 22 bits or less or two independent bursts, each of length 11 bits or less.

Since the Reed-Solomon code implemented in the preferred embodiment is not interleaved, a single burst can affect two adjacent symbols and, therefore, it was necessary to select a code that could correct four symbols in error in order to guarantee the correction of two bursts. The code itself could be used to correct up to four independent bursts if each burst is contained within a single symbol. However, using the code in this way increases miscorrection probability and, therefore, is not recommended. When the software algorithm determines that four symbols are in error, it verifies that no more than two bursts exist by performing check on error locations and patterns.

| LINE AND FUNCTION DEFINITIONS | |
|---|---|
| 1FCLK | Clock synchronized to read/write data. |
| 2FCLK | Clock with twice the frequency of 1FCLK. |
| A0-A79 | Outputs of flops of Shift Register A. |
| A_CLK | A gated clock developed by the ECC circuit and used to clock Shift Register A. |
| ADDRDEC | This signal is used to decrement the address counter in the data buffer manager logic. When the error pattern is found, the address counter holds the offset of the last byte in error from the beginning of the sector. The data buffer logic performs a read-modify-write at the location pointed to by the address counter using bits B55-B48 as the error pattern. Next, the address counter is decremented by the data buffer manager logic and another read-modify-write is performed using bits B63-B56 as the error pattern. The address counter is decremented once more by the data buffer manager logic and the final read-modify-write is performed using bits B71-B64 as the error pattern. The above procedure is modified if any of the signals DISPMINUS, DISPZERO, or DISPONE are asserted. |
| B0-B79 | Outputs of flops of Shift Register B. |
| B_CLK | A gated clock developed by the ECC circuit and used to clock Shift Register B. |
| CORR_MODE | CORR_MODE is set if an error is detected on reading a data field, provided hardware correction is enabled. The set up condition for this mode causes Shift Register A to be transferred to Shift Register B. The error displacement and pattern are determined under this mode. |
| CORRECTABLE_ECC_ERR | This signal is activated if the error pattern is found in correction mode within the number of shifts allocated and other qualifying criteria are met. |
| COUNT_NINE_A | Activates for one GTD1FCLK clock period each time the modulo-ten counter A reaches nine. |
| COUNT_NINE_B | Activates for one GTD1FCLK clock period each time the modulo-ten counter B reaches nine. |
| COUNT_ZERO_A | Activates for one GTD1FCLK clock period each time the modulo-ten counter A reaches zero. |
| CRC/$\overline{ECC}$ | This signal is high for an ID field and low for a data field. |
| DATA_TIME | DATA_TIME is an input to the circuit. It is asserted prior to the leading edge of 1FCLK for the first data bit. It is de-asserted after the leading edge of the 1FCLK for the last data bit. |
| DATA_DONE_PUISE | Asserted for one GTD1FCLK clock time after the de-assertion of DATA_TIME. |
| OFFSET_MOD_8=1 | This signal is activated for one GTD1FCLK clock time when the contents of the offset counter modulo 8 are equal to one. It is used in achieving error pattern byte alignment. |
| DISPGTHONE | If this line is asserted, the data buffer manager logic will perform three read-modify-writes in accomplishing correction. |
| DISPMINUS | If this line is asserted, the data buffer manager logic will not perform any read-modify-writes. |
| DISPONE | If this line is asserted, the data buffer manager logic will perform only two read-modify-writes in accomplishing correction. |
| DISPZERO | If this line is asserted, the data buffer manager logic will perform only one read-modify-write in accomplishing correction. |
| DLYD_DATA_TIME | DATA_TIME delayed by one GTD1FCLK clock time of GTD1FCLK. |

-continued

| LINE AND FUNCTION DEFINITIONS | |
|---|---|
| DLYD_REDUN_TIME | REDUN_TIME delayed by one GTD1FCLK clock time of GTD1FCLK. |
| ECCIN | This is the input to Shift Register A during a write or read. During a write, write data appears on this line. During a read, data and redundancy read from the media appear on this line. This line is forced low during PREPAD_TIME and POSTPAD_TIME during both writes and reads. |
| ERR_CLEAR | Clears error status. |
| EXT_BCLK_EN | External B clock enable. This is asserted for 8 periods of 2FCLK, to shift Shift Register B 8 times in order to position the next byte for outputting. This function is used only when HDW_CORR_EN is inactive. This signal must be activated and de-activated during the positive half cycle of 2FCLK. |
| EXT_REDUN_TIME | Extended redundancy time. This signal is the OR of PREPAD_TIME, REDUN_TIME, and POSTPAD_TIME. |
| FDBKEN | When high, this signal enables feedback for Shift Register A. |
| FREEZE_CLK | This signal is normally de-asserted. It is asserted only when it is desired to hold the ECC circuit conditions as the gap between split fields is processed. It must be activated and de-activated during the high half of 1FCLK. |
| GTD1FCLK | This is the gated 1FCLK. 1FCLK is gated only by the FREEZE_CLK input signal. |
| HDW_CORR_EN | When this signal is high, single bursts are corrected on-the-fly. |
| ID_FIELD_CRC_ERROR | Indicates an ID field error. |
| ID_ERR_CLEAR | Clears the ID field CRC error latch. |
| INTERRUPT | If hardware correction is not enabled, INTERRUPT is set at the end of a read if an error exists. If hardware correction is enabled, INTERRUPT is set when the error pattern is found for a correctable error or when the offset counter goes negative for an uncorrectable error. |
| INIT | Initializes the ECC circuit. INIT must be asserted for one 1FCLK clock time prior to each read or write (prior to asserting DATA_TIME). |
| ISOLATED | ISOLATED is asserted if either the isolation detect Flipflop (FF) or the first non-zero FF are in the one state. |
| JOB_DONE_PULSE | This signal is active for one GTD1FCLK clock time at the end of POSTPAD_TIME or at the end of REDUN_TIME if no post-padding is required. |
| LATCHED_ERROR | On a read, LATCHED_ERROR is set if a nonzero difference exists between read checks and write checks. |
| LNET_A | LNET_A is the linear network (PTREE _A) and the linear network register for Shift Register A. |
| LNET_B | LNET_B is the linear network (PTREE_B) and the linear network register for Shift Register B. |
| LNLOAD_A | This signal is asserted each time modulo ten counter A reaches nine. On the next rising clock edge after its assertion, the LNET_A register is cleared and its input is transferred to Shift Register A bits A70-A79. |
| LNLOAD_B | This signal is asserted each time modulo ten counter B reaches nine. On the next rising clock edge after its assertion, the LNET_B register is cleared and its input is transferred to Shift Register B bits B70-B79. |
| MODULO_TEN_COUNTER_A | The symbol size for the Reed-Solomon code is 10. The MODULO_TEN_COUNTER_A establishes symbol boundaries during read and write operations. |
| MODULO_TEN_COUNTER_B | The symbol size for the Reed-Solomon code is 10. The MODULO_TEN_COUNTER_B establishes symbol boundaries during a correction operation. |

-continued

| LINE AND FUNCTION DEFINITIONS | |
|---|---|
| MP_BUS | The microprocessor bus comes to the ECC circuit for loading the offset counter. |
| MP_BUS_CONTROL | Control signals for latching the contents of the microprocessor bus into the offset counter. |
| NUMFMTBYTES= 0<br>NUMFMTBYTES= 1<br>NUMFMTBYTES= 2 | This signal informs the ECC logic of the number of formal bytes between the sync byte and the first data bytes. Errors in the sync byte are considered uncorrectable (option) while errors in the format bytes are ignored. |
| OFFSET COUNTER | At the beginning of a correction operation, the offset counter is initialized to the maximum number of shifts of Shift Register B that could be required before the error pattern is found. The offset counter is decremented once each time Shift Register B is shifted in searching for the error pattern. When the error pattern is found, shifting continues until it is byte aligned. When byte alignment is complete, the offset counter contains the displacement. |
| OFFSET_CNTR=0 | Asserted when the offset counter is equal to zero. |
| OFFSET_MOD_8=1 | This signal is used in byte aligning the error pattern. |
| PAD COUNTER | The pad counter counts pad bits. There are always a total of eight pad bits. There are two pad areas. The prepad area is between data and redundancy. The postpad area is after redundancy. If the number of data bits is divisible by 10, all pad bits are written in the postpad area, otherwise,, pad bits are split between the prepad and postpad areas. The number of prepad bits are selected to make the sum of data and prepad bits divisible by 10. |
| PAD_CNTR=7 | Asserted when the PAD COUNTER is equal to seven. |
| PAD_CNTR=8 | Asserted when the PAD COUNTER is equal to eight. |
| POSTPAD_TIME | This signal spans all post pad bits. |
| POSTPAD_DONE_PULSE | This signal is active for one GTD1FCLK clock time after POSTPAD_TIME. |
| PREPAD_COUNT SAVE REGISTER | The number of prepad bits varies with sector size. This register saves the number of prepad bits for the correction circuitry. |
| PREPAD_CNT_SAV | Outputs of the PREPAD_COUNT SAVE REGISTER. |
| PREPAD_TIME | This signal spans all prepad bits. |
| PREPAD_DONE_PULSE | This signal is active for one GTD1FCLK clock time after PREPAD_TIME. |
| PTREE_A | This is the linear network for Shift Register A. Its configuration is established by the code generator polynomial. |
| PTREE_B | This is the linear network for Shift Register B. Its configuration is established by the reciprocal polynomial of the code generator polynomial. |
| PTRN_FOUND | As Shift Register B is shifted while searching for the error pattern, certain conditions are monitored. The PTRN_FOUND signal is active when the monitored conditions are met. |
| PWR_ON_RST | Asserted at POWER_ON time or at any other time when the state of the ECC circuitry is not known. |
| RD/WRT_DATA | This is the data input signal to the ECC circuit. |
| READ | Active during a read from the media. |
| REDUNDANCY_COUNTER | Counts CRC redundancy bits for ID fields and ECC redundancy bits for data fields. |
| REDUN_TIME | Spans all redundancy bits during a read or write operation. |
| REDUN_TCNT | This signal becomes active on count 15 for ID fields (CRC) and on count 79 for data fields (ECC). |
| REDUN_DONE_PULSE | This signal is active for one B-CLK clock time after REDUN_TIME. |
| REDUN/REM | During a write, redundancy bits appear on this line, during a read, residue bits appear on this line. |
| RSTB1 | The logical OR of ERR_CLEAR, PWR_ON_RST, |

-continued

| LINE AND FUNCTION DEFINITIONS | |
|---|---|
| | and $\overline{\text{CORR\_MODE}}$. |
| SET_CORR_MODE | This signal activates at the end of a read to set correction mode if an error exists. |
| SET_REDUN_TIME | The set condition for REDUN_TIME. |
| SHIFT_Register_A (SRA) | Shift Register A generates redundancy during write operations and a residue during read operations. |
| SHIFT_Register_B (SRB) | Shift Register B is the corrector shift register. On the detection of an error on read, the contents of Shift Register A (the residue) are flipped end-on-end and then transferred to Shift Register B. Shift Register B is then shifted until the error pattern is found or until the offset count is exhausted. |
| STOP_A_CLK | This signal goes active to stop clocking of Shift Register A so that its contents can be transferred to Shift Register B. |
| STOP_B_CLK | This signal goes active to stop clocking of Shift Register B and the offset counter once the error pattern is found so that the error pattern can be preserved. |
| SUPPRESS | SUPPRESS is asserted during correction mode during the first clocks as we clock back over redundancy and prepad bits. It is used to prevent the circuitry from attempting a correction within redundancy or pad bits. |
| SYNC_ERR_INHIBIT | If this signal is asserted, errors in the sync byte will be ignored. |
| UNCORRECTABLE_ECC_ERR | This signal goes active if the offset count is exhausted while clocking Shift Register B in searching for an error pattern. |
| WRITE | Active during a write to the media. |
| WRITE DATA/REDUN | During DATA_TIME of a write operation, this line carries write data bits. During the REDUN_TIME that follows, it carries write redundancy bits. |
| XFER | This signal causes the contents of Shift Register A to be flipped end-on-end and then transferred to Shift Register B. |

NOTES

1. All clocking is on the positive edge of the input clocks 1FCLK and 2FCLK.

2. When the B-CLK stops, B48-B55 (B55 is LSB) is the last byte in error. B56-B63 is the middle byte in error. B64-B71 is the first byte in error. Data buffer READ_MODIFY_WRITES are required only for the non-zero of these bytes.

3. Shift Register B (SRB) is loaded with a flipped copy of Shift Register A (SRA) and therefore, does not require preset or clear. Shift Register A must be initialized to the following HEX pattern prior to any write or read: HEX "00 29 3F 75 71 DB 5D 40 FF FF" The least significant bit of this pattern defines the initialization value for Shift Register bit AO and so on. The LFSR initialization pattern used in the preferred embodiment was chosen to minimize the likelihood of undetected errors in the synchronization between the bit stream recorded or transmitted in the media and the byte or symbol boundaries imposed on the information as it is received. This type of error is called a synchronization framing error. Techniques for minimizing the influence of synchronization framing errors on miscorrection are known in the prior art. See the book Practical Error Correction Design for Engineers by Glover and Dudley, page 256. The initialization pattern of the preferred embodiment was selected according to the rules set forth in the above reference so as to be unlike itself in shifted positions. This initialization pattern provides protection from miscorrection associated with synchronization framing errors that is far superior to the protection provided by initialization patterns of all ones or of all zeros.

4. Clock cycles start on a positive edge. DATA_GATE must be activated within the first half of a cycle of 1FCLK.

5. There are always 8 bits of padding to be handled on each read or write. This padding is divided such that part is accomplished between data and redundancy and part follows redundancy. In the special case where the number of data bits is divisible by 10, all padding follows redundancy. In all other cases, the number of pad bits between data and redundancy bits (prepad bits) is selected to make the number of data and prepad bits divisible by 10.

DETAILED FIRMWARE DESCRIPTION

In a finite field $GF(2^m)$ elements are composed of m binary bits and addition ($\oplus$) consists of MODULO 2 summation of corresponding bits; this is equivalent to performing the bit-wise EXCLUSIVE-OR sum of operands:

$$x \oplus y = x \text{ XOR } y.$$

Note that subtraction is equivalent to addition since the MODULO2 difference of bits is the same as their MODULO 2 sum.

In software, multiplication (*) may be implemented using finite field logarithm and antilogarithm tables wherein LOG $[\alpha^i]=i$ and $ALOG[i]=\alpha^i$:

| | |
|---|---|
| $x*y=0$ | if $x=0$ or $y=0$ |
| $x*y=\mathrm{ALOG}[\mathrm{LOG}[x]+\mathrm{LOG}[y]]$ | if $x\neq 0$ and $y\neq 0$ |

where the addition of the finite field logarithms is performed MODULO $2^m-1$. LOG[O] is undefined.

Division (/) may be implemented similarly:

| | |
|---|---|
| $x/y$ is undefined | if $y=0$; |
| $x/y=0$ | if $x=0$ and $y\neq 0$; |
| $x/y=\mathrm{ALOG}[\mathrm{LOG}[x]-\mathrm{LOG}[y]]$ | if $x\neq 0$ and $y\neq 0$. |

Note that for non-zero x, LOG[i/x]=-LOG[x]=LOG[x]XOR $2^m-1$.

Alternatively, multiplication of two elements may be implemented without the need to check either element for zero by appropriately defining LOG[O]and using a larger antilogarithm table, e.g. by defining LOG[O]=$2^{(m+1)}-3$ and using an antilogarithm table of $2^{(m+2)}-5$ elements wherein:

| | |
|---|---|
| $\mathrm{ALOG}[i]=\mathrm{ALOG}[i-(2^m-1)]$ | for $2^m-1\leqq i<2^{(m+1)}-3$, and |
| $\mathrm{ALOG}[i]=0$ | for $i\geqq 2^{(m+1)}-3$. |

The size of the tables increases exponientially as m increases. In certain finite fields, subfield computations can be performed, as developed in the section entitled "Subfield Computation" herein. In such a finite field, addition, the taking of logarithms and antilogarithms, multiplication, and division in the "large" field GF($2^m$) are performed using a series of operations in a "small" finite field GF($2^n$) where n=m+2. Consequently, the size of the tables required is greatly reduced. However, such a finite field may not have the best characteristics for minimizing complexity and cost of hardware necessary to implement encoders and decoders. By proper selection of finite field generator polynomials as shown in the section entitled "Constructing Reed-Solomon Codes" herein, it is possible to use an "external" finite field well suited for hardware implementation and an "internal" finite field with subfield properties for software algorithms. Conversion between the two fields is performed using a linear mapping, as developed in the section entitled "Constructing Reed-Solomon Codes" herein.

In a decoder for an error detection and correction system using a Reed-Solomon or related code of distance d for the detection and correction of a plurality of symbol errors in codewords of n symbols comprised of n-(d-l) data symbols and d-1 check symbols, each symbol an element of GF($2^m$), a codeword C(x) is given by $$C(x)=(x^{d-1}*I(x))\oplus((x^{d-31\ 1}*I(x))\ \mathrm{MOD}\ G(x)) \quad (1)$$

where I(x) is an information polynomial whose coefficients are the n-(d−1) data symbols and G(x) is the code generator polynomial $$G(x)=\prod_{i=0}^{d-2}(x-\alpha^{m0+i}) \quad (2)$$

where $m_0$ is a parameter of the code. A code of distance d can be used to correct all cases of t=INT((d−1)/2) symbol errors without pointers and is guaranteed to detect all cases of INT(d/2) symbol errors.

When e symbol errors occur, the received codeword C'(x) consists of the EXCLUSIVE-OR sum of the transmitted codeword C(x) and the error polynomial E(x):

$$C'(x)=C(x)\oplus E(x). \quad (3)$$

where $$E(x)=E_1*x^{L_1}\oplus\ldots E_e*x^{L_e}; \quad (4)$$

$L_i$ and $E_i$ are the locations and values, respectively, of the e symbol errors.

The remainder polynomial $$R(x)=R_{d-2}*x^{d-2}\oplus\ldots\oplus R_1*x\oplus R_0 \quad (5)$$

is given by $$R(x)=C'(x)\ \mathrm{MOD}\ G(x) \quad (6)$$

that is, the remainder generated by dividing the received codeword C'(x) by the code generator polynomial G(x).

By equation (1), $$C(x)\ \mathrm{MOD}\ G(x)=0, \quad (7)$$

so from equation (3), $$R(x)=E(x)\ \mathrm{MOD}\ G(x) \quad (8)$$

The coefficients of the syndrome polynomial $$S(x)=S_{d-2}*x^{d-2}\oplus\ldots\oplus S_1*x\oplus S_O$$

are given by $$S_i=C'(x)\ \mathrm{MOD}\ g_i(x), \quad (9)$$

that is, the remainders generated by dividing the received codeword C'(x) by the factors $$g_i(x)=(x\oplus\alpha^{m0+i})$$

of the code generator polynomial G(x).

Equation (1) implies $$C(x)\ \mathrm{MOD}\ g_i(x)=0, \quad (10)$$

so from equation (3), $$Si(x)=E(x)\ \mathrm{MOD}\ g_i(x) \quad (11)$$

Shift Register A of the present invention could emit the remainder coefficients $R_i$ if feedback were disabled while the redundancy symbols of the received codeword C'(x) are being received, but additional hardware would be required to collect and store the coefficients $R_i$ for use in decoding error locations and values. Instead, shift register feedback is enabled while redundancy symbols are being received and a modified form of the remainder polynomial, called the residue polynomial T(x), is stored in the shift register itself. The coefficients $T_i$ of t h e residue polynomial T(x) are related to the coefficients $R_i$ of the remainder polynomial R(x) according to:

$$T_i=R_{d-3-i}\oplus\sum_{j=0}^{i-1}G_{j+d-1-i}*T_j\oplus G_{d-2-i}*R_7$$

for $0<i\leqq d-3$;

$$T_i=\sum_{j=0}^{i-1}G_{j+1}*T_j\oplus G_0*R_7 \quad \text{for } i=d-2.$$

The residue polynomial T(x) can be used in decoding error locations and values in several ways. T(x) can be used directly, e.g. the burst-trapping algorithm implemented in the preferred embodiment of the invention uses T(x) to decode and correct a single error burst spanning multiple symbols using a shifting process. Decoding error locations and values from the remainder polynomial R(x) or the syndrome polynomial S(x) is known in the prior art, for example see Glover and Dudley, U.S. Pat. No. 4,839,896. T(x) could be used to compute R(x) by solving the system of equations above. T(x) could be used to directly compute S(x) using a matrix of multiplication constants. In the preferred embodiment of the invention, T(x) is used to compute a modified form of the remainder polynomial R(x), which is then used to compute a modified form of the syndrome polynomial S(x).

SYNDROME POLYNOMIAL GENERATION: A software correction algorithm could produce a modified form of the remainder polynomial defined by $$P(x)=(x^{d-1}*C'(x)) \text{ MOD } G(x)$$

from T(x) by simulating clocking the shift register d-1 symbol-times with input forced to zero and feedback disabled and recording the output of the XOR gate which emits redundancy during a write operation. Mathematically, this process is defined by:

$$P_i=\sum_{j=0}^{i} G_j*T_{j+d-3-i} \quad \text{for } 0<i\leqq d-3;$$
$$P_i=T_{d-2} \quad \text{for } i=d-2.$$

The coefficients $S_i'$ of a modified frequency-domain syndrome polynomial S'(x) can be computed from the coefficients $P_i$ of the modified remainder polynomial P(x) according to $$S_i'=\sum_{j=0}^{d-2} P_j*\alpha^{j(m0+1)}.$$

When the coefficients $P_i$ or $S_i'$ are used in decoding, the error locations produced are greater than the actual error locations by d-1.

In the preferred embodiment of the invention, software complexity is reduced by first simulating the clocking of the shift register one symbol-time with input forced to zero and feedback enabled and then clocking d-1 symbol-times with input forced to zero and feedback disabled to produce a modified form of the remainder defined by $$W(x)=(x^{d}*C'(x)) \text{ MOD } G(x)$$

The coefficients Qi of Q(x) are calculated from the residue coefficients $T_i$ as follows:

$$Q_i=\sum_{j=0}^{i} G_j*T_{j+d-2-i} \quad \text{for } 0<i\leqq d-2.$$

The coefficients $S_i''$ of the frequency-domain syndrome polynomial S"(x) can be computed from the coefficients $Q_i$ of the modified remainder polynomial Q(x) according to $$S_i''=\sum_{j=0}^{d-2} Q_j*\alpha^{j(m0+1)}.$$

When the coefficients $Q_i$ or $S_i''$ are used in decoding, the error locations produced are greater than the actual error locations by d. Hereafter, S(x) means S"(x), $S_i$ means $S_i''$ etc. unless otherwise noted.

It is clear that those skilled in the art could implement variations of the above methods to produce remainder and/or syndrome polynomials suitable for decoding errors.

Sequential computation of each coefficient $S_i$ would require d-1 references to each coefficient $Q_j$. Physical constraints and interleaving of multiple codewords often make each reference to a coefficient $Q_j$ difficult and time-consuming.

In the preferred embodiment of this invention, the time required to calculate the coefficients of S(x) is reduced by computing each coefficient $Q_j$ and sequentially computing and adding its contribution to each coefficient $S_i$.

When an "external" finite field suited for hardware implementation and an "internal" finite field with subfield properties suited for software implementation are used, the coefficients $T_i$ are mapped from the "external" finite field to the "internal" finite field before any finite field computations are performed. When an error value has been decoded, it is mapped back to the "external" finite field before being applied to the symbol in error.

Data paths and storage elements in hardware executing a software correction algorithm are typically eight, sixteen, or thirty-two bits in width. When m differs from the data path width, storage space can be minimized by storing finite field elements in a "packed" format wherein a given finite field element may share a storage element with one or more others. Shifting of the desired finite field element and masking of the undesired finite field element(s) are required whenever a finite field element is accessed. On the other hand, speed can be increased by storing finite field elements in an "unpacked" format wherein each storage element is used by all or part of a single finite field element, with unused bits reset. When subfield computation is to be used, software complexity and execution time can be reduced when the components $x_0$ and $x_1$ of a finite field element $x=x_1\cdot\alpha\oplus x_0$ are kept in separate storage elements with unused high-order bits reset. In the preferred embodiment of the invention, the process of mapping the coefficients $T_i$ from the "external" field to the "internal" field is combined with that of separating subfield components. This is done by separating the mapping table into two parts, one for the m/2 low-order bits and one for the m/2 high-order bits of the "internal" finite field representation, where each part of the table has m entries of m/2 bits each. Likewise, the process of mapping an error value E from the "internal" field to the "external" field is performed simultaneously with that of combining subfield components. This is done by separating the mapping table into two parts, one for them/2 low-order bits and one for them/2 high-order bits of the "internal" finite field representation, where each part of the table has m/2 entries of m bits each.

ERROR LOCATOR POLYNOMIAL GENERATION: The coefficients of S(x) are used to iteratively generate the coefficients of the error locator polynomial σ(x). Such iterative algorithms are known in the prior art; for example, see Chapter 5 of Error-Correction Coding for Digital Communications by Clark and Cain. Typically, the error locator polynomial is iterated until n=d-1, but at the cost of some increase in miscorrection probability when an uncorrectable error is encounterd, it is possible to reduce the number of iterations required for correctable errors by looping only until $n=t+l_n$, where 1. is the degree of σ(x).

ERROR LOCATION AND EVALUATION: If the degree of σ(x) indicates more than four errors exist, σ(x) is evaluated at $x=\alpha^L$ for each L, $0\leqq L<2^m-1$, until the result is zero, which signifies that $\alpha^L$ is a root of σ(x) and L is an error location. When the location L of an error has been determined, σ(x) is divided by $(x\oplus\alpha^L)$, producing a new error locator polynomial of degree one less than that of the old:

$$\sigma(x) = \frac{\sigma(x)}{x \oplus \alpha^L}.$$

The error value E may be calculated directly from S(x) and the new σ(x) using $$E = \alpha^{-Lm_0} * \frac{\sum_{i=0}^{j} \sigma_i * S_{j-i}}{\sigma(x)'_{\alpha^L}}$$

where j is the degree of the new σ(x).

In the preferred embodiment of this invention, the division of σ(x) by $(x \oplus \alpha^L)$ and the calculation of the numerator and denominator of E are all performed in a single software loop.

When the location L and value E of an error have been determined, the coefficients of S(x) are adjusted to remove its contribution according to $$S_i = S_i \oplus E * \alpha^{L(M_0+i)}.$$

By reducing the degree of σ(x) and adjusting S(x) as the location and value of each error are determined, the time required to locate and evaluate each successive error is reduced.

As noted above, in the preferred embodiment of the invention, an error location L produced is greater than the actual error location by d, due to the manner in which S(x) is calculated. Also, when different "external" and "internal" finite fields are used, the error value E must be mapped back to the "external" field before it is applied to the symbol in error.

When the degree j of σ(x) is four or less, the time required to locate the remaining errors is reduced by using the special error locating routines below, each of which locates one of the remaining errors without using the Chien search. After the location of an error has been determined by one of the special error locating routines, its value is calculated, σ(x) is divided by $(x \oplus \alpha^L)$, and S(x) is adjusted in the same way as when an error is located by evaluating σ(x).

When j=1, the error locator polynomial is $$x \oplus \sigma_1 = 0$$

By inspection, the root of this equation is $\sigma_1 = \alpha^L$. Thus $$L = LOS[\sigma_1].$$

When j=2, the error locator polynomial is $$x^2 \oplus \sigma_1 * x \oplus \sigma_2 = 0.$$

Solution of a quadratic equation in a finite field is known in the prior art; for example, see Chapter 3 of Practical Error Correction Design for Engineers by Neal Glover and Trent Dudley. Substituting $x = y,\sigma_1$ yields $$y^2 \oplus y \oplus c = 0, \text{ where } c = \frac{\sigma_2}{\sigma_1^2}.$$

For each odd solution to this equation $Y_1$, there is an even solution $Y_2 = Y_1 \oplus \alpha^0$ (wherein $\alpha^0 = 1$ in the preferred embodiment) $Y^1$ can be fetched from a pre-computed quadratic table derived according to $$QUAD[i^2 \oplus i] = i \oplus 1 \text{ for } i = 0, 2, \ldots 2^m - 2$$

using c as an index. There are $2^{m-1}$ such pairs of solutions; the other elements of the table are set to an invalid number, for example zero, to flag the existence of more than two errors. When $Y_1 = /0$ has been determined, reverse substitution yields an expression for the error location $$L_1 = LOG[\sigma_1 * Y_1]$$

When j=3, the error locator polynomial is $$x^3 \oplus \sigma_1 * x^2 \oplus \sigma_2 * x \oplus \sigma_3 = 0.$$

Solution of a cubic equation in a finite field is known in the prior art; for example, see Flagg, U.S. Pat. No. 4,099,160. Substituting $$x = w \oplus \sigma_1,\ w = t \oplus \frac{B}{t},\ \text{and } v = \frac{t^3}{B}$$

yields a quadratic equation in v:

$$v^2 \oplus v \oplus \frac{A^3}{B^2} = 0$$

where $$A = \sigma_1^2 \oplus \sigma_2 \text{ and } B = \sigma_1 * \sigma_2 \oplus \sigma^3.$$

A root V of this equation may be found by the quadratic method above. Then by reverse substitution $$L = LOG\left[\sigma_1 \oplus (B*V)^{1/3} \oplus \frac{A}{(B*V)^{1/3}}\right].$$

When j=4, the error locator polynomial is $$X^4 \oplus \sigma_1 * x^3 \oplus \sigma_2 * x^2 \oplus \sigma_3 * x \oplus \sigma_4 = 0.$$

Solution of a quartic equation in a finite field is known in the prior art; for example, see Deodhar, U.S. Pat. No. 4,567,594. If $\sigma_1 = 0$, assign $b_i = \sigma_i$ for i=2 to 4, otherwise substitute $$z = \frac{1}{x \oplus (\sigma_3/\sigma_1)^{1/2}}$$

to give $$z^4 \oplus b_2 z^2 \oplus b_3 z \oplus b_4 = 0$$

where $$b_4 = \frac{\sigma_1^2}{\sigma_1^2 * \sigma_4 \oplus \sigma_1 * \sigma_2 * \sigma_3 \oplus \sigma_3^2},$$

$$b_3 = \sigma_1 * b_4,$$

$$b_2 = ((\sigma_1 * \sigma_3)^{1/2} \oplus \sigma_2) * b_4.$$

The resulting affine polynomial may be solved in the following manner:

1) Solve for a root Q of the equation $q^3 \oplus b_2 * q \oplus b_3 = 0$ by the cubic method above.
2) Solve for a root S of the equation $s^2 \oplus b_3/Q * s \oplus b_4 = 0$ by the quadratic method above.
3) Solve for a root Z of the equation $z^2 \oplus Q * z \oplus S = 0$ by the quadratic method above.

If $\sigma_1=0$, L=LOG[Z], otherwise reverse substitution yields $$L=\mathrm{LOG}\left[(\sigma_3/\sigma_1)^{1/2}\oplus\frac{1}{Z}\right]$$

Figure 23:
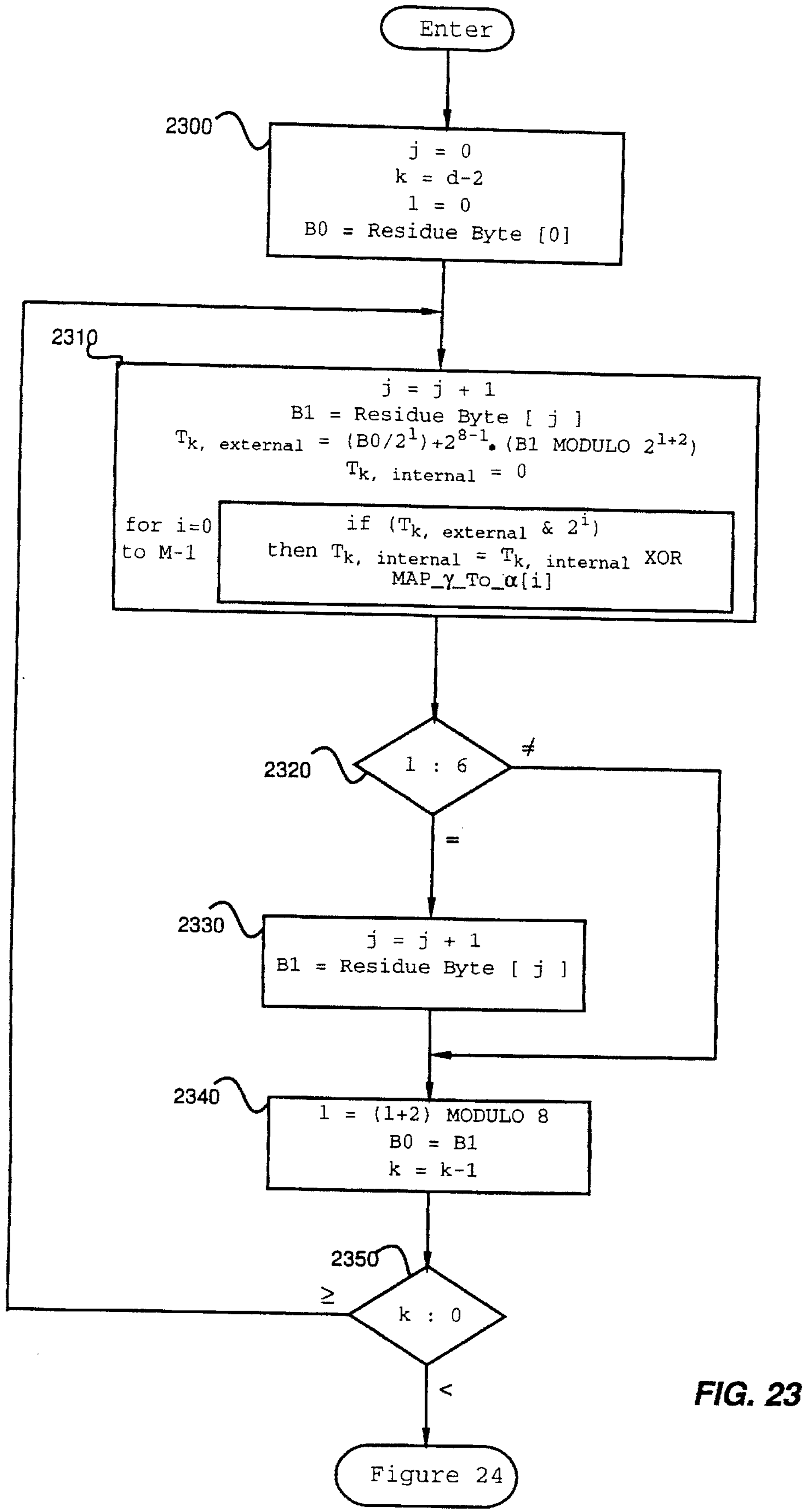
FIG. 23 illustrates the steps required to fetch, assemble, map to an "internal" finite field with subfield properties, and separate the subfield components of the ten-bit symbols of a residue polynomial T(x) stored in a memory of width eight bits.

FIG. 23 illustrates, without loss of generality, the particular case where m=10, the width of data paths and storage elements is eight bits, the residue coefficients $T_i$ are accessed beginning with the eight least-significant bits of $T_{d-2}$, and subfield computation is to be used in a software correction algorithm.

Referring to FIG. 23, Step 2300 initializes counters j=0, k=d-2, 1=0 and fetches the first 8-bit byte from the residue buffer B0. Step 2310 increments counter j, fetches the next 8-bit byte from the residue buffer into B1, and shifts, masks, and combines B0 and B1 to form the next residue coefficient $T_k$, as determined by the value of counter 1. Because subfield computation is to be used, Step 2310 then performs the mapping between the "external" finite field and the "internal" finite field, simultaneously separating the subfield components $T_{k0}$ and $T_{k1}$ for more efficient manipulation by the software correction algorithm. MPA_γ_TO_α[i] is a table such as Table 2 whose entries represent the contribution to the "internal" finite field element of each set bit i in the "external" finite field element. The two components are then stored in a pair of S-bit storage elements. If counter 1 is not equal to six, Step 2320 transfers control to Step 2340. Otherwise Step 2330 increments counter j and fetches the next 8-bit byte from the residue buffer. Step 2340 adds two to counter 1 in a MODULO eight fashion, transfers the contents of B1 to B0, and decrements counter k. If counter k is not less than zero, Step 2350 transfers control back to Step 2310. Otherwise all residue coefficients $T_1$ have been assembled, mapped, separated, and stored, and control is transferred to FIG. 24.

Figure 24:
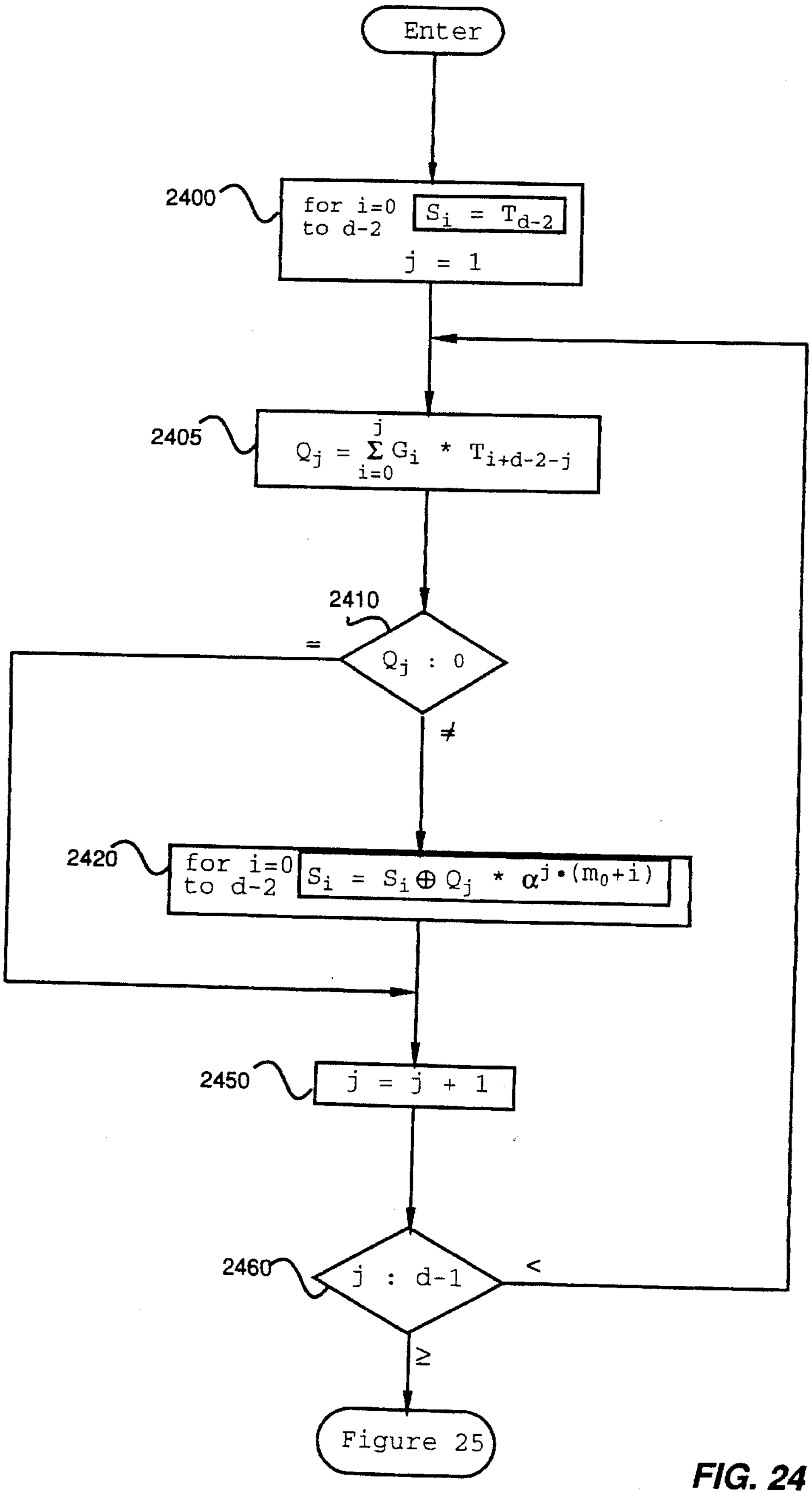
FIG. 24 illustrates the steps required to calculate the coefficients of S(x).

Referring to FIG. 24, Step 2400 initializes all syndrome coefficients $S_1=T_{d-2}$ and initializes counter j=1. Step 2405 computes $Q_j$. If $Q_j=0$, it does not alter the coefficients $S_i$, so Step 2410 transfers control to Step 2450. Otherwise Step 2420 computes and adds the contribution of $Q_j$ to each coefficient $S_i$. Step 2450 increments counter j. If counter j is less than d-1, Step 2460 transfers control back to Step 2405. Otherwise all coefficients $S_i$ have been calculated and control is transferred to FIG. 25.

Figure 25:
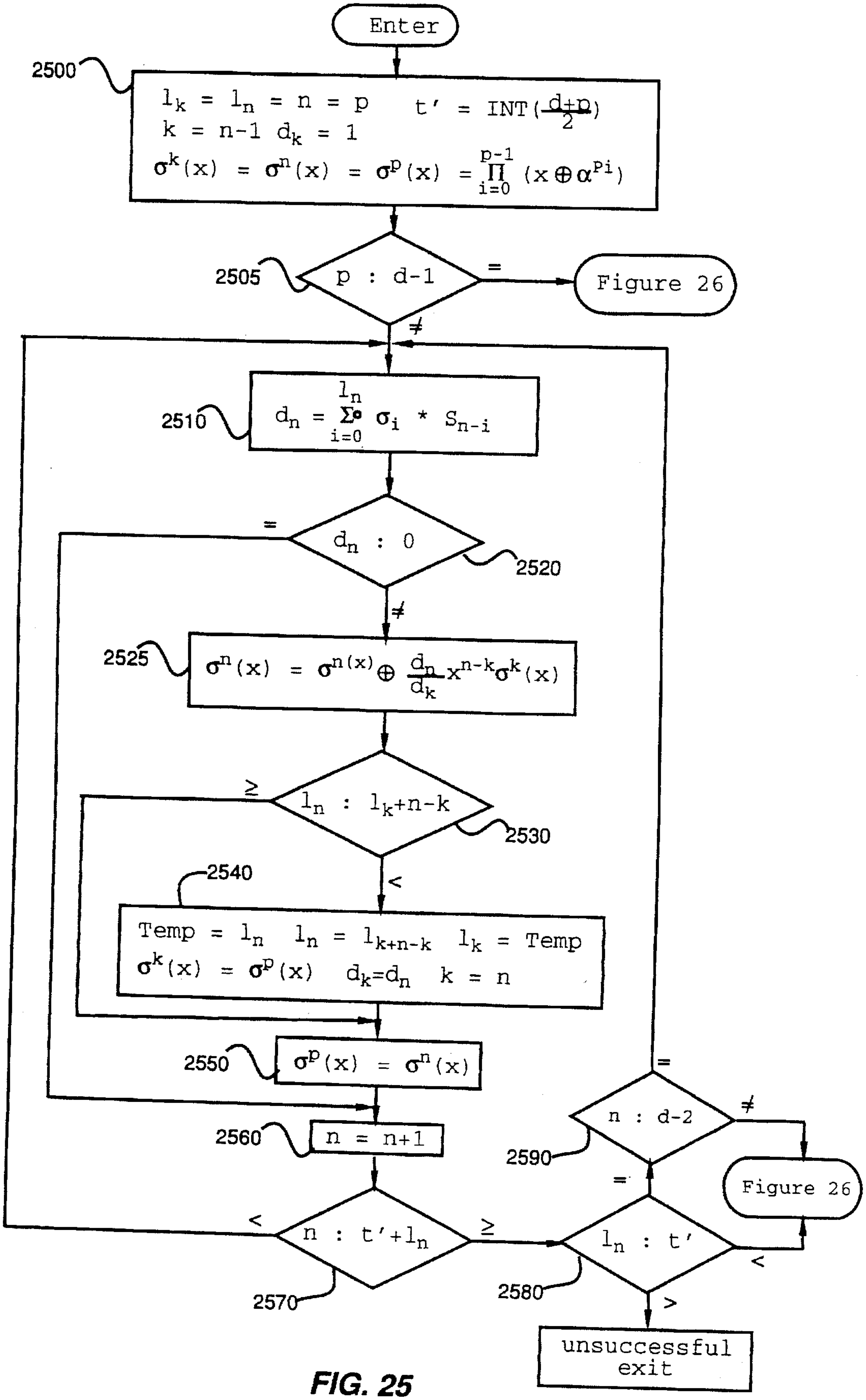
FIG. 25 illustrates the steps required to iteratively generate the error locator polynomial $\sigma(x)$.

Referring to FIG. 25, Step 2500 initializes the polynomials, parameters, and counters for iterative error locator polynomial generation. When erasure pointer information is available, the correction power of the code is increased. Parameter t' is maximum number of errors and erasures which the code can correct. $P_i$ are the erasure pointer locations. If the number of erasure pointers p is equal to d-1, the maximum degree of σ(x) has been reached, so Step 2505 transfers control to FIG. 26. Otherwise, Step 2510 computes the nth discrepancy value $d_n$. If $d_n$ is equal to zero, Step 2520 transfers control to Step 2560. Otherwise Step 2525 updates σ(x). If $l_n \geqq l_k+n-k$, Step 2530 transfers control to Step 2550. Otherwise Step 2540 updates $\sigma^k(x)$ and other parameters. Step 2550 updates $\sigma^P(x)$. Step 2560 increments counter n. If n<d–1, Step 2570 transfers control back to Step 2510. If $l_n$, the degree of σ(x), is greater than the number of errors and erasures the code can correct, Step 2580 exits the correction procedure unsuccessfully. Otherwise we are assured that we have generated a valid error locator polynomial and control is transferred to FIG. 26.

Figure 26:
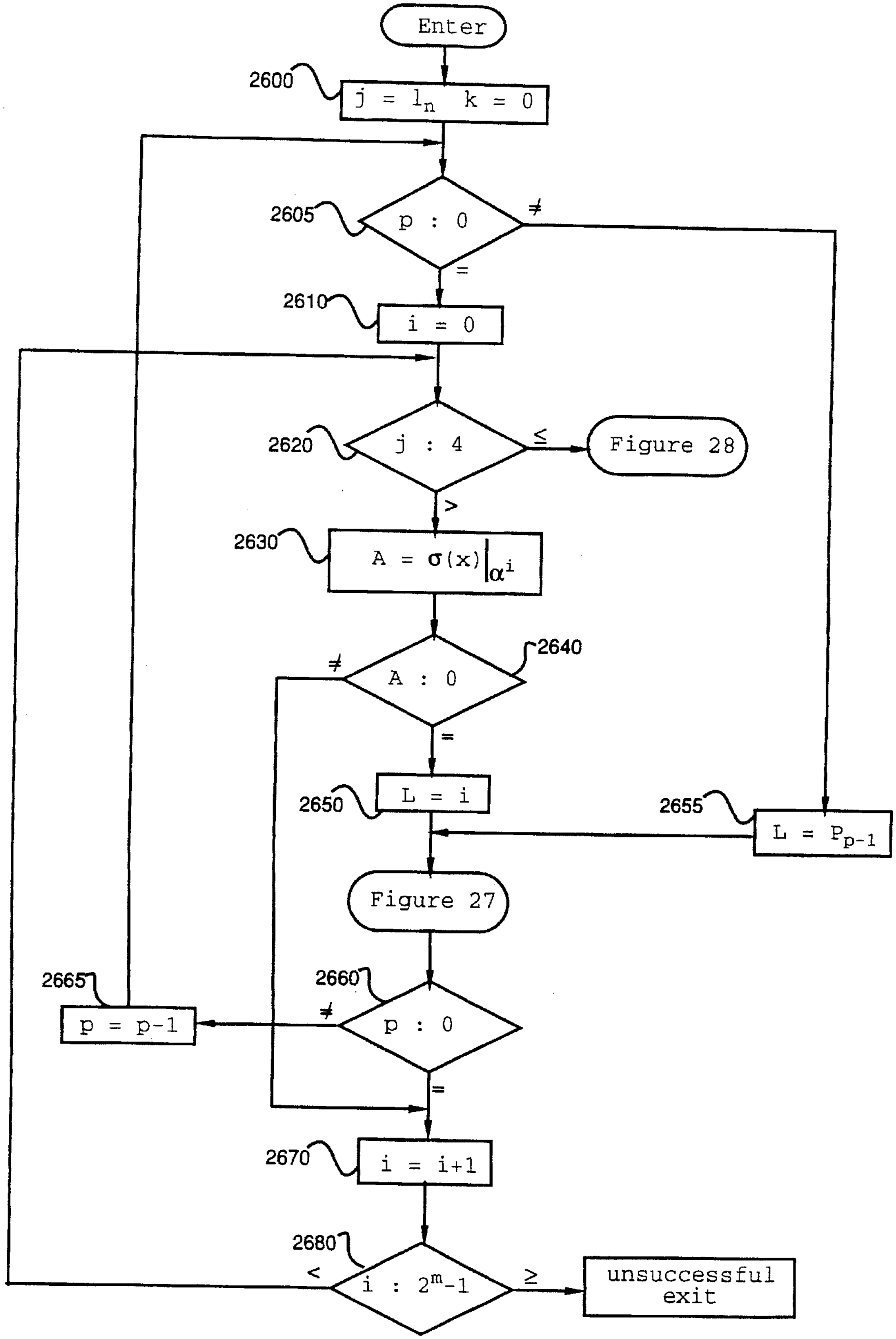
FIG. 26 illustrates the steps required to locate and evaluate errors by searching for roots of $\sigma(x)$.

Referring to FIG. 26, Step 2600 initializes counters $j=l_n$ and k=0. If the erasure pointer counter p is not zero, Step 2605 transfers control to Step 2655, which sets L equal to the next unused erasure pointer and transfers control to FIG. 27. Otherwise, Step 2610 initializes counter i=0. If j is less than or equal to four, Step 2620 transfers control to FIG. 28. Otherwise Step 2630 evaluates σ(x) at $x=\alpha^i$. If the result A is equal to zero, a root of σ(x) has been found and Step 2640 transfers control to Step 2650, which sets L=i before transferring control to FIG. 27. Otherwise Step 2640 transfers control to Step 2670. On successful exit from FIG. 27, control is transferred to Step 2660. If the erasure pointer counter p is not equal to zero, there may remain unused erasure pointers; Step 2660 transfers control to Step 2665, which decrements the erasure pointer counter p and transfers control back to Step 2605. Otherwise, Step 2670 increments counter i. If counter i is then not equal to $2^m-1$, Step 2680 transfers control back to Step 2620. Otherwise all possible locations have been tested without locating all the errors; therefore the correction procedure is exited unsuccessfully.

Figure 27:
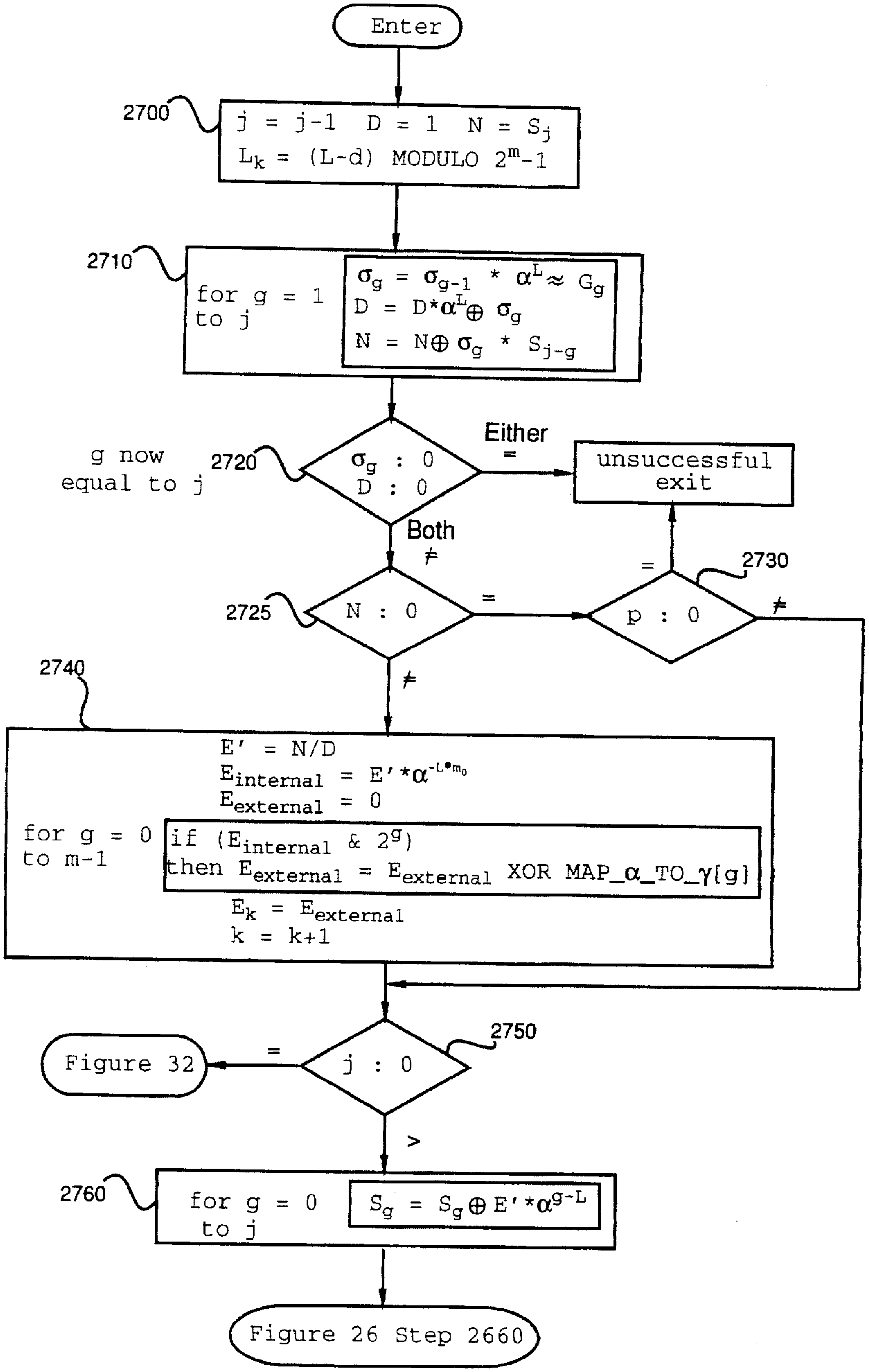
FIG. 27 illustrates the steps required to divide $\sigma(x)$ by $(x \oplus \alpha^L)$, compute the error value E, and adjust the coefficients of S(x).

Referring to FIG. 27, Step 2700 decrements counter j, the number of errors remaining to be found, initializes D=i and $N=S_j$, records the true error location. Without loss of generality, the case where coefficients $Q_j$ were used to compute S(x)=S"(x) is shown; the true error location is (L-d) MODULO $2^m-1$. Step 2710 divides σ(x) by $(x\oplus\alpha^L)$ and calculates the numerator N and denominator D of $E'=\alpha^{L*m}0*E$. If the new $\sigma_j$ (g now equal to j) is equal to zero, the new σ(x) has a root equal to zero, which is not the finite field antilogarithm of any error location, so Step 2720 exits the correction procedure unsuccessfully. If the denominator is equal to zero, the error value cannot be computed, since division by zero in a finite field is undefined, so Step 2720 exits the correction procedure unsuccessfully. If the numerator not equal to zero, Step 2725 transfers control to Step 2740. Otherwise, if the erasure pointer counter p is not equal equal to zero, a false erasure pointer has been detected, so Step 2730 transfers control to Step 2750. Otherwise, the computed error value is equal to zero in the absence of an erasure pointer, so Step 2725 exits the correction procedure unsuccessfully. Step 2740 calculates E'=N/D and $E=\alpha^{-}{}_{Lm}0*E'$. Without loss of generality, the case Where subfield computation is used is shown; the true error value is obtained by mapping the value E from the "internal" finite field to the "external" finite field. MAP_α_TO_γ[i] is a table such as Table 3 whose entries represent the contribution to the "external" finite field element of each set bit i in the "internal" finite field element. Step 2740 also increments counter k, the number of errors found. If counter j the number of errors remaining to be found, is equal to zero, Step 2750 transfers control to FIG. 32. Otherwise Step 2760 adjusts the coefficients of S(x) to remove the contribution of the error just found and transfers control to FIG. 26, Step 2660.

Figure 28:
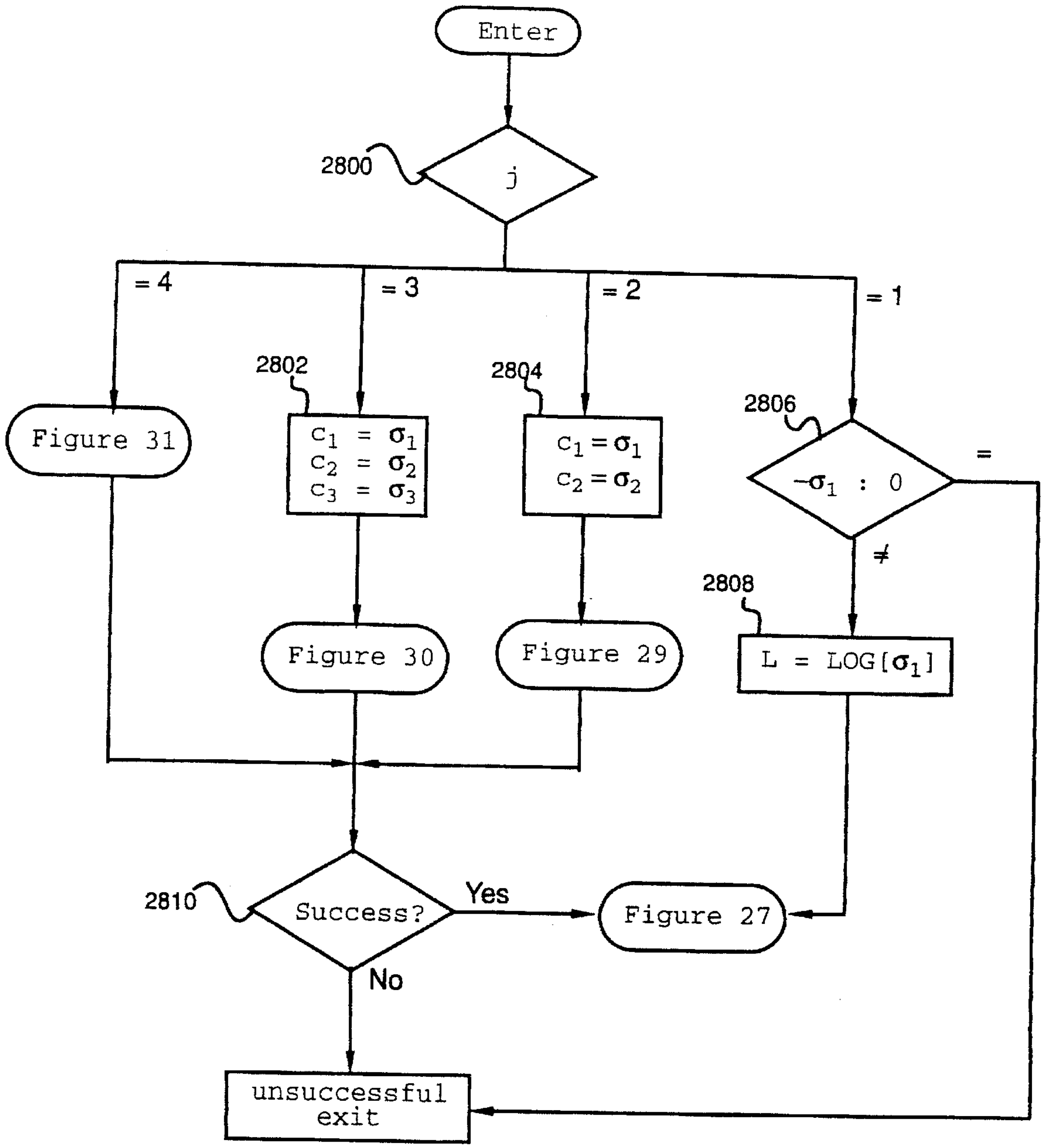
FIG. 28 illustrates the steps required to transfer control to the appropriate special error location subroutine.
Figure 29:
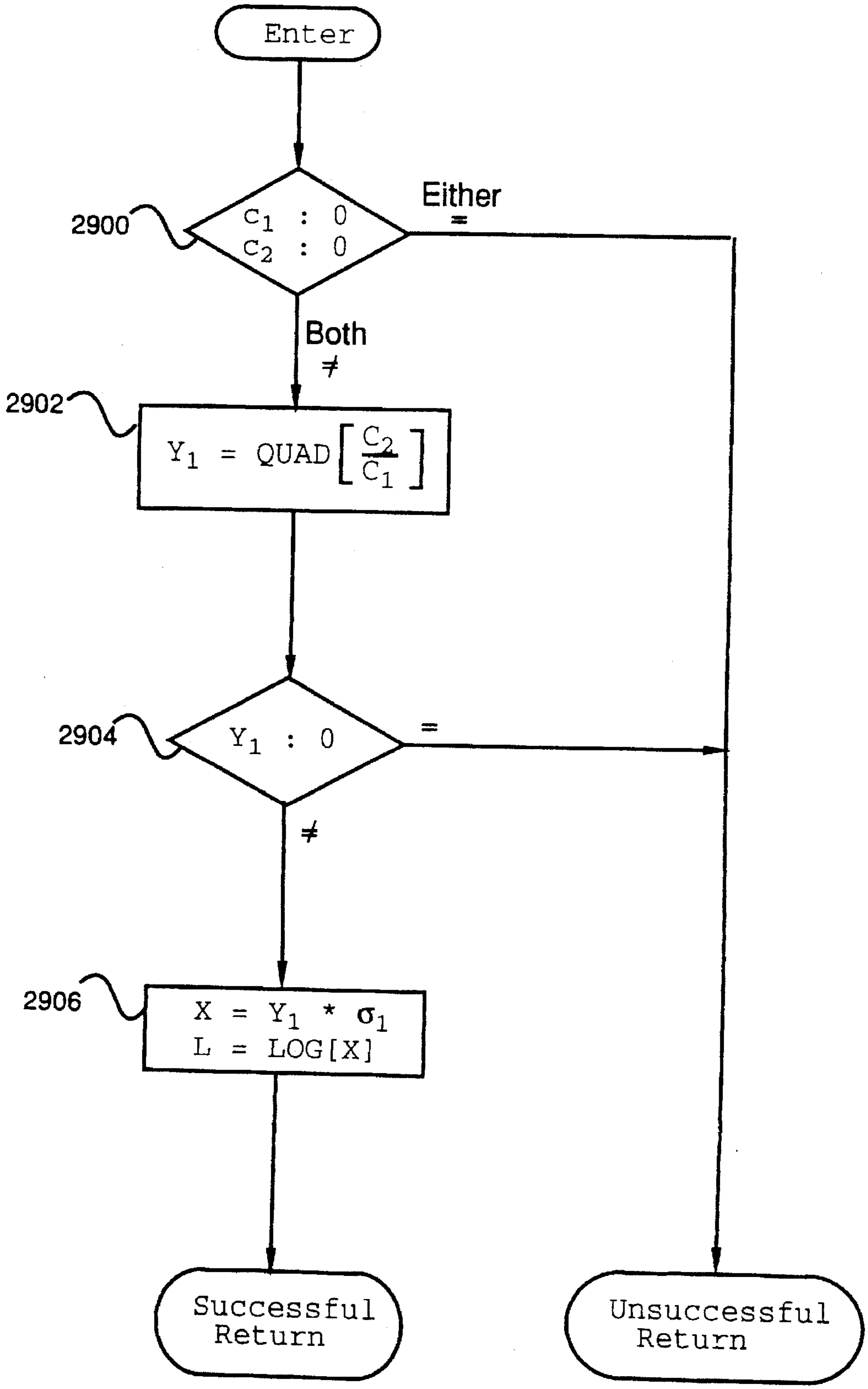
FIG. 29 illustrates the steps required to compute a root X, and its log L, of a quadratic equation in a finite field.
Figure 30:
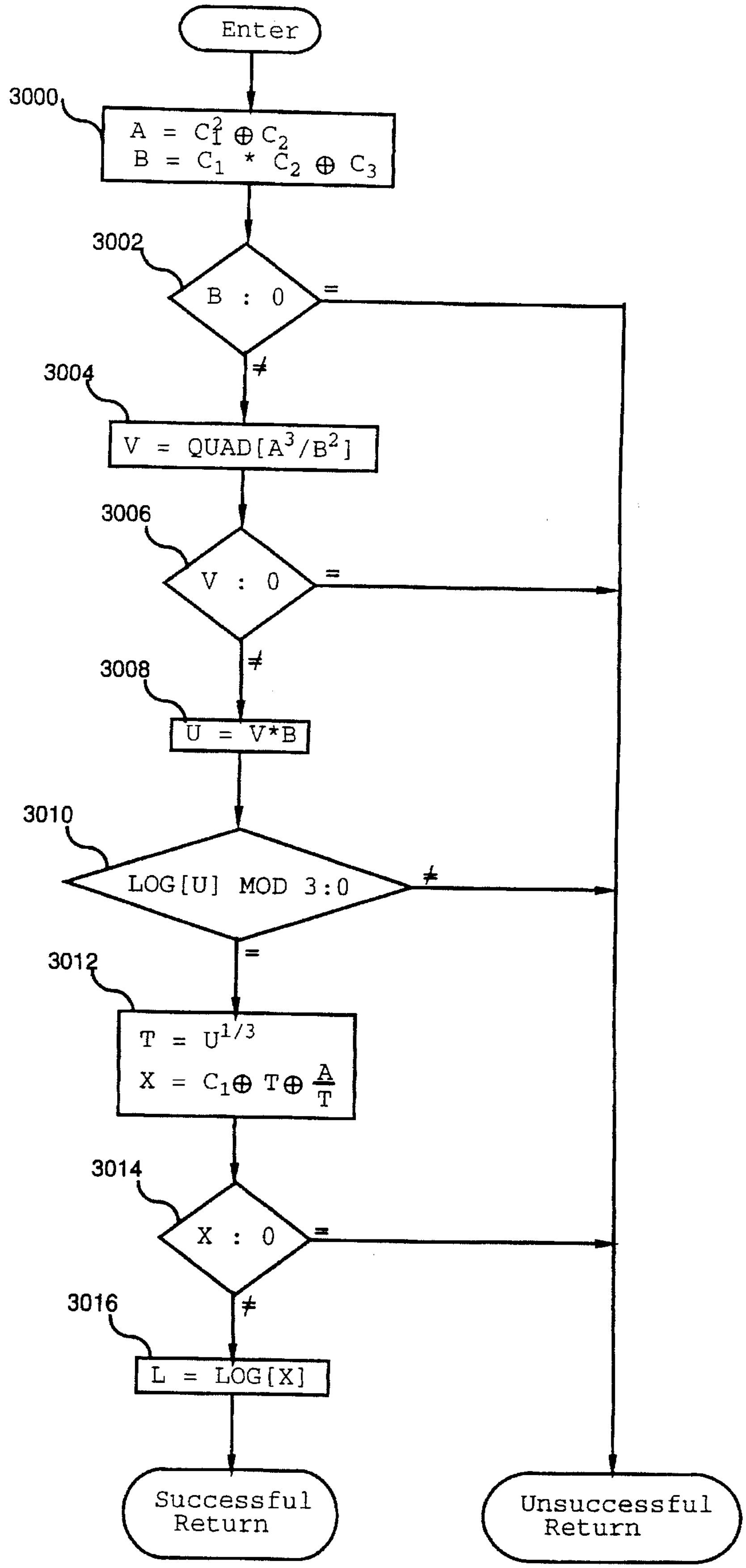
FIG. 30 illustrates the steps required to compute a root X, and its log L, of a cubic equation in a finite field.
Figure 31:
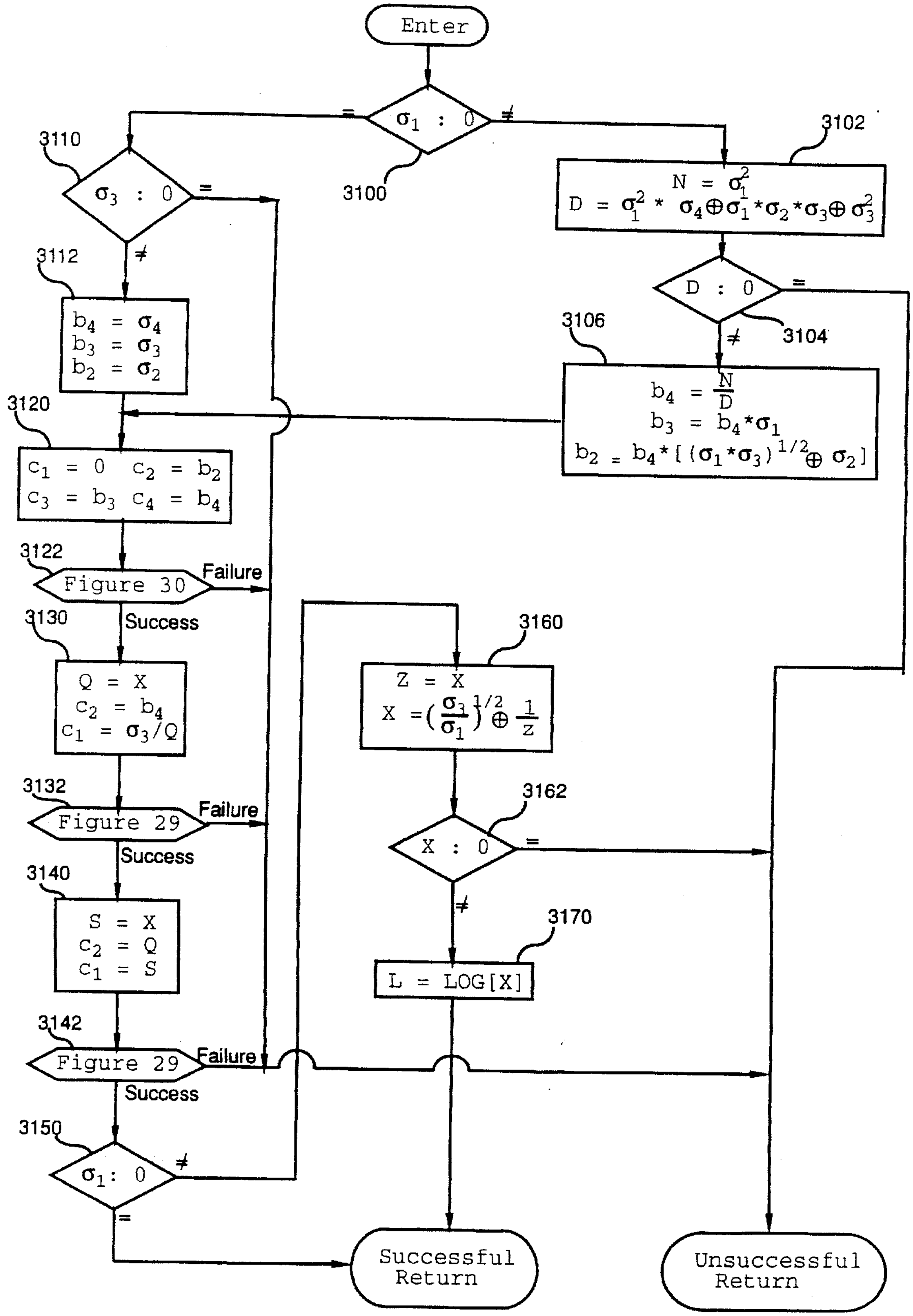
FIG. 31 illustrates the steps required to compute the log L of one of the four roots of a quartic equation in a finite field.

Referring to FIG. 28, if four errors remain, Step 2800 calls the quartic solution subroutine of FIG. 31. If three errors remain, Step 2800 transfers control to Step 2802, which sets parameters for and calls the cubic solution subroutine of FIG. 30. If two errors remain, Step 2800 transfers control to Step 2804, which sets parameters for and calls the quadratic solution subroutine of FIG. 29. Otherwise one error remains and Step 2800 transfers control to Step 2806. If $\sigma_1$ is equal to zero, Step 2806 exits the correction procedure unsuccessfully, since the finite field logarithm of zero is undefined. Otherwise Step 2808 determines L=LOG[$\sigma_1$] and transfers control to FIG. 27. Likewise, if one of the subroutines of FIGS. 29, 30, or 31 successfully determines an error location, Step 2810 transfers control to FIG. 27. Otherwise, the correction procedure is exited unsuccessfully. On entry to FIG. 29, the parameters $c_1$ and $c_2$ describe the quadratic equation $$x^2\oplus c_1*x\oplus c_2=0.$$

If $c_1=0$, the equation has a repeated root. If $c_2=0$, one of the roots is zero, whose log is undefined. If $c_1=0$ or $c_2=0$, Step 2900 exits the subroutine unsuccessfully. Otherwise Step 2902 determines a transformed root $Y_1$; when subfield computation is used, Step 2902 involves a procedure described in the section entitled "Subfield Computation" herein. If $Y_1$ is invalid, Step 2904 exits the subroutine unsuccessfully. Otherwise Step 2906 calculates the root X and its log L and returns successfully.

On entry to FIG. 30, the parameters $c_1$, $c_2$, and $c_3$ describe the cubic equation $$x^3 \oplus c_1 * x^2 \oplus c_2 * x \oplus c_3 = 0.$$

Step 3000 calculates the transform parameters A and B. If B is equal to zero, Step 3002 exits the subroutine unsuccessfully. Otherwise Step 3004 determines a root V of the quadratic equation $$v^2 \oplus * v \oplus \frac{A^3}{B^2} = 0.$$

using the QUAD table. If no such root exists, Step 3004 produces zero and Step 3006 exits the subroutine unsuccessfully. Otherwise Step 3008 computes U. If U is not the cube of some finite field value T, Step 3010 exits the subroutine unsuccessfully. Otherwise Step 3012 calculates T and a root X of the cubic equation. If X is equal to zero, Step 3014 exits the subroutine unsuccessfully. Otherwise Step 3016 calculates the log L of the root X and returns successfully.

On entry to FIG. 31, the parameters $\sigma_1$, $\sigma_2$, $\sigma_3$, and $\sigma_4$ describe the quartic equation $$x^4 \oplus \sigma_1 * x^3 \oplus \sigma_2 * x^2 \oplus \sigma_3 * x \oplus \sigma_4 = 0.$$

If $\sigma_1$ is equal to zero, Step 3100 transfers control to Step 3110; if $\sigma_3$ is equal to zero, the quartic equation has repeated roots, so Step 3110 exits the subroutine unsuccessfully. Otherwise Step 3112 assigns $b_i = \sigma_i$ for i=2 to 4 and transfers control to Step 3120. If $\sigma_1$ is not equal to zero, Step 3100 transfers control to Step 3102, which calculates the numerator and denominator of transform parameter $b_4$. If the denominator of $b_4$ is equal to zero, Step 3104 exits the subroutine unsuccessfully. Otherwise Step 3106 calculates the transform parameters $b_4$, $b_3$, and $b_2$ and transfers control to Step 3120.

Step 3120 sets parameters for and calls the cubic solution subroutine of FIG. 30. If this returns unsuccessfully, Step 3122 exits the subroutine unsuccessfully. Otherwise Step 3130 assigns Q=X and sets parameters for and calls the quadratic solution subroutine of FIG. 29. If this returns unsuccessfully, Step 3132 exits the subroutine unsuccessfully. Otherwise Step 3140 sets parameters for and calls the quadratic solution subroutine of FIG. 29. If this returns unsuccessfully, Step 3142 exits the subroutine unsuccessfully. Otherwise if $\sigma_1$ is equal to zero, Step 3150 returns L successfully. Otherwise Step 3160 computes X. If X is equal to zero, Step 3162 exits the subroutine unsuccessfully. Otherwise Step 3170 computes and returns L successfully.

Figure 32:
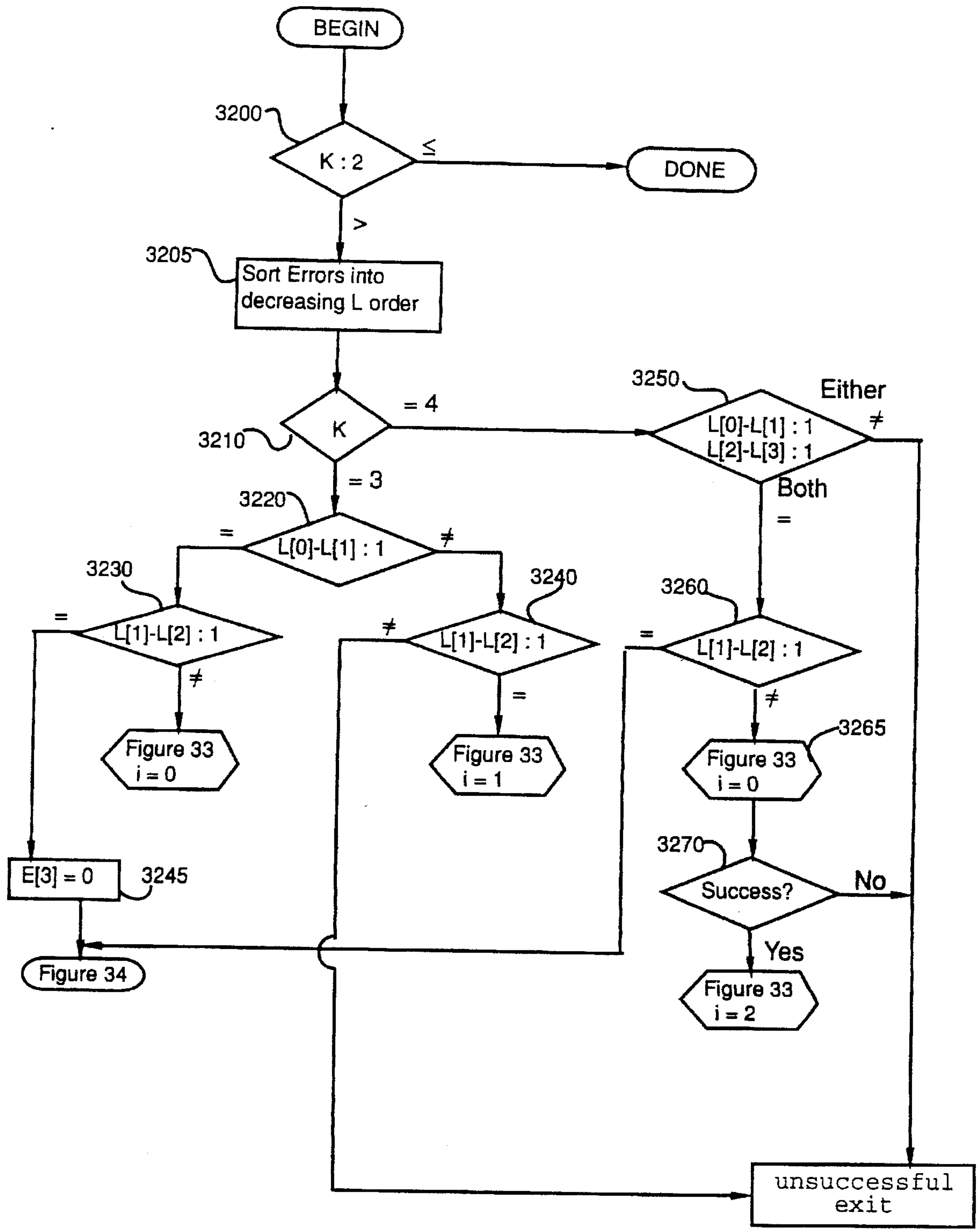
FIG. 32 illustrates the steps required to analyze a set of up to four symbol errors for compliance with a requirement that there exist at most a single burst up to twenty-two bits in length or two bursts, each up to eleven bits in length, where the width of a symbol is ten bits.

FIG. 32 illustrates, without loss of generality, error burst length checking for the particular case where m=10, t=4, and a single burst up to twenty-two bits in length or two bursts, each up to eleven bits in length, are allowed.

Referring to FIG. 32, if the number of error symbols found is less than or equal to two, by inspection there are at most two bursts, each less than eleven bits in length, so Step 3200 exits the correction procedure successfully. Otherwise, Step 3205 sorts the symbol errors into decreasing-L order. If there are four symbols in error, Step 3210 transfers control to Step 3250. Otherwise, if the first and second error symbols are adjacent, Step 3220 transfers control to Step 3230. If the third error symbol is also adjacent to the second error symbol, Step 3230 transfers control to Step 3245, which forces the fourth error symbol to zero and transfers control to FIG. 34 to check the length of the error burst(s) contained in the three adjacent error symbols. Otherwise, Step 3230 transfers control to FIG. 33 to check the length of the error burst contained in the first and second error symbols. If the first two error symbols are not adjacent, Step 3220 transfers control to Step 3240. If the second and third error symbols are also not adjacent, three bursts have been detected, so Step 3240 exits the correction procedure unsuccessfully. Otherwise, Step 3240 transfers control to FIG. 33 to check the length of the error burst contained in the second and third error symbols.

If the number of error symbols found is equal to four, Step 3210 transfers control to Step 3250. If the first and second error symbols are not adjacent, or if the third and fourth error symbols are not adjacent, two bursts have been detected, one of which is at least twelve bits in length, so Step 3250 exits the correction procedure unsuccessfully. Otherwise, if the second and third error symbols are adjacent, Step 3260 transfers control to FIG. 34 to check the length of the burst(s) contained in the four adjacent error symbols. If the second and third error symbols are not adjacent, two bursts have been detected, so Step 3260 transfers control to Step 3265, which calls FIG. 33 to check the length of the burst contained in the first and second error symbols. If that burst is less than or equal to eleven bits in length, Step 3270 transfers control to FIG. 33 to check the length of the burst contained in the third and fourth error symbols.

Figure 33:
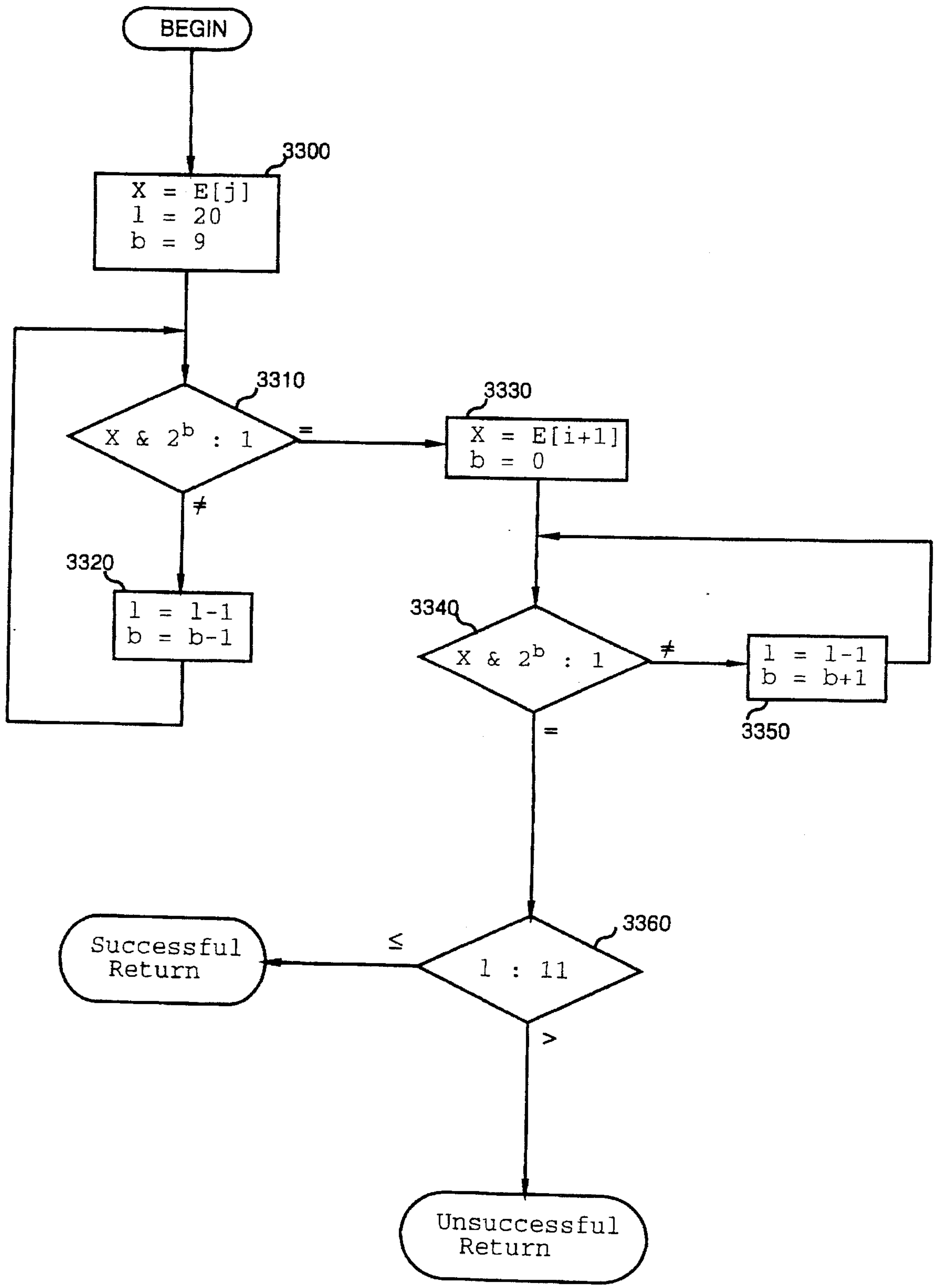
FIG. 33 illustrates the steps required to analyze a set of two adjacent symbol errors for compliance with a requirement that there exits a single burst up to eleven bits in length, where the width of a symbol is ten bits.
Figure 34:
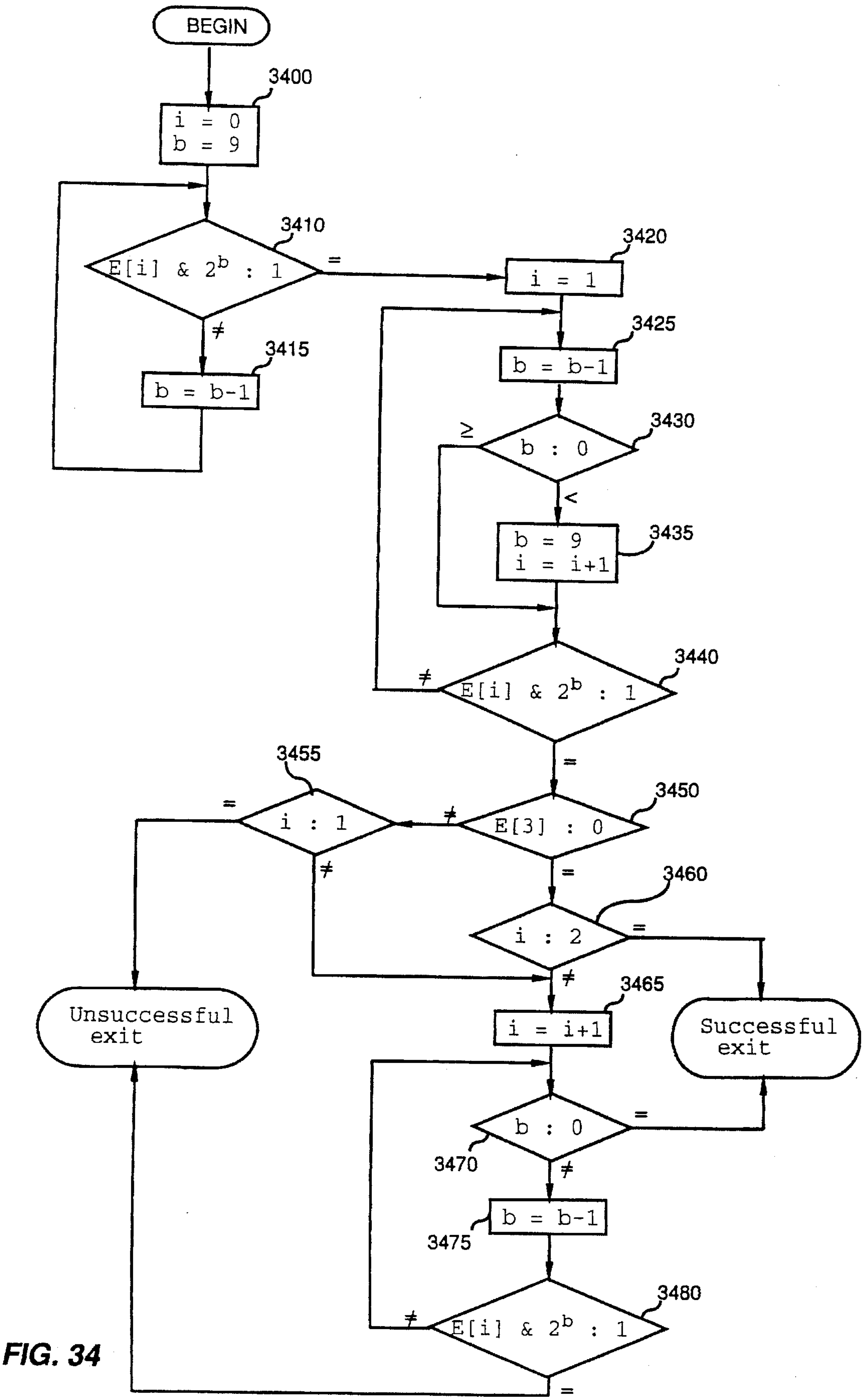
FIG. 34 illustrates the steps required to analyze a set of three or four adjacent symbol errors for compliance with a requirement that there exist at most a single burst up to twenty-two bits in length or two bursts, each up to eleven bits in length, where the width of a symbol is ten bits.

Referring to FIG. 33, Step 3300 sets X equal to the first error symbol in the burst to be checked, initializes the burst length 1=20, and sets bit number b=9. Steps 3310 and 3320 search for the first bit of the error burst. Steps 3340 and 3350 search for the last bit of the error burst. Upon entry to Step 3360, 1 is equal to the length of the error burst. If 1 is greater than eleven, Step 3360 returns unsuccessfully. Otherwise, the burst contained in the two adjacent error symbols is less than or equal to eleven bits in length and Step 3360 returns successfully. Referring to FIG. 34, Step 3400 initializes symbol number i=0 and bit number b=9. A single burst, twenty-two bits in length, is treated as two consecutive bursts, each eleven bits in length. Steps 3410 and 3415 search for the first bit of the first burst. Steps 3420, 3425, 3430, and 3440 skip the next eleven bits, allowing the first burst to be up to eleven bits in length, then search for the next non-zero bit, which is the first bit of the second burst. If the fourth error symbol is not zero, Step 3450 transfers control to Step 3455. On entry to Step 3455, the end of the second burst has been determined to be in the fourth error symbol; if the second burst begins in the second error symbol, the second burst is at least twelve bits in length, so Step 3455 exits the correction procedure unsuccessfully. If the second error burst begins in the third error symbol and ends in the fourth error symbol, Step 3455 transfers control to Step 3465. If the fourth error symbol is zero, Step 3450 transfers control to Step 3460; if the second error burst begins and ends in the third error symbol, the second error burst must be less than eleven bits in length, so Step 3460 exits the correction procedure successfully. Otherwise, the second error burst begins in the second error symbol and ends in the third error symbol, so step 3460 transfers control to Step 3465. Steps 3465, 3470, 3475, and 3480 skip eleven more bits, allowing the second error burst to be up to eleven bits in length, then search for any other non-zero bits in the last error symbol. If a non-zero bit is detected, the second error burst is more than eleven bits in length, so Step 3480 exits the correction procedure unsuccessfully. Otherwise, Step 3470 exits the correction procedure successfully when all bits have been checked.

SUBFIELD COMPUTATION:

In this section, a large field, $GF(2^{2*n})$, generated by a small field, $GF(2^n)$, is discussed. Techniques are developed to accomplish operations in the large field by performing several operations in the small field.

Let elements of the small field be represented by powers of β. Let elements of the large field be represented by powers of α.

The small field is defined by a specially selected polynomial of degree n over GF(2). The large field is defined by the polynomial:

$$x^2+x+\beta$$

over the small field.

Figure 1A:
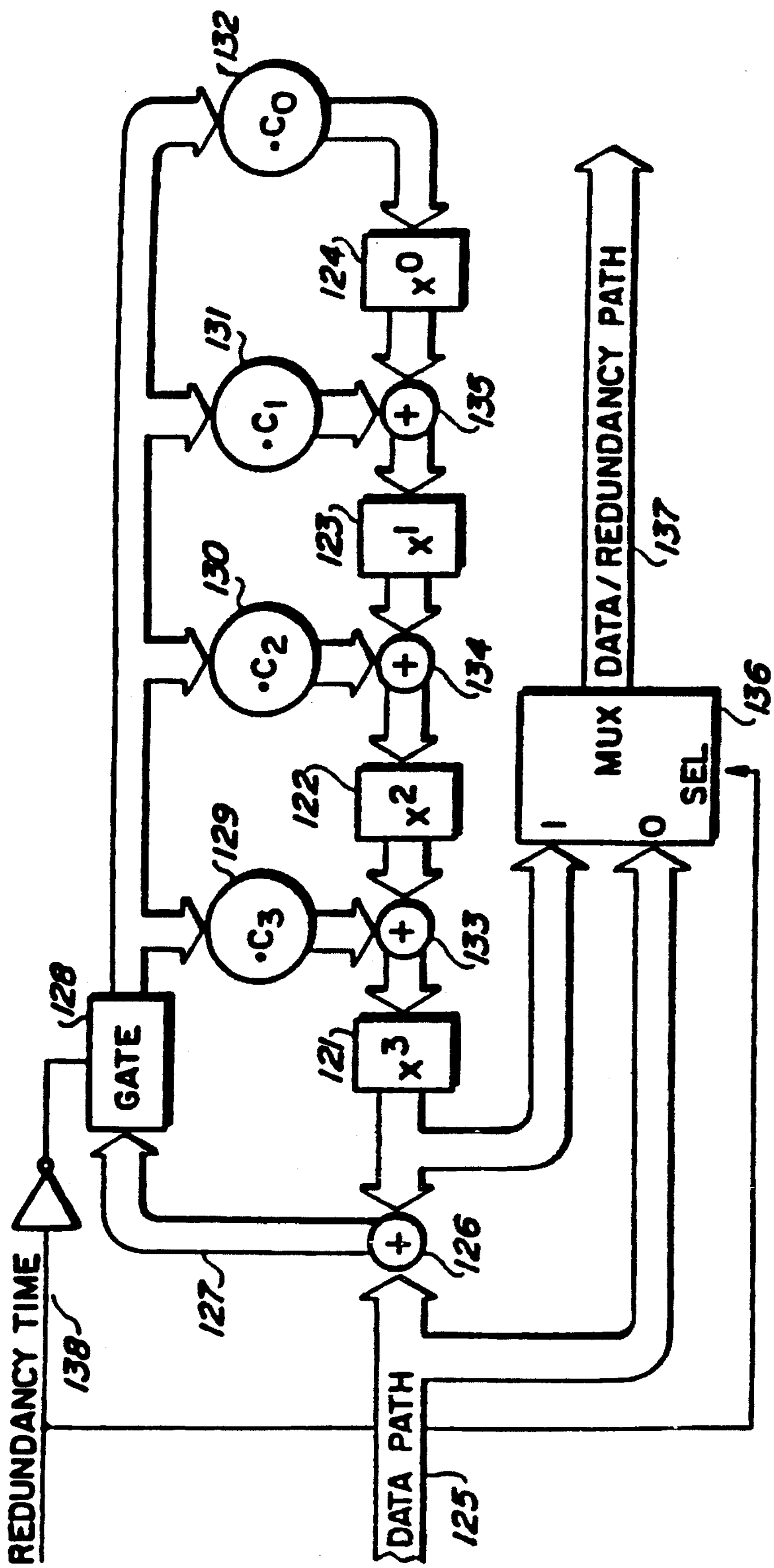
FIG. 1A is a block diagram showing a prior art, symbol-wide linear feedback shift register (LFSR) configured with internal XOR gates that generates the redundancy polynomial for a distance 5 Reed-Solomon code.
Figure 1B:
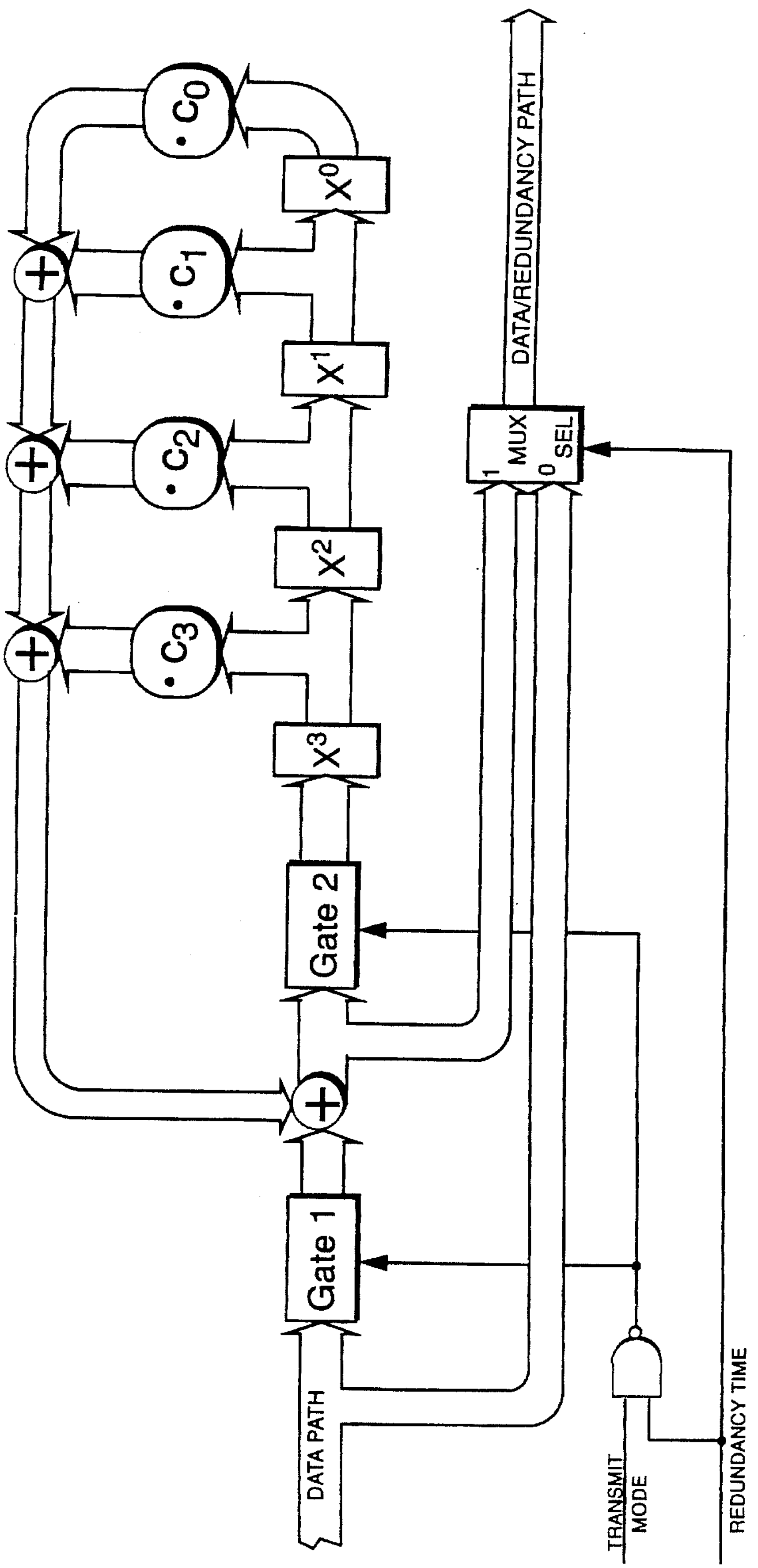
FIG. 1B is a block diagram showing a prior art, symbol-wide LFSR configured with external XOR gates that generates the redundancy polynomial for a distance 5 Reed-Solomon code.
Figure 2:
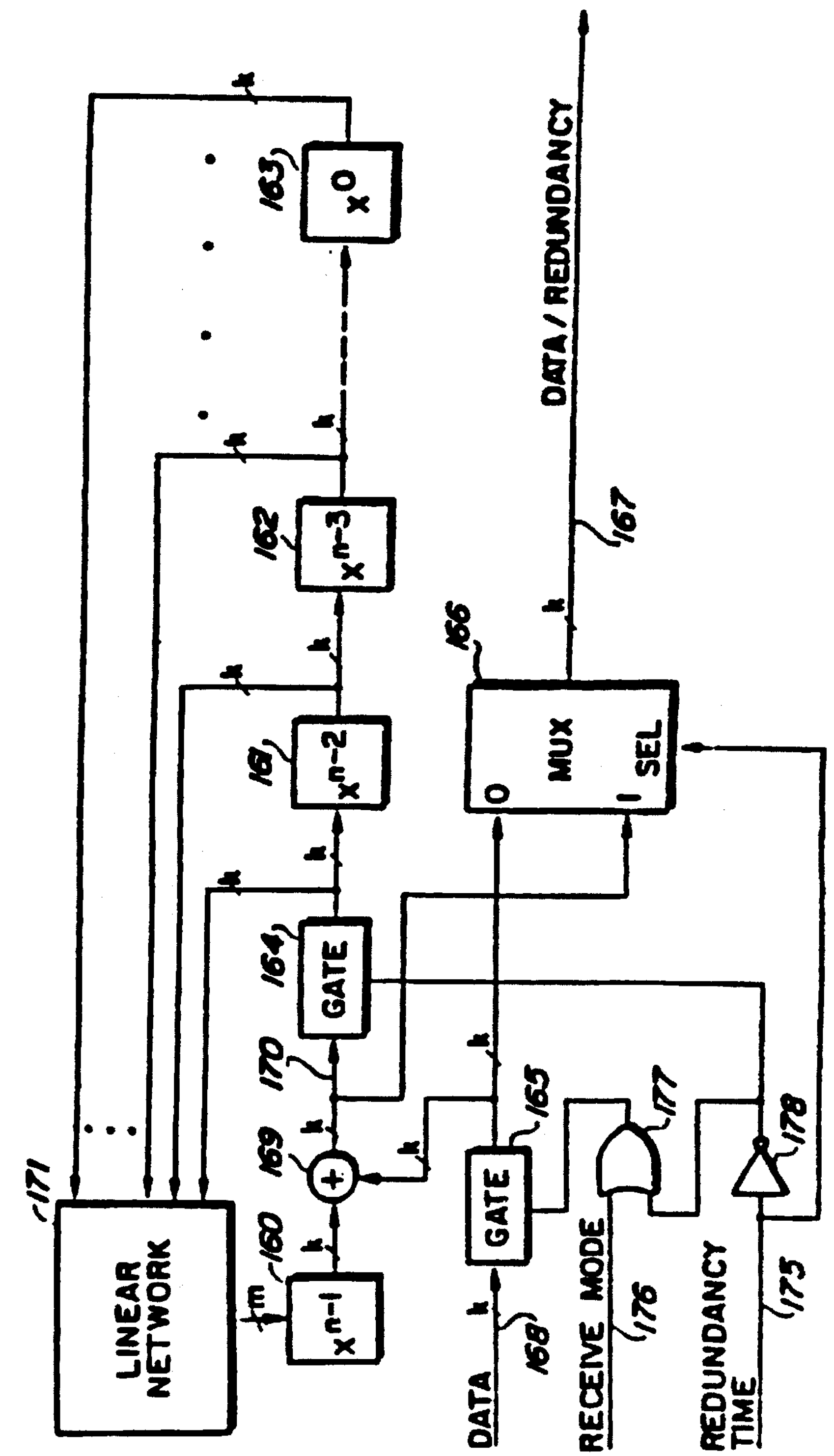
FIG. 2 is a block diagram showing a prior art, k-bit-serial, LFSR configured with external XOR gates with equivalent function to that of FIG. 1B.

Each element of the large field, $GF(2^{2*n})$, can be represented by a pair of elements from the small field, $GF(2^n)$. Let x represent an arbitrary element from the large field. Then:

$$x=x_1\cdot\alpha+x_0$$

where $X_1$ and $X_0$ are elements from the small field, $GF(2^n)$. The element x from the large field can be represented by the pair of elements $(x_1,x_0)$ from the small field. This is much like representing an element from the field of FIG. 2.5.1 of Glover and Dudley, *Practical Error Correction Design for Engineers,* pg. 89, with three elements from GF(2), $(x2,x_1, x_0)$. Let α be any primitive root of:

$$x^2+x+\beta$$

Then:

$$\alpha^2+\alpha+\beta=0$$

Therefore:

$$\alpha^2=\alpha+\beta$$

The elements of the large field $GF(2^{2*n})$, can be defined by the powers of α. For example:

$$\begin{aligned} 0 &= 0\\ \alpha^0 &= \alpha^0\\ \alpha^1 &= \alpha^1\\ \alpha^2 &= \alpha+\beta\\ \alpha^3 &= \alpha\cdot\alpha^2\\ &= \alpha\cdot(\alpha+\beta)\\ &= \alpha^2+\alpha\cdot\beta\\ &= \alpha+\beta+\alpha\cdot\beta\\ &= (\beta+1)\cdot\alpha+\beta\\ \ldots \end{aligned}$$

This list of elements can be denoted

| | $\alpha^1$ | $\alpha^0$ |
|---|---|---|
| 0 | 0 | 0 |
| $\alpha^0$ | 0 | 1 |
| $\alpha^1$ | 1 | 0 |
| $\alpha^2$ | 1 | β |
| $\alpha^3$ | β+1 | β |
| ... | | |

The large field, $GF(2^{2*n})$, can be viewed as being generated by the following shift register. All paths are n bits wide.

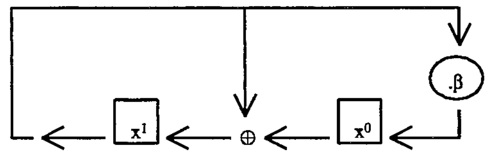

This shift register implements the polynomial $x^2+x+\beta$ over $GF(2^n)$.

Methods for accomplishing finite field operations in the large field by performing several simpler operations in the small field are developed below.

ADDITION

Let x and w be arbitrary elements from the large field. Then:

$$\begin{aligned} y &= x+w\\ &= (x_1\cdot\alpha+x_0)+(w_1\cdot\alpha+w_0)\\ &= (x_1+w_1)\cdot\alpha+(x_0+w_0) \end{aligned}$$

MULTIPLICATION

The multiplication of two elements from the large field can be accomplished with several multiplications and additions in the small field. This is illustrated below:

$$\begin{aligned} y &= x\cdot w\\ &= (x_1\cdot\alpha+x_0)\cdot(w_1\cdot\alpha+w_0)\\ &= x_1\cdot w_1\cdot\alpha^2+x_1\cdot w_0\cdot\alpha+x_0\cdot w_1\cdot\alpha+x_0\cdot w_0 \end{aligned}$$

But, $\alpha^2=\alpha+\beta$, so $$\begin{aligned} &= x_1\cdot w_1\cdot(\alpha+\beta)+w_0\cdot x_1\cdot\alpha+x_0\cdot w_1\cdot\alpha+x_0w_0\\ &= (x_1\cdot w_1+w_0\cdot x_1+x_0\cdot w_1)\cdot\alpha+(x_1\cdot w_1\cdot\beta+x_0\cdot w_0) \end{aligned}$$

Methods for accomplishing other operations in the large field can be developed in a similar manner. The method for several additional operations are given below without the details of development.

INVERSION $$\begin{aligned} y &= 1/x\\ &= \frac{x_1}{(x_1)^2\cdot\beta+x_1\cdot x_0+x_0^2}\cdot\alpha+\frac{x_1+x_0}{(x_1)^2\cdot\beta+x_1\cdot x_0+x_0^2} \end{aligned}$$

LOGARITHM $L=LOG_\alpha(x)$

Let, $$\begin{aligned} J &= LOG_\beta[(x_1)^2\cdot\beta+x_1\cdot x_0+x_0^2]\\ K &= 0 && \text{if } x_1=0\\ &= 1 && \text{if } x_1\neq 0 \text{ and } x_0=0\\ &= f_1(x_0/x_1) && \text{if } x_1\neq 0 \text{ and } x_0\neq 0 \end{aligned}$$

Then,

L={the integer whose residue modulo $(2^n-1)$ is J and whose residue modulo $(2^{n+1})$ is K}

This integer can be determined by the application of the Chinese Remainder Method. See Section 1.2 of Glover and Dudley, *Practical Error Correction Design for Engineers,* pages 11–13, for a discussion of the Chinese Remainder Method.

The function $f_1$ can be accomplished with a table of $2^n$ entries which can be generated with the following algorithm.

```
BEGIN
  Set table location f_1(0) = 0
  FOR I = 2 to 2^n
    Calculate the GF(2^(2*n)) element Y = α^I = Y_1 · α + Y_0
    Calculate the GF(2^n) element Y_0/Y_1
    Set f_1(Y_0/Y_1) = I
  NEXT I
END
```

ANTILOGARITHM $$
\begin{aligned}
X &= \mathrm{ANTILOG}_\alpha(L) \\
&= \mathrm{ANTILOG}_\beta(INT(L/(2^n+1)) && \text{if } [L\ MOD\ (2^n+1)]=0 \\
&= [\mathrm{ANTILOG}_\beta(INT(L/(2^n+1))]\cdot\alpha && \text{if } [L\ MOD\ (2^n+1)]=1 \\
&= x_1\cdot\alpha+x_0 && \text{if } [L\ MOD\ (2^n+1)]>1
\end{aligned}
$$

where $x_1$ and $x_0$ are determined as follows. Let $a=\mathrm{ANTILOG}_\beta[L\ MOD\ (2^n-1)\ ]$ $b=f2[(L\ mod\ (2+1))-2\ ]$ Then, $$x_1=\left[\frac{a}{b^2+b+\beta}\right]^{1/2}$$

$$x_0=b\cdot x_1$$

The function $f_2$ can be accomplished with a table of $2^n$ entries. This table can be generated with the following algorithm.

```
BEGIN
  Set f_2(2^n - 1) = 0
  FOR I = 0 to 2^n - 2
    Calculate the GF(2^(2*n)) element Y = α^(I+2) = Y_1 · α + Y_0
    Calculate the GF(2^n) element Y_0/Y_1
    Set f_2(X) = (Y_0/Y_1)
  NEXT I
END
```

ROOTS OF $Y^2+Y+C=0$

To find the roots of:

$$Y^2+Y+C=0 \tag{1}$$

in the large field, first construct a table for finding such roots in the small field. Roots in the large field are then computed from roots in the small field.

JUSTIFICATION $Y^2+Y+C=0$

But, $Y=Y_1\alpha+Y_0$, therefore, $(Y_1\alpha+Y_O)^2+(Y_1\alpha+Y_0)+(C_1\alpha+C_0)=0$ $(Y_1^2\alpha^2+Y_0^2)+(Y_1\ +Y_0)+(C_1\alpha+C_0)=0$ $Y_1^2\alpha^2+Y_0^2+Y_1\alpha+Y_0+C_1\alpha+C_0=0$ But, $\alpha^2=\alpha+\beta$, therefore, $Y_1^2\alpha+Y_1^2\beta+Y_0^2+Y_1\alpha+Y_0+C_1\alpha+C_0=0$ $(Y_1^2+Y_1+C_1)\alpha+[Y_0^2+Y_0+(C_0+Y_1^2\beta)]=0$ Equating coefficients of powers of $\alpha$ on the two sides of the equation yields:

$$(Y_1^2+Y_1+C_1)\alpha=0 \tag{2}$$

and $$[Y_0^2+Y_0+(C_0Y_1^2\beta)]=0 \tag{3}$$

PROCEDURE

Construct a table for finding roots of:

$$Y^2+Y+C=0 \tag{4}$$

in the small field. The contents of table locations corresponding to values of C for which a root of (4) does not exist should be forced to all zeros. The low order bit ($2^0$) of each table location corresponding to values of C for which a root of (4) exists should be forced to $\alpha^0$ (where $\alpha^0=1$ in the preferred embodiment).

```
IF, Trace(C) = 0, THEN,
      Y_a = 0.
ELSE,
      FIND A ROOT OF (2), SAY Y_1a, USING THE TABLE FOR
      FINDING A ROOT OF Y^2 + Y + C = 0 ON THE SMALL FIELD.
      SUBSTITUTE Y_1a INTO (3) AND FIND A ROOT OF (3),
      SAY Y_0a, USING THE SAME TABLE.
      IF Y_0a IS 0, XOR Y_1a WITH β^0 AND AGAIN SUBSTITUTE
      Y_1a INTO (3) AND FIND A ROOT OF (3) USING THE TABLE.
      THE DESIRED ROOT IN THE LARGE FIELD IS:
      Y_a = Y_1a α + Y_0a
      THE SECOND ROOT IS SIMPLY:
      Y_b = Y_a + α^0
END IF
```

NOTE:
$Y_a = 0$ flags the case where a root does not exist in the large field for (1).

CONSTRUCTING REED-SOLOMON CODES

CONSTRUCTING THE FINITE FIELD FOR A REED-SOLOMON CODE

It is well-known in the prior art that a primitive polynomial of degree m over GF(2) can be used to construct a representation for a finite field $GF(2^m)$. For example, see *Practical Error Correction Design for Engineers,* hereinbefore identified, pages 89–90.

It is possible to use such a representation of $GF(2^m)$ to construct other representations of $GF(2^m)$. For example, let $\beta^1$ represent the elements of a finite field constructed as described, then the elements $\alpha^i$ of another representation may be constructed by application of the equation $$\alpha^L=(\beta^i)^M$$

where no factor of M divides $2^{m-1}$ (field size minus one).

Appendix A discusses the use of a polynomial of the form $$x^2+x+\beta$$

to construct a representation for a large finite field $GF(2^{2m})$ from a representation of a small finite field $GF(2^m)$.

It is possible to use a primitive polynomial of degree m over GF(2) to construct a representation for the elements $\gamma^i$ of a small finite field $GF(2^m)$ and then to use the relationship $\beta^i=(\gamma^i)^M$ to construct another representation of the elements of the small field and then to use the polynomial $x^2+x+\beta$ over GF($2^m$) to construct a representation for the elements $\alpha^i$ of a large finite field of GF($2^{2m}$).

DEFINING THE CODE GENERATOR POLYNOMIAL FOR A REED-SOLOMON CODE

The code generator polynomial G(x) for a Reed-Solomon Code is defined by the equation $$G(x)=\prod_{i=0}^{d-2}(x-\alpha^{m0+i})$$

where d=the minimum Hamming distance of the code $m_0$=the offset

The minimum Hamming distance d of the code establishes the number of symbol errors correctable by the code (t) and the number of extra symbol errors detectable by the code (det). The equation $d=1=2t+\text{det}$ establishes the relationship between the code's minimum Hamming distance and its correction and detection power.

MAPPING BETWEEN FINITE FIELDS

Let $\omega^i$ be a representation of the elements of GF($2^{2m}$) established by any primitive polynomial of degree 2m over GF(2).

Let $\gamma^i$ be a representation of the elements of GF($2^{2m}$) established by the relationship $\gamma^i=(\omega^i)^{MM}$ A simple linear mapping may exist between elements of the $\alpha$ and $\gamma$ finite fields. One such candidate mapping can be defined as follows:

$$\frac{\text{Bit of } \gamma \text{ field element}}{j} \rightarrow \frac{\text{Contribution to } \alpha \text{ field element}}{\text{ALOG}_\alpha[(MM\cdot j)\bmod(2^{2m}-1)]}$$

$$\frac{\text{Bit of } \alpha \text{ field element}}{j} \rightarrow \frac{\text{Contribution to } \gamma \text{ field element}}{\text{ALOG}_\gamma[\text{LOG}_\alpha(2^j)]}$$

The mapping is valid only if the following test holds:

TEST $$K=\text{LOG}_\gamma\left[\sum_{j=0}^{m-1} z_j\right]\ \{0\leqq K\leqq 2^{2m}-2\}$$

where, $$\begin{aligned} z_j &= \text{ALOG}_\gamma[\text{LOG}_\alpha(2^j)] && \{[2^j \text{ AND ALOG}_\alpha(K)]>0\} \\ &= 0 && \{[2^j \text{ AND ALOG}_\alpha(K)]=0\}\end{aligned}$$

AND is bit for bit binary AND

An alternative candidate mapping can be defined as follows:

$$\frac{\text{Bit of } \gamma \text{ field element}}{j} \rightarrow \frac{\text{Contribution to } \alpha \text{ field element}}{\text{ALOG}_\alpha[MM\cdot(2^{2m}-1-j)\bmod(2^{2m}-1)]}$$

$$\frac{\text{Bit of } \alpha \text{ field element}}{j} \rightarrow \frac{\text{Contribution to } \gamma \text{ field element}}{\text{ALOG}_\gamma[2^{2m}-1-\text{LOG}_\alpha(2^j)]}$$

The mapping is valid only if the following test holds:

TEST $$K=\text{LOG}_\gamma\left[\sum_{j=0}^{m-1} z_j\right]\ \{0\leqq K\leqq 2^{2m}-2\}$$

where, $$\begin{aligned} z_j &= \text{ALOG}_\gamma[2^{2m}-1-\text{LOG}_\alpha(2^j)] && \{[2^j \text{ AND ALOG}_\alpha(2^{2m}-1-K)]>0\} \\ &= 0 && \{[2^j \text{ AND ALOG}_\alpha(2^{2m}-1-K)]=0\}\end{aligned}$$

AND is bit for bit binary AND

Let $\mu^i$ be a representation of the elements of GF($2^m$) established by any primitive polynomial of degree m over GF(2).

Let $\beta^i$ be a representation of the elements of GF($2^m$) established by the relationship $\beta^i=(\mu^i)^M$ Let $\alpha^i$ be a representation of the elements of GF($2^{2m}$) established by the polynomial $x^2+x+\beta$ over GF ($2^m$).

In constructing candidate $\alpha$ fields, any value of M satisfying the relationship $1\leqq M\leqq 2^m-1$ (no factor of M divides $2^m-1$)

may be used.

In constructing candidate $\gamma$ fields, any value of MM satisfying the relationship $1\leqq MM\leqq 2^{2m}-1$ (no factor of MM divides $2^{2m}-1$)

may be used.

In most cases, many pairs of $\gamma$ and $\alpha$ fields can be found for which there exists a simple linear mapping (as described above) between the elements of the two fields. Such a mapping is employed in the current invention to minimize the gate count in the encoder and residue generator and to minimize firmware space required for the correction of multiple bursts.

One could reduce the computer time required for evaluating candidate pairs of γ and α fields by performing a number of pre-screening operations to pre-eliminate some candidate pairs, though the computer time required without such pre-screening operations is not excessive.

MAPPING BETWEEN ALTERNATIVE FINITE FIELDS

In the preferred embodiment of the current invention, the representation for the ω field is established by the primitive polynomial $$x^{10}+x^9+x^5+x^4+x^2+x^1+1$$

over GF(2). The representation for the γ field is established by the equation $$\gamma^i=(\omega^i)^{MM}$$

where, $$MM=32$$

The representation for the μ field is established by the primitive polynomial $$x^5+x^4+x^2+x^1+1$$

over GF(2). The representation for the β field is established by the relationship $$\oplus^i=(\mu^i)^M$$

where $$M=1$$

The representation for the α field is established by the polynomial $$x^2+x+\beta$$

over GF($2^m$)

Also in the preferred embodiment of the current invention, the alternative form of mapping described above is employed. The resulting mapping is defined in the tables shown below.

TABLE 2

| Bit of γ Field Element | Contribution to α Field Element |
|---|---|
| 0000000001 | 0000000001 |
| 0000000010 | 1101100000 |
| 0000000100 | 1011011011 |
| 0000001000 | 1110110110 |
| 0000010000 | 1111011101 |
| 0000100000 | 1101011110 |
| 0001000000 | 0001011010 |

TABLE 2-continued

| Bit of γ Field Element | Contribution to α Field Element |
|---|---|
| 0010000000 | 0110000010 |
| 0100000000 | 0011101100 |
| 1000000000 | 1111000111 |

TABLE 3

| Bit of α Field Element | Contribution to γ Field Element |
|---|---|
| 0000000001 | 0000000001 |
| 0000000010 | 0110001101 |
| 0000000100 | 0100101000 |
| 0000001000 | 0011011110 |
| 0000010000 | 1101000011 |
| 0000100000 | 1100011010 |
| 0001000000 | 1001010000 |
| 0010000000 | 0110111100 |
| 0100000000 | 0010110001 |
| 1000000000 | 0111111001 |

To convert an element of the y field to an element of the α field, sum the contributions in the right-hand column of Table 2 that correspond to bits that are "1" in the γ field element.

To convert an element of the α field to an element of the γ field, sum the contributions in the right-hand column of Table 3 that correspond to bits that are "1" in the α field element.

In the preferred embodiment of the current invention, the code generator polynomial $$G(x)=\prod_{i=0}^{d-2}(x-\gamma^{m_0+i})$$

is selected to be self-reciprocal. G(x) is self-reciprocal when $m_0$ satisfies $$\begin{aligned} m_0 &= (2^{m-1})-((d-1)/2) \quad \{d\text{ ODD}) \\ &= -((d-2)/2) \quad \{d\text{ EVEN}\} \end{aligned}$$

More specifically, the preferred code generator polynomial is $$\begin{aligned} G(x) &= \prod_{i=0}^{7}(x-\gamma^{508+i}) \\ &= x^8+\gamma^{291}x^7+\gamma^{936}x^6+\gamma^{790}x^5+\gamma^{827}x^4+ \\ &\quad \gamma^{790}x^3+\gamma^{936}x^2+\gamma^{291}x+1 \end{aligned}$$

There has been disclosed and described in detail herein three preferred embodiments of the invention and their method of operation. From the disclosure it will be obvious to those skilled in the art that various changes in form and detail may be made to the invention and its method of operation without departing from the spirit and scope thereof.

APPENDIX A

```
REM
REM ---88BITSUB----CORRECTION ALGORITHM FOR 88 BIT CODE USING SUBFIELD
REM
REM           V 1.5  09-APR-90
REM
REM           (C) COPYRIGHT 1990.  DATA SYSTEMS TECHNOLOGY, CORP.
REM           ALL RIGHTS RESERVED.
REM
REM        TURBO BASIC REPRESENTATION OF ECC
REM        FIRMWARE USING SUBFIELD COMPUTATION
REM
REM
REM
REM
REM
DEFINT A-Z
OPTION BASE 0
DIM Atx(1023),Ltx(1023)
DIM Ats(31),Lts(31),Qts(31),F1(32),F2(31),T1(33)
DIM Extpoly(33),Subpoly(33),Rbytebuff(40)
DIM Databuff(1023),Dupdata(1023),Dupdata2(1023)
DIM E(31),L(31),P(31),R(31),S(31),T(32)
DIM Sigman(32),Sigmak(32),Sigmap(32)
RANDOMIZE TIMER
REM
REM ------------------------------------------------------------------
REM    DEFINE VARIABLES
REM ------------------------------------------------------------------
REM
REM    NUMERRS         - NUMBER OF ERRORS TO BE SIMULATED
REM    NUMPTRS         - NUMBER OF POINTERS
REM    E(*)            - TABLE OF ERROR VALUES
REM    L(*)            - TABLE OF ERROR LOCATIONS
REM    P(*)            - TABLE OF ERASURE POINTERS
REM    R(*)            - REMAINDER IN SYMBOL FORM, LSS FIRST
REM    RBYTEBUFF(*)    - REMAINDER IN BYTE FORM, LSB OF MSS FIRST
REM    S(*)            - SYNDROMES
REM    N               - "N" OF ITERATIVE ALGORITHM
REM    K               - "K" OF ITERATIVE ALGORITHM
REM    DSUBN           - "D SUB N" OF ITERATIVE ALGORITHM
REM    DSUBK           - "D SUB K" OF ITERATIVE ALGORITHM
REM    LSUBN           - "L SUB N" OF ITERATIVE ALGORITHM
REM    LSUBK           - "L SUB K" OF ITERATIVE ALGORITHM
REM    SIGMAN(*)       - "SIGMA SUPER N" OF ITERATIVE ALGORITHM
REM    SIGMAK(*)       - "SIGMA SUPER K" OF ITERATIVE ALGORITHM
REM    SIGMAP(*)       - "SIGMA PRIME" OF ITERATIVE ALGORITHM
REM    DEGREE          - DEGREE OF CODE GENERATOR POLYNOMIAL
REM    OFFSET          - SYNDROME OFFSET (0 TO START AT ALPHA 0)
REM    MAXDEG          - MAXIMUM DEGREE OF ERROR LOCATOR POLYNOMIAL
REM    SPOLYFDBK       - POLYNOMIAL THAT GENERATES SMALL FIELD, LESS HIGH TERM
REM    LPOLYFDBK       - POLYNOMIAL THAT GENERATES LARGE FIELD, LESS HIGH TERM
PRINT
REM ========== SET RUN PARAMETERS ==================================

NUMDATBYTS = 513
NUMSYMBOLS = (8*(NUMDATBYTS+11)) \ 10
PRINT USING "NUMDATBYTS = ####  NUMSYMBOLS = ####";NUMDATBYTS;NUMSYMBOLS

%PRNTFLAG       = 0
%DOBURSTCHECK   = 1
%ENCODE         = 1
%DECODE         = 0
%NUMLFLDBITS    = 10
%LFLDSIZE       = 1024  ' = 2^NUMLFLDBITS
%LFLDSIZELESS1  = 1023
%SFLDSIZE       = 32    ' = 2^(NUMLFLDBITS/2)
```

```
  %SFLDSIZELESS1 = 31
  %SFLDSIZEPLUS1 = 33
  %DEGREE        = 8
  %DEGREELESS1   = 7
  %DEGREELESS2   = 6
  %OFFSET        = 508   ' = (LFLDSIZE-DEGREE)\2
  %SPOLYFDBK     = 23
  %LPOLYFDBK     = 567
  %M             = 32
100 REM MAPPINGS FOR SPOLYFDBK=23, LPOLYFDBK=567, M=32
  REM XTOS MAPPING
  DATA    1, 864, 731, 950, 989, 862,  90, 386, 236, 967
  REM STOX MAPPING
  DATA    1, 397, 296, 222, 835, 794, 592, 444, 177, 505

  REM ========== SET UP TRANSLATION TABLES ============================
  RESTORE 100
  FOR I = 0 TO %NUMLFLDBITS-1
    READ Xtos(I)
  NEXT I
  FOR I = 0 TO %NUMLFLDBITS-1
    READ Stox(I)
  NEXT I

  REM ========== GENERATE SUBFIELD TABLES ============================
  CALL Gentbls

  REM ========== GENERATE EXTERNAL LARGE FIELD TABLES ================
  CALL Genltbls

FOR II! = 1 TO 1E6
  IF %PRNTFLAG OR 1 THEN
    PRINT "----------------------------------------------------------"
    PRINT "TRIAL NUMBER";II!
  END IF

  REM ========== RANDOMIZE THE DATA BUFFER ===========================
  FOR I = 0 TO NUMDATBYTS-1
    Databuff(I) = INT(RND*256)*0
  NEXT I

  FOR I = 0 TO NUMDATBYTS-1
    Dupdata(I) = Databuff(I)
  NEXT I

  REM ========== GENERATE REDUNDANCY FOR GIVEN DATA ==================
  CALL EncodeDecode((%ENCODE))

  Numptrs = 0
  Maxdeg = (%DEGREE+Numptrs) \ 2
  RESTORE 300
  FOR I = 0 TO Numptrs-1
    READ P(I)
  NEXT I
  300
  DATA 27,29,31,33,35,37,39,41

  RAND = 1
  IF RAND = 0 THEN
    RESTORE 400
    READ Numerrs
    RESTORE 500
  ELSE
    Numerrs = 1+INT(RND*8)
  END IF
  FOR I = 1 TO Numerrs
```

```
    IF RAND = 0 THEN
      READ L(I),E(I)
    ELSE
      DO
        L(I) = INT(RND*NUMSYMBOLS)
        Dup = 0
        FOR J = 0 TO I-1
          IF L(J) = L(I) THEN Dup = 1
        NEXT J
      LOOP UNTIL (Dup = 0)
      E(I) = 1+INT(RND*%LFLDSIZELESS1)
    END IF
  NEXT I
400
  DATA 4
  DATA   0,&b0000000001
  DATA 392,&b0000111111
  DATA 391,&b1100000000
500
  DATA  14,&b0000000001
  DATA  13,&b1111111111
  DATA  12,&b1111111111
  DATA  11,&b1100000000
600
  DATA 27,28,29,30,31,32,33,34
  DATA 35,36,37,38,39,40,41,42

  IF %PRNTFLAG OR 1 THEN
    IF Numptrs THEN
      PRINT "TOTAL NUMBER OF ERROR POINTERS = ";Numptrs
      PRINT "POINTERS   ";
      FOR I = 0 TO Numptrs-1
        PRINT FNH3$(P(I));
      NEXT I
      PRINT
    END IF
    PRINT "TOTAL NUMBER OF ERROR SYMBOLS = ";Numerrs
    PRINT "LOCATIONS ";
    FOR I = 1 TO Numerrs
      PRINT FNH3$(L(I));
    NEXT I
    PRINT
    PRINT "VALUES     ";
    FOR I = 1 TO Numerrs
      PRINT FNH3$(E(I));
    NEXT I
    PRINT
  END IF

  REM ========== CORRUPT THE DATA BUFFER WITH ERRORS ==================
  FOR I = 1 TO Numerrs
    Fwdbitdisp = %NUMLFLDBITS*(NUMSYMBOLS-1-L(I))
    Byteoffset = Fwdbitdisp \ 8
    Shiftcount = (Fwdbitdisp AND 7) XOR 6
    Ehigh = INT(E(I)*2^(Shiftcount-8))
    Elow = 256*(E(I)*2^(Shiftcount-8)-Ehigh)
    Databuff(Byteoffset) = DatabUFF(Byteoffset) XOR Ehigh
    Databuff(Byteoffset+1) = Databuff(Byteoffset+1) XOR Elow
  NEXT I

  REM ========== GENERATE REMAINDER FOR DATA + ERRORS =================
  CALL EncodeDecode((%DECODE))

  REM ************************************************************************
  REM * BEGIN CORRECTION ALGORITHM                                           *
  REM ************************************************************************
```

```
REM ========== COMPUTE SYNDROMES FROM REMAINDER =====================
CALL ComputeSyndromes

REM ========== COMPUTE INITIAL LOCATOR POLYNOMIIAL ==================
IF Numptrs THEN
  FOR I = 0 TO Numptrs
    T(I) = 0
  NEXT I
  Acc = 1
  FOR J = 0 TO Numptrs
    FOR I = 0 TO Numptrs-1
      Temp = Acc
      Acc = Acc XOR T(I)
      T(I) = FNM1(Temp,FNA1((P(I)+9) MOD %LFLDSIZELESS1))
    NEXT I
    Sigman(J) = Acc
    Sigmak(J) = Acc
    Sigmap(J) = Acc
    Acc = 0
  NEXT J
  IF %PRNTFLAG THEN
    PRINT "------------------------------------------------------------"
    PRINT "ERASURE LOCATOR POLYNOMIAL"
    FOR I = 0 TO Numptrs
      PRINT FNH3$(Sigman(I));
    NEXT I
    PRINT
  END IF
ELSE
  Sigman(0) = 1
  Sigmak(0) = 1
  Sigmap(0) = 1
END IF
FOR I = Numptrs+1 TO Maxdeg
  Sigman(I) = 0
  Sigmak(I) = 0
  Sigmap(I) = 0
NEXT I

REM ========== BEGIN ITERATIVE ALGORITHM ===========================

IF %PRNTFLAG AND Numptrs<%DEGREE THEN
  PRINT "------------------------------------------------------------"
  PRINT "ITERATIVE ALGORITHM"
END IF

N = Numptrs
K = N-1
Lsubn = Numptrs
Lsubk = Lsubn
Dsubk = 1
WHILE N < %DEGREE
  Dsubn = 0
  FOR I = 0 TO Lsubn
    Dsubn = Dsubn XOR FNM1(Sigman(I),S(N-I))
  NEXT I
  IF Dsubn THEN
    Dnoverdk = FND1(Dsubn,Dsubk)
    J = Maxdeg-(N-K)
    IF Lsubk < J THEN J = Lsubk
    FOR I = 0 TO J
      Sigman(I+(N-K)) = Sigman(I+(N-K)) XOR FNM1(Dnoverdk,Sigmak(I))
    NEXT I
    IF Lsubn < Lsubk+(N-K) THEN
      Temp = Lsubn
```

```
      Lsubn = Lsubk+(N-K)
      Lsubk = Temp
      FOR I = 1 TO Lsubk
        Sigmak(I) = Sigmap(I)
      NEXT I
      Dsubk = Dsubn
      K = N
    END IF
    FOR I = 1 TO Lsubn
      Sigmap(I) = Sigman(I)
    NEXT I
  END IF
  N = N+1
  IF %PRNTFLAG THEN
    PRINT N;TAB(6);
    FOR I = 0 TO Lsubn
      PRINT FNH3$(Sigman(I));
    NEXT I
    PRINT
  END IF
WEND
REM ========== END ITERATIVE ALGORITHM ==============================

REM ========== BEGIN FINDING ROOTS ==================================
IF Lsubn = 0 OR Lsubn>Maxdeg THEN
  Erflg = 1
  IF Numerrs > %DEGREE\2 THEN
    PRINT "UNCORRECTABLE ERROR DETECTED BY ITERATIVE ALGORITHM"
  ELSE
    PRINT "ITERATIVE ALGORITHM FAILURE":STOP
  END IF
ELSE
  Erflg = 0
  IF %PRNTFLAG THEN
    PRINT "-----------------------------------------------------------"
    PRINT "FIND ROOTS"
  END IF
  I = -1
  J = Lsubn
  K = 0
  WHILE J>0 AND Erflg = 0
    IF Numptrs THEN
      I = (P(Numptrs-1)+9) MOD %LFLDSIZELESS1
      Root = FNA1(I)
    ELSEIF J<5 THEN
      SELECT CASE J
        CASE 4
          CALL Case4(Sigman(1),Sigman(2),Sigman(3),Sigman(4),Root,Erflg)
        CASE 3
          CALL Case3(Sigman(1),Sigman(2),Sigman(3),Root,Erflg)
        CASE 2
          CALL Case2(Sigman(1),Sigman(2),Root,Erflg)
        CASE 1
          Root = Sigman(1)
          IF Root = 0 THEN Erflg = 1
      END SELECT
      IF Erflg = 0 THEN I = FNL1(Root)
    ELSE
      DO
        I = I+1
        IF I >=  NUMSYMBOLS THEN
          Erflg = 1
        ELSE
          A = 1
          Root = FNA1(I)
          FOR G = 1 TO J
```

```
        A = Sigman(G) XOR FNM1(A,Root)
      NEXT G
    END IF
  LOOP UNTIL A = 0 OR Erflg = 1
END IF
IF Erflg = 0 THEN
  J = J-1
  K = K+1
  L(K) = I
  REM ========== COMPUTE ERROR VALUE ===========================
  A = 0
  D = 0
  N = 0
  FOR G = 0 TO J
    A = Sigman(G) XOR FNM1(A,Root)
    Sigman(G) = A
    D = A XOR FNM1(D,Root)
    N = N XOR FNM1(A,S(J-G))
  NEXT G
  IF (N = 0 AND Numptrs = 0) OR D = 0 OR A = 0 THEN
    Erflg = 1
  ELSEIF (N = 0 and Numptrs <> 0) THEN
    Lsubn = Lsubn-1
    K = K-1
  ELSE
    Ee = FND1(N,D)
    C& = 1.*I*%OFFSET
    C = C&-%LFLDSIZELESS1*INT(C&/%LFLDSIZELESS1)
    E(K) = FNStox(FND1(Ee,FNA1(C)))
    IF J THEN
      FOR H = 0 TO J
        X = FNA1((H*I) MOD %LFLDSIZELESS1)
        S(H) = S(H) XOR FNM1(X,Ee)
      NEXT H
    END IF
  END IF
  IF Erflg = 0 AND Numptrs THEN
    Numptrs = Numptrs-1
    IF Numptrs = 0 THEN I = -1
  END IF
END IF
WEND
REM ========== END FINDING ROOTS ===================================

IF Erflg THEN
  IF Numerrs > %DEGREE\2 THEN
    PRINT "UNCORRECTABLE ERROR DETECTED BY ROOT FINDER"
  ELSE
    PRINT "ROOT FINDER FAILURE":STOP
  END IF
ELSE
  FOR I = 1 TO Lsubn
    L(I) = (L(I)+%LFLDSIZELESS1-9) MOD %LFLDSIZELESS1
  NEXT I
  IF %PRNTFLAG THEN
    PRINT "LOCATIONS ";
    FOR I = 1 TO Lsubn
      PRINT FNH3$(L(I));
    NEXT I
    PRINT
    PRINT "VALUES    ";
    FOR I = 1 TO Lsubn
      PRINT FNH3$(E(I));
    NEXT I
    PRINT
    IF Lsubn <> Numerrs THEN
```

```
    PRINT "INCORRECT NUMBER OF ERRORS DETECTED":STOP
  END IF
END IF

REM ========== BEGIN QUALIFYING BURSTS ============================
IF Lsubn>2 AND %DOBURSTCHECK THEN
  FOR J = Lsubn-1 TO 1 STEP -1
    FOR I = 1 TO J
      IF L(I)<L(I+1) THEN
        Temp = L(I)
        L(I) = L(I+1)
        L(I+1) = Temp
        Temp = E(I)
        E(I) = E(I+1)
        E(I+1) = Temp
      END IF
    NEXT I
  NEXT J
  IF Lsubn = 3 THEN
    IF L(1)-L(2) = 1 THEN
      IF L(2)-L(3) = 1 THEN
        E(4) = 0
        Erflg = FNGT22
      ELSE
        Erflg = FNGT11(1)
      END IF
    ELSE
      IF L(2)-L(3) = 1 THEN
        Erflg = FNGT11(2)
      ELSE
        Erflg = 1
      END IF
    END IF
  ELSE
    IF L(1)-L(2)<>1 OR L(3)-L(4)<>1 THEN
      Erflg = 1
    ELSE
      IF L(2)-L(3) <> 1 THEN
        Erflg = FNGT11(1) OR FNGT11(3)
      ELSE
        Erflg = FNGT22
      END IF
    END IF
  END IF
END IF
REM ========== END QUALIFYING BURSTS ==============================

IF Erflg THEN
  PRINT "NON-QUALIFYING ERROR BURST(S) DETECTED"
  IF Numerrs < =  Maxdeg THEN Erflg = 0
END IF

REM ========== BEGIN CORRECTING ERRORS =========================
FOR I = 1 TO Lsubn
  IF L(I) > NUMSYMBOLS-1 THEN
    Erflg = 1
    I = Lsubn
  ELSE
    IF L(I) >=  Degree THEN
      Fwdbitdisp = %NUMLFLDBITS*(NUMSYMBOLS-1-L(I))
      Byteoffset = Fwdbitdisp \ 8
      Shiftcount = (Fwdbitdisp AND 7) XOR 6
      Ehigh = INT(E(I)*2^(Shiftcount-8))
      Databuff(Byteoffset) = Databuff(Byteoffset) XOR Ehigh
      IF Byteoffset+1 < NUMDATBYTS THEN
        Elow = 256*(E(I)*2^(Shiftcount-8)-Ehigh)
```

```
            Databuff(Byteoffset+1) = Databuff(Byteoffset+1) XOR Elow
          END IF
        END IF
      END IF
    NEXT I
    REM ========== END CORRECTING ERRORS ==============================
    IF Erflg THEN
      PRINT "INVALID ERROR LOCATION DETECTED BY ERROR FIXER"
    END IF
  END IF
END IF

REM ***********************************************************************
REM * END CORRECTION ALGORITHM                                            *
REM ***********************************************************************

IF Erflg THEN
  IF Numerrs < =  2 OR (Numerrs < =  %DEGREE\2 AND %DOBURSTCHECK = 0) THEN
    PRINT "CORRECTION FAILURE":STOP
  END IF
ELSE
  IF Numerrs > Maxdeg THEN
    PRINT "MISCORRECTION":STOP
  ELSE
    REM ========== CHECK FOR ALL CORRECTED DATA ======================
    FOR I = 0 TO NUMDATBYTS-1
      IF Databuff(I)<>Dupdata(I) THEN
        PRINT "UNCORRECTED ERROR";I;Databuff(I);Dupdata(I):STOP
      END IF
    NEXT I
    PRINT "ERROR LOCATIONS AND VALUES VERIFIED BY BUFFER COMPARISON"
  END IF
END IF

IF %PRNTFLAG THEN
  PRINT "-----------------------------------------------------------"
END IF
IF RAND=0 THEN INPUT A$
NEXT II!
STOP

END

REM ********************************************************************

REM -----TWO-BYTE HEX$ FUNCTION
DEF FNH2$(Opa)
  FNH2$ = "    "+RIGHT$("0"+HEX$(Opa),2)
END DEF

REM -----THREE-BYTE HEX$ FUNCTION
DEF FNH3$(Opa)
  FNH3$ = "    "+RIGHT$("00"+HEX$(Opa),3)
END DEF

REM -----EXTERNAL TO SUBFIELD TRANSFORMATION
DEF FNXtos(Opa)
  SHARED Xtos()
  LOCAL I,X,Y
  X = Opa
  Y = 0
  FOR I = 0 TO %NUMLFLDBITS-1
    IF X AND 1 THEN Y = Y XOR Xtos(I)
    X = X \ 2
  NEXT I
  FNXtos = Y
```

```
END DEF

REM -----SUBFIELD TO EXTERNAL TRANSFORMATION
DEF FNStox(Opa)
  SHARED Stox()
  LOCAL I,X,Y
  X = Opa
  Y = 0
  FOR I = 0 TO %NUMLFLDBITS-1
    IF X AND 1 THEN Y = Y XOR Stox(I)
    X = X \ 2
  NEXT I
  FNStox = Y
END DEF

REM -----SMALL FINITE FIELD MULTIPLICATION FUNCTION
DEF FNMs(Opa,Opb)
  SHARED Ats(),Lts()
  LOCAL X
  IF Opa = 0 OR Opb = 0 THEN
    FNMs = 0
  ELSE
    FNMs = Ats((Lts(Opa)+Lts(Opb)) MOD %SFLDSIZELESS1)
  END IF
END DEF

REM -----SMALL FINITE FIELD DIVISION FUNCTION
DEF FNDs(Opa,Opb)
  SHARED Ats(),Lts()
  SHARED Erflg
  IF Opb = 0 THEN Erflg = 1
  IF Opa = 0 THEN
    FNDS = 0
  ELSE
    FNDs = Ats((Lts(Opa)-Lts(Opb)+%SFLDSIZELESS1) MOD %SFLDSIZELESS1)
  END IF
END DEF

REM -----LARGE FINITE FIELD LOG FUNCTION
DEF FNL1(Opa)
  SHARED Ats(),Lts(),F1()
  LOCAL X1,X0,J,K
  X1 = Opa  \  %SFLDSIZE
  X0 = Opa AND %SFLDSIZELESS1
  J = Lts(FNMs(Ats(1),FNMs(X1,X1)) XOR FNMs(X1,X0) XOR FNMs(X0,X0))
  IF X1 = 0 THEN
    K = 0
  ELSE
    K = F1(FNDs(X0,X1))
  END IF
  FNL1 = (%SFLDSIZE/2.*(%SFLDSIZEPLUS1*J+%SFLDSIZELESS1*K)) MOD %LFLDSIZELESS1
END DEF

REM -----LARGE FINITE FIELD ANTILOG FUNCTION
DEF FNA1(Opa)
  SHARED Ats(),Lts(),F2()
  LOCAL B,Temp
  SELECT CASE (Opa MOD %SFLDSIZEPLUS1)
    CASE 0
      Temp = Ats(Opa \ %SFLDSIZEPLUS1)
    CASE 1
      Temp = Ats(Opa \ %SFLDSIZEPLUS1)*%SFLDSIZE
    CASE ELSE
      B = F2((Opa MOD %SFLDSIZEPLUS1)-2)
      Temp = B XOR Ats((2*Lts(B)) MOD %SFLDSIZELESS1) XOR Ats(1)
      Temp = (Opa-Lts(Temp)+%SFLDSIZELESS1) MOD %SFLDSIZELESS1
```

```
      Temp = (Temp+%SFLDSIZE*(Temp AND 1)) \ 2
      Temp = %SFLDSIZE*Ats(Temp)+Ats((Temp+Lts(B)) MOD %SFLDSIZELESS1)
  END SELECT
  FNA1 = Temp
END DEF

REM -----LARGE FIELD QUAD FUNCTION
DEF FNQ1(Opa)
  SHARED Ats(),Lts(),Qts()
  LOCAL C0,C1,Q1,Q0
  C1 = Opa  \  %SFLDSIZE
  C0 = Opa AND %SFLDSIZELESS1
  Q1 = Qts(C1)
  IF Q1 = 0 THEN
    FNQ1 = 0
  ELSE
    Q0 = Qts(C0 XOR FNMs(2,FNMs(Q1,Q1)))
    IF Q0 = 0 THEN
      Q1 = Q1 XOR 1
      Q0 = Qts(C0 XOR FNMs(2,FNMs(Q1,Q1)))
    END IF
    FNQ1 = %SFLDSIZE*Q1+Q0
  END IF
END DEF

REM -----LARGE FINITE FIELD MULTIPLICATION FUNCTION
DEF FNM1(Opa,Opb)
  SHARED Ats(),Lts()
  IF Opa = 0 OR Opb = 0 THEN
    FNM1 = 0
  ELSE
    X1 = Lts(Opa  \  %SFLDSIZE)
    X0 = Lts(Opa AND %SFLDSIZELESS1)
    W1 = Lts(Opb  \  %SFLDSIZE)
    W0 = Lts(Opb AND %SFLDSIZELESS1)
    Y1 =           Ats((X1+W1) MOD %SFLDSIZELESS1) AND X1<>0 AND W1<>0
    Y1 = Y1 XOR   (Ats((X1+W0) MOD %SFLDSIZELESS1) AND X1<>0 AND W0<>0)
    Y1 = Y1 XOR   (Ats((X0+W1) MOD %SFLDSIZELESS1) AND X0<>0 AND W1<>0)
    Y0 =           Ats((X0+W0) MOD %SFLDSIZELESS1) AND X0<>0 AND W0<>0
    Y0 = Y0 XOR (Ats((X1+W1+1) MOD %SFLDSIZELESS1) AND X1<>0 AND W1<>0)
    FNM1 = %SFLDSIZE*Y1+Y0
  END IF
END DEF

REM -----LARGE FINITE FIELD DIVISION FUNCTION
DEF FND1(Opa,Opb)
  SHARED Ats(),Lts()
  LOCAL X0,X1,Y0,Y1,Denom
  X1 = Opb  \  %SFLDSIZE
  X0 = Opb AND %SFLDSIZELESS1
  Denom = FNMs(X0,X0) XOR FNMs(X1,X0) XOR FNMs(X1,FNMs(X1,Ats(1)))
  Y1 = FNDs(X1,Denom)
  Y0 = FNDs(X1 XOR X0,Denom)
  FND1 = FNM1(Opa,%SFLDSIZE*Y1+Y0)
END DEF

REM -----GENERATE TABLES
SUB Gentbls
  SHARED Ats(),Lts(),Qts(),F1(),F2(),T1()
  LOCAL X,Y,I,J,X0,X1,Temp
  X = 1
  FOR I = 0 TO %SFLDSIZELESS1
    Ats(I) = X
    X = X+X
    IF X >= %SFLDSIZE THEN X = X-%SFLDSIZE XOR %SPOLYFDBK
  NEXT I
```

```
  FOR I = 0 TO %SFLDSIZELESS1
    Lts(Ats(I)) = I
  NEXT I
  Lts(0) = 0
  REM -----GENERATE SMALL QUAD TABLE
  FOR J = 0 TO %SFLDSIZELESS1
    Qts(J) = 0
  NEXT J
  FOR J = 0 TO %SFLDSIZE-2 STEP 2
    Qts(FNMs(J,J) XOR J) = J XOR 1
  NEXT J
  REM -----GENERATE TABLE T1
  X1 = 0
  X0 = 1
  T1(0) = 1
  FOR I = 1 TO %SFLDSIZEPLUS1
    Temp = X1
    X1 = X0 XOR Temp
    X0 = FNMs(Ats(1),Temp)
    T1(I) = %SFLDSIZE*X1+X0
  NEXT I
  REM -----GENERATE TABLE F1
  FOR I = 2 TO %SFLDSIZE
    Y = T1(I)
    F1(FNDs(Y AND %SFLDSIZELESS1,Y \ %SFLDSIZE)) = I
  NEXT I
  F1(0) = 1
  REM -----GENERATE TABLE F2
  FOR I = 0 TO %SFLDSIZE-2
    Y = T1(I+2)
    F2(I) = FNDs(Y AND %SFLDSIZELESS1,Y \ %SFLDSIZE)
  NEXT I
  F2(%SFLDSIZELESS1) = 0
END SUB

DEF FNGetR(J)
  SHARED R(),SUBPOLY()
  LOCAL I,SRFDBK
  SRFDBK = R(%DEGREELESS1-J)
  FOR I = 1 TO J
    SRFDBK = SRFDBK XOR FNM1(R(I+%DEGREELESS1-J),SUBPOLY(I))
  NEXT I
  FNGetR = SRFDBK
END DEF

SUB ComputeSyndromes
  SHARED Ats(),Lts()
  SHARED R(),S(),Rbytebuff()
  LOCAL I,J,Temp1,Temp2
  LOCAL X0,X1,W0,W1,Y0,Y1,W

  J = 0
  L = 0
  Temp2 = Rbytebuff(J)
  FOR K = %DEGREELESS1 TO 0 STEP -1
    J=J+1
    Temp1 = Rbytebuff(J)
    SELECT CASE L
      CASE 0
        Temp2 = Temp2  +256*(Temp1 AND 3)
      CASE 2
        Temp2 = Temp2\4 +64*(Temp1 AND 15)
      CASE 4
        Temp2 = Temp2\16+16*(Temp1 AND 63)
      CASE 6
        Temp2 = Temp2\64+ 4* Temp1
```

```
        J = J+1
        Temp1 = Rbytebuff(J)
    END SELECT
    L = (L+2) AND 7
    R(K) = FNXtos(Temp2)
    Temp2 = Temp1
  NEXT K

  Temp1 = R(%DEGREELESS1)
  FOR I = 0 TO %DEGREELESS1
    S(I) = Temp1
  NEXT I
  FOR J = 1 TO %DEGREELESS1
    Temp1 = FNGetR(J)
    IF Temp1 THEN
      X1 = Lts(Temp1  \  %SFLDSIZE)
      X0 = Lts(Temp1 AND %SFLDSIZELESS1)
      Temp2 = (1.*J*%OFFSET) MOD %LFLDSIZELESS1
      FOR I = 0 TO %DEGREELESS1
        W = FNAl(Temp2)
        W1 = Lts(W  \  %SFLDSIZE)
        W0 = Lts(W AND %SFLDSIZELESS1)
        Y1 =           Ats((X1+W1) MOD %SFLDSIZELESS1) AND X1<>0 AND W1<>0
        Y1 = Y1 XOR   (Ats((X1+W0) MOD %SFLDSIZELESS1) AND X1<>0 AND W0<>0)
        Y1 = Y1 XOR   (Ats((X0+W1) MOD %SFLDSIZELESS1) AND X0<>0 AND W1<>0)
        Y0 =           Ats((X0+W0) MOD %SFLDSIZELESS1) AND X0<>0 AND W0<>0
        Y0 = Y0 XOR (Ats((X1+W1+1) MOD %SFLDSIZELESS1) AND X1<>0 AND W1<>0)
        S(I) = S(I) XOR (%SFLDSIZE*Y1+Y0)
        Temp2 = (Temp2+J) MOD %LFLDSIZELESS1
      NEXT I
    END IF
  NEXT J
  IF %PRNTFLAG THEN
    PRINT "----------------------------------------------------------"
    PRINT "SYNDROMES"
    FOR I = 0 TO %DEGREELESS1
      PRINT FNH3$(S(I));
    NEXT I
    PRINT
  END IF
END SUB

REM -----TWO ERROR CASE
SUB Case2(Sig1,Sig2,Root,Erflg)
  SHARED Ats(),Lts()
  Root = FNMl(Sig1,FNQl(FNDl(Sig2,FNMl(Sig1,Sig1))))
  IF Root = 0 THEN Erflg = 1
END SUB

REM -----THREE ERROR CASE
SUB Case3(Sig1,Sig2,Sig3,Root,Erflg)
  SHARED Ats(),Lts()
  LOCAL A,B,A3,T
  A = Sig2 XOR FNMl(Sig1,Sig1)
  B = Sig3 XOR FNMl(Sig1,Sig2)
  A3 = FNMl(A,FNMl(A,A))
  CALL Case2(B,A3,T,Erflg)
  IF Erflg = 0 THEN
    T = FNLl(T)
    IF (T MOD 3) THEN
      Erflg = 1
    ELSE
      T = FNAl(T \ 3)
      Root = Sig1 XOR T XOR FNDl(A,T)
      IF Root = 0 THEN Erflg = 1
    END IF
```

```
  END IF
END SUB

REM -----FOUR ERROR CASE
SUB Case4(Sig1,Sig2,Sig3,Sig4,Root,Erflg)
  SHARED Ats(),Lts()
  LOCAL A,B,B2,B3,B4,Q,S,F
  IF Sig1 = 0 THEN
    IF Sig3 = 0 THEN
      Erflg = 1
      EXIT SUB
    END IF
    B4 = Sig4
    B3 = Sig3
    B2 = Sig2
  ELSE
    B4d = FNM1(Sig3,Sig3) XOR
      FNM1(FNM1(Sig1,Sig2),Sig3) XOR
      FNM1(FNM1(Sig1,Sig1),Sig4)
    IF B4d = 0 THEN
      Erflg = 1
      EXIT SUB
    END IF
    B4 = FND1(FNM1(Sig1,Sig1),B4d)
    B3 = FNM1(Sig1,B4)
    B = FNM1(Sig1,Sig3)
    IF B = 0 THEN
      A = 0
    ELSE
      B = FNL1(B)
      A = FNA1((B+%LFLDSIZE*(B AND 1)) \ 2)
    END IF
    B2 = FNM1(A XOR Sig2,B4)
  END IF
  CALL Case3(0,B2,B3,Q,Erflg)
  IF Erflg THEN EXIT SUB
  CALL Case2(FND1(B3,Q),B4,S,Erflg)
  IF Erflg THEN EXIT SUB
  CALL Case2(Q,S,F,Erflg)
  IF Erflg THEN EXIT SUB
  IF Sig1 = 0 THEN
    Root = F
  ELSE
    B = FND1(Sig3,Sig1)
    IF B = 0 THEN
      A = 0
    ELSE
      B = FNL1(B)
      A = FNA1((B+%LFLDSIZE*(B AND 1)) \ 2)
    END IF
    Root = FND1(1,F) XOR A
    IF Root = 0 THEN Erflg = 1
  END IF
END SUB

DEF FNGT11(I)
  SHARED E()
  LOCAL B,X,L
  X = E(I)
  L = 20
  B = 9
  WHILE (X AND 2^B) = 0
    L = L-1
    B = B-1
  WEND
  X = E(I+1)
```

```
  B = 0
  WHILE (X AND 2^B) = 0
    L = L-1
    B = B+1
  WEND
  IF L <= 11 THEN
    FNGT11 = 0
  ELSE
    FNGT11 = 1
  END IF
END DEF

DEF FNGT22
  SHARED E(),L()
  LOCAL I,Bmask
  I = 1
  Bmask = &H200
  WHILE (E(I) AND Bmask) = 0
    Bmask = Bmask\2
  WEND
  I = 2
  DO
    Bmask = Bmask\2
    IF Bmask = 0 THEN
      Bmask = &h200
      I = I+1
    END IF
  LOOP UNTIL (E(I) AND Bmask)
  IF E(4)<>0 AND I = 2 THEN
    FNGT22 = 1
    EXIT DEF
  ELSE
    IF E(4) = 0 AND I = 3 THEN
      FNGT22 = 0
      EXIT DEF
    ELSE
      I = I+1
      Bmask = Bmask\2
      WHILE Bmask<>0
        IF (E(I) AND Bmask) THEN
          FNGT22 = 1
          EXIT DEF
        END IF
        Bmask = Bmask\2
      WEND
    END IF
  END IF
  FNGT22 = 0
END DEF

REM ***** THE FOLLOWING ROUTINES ARE USED FOR TESTING ONLY *****

REM -----GENERATE EXTERNAL LARGE TABLES
SUB Genltbls
  SHARED Atx(),Ltx(),Extpoly(),Subpoly()
  LOCAL X,I,J,Acc,Temp,T()
  DIM T(%LFLDSIZELESS1)
  X = 1
  FOR I = 0 TO %LFLDSIZELESS1
    T(I) = X
    X = X+X
    IF X >= %LFLDSIZE THEN X = X-%LFLDSIZE XOR %LPOLYFDBK
  NEXT I
  FOR I = 0 TO %LFLDSIZELESS1
    X = T((%M*I) MOD %LFLDSIZELESS1)
    Atx(I) = X
```

```
    Ltx(X) = I
  NEXT I
  Ltx(0) = 0
  FOR I = 0 TO %DEGREE
     T(I) = 0
  NEXT I
  Acc = 1
  FOR J = 0 TO %DEGREE
    FOR I = 0 TO %DEGREELESS1
      Temp = Acc
      Acc = Acc XOR T(I)
      T(I) = Atx((Ltx(Temp)+I+%OFFSET) MOD %LFLDSIZELESS1) AND Temp<>0
    NEXT I
    Extpoly(J) = Acc
    Subpoly(J) = FNXtos(Acc)
    Acc = 0
  NEXT J
  IF %PRNTFLAG AND 0 THEN
    PRINT "---------------------------------------------------------"
    PRINT "EXTERNAL CODE GENERATOR POLYNOMIAL"
    FOR I = 0 TO %DEGREE
      PRINT FNH3$(Extpoly(I));
    NEXT I
    PRINT
  END IF
END SUB

REM -----LARGE FINITE FIELD MULTIPLICATION FUNCTION USING LARGE TABLES
DEF FNMx(Opa,Opb)
  SHARED Atx(),Ltx()
  IF Opa = 0 OR Opb = 0 THEN
    FNMx = 0
  ELSE
    FNMx = Atx((Ltx(Opa)+Ltx(Opb)) MOD %LFLDSIZELESS1)
  END IF
END DEF

SUB EncodeDecode(Encode)
  SHARED Atx(),Ltx(),Extpoly()
  SHARED Databuff(),Rbytebuff(),NUMDATBYTS,NUMSYMBOLS
  LOCAL H,I,J,K,L,SRFDBK,LOGFDBK,JSAVE,R(),SRINPUT,RSAVE()
  DIM R(31),RSAVE(31)
  RESTORE 9999
  FOR I = 0 TO %DEGREE
    READ R(I)
  NEXT I
  9999
  DATA &H3FF,&H3F0,&H0AE,&H2DB,&H23A,&H2EF,&H325,&H000,&H000

  IF Encode THEN
    FOR I = NUMDATBYTS TO NUMDATBYTS+10
      Databuff(I) = 0
    NEXT I
  END IF

  L = 2
  J = 0
  FOR K = 0 TO NUMSYMBOLS-%DEGREE-1
    SELECT CASE L
      CASE 2
        SRINPUT = (4*(Databuff(J) AND 255)+Databuff(J+1)\64)
      CASE 4
        SRINPUT = (16*(Databuff(J) AND 63)+Databuff(J+1)\16)
      CASE 6
        SRINPUT = (64*(Databuff(J) AND 15)+Databuff(J+1)\4)
      CASE 0
```

```
      SRINPUT = (256*(Databuff(J) AND 3)+Databuff(J+1))
      J = J+1
  END SELECT
  J = J+1
  L = (L+2) AND 7
  SRINPUT = SRINPUT XOR R(%DEGREELESS1)
  XORSUM = FNMx(SRINPUT,EXTPOLY(%DEGREELESS1))
  FOR I = %DEGREELESS2 TO 0 STEP -1
    XORSUM = XORSUM XOR FNMx(R(I),EXTPOLY(I))
  NEXT I
  FOR I = 0 TO %DEGREELESS1-2
    R(I) = R(I+1)
  NEXT I
  R(%DEGREELESS2) = SRINPUT
  R(%DEGREELESS1) = XORSUM
NEXT K

IF Encode THEN
  JSAVE = J
  FOR K = %DEGREELESS1 TO 0 STEP -1
    RSAVE(K) = R(%DEGREELESS1)
    XORSUM = 0
    FOR I = %DEGREELESS2 TO 0 STEP -1
      XORSUM = XORSUM XOR FNMx(R(I),EXTPOLY(I))
    NEXT I
    FOR I = 0 TO %DEGREELESS1 STEP 1
      R(I) = R(I+1)
    NEXT I
    R(%DEGREELESS2) = 0
    R(%DEGREELESS1) = XORSUM
  NEXT K
  J = JSAVE
  FOR K = %DEGREELESS1 TO 0 STEP -1
    SELECT CASE L
      CASE 2
        Databuff(J) = RSAVE(K)\4
      CASE 4
        Databuff(J) = 64*(RSAVE(K+1) AND 3)+RSAVE(K)\16
      CASE 6
        Databuff(J) = 16*(RSAVE(K+1) AND 15)+RSAVE(K)\64
      CASE 0
        Databuff(J) = 4*(RSAVE(K+1) AND 63)+RSAVE(K)\256
        J = J+1
        Databuff(J) = RSAVE(K) AND 255
    END SELECT
    J = J+1
    L = (L+2) AND 7
  NEXT K
  IF L <> 2 THEN
    SELECT CASE L
      CASE 4
        Databuff(J) = 64*(RSAVE(0) AND 3)
      CASE 6
        Databuff(J) = 16*(RSAVE(0) AND 15)
      CASE 0
        Databuff(J) = 4*(RSAVE(0) AND 63)
    END SELECT
  END IF
  IF %PRNTFLAG THEN
    PRINT "-------------------------------------------------------"
    PRINT "REDUNDANCY SYMBOLS (MSS FIRST)"
    FOR I = %DEGREELESS1 TO 0 STEP -1
      PRINT FNH3$(RSAVE(I));
    NEXT I
    PRINT
    IF 1 THEN
```

```
    PRINT "REDUNDANCY BYTES (MSB OF MSS FIRST)"
    FOR I = NUMDATBYTS TO NUMDATBYTS+10
      PRINT FNH2$(Databuff(I));
    NEXT I
    PRINT
   END IF
  END IF
ELSE 'Decode
  JSAVE = J
  FOR K = %DEGREELESS1 TO 0 STEP -1
    SELECT CASE L
      CASE 2
        SRINPUT = (4*Databuff(J)+Databuff(J+1)\64)
      CASE 4
        SRINPUT = (16*(Databuff(J) AND 63)+Databuff(J+1)\16)
      CASE 6
        SRINPUT = (64*(Databuff(J) AND 15)+Databuff(J+1)\4)
      CASE 0
        SRINPUT = (256*(Databuff(J) AND 3)+Databuff(J+1))
        J = J+1
    END SELECT
    J = J+1
    L = (L+2) AND 7
    SRINPUT = SRINPUT XOR R(%DEGREELESS1)
    XORSUM = FNMx(SRINPUT,EXTPOLY(%DEGREELESS1))
    FOR I = %DEGREELESS2 TO 0 STEP -1
      XORSUM = XORSUM XOR FNMx(R(I),EXTPOLY(I))
    NEXT I
    FOR I = 0 TO %DEGREELESS1 STEP 1
      R(I) = R(I+1)
    NEXT I
    R(%DEGREELESS2) = SRINPUT
    R(%DEGREELESS1) = XORSUM
  NEXT K
  J = 0
  L = 0
  FOR K = %DEGREELESS1 TO 0 STEP -1
    SELECT CASE L
      CASE 0
        Rbytebuff(J) = R(K) AND 255
      CASE 2
        Rbytebuff(J) = 4*(R(K) AND 63)+R(K+1)\256
      CASE 4
        Rbytebuff(J) = 16*(R(K) AND 15)+R(K+1)\64
      CASE 6
        Rbytebuff(J) = 64*(R(K) AND 3)+R(K+1)\16
        J = J+1
        Rbytebuff(J) = R(K)\4
    END SELECT
    J = J+1
    L = (L+2) AND 7
  NEXT K
  IF %PRNTFLAG THEN
    PRINT "-----------------------------------------------------------"
    PRINT "REMAINDER SYMBOLS (MSS FIRST)"
    FOR I = %DEGREELESS1 TO 0 STEP -1
      PRINT FNH3$(R(I));
    NEXT I
    PRINT
   IF 1 THEN
    PRINT "REMAINDER BYTES (MSB OF LSS FIRST)"
    FOR I = 9 TO 0 STEP -1
      PRINT FNH2$(Rbytebuff(I));
    NEXT I
    PRINT
   END IF
```

```
    END IF
  END IF
END SUB
```

We claim:

1. In a Reed-Solomon decoder, a method of determining error locations and values comprising the steps of:

(a) receiving a codeword comprised of user bits and redundancy bits from a digital magnetic disk storage device;

(b) forming a modified residue from the codeword using a linear feedback shift register by keeping a feedback path enabled during redundancy time;

(c) converting the modified residue formed in step (b) to a modified time domain error syndrome;

(d) converting the modified time domain error syndrome of step (c) to modified frequency domain error syndromes; and (e) determining error locations and values from the modified frequency domain error syndromes.

2. The method of determining error locations and values as recited in claim 1, wherein the modified residue comprises modified coefficients $T_i$ related to a remainder polynomial comprising coefficients $R_i$ according to the following transformation:

$$Ti = R_{d-3-i} \oplus \left[ \sum_{j=0}^{i-1} G_{j+d-1-i} * T_j \right] \oplus G_{d-2-i} * R_{d-2} \text{ for } 0 \leqq i \leqq d-3;$$

$$Ti = \left[ \sum_{j=0}^{i-1} G_{j+1} * T_j \right] \oplus G_0 * R_{d-2} \text{ for } i = d-2;$$

where:

d-1=a number of check symbols; and

Gj=coefficients of a generator polynomial.

3. The method of determining error locations and values as recited in claim 1, wherein the linear feedback shift register is a k-bit serial external XOR form of linear feedback shift register.

4. A decoder for an error detection and correction system using a Reed-Solomon code or related code of degree d-1 for detection and correction of a plurality of errors in a codeword of n symbols comprised of k data symbols and d-1 check symbols, wherein each symbol is comprised of m binary bits of information, said decoder comprising:

residue generator for producing a modified residue polynomial T(x) having modified residue coefficients $T_i$ according to a predetermined transformation of a remainder polynomial having coefficients $R_i$;

processor comprising syndrome generator for computing a syndrome polynomial S(x) from said modified residue coefficients $T_i$;

error polynomial generator for generating an error locator polynomial $\sigma(x)$ from said syndrome polynomial S(x);

error locator responsive to said locator polynomial $\sigma(x)$ for generating error locations;

error value generator responsive to said error locator polynomial $\sigma(x)$, said error locations, and said syndrome polynomial S(x) for generating error values; and, corrector for applying said error value to said data symbols in said data buffer to correct symbols that are in error wherein said residue polynomial coefficients $T_i$ are mapped to a subfield representation of the finite field before being used in computations.

5. A decoder for an error detection and correction system using a Reed-Solomon code of degree d-1 for detection and correction of at least one error in a codeword of n symbols comprised of k data symbols and d-1 check symbols, wherein each symbol is comprised of m binary bits of information, said decoder comprising:

an input connected to receive the codeword from a digital magnetic disk storage device;

residue generator for producing a modified residue polynomial T(x) having modified residue coefficients $T_i$ according to a predetermined transformation of a remainder polynomial having coefficients $R_i$;

syndrome generator for computing a syndrome polynomial S(x) from said modified residue coefficients $T_i$;

error polynomial generator for generating an error locator polynomial $\sigma(x)$ from said syndrome polynomial S(x);

error locator responsive to said error locator polynomial $\sigma(x)$ for generating error locations;

error value generator responsive to said error locator polynomial $\sigma(x)$, said error locations, and said syndrome polynomial S(x) for generating error values; and corrector for applying said error values to said data symbols to correct symbols that are in error, wherein m=10, d=9, t=8, G(x) is a GF(1024) polynomial $$G(x) = \prod_{i=0}^{7} (x \oplus \gamma^{m0+i}),$$

$m_0$=508, and $\gamma^i$ are given by $\gamma^i=(\omega^i)^{32}$, wherein $\omega^i$ are elements of a finite field generated by a GF(2) polynomial $x^{10} \oplus x^9 \oplus x^5 \oplus x^4 \oplus x^2 \oplus x^1 \oplus 1$.

6. A method of Reed-Solomon coding and decoding so that the location and pattern of errors in corrupted versions of original digital message words may later be determined comprising the steps of:

(a) receiving information polynomials, each of a plurality of 8 bit bytes;

(b) appending to each said information polynomial, eight 10 bit redundancy symbols for later determining the location and pattern of a first burst error not exceeding 22 bits in length, or for later determining the location and pattern of first and second burst errors each not exceeding 11 bits in length, the combination of the information polynomial and the eight 10 bit redundancy symbols, together with any prepad and post pad bits, forming each respective original digital message word;

(c) decoding versions of the original digital message words that may be corrupted versions of the original digital message words:

(i) to detect and correct in real time any single burst error therein of not more than 11 bits in length, or;

(ii) to detect and correct off line either any single burst errors therein of more than 11 bits and not more than 22 bits in length, or to detect and correct off line first and second burst errors therein, each of not more than 11 bits in length.

7. In a Reed-Solomon coder/decoder, the improvement comprising:

an encoder having a k bit serial external XOR form of linear feedback shift register, where k is equal to or greater than 1, for determining and appending a redundancy polynomial to the information polynomial;

said k bit serial external XOR form of linear feedback shift register of said encoder also forming a residue generator of a decoder responsive to a received codeword for forming a residue responsive to introduced errors, the feedback for the linear feedback shift register remaining active during the redundancy time of the decoder.

8. In the Reed-Solomon coder/decoder of claim 7, the further improvement comprising a burst trapping decoder coupled to the residue generator for correcting a single burst error contained within one, two or three adjacent symbols, said burst trapping decoder also being a k bit serial external XOR form of linear feedback shift register.

9. A decoder for an error detection and correction system using a Reed Solomon code or related code of degree d-1 for detection and correction of a plurality of errors in codewords of n symbols comprised of k data symbols and d-1 check symbols, wherein each symbol is comprised of m binary bits of information, said decoder comprising:

a residue generator responsive to a received codeword polynomial for forming a residue responsive to introduced errors by multiplying said received codeword by $x^{d-1}$ and dividing by the GF (1024) generator polynomial $$G(x) = \prod_{i=o}^{7} (x - \gamma^{m0+i})$$

wherein $m_0$508, and $\gamma^i$ are given by $\gamma^i=((\omega^i)^{32}$, wherein $\omega^i$ are elements of a finite field generated by a GF (2) polynomial $$x^{10}+x^9+x^5+x^4+x^2+x^1+1$$

and wherein m=10, d=9 and t=4.

a burst trapping decoder coupled to the residue generator for correcting in real time a single burst error contained within one, two or three adjacent symbols of a first predetermined number of bits; and means operating in non real time for determining error locations and values for both (i) single burst errors limited to a second predetermined number of bits and (ii) double burst errors limited to a third predetermined number of bits.

10. In a Reed-Solomon decoder, the improvement comprising:

(a) a residue generator responsive to a received codeword polynomial for forming a residue responsive to introduced errors; and (b) a bit serial burst trapping decoder coupled to the residue generator for correcting at least one burst error.

11. The Reed-Solomon decoder as recited in claim 10, further comprising a firmware decoder for determining error locations and values.

12. The Reed-Solomon decoder as recited in claim 11, wherein the firmware decoder operates by:

(a) converting the residue into a time domain error syndrome;

(b) converting the time domain error syndrome into frequency domain error syndromes; and (c) determining error locations and values from the frequency domain syndromes.

13. A data controller comprising:

(a) a host interface connected to a host computer;

(b) a device interface connected to a magnetic disk digital storage device;

(c) an encoder, connected to receive user data from the host computer, for encoding the user data into a plurality of codewords wherein each codeword comprises a number of user data bits and a number of redundancy bits, the codewords being transmitted through the device interface and stored to the magnetic disk digital storage device;

(d) a data buffer manager for controlling access to the codeword user data bits stored in a data buffer; and (e) an error detection and correction system for detecting and correcting errors in the user data bits of a selected codeword comprising:

(i) a first level hardware system for detecting and correcting a first predetermined number of errors in the user data bits of the selected codeword; and (ii) a second level software system for detecting and correcting a second predetermined number of errors in the user data bits of the selected codeword wherein the second predetermined number of errors is greater than the first predetermined number of errors, wherein:

if an error is detected in the user data bits of the selected codeword, a part of the selected codeword containing the error is read from the data buffer, corrected, and restored to the data buffer;

the first level hardware error detection and correction process occurs on-the-fly without pausing the information transfer of uncorrected codewords between the magnetic disk digital storage device and the data buffer; and the total time to process and correct the selected codeword varies.

14. The data controller as recited in claim 13, wherein:

(a) the hardware system receives the selected codeword as it is being read from the digital storage device and concurrently stored in the data buffer;

(b) if the hardware system detects an error in the selected codeword, then a part of the selected codeword containing the error is read from the data buffer, corrected, and restored to the data buffer.

15. The data controller as recited in claim 14, wherein:

(a) the hardware system comprises a burst error trapping decoder for on-the-fly correction of at least a single burst; and (b) the software system receives an error signature from the hardware system; converts the error signature into an error syndrome; determines error locations and values from the error syndrome; reads a part of the selected codeword from the data buffer corresponding to the error locations; corrects the part of the selected codeword containing the error; and restores to the data buffer a corrected part of the selected codeword.

16. The data controller as recited in claim 14, wherein:

(a) the error signature is a residue;

(b) the software system converts the residue into a time domain error syndrome;

(c) the software system converts the time domain error syndrome into a frequency domain error syndrome; and (d) the software system determines the error locations and values from the frequency domain error syndrome.

17. The data controller as recited in claim 13, wherein the hardware system comprises a k-bit serial burst trapping decoder.

18. The data controller as recited in claim 17, wherein k is greater than one.

19. The data controller as recited in claim 17, wherein the burst trapping decoder comprises an external XOR form of a linear feedback shift register.

20. A method for transferring user data between a host computer and a digital magnetic disk storage device comprising the steps of:

(a) receiving the user data from the host computer and encoding the user data into a plurality of codewords wherein each codeword comprises a number of user data bits and a number of redundancy bits;

(b) storing the codewords to the digital magnetic disk storage device;

(c) reading the plurality of codewords from the digital magnetic disk storage device and storing the user data bits of the codewords in a data buffer;

(d) detecting and correcting errors in the user data bits of a selected codeword comprising:

(i) a first level hardware system for detecting and correcting a first predetermined number of errors in the user data bits of a selected codeword; and (ii) a second level software system for detecting and correcting a second predetermined number of errors in the user data bits of the selected codeword wherein the second predetermined number of errors is greater than the first predetermined number of errors, wherein:

if an error is detected in the user data bits of the selected codeword, a part of the selected codeword containing the error is read from the data buffer, corrected, and restored to the data buffer;

the first level hardware error detection and correction process occurs on-the-fly without pausing the information transfer of uncorrected codewords between the digital magnetic disk storage device and the data buffer; and the total time to process and correct the selected codeword varies.

21. The method for transferring user data as recited in claim 20, wherein:

(a) the hardware system receives the selected codeword as it is being read from the digital storage device and concurrently stored in the data buffer;

(b) if the hardware system detects an error in the selected codeword, then a part of the selected codeword containing the error is read from the data buffer, corrected, and restored to the data buffer.

22. The method for transferring user data as recited in claim 21, wherein:

(a) the hardware system comprises a burst error trapping decoder for on-the-fly correction of at least a single burst; and (b) the software system receives an error signature from the hardware system; converts the error signature into an error syndrome; determines error locations and values from the error syndrome; reads a part of the selected codeword from the data buffer corresponding to the error locations; corrects the part of the selected codeword containing the error; and restores to the data buffer a corrected part of the selected codeword.

23. The method for transferring user data as recited in claim 22, wherein:

(a) the error signature is a residue;

(b) the software system converts the residue into a time domain error syndrome;

(c) the software system converts the time domain error syndrome into a frequency domain error syndrome; and (d) the software system determines the error locations and values from the frequency domain error syndrome.

24. The method for transferring user data as recited in claim 20, wherein the hardware system comprises a k-bit serial burst trapping decoder.

25. The method for transferring user data as recited in claim 24, wherein k is greater than one.

26. The method for transferring user data as recited in claim 24, wherein the burst trapping decoder comprises an external XOR form of a linear feedback shift register.

27. A k-bit serial burst trapping decoder for decoding a codeword, comprising an input connected to receive the codeword from a digital magnetic disk storage device, the codeword having a plurality of m-bit symbols where $k<m$, further comprising a k-bit serial low order first multiplier.

28. A k-bit serial burst trapping decoder for decoding a codeword, comprising an input connected to receive the codeword from a digital magnetic disk storage device, the codeword having a plurality of m-bit symbols where $k<m$, further comprising a k-bit serial encoder, wherein:

the encoder comprises a k-bit serial high order first multiplier; and the decoder comprises a k-bit serial low order first multiplier.

29. A burst trapping decoder, comprising:

(a) an input connected to receive a codeword comprised of user data bits and redundancy bits from a digital magnetic disk storage device; and (b) a multiple input, multiple constant k-bit serial multiplier having a plurality of memory elements connected in series, each memory element having an input and an output, wherein a result output of the multiplier is taken from the inputs of the memory elements.

30. The burst trapping decoder as recited in claim 29, further comprising an external XOR linear feedback shift register.

31. An error correcting system for decoding a received codeword polynomial having coefficients represented by symbols in a finite field $GF(2^m)$, comprising:

(a) an input connected to receive the codeword polynomial from a digital magnetic disk storage device;

(b) a first decoder for decoding the received codeword polynomial according to a first representation of the finite field; and, (c) a second decoder for decoding the received codeword polynomial according to a second representation of the finite field, wherein the first decoder is implemented in hardware and the second decoder is implemented in software.

32. An error correcting system for decoding a received codeword polynomial having coefficients represented by symbols in a finite field $GF(2^m)$, comprising:

(a) an input connected to receive the codeword polynomial from a digital magnetic disk storage device;

(b) a first decoder for decoding the received codeword polynomial according to a first representation of the finite field; and, (c) a second decoder for decoding the received codeword polynomial according to a second representation of the finite field, wherein:

(a) the second representation of the finite field is a large field generating by a polynomial over a small field $GF(2^k)$ where $k>1$;

(b) elements of the small field are represented by powers of $\beta$ and generated according to a first polynomial of degree m/w over GF (2); and (c) elements of the large field are represented by powers of $\alpha$ and generated according to a second polynomial:

$$x^2+x+\beta$$

over GF ($2^{m/2}$).

33. The error correcting system as recited in claim 32, wherein elements of the large field are represented by a pair of elements ($x_1$,$x_0$) from the small field.

34. The error correcting system as recited in claim 32, wherein each element x of the large field is represented by a polynomial in $\alpha$ of degree one having coefficients ($x_1$,$x_0$) selected from the small field, wherein:

$x=x_1\cdot\alpha+x_0$.

35. A Reed-Solomon error correcting system for decoding a received codeword polynomial having coefficients represented by symbols in a finite field GF($2^m$), comprising:

(a) an input connected to receive the codeword polynomial from a digital magnetic disk storage device;

(b) a burst trapping decoder for correcting, on-the-fly, a single burst error in the received codeword polynomial;

(c) a firmware decoder for correcting, not on-the-fly, a plurality of burst errors in the received codeword polynomial; and, (d) an error signature generator for generating an error signature using by the burst trapping decoder to correct the single burst error in the received codeword, wherein the firmware decoder converts the error signature into syndromes and decodes the syndromes into error locations and values to correct the plurality of burst errors in the received codeword.

36. A Reed-Solomon error correcting system for decoding a received codeword polynomial having coefficients represented by symbols in a finite field GF($2^m$), comprising:

(a) an input connected to receive the codeword polynomial from a digital magnetic disk storage device;

(b) a burst trapping decoder for correcting, on-the-fly, a single burst error in the received codeword polynomial; and, (c) a firmware decoder for correcting, not on-the-fly, a plurality of burst errors in the received codeword polynomial, wherein:

(a) the burst trapping decoder operates according to a first representation of the finite field; and (b) the firmware decoder operates according to a second representation of the finite field.

37. The error correcting system as recited in claim 36, further comprising a code mapper for mapping the symbols of the received codeword from the first representation of the finite field to the second representation of the finite field.

38. A Reed-Solomon error correcting system for decoding a received codeword polynomial having coefficients represented by symbols in a finite field GF($2^m$), comprising;

(a) a burst trapping decoder for correcting, on-the-fly, a single burst error in the received codeword polynomial; and, (b) a firmware decoder for correcting, not on-the-fly, a plurality of burst errors in the received codeword polynomial, wherein the burst trapping decoder comprises an external XOR linear feedback shift register.

39. A data controller comprising:

(a) an interface to a data buffer, the data buffer storing user data bits of a plurality of codewords from a digital magnetic storage device, each codeword comprises a plurality of the user data bits and a plurality of appended redundancy bits;

(b) an error correcting system for detecting and correcting errors in the user data bits of a selected codeword; and (c) an address pointer for addressing the data buffer, wherein:

when correcting an error in the user data bits of the selected codeword stored in the data buffer, the address pointer is initialized to a buffer address relative to an end of the selected codeword closest to the redundancy bits and decremented toward an end of the selected codeword furthest from the redundancy bits; and when the address pointer contains an address corresponding to an error in the user data bits of the selected codeword stored in the buffer, the codeword is corrected using a read-modify-write operation.

40. The data controller as recited in claim 39, wherein the error correcting system comprises a self-reciprocal code generator polynomial for generating the codewords over a finite field GF($2^m$).

41. The data controller as recited in claim 39, wherein:

(a) the error correcting system comprises an error signature generator for generating an error signature in response to the selected codeword; and (b) the error signature is reversed and then used by the error correcting system to correct the codeword.

42. The data controller as recited in claim 41, wherein the error signature is a modified residue comprising modified coefficients $T_i$ related to a remainder polynomial comprising coefficients $R_i$ according to a predetermined transformation.

43. The data controller as recited in claim 39, wherein the error correcting system is a Reed-Solomon error correcting system.

44. The data controller as recited in claim 39, wherein the error correcting system operates on-the-fly.

* * * * *

UNITED STATES PATENT AND TRADEMARK OFFICE

CERTIFICATE OF CORRECTION

PATENT NO. : 5,659,557

DATED : August 19, 1997

INVENTOR(S) : Glover et al.

It is certified that error appears in the above-identified patent and that said Letters Patent is hereby corrected as shown below:

In column 4, at line 27; in column 10, at line 58; in column 15, at line 33; in column 17, at line 12; and in column 18, at line 29, please delete " egual " and insert -- equal --.

In column 10, starting at line 1 and ending at line 26 please delete the two repetitous paragraphs ending with "computed empirically ".

In column 15, at line 29, please delete "Control" and insert --control--.

In column 16, at line 58, please delete "forman" and insert --form an--.

Signed and Sealed this

Twenty-ninth Day of May, 2001

Attest:

Nicholas P. Godici

NICHOLAS P. GODICI

*Attesting Officer*

*Acting Director of the United States Patent and Trademark Office*